US012228856B2

(12) United States Patent
Hatakeyama

(10) Patent No.: US 12,228,856 B2
(45) Date of Patent: Feb. 18, 2025

(54) RESIST COMPOSITION AND PATTERNING PROCESS

(71) Applicant: Shin-Etsu Chemical Co., Ltd., Tokyo (JP)

(72) Inventor: Jun Hatakeyama, Joetsu (JP)

(73) Assignee: SHIN-ETSU CHEMICAL CO., LTD., Tokyo (JP)

( * ) Notice: Subject to any disclaimer, the term of this patent is extended or adjusted under 35 U.S.C. 154(b) by 252 days.

(21) Appl. No.: 17/011,002

(22) Filed: Sep. 3, 2020

(65) Prior Publication Data

US 2021/0080828 A1 Mar. 18, 2021

(30) Foreign Application Priority Data

Sep. 13, 2019 (JP) ................................ 2019-167112

(51) Int. Cl.

*G03F 7/004* (2006.01)
*C08F 212/14* (2006.01)
*C08F 220/18* (2006.01)
*G03F 7/038* (2006.01)
*G03F 7/039* (2006.01)

(52) U.S. Cl.

CPC .......... *G03F 7/0045* (2013.01); *C08F 212/22* (2020.02); *C08F 212/24* (2020.02); *C08F 220/1806* (2020.02); *G03F 7/0382* (2013.01); *G03F 7/0392* (2013.01)

(58) Field of Classification Search

CPC ........ G03F 7/0045; C07F 9/065; C07F 9/067; C07F 9/65812; C07C 279/26
See application file for complete search history.

(56) References Cited

U.S. PATENT DOCUMENTS 10,101,654 B2 * 10/2018 Hatakeyama ......... G03F 7/0382
2004/0053160 A1 * 3/2004 Takahashi ............. G03F 7/0397 430/921
2015/0185612 A1 * 7/2015 Kawabata ................. G03F 7/30 430/311
2015/0346599 A1 * 12/2015 LaBeaume ............ G03F 7/0392 430/281.1
2016/0041465 A1 * 2/2016 Takizawa ................ G03F 7/039 430/311
2017/0059992 A1 * 3/2017 Nakagawa .............. G03F 7/325
2017/0075224 A1 * 3/2017 Nakagawa .............. G03F 7/162
2017/0184962 A1 * 6/2017 Hatakeyama ......... C07C 279/02
2017/0184963 A1 * 6/2017 Hatakeyama ......... G03F 7/2006
2017/0184964 A1 * 6/2017 Hatakeyama ........... G03F 7/168
2017/0351177 A1 12/2017 Hatakeyama et al.
2018/0039173 A1 * 2/2018 Hatakeyama ......... C07C 309/17
2018/0081266 A1 * 3/2018 Hatakeyama ....... H01L 21/0274
2018/0364574 A1 * 12/2018 Hatakeyama ......... G03F 7/0045

FOREIGN PATENT DOCUMENTS

JP 2001-194776 A 7/2001
JP 2002-226470 A 8/2002
JP 2002-363148 A 12/2002
JP 2017-219836 A 12/2017
JP 2018-49264 A 3/2018
JP 2018049264 A * 3/2018 .......... C07C 303/32
JP 2018-97356 A 6/2018
TW 201814399 A 4/2018
WO 2008/066011 A1 6/2008

* cited by examiner

*Primary Examiner* — Geraldina Visconti
*Assistant Examiner* — Anna Malloy
(74) *Attorney, Agent, or Firm* — WHDA, LLP

(57) ABSTRACT

The resist composition includes a base polymer and a salt. The salt consisting of an anion derived from an iodized or brominated phenol and a cation derived from a 2,5,8,9-tetraaza-1-phosphabicyclo[3.3.3]undecane, biguanide or phosphazene compound. The resist composition exerts a high sensitizing effect and an acid diffusion suppressing effect, causes no film thickness loss after development, and is improved in resolution, LWR and CDU when a pattern is formed therefrom by lithography.

13 Claims, No Drawings

RESIST COMPOSITION AND PATTERNING PROCESS

CROSS-REFERENCE TO RELATED APPLICATION

This non-provisional application claims priority under 35 U.S.C. § 119(a) on Patent Application No. 2019-167112 filed in Japan on Sep. 13, 2019, the entire contents of which are hereby incorporated by reference.

TECHNICAL FIELD

This invention relates to a resist composition and a pattern forming process.

BACKGROUND ART

To meet the demand for higher integration density and operating speed of LSIs, the effort to reduce the pattern rule is in rapid progress. In particular, the enlargement of the logic memory market to comply with the wide-spread use of smartphones drives forward the miniaturization technology. As the advanced miniaturization technology, manufacturing of microelectronic devices at the 10-nm node by double patterning of the ArF immersion lithography has been implemented in a mass scale. Manufacturing of 7-nm node devices as the next generation by the double patterning technology is approaching to the verge of high-volume application. The candidate for 5-nm node devices as the next generation but one is EUV lithography.

As the pattern feature size is reduced, approaching to the diffraction limit of light, light contrast lowers. In the case of positive resist film, a lowering of light contrast leads to reductions of resolution and focus margin of hole and trench patterns. For preventing the reduction of resolution of resist pattern due to a lowering of light contrast, an attempt is made to enhance the dissolution contrast of resist film.

Chemically amplified resist compositions comprising an acid generator capable of generating an acid upon exposure to light or EB include chemically amplified positive resist compositions wherein deprotection reaction takes place under the action of acid and chemically amplified negative resist compositions wherein polarity switch or crosslinking reaction takes place under the action of acid. Quenchers are often added to these resist compositions for the purpose of controlling the diffusion of the acid to unexposed region to improve the contrast. The addition of quenchers is fully effective to this purpose. A number of amine quenchers were proposed as disclosed in Patent Documents 1 to 3.

With respect to the acid labile group used in (meth) acrylate polymers for the ArF lithography resist material, deprotection reaction takes place when a photoacid generator capable of generating a sulfonic acid having fluorine substituted at α-position (referred to "α-fluorinated sulfonic acid") is used, but not when an acid generator capable of generating a sulfonic acid not having fluorine substituted at α-position (referred to "α-non-fluorinated sulfonic acid") or carboxylic acid is used. If a sulfonium or iodonium salt capable of generating an α-fluorinated sulfonic acid is combined with a sulfonium or iodonium salt capable of generating an α-non-fluorinated sulfonic acid, the sulfonium or iodonium salt capable of generating an α-non-fluorinated sulfonic acid undergoes ion exchange with the α-fluorinated sulfonic acid. Through the ion exchange, the α-fluorinated sulfonic acid thus generated by light exposure is converted back to the sulfonium or iodonium salt while the sulfonium or iodonium salt of an α-non-fluorinated sulfonic acid or carboxylic acid functions as a quencher. Patent Document 4 discloses a resist composition comprising a sulfonium or iodonium salt capable of generating carboxylic acid as a quencher.

Patent Document 5 discloses a resist composition comprising a sulfonium salt of iodized aromatic carboxylic acid as a quencher. The quencher is readily decomposed upon EUV exposure due to the substantial EUV absorption of iodine, and is quite effective for controlling acid diffusion by virtue of the large atomic weight of iodine. Thus a high sensitivity and an improved dimension uniformity due to low acid diffusion are expectable.

Patent Document 6 discloses a resist composition comprising an iodized aniline as a quencher. The aniline has a low basicity which is insufficient to suppress acid diffusion.

Sulfonium and iodonium salt type quenchers are photodecomposable like photoacid generators. That is, the amount of quencher in the exposed region is reduced. Since acid is generated in the exposed region, the reduced amount of quencher leads to a relatively increased concentration of acid and hence, an improved contrast. However, the acid diffusion in the exposed region is not suppressed, indicating the difficulty of acid diffusion control.

Patent Document 7 discloses a resist composition comprising a 2,5,8,9-tetraaza-1-phosphabicyclo[3.3.3]undecane salt, biguanide salt, and phosphazene salt of an iodized aromatic carboxylic acid. A sensitizing effect due to the high absorption of iodine is expectable as well as a high sensitivity and low acid diffusion assigned to a salt of a strong base or 2,5,8,9-tetraaza-1-phosphabicyclo[3.3.3]undecane, biguanide or phosphazene compound. Nevertheless, there is the demand for a resist material of new concept which exhibits a higher sensitivity and lower acid diffusion.

CITATION LIST

Patent Document 1: JP-A 2001-194776
Patent Document 2: JP-A 2002-226470
Patent Document 3: JP-A 2002-363148
Patent Document 4: WO 2008/066011
Patent Document 5: JP-A 2017-219836
Patent Document 6: JP-A 2018-097356
Patent Document 7: JP-A 2018-049264 (U.S. Pat. No. 10,101,654)

SUMMARY OF INVENTION

As the wavelength of light becomes shorter, the energy density thereof becomes higher and hence, the number of photons generated upon exposure becomes smaller. A variation in photon number causes variations in the LWR of line patterns and the CDU of hole patterns. As the exposure dose increases, the number of photons increases, leading to a less variation of photon number. Thus there is a tradeoff relationship between sensitivity and resolution, LWR and CDU. In particular, the EUV lithography resist materials have the tendency that a lower sensitivity leads to better LWR and CDU.

An increase in acid diffusion also causes degradation of resolution, LWR and CDU. This is because acid diffusion not only causes image blur, but also proceeds non-uniformly in a resist film. For suppressing acid diffusion, it is effective to lower the PEB temperature, to use a bulky acid which is least diffusive, or to increase the amount of quencher added. However, any of these means for reducing acid diffusion results in a lowering of sensitivity. Either the means for reducing photon variation or the means for reducing acid diffusion variation leads to a lowering of resist sensitivity.

An object of the invention is to provide a resist composition which has a high sensitizing effect and an acid diffusion suppressing effect and causes no film thickness loss after development and which has improved resolution, LWR and CDU, and a pattern forming process using the same.

A significant increase of acid generation efficiency and a significant suppression of acid diffusion must be achieved before the tradeoff relationship between sensitivity and resolution, LWR and CDU can be overcome.

The inventor has found that when a salt consisting of an iodized or brominated phenol compound and a 2,5,8,9-tetraaza-1-phosphabicyclo[3.3.3]undecane, biguanide or phosphazene compound is added to a base polymer, the resulting resist composition forms a resist film which exerts a high sensitizing effect and an acid diffusion suppressing effect and has a high sensitivity, minimized LWR and improved CDU.

In one aspect, the invention provides a resist composition comprising a base polymer and a salt, the salt consisting of an anion derived from an iodized or brominated phenol compound and a cation derived from a 2,5,8,9-tetraaza-1-phosphabicyclo[3.3.3]undecane, biguanide or phosphazene compound.

Typically, the salt has the formula (A).

(A)

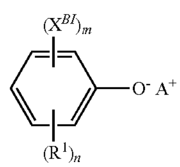

Herein m is an integer of 1 to 5, and n is an integer of 0 to 4, and $1 \le m+n \le 5$. $X^{BI}$ is iodine or bromine. $R^1$ is hydroxyl, an optionally fluorinated or chlorinated $C_1$-$C_6$ saturated hydrocarbyl group, an optionally fluorinated or chlorinated $C_1$-$C_6$ saturated hydrocarbyloxy group, an optionally fluorinated or chlorinated $C_2$-$C_6$ saturated hydrocarbyloxycarbonyl group, formyl, an optionally fluorinated or chlorinated $C_2$-$C_6$ saturated hydrocarbylcarbonyl group, an optionally fluorinated or chlorinated $C_2$-$C_6$ saturated hydrocarbylcarbonyloxy group, an optionally fluorinated or chlorinated $C_1$-$C_4$ saturated hydrocarbylsulfonyloxy group, a $C_6$-$C_{10}$ aryl group, fluorine, chlorine, amino, nitro, cyano, —$NR^{1A}$—C(═O)—$R^{1B}$, or —$NR^{1A}$—C(═O)—O—$R^{1B}$, wherein $R^{1A}$ is hydrogen or a $C_1$-$C_6$ saturated hydrocarbyl group, and $R^{1B}$ is a $C_1$-$C_6$ saturated hydrocarbyl group or a $C_2$-$C_8$ unsaturated aliphatic hydrocarbyl group.

$A^+$ is a cation having the formula (A)-1, (A)-2 or (A)-3.

(A)-1

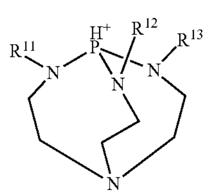

-continued (A)-2

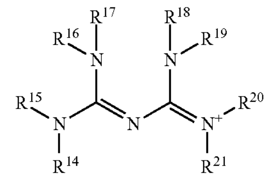

(A)-3

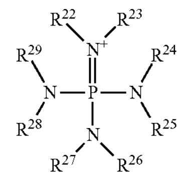

Herein $R^{11}$ to $R^{13}$ are each independently a $C_1$-$C_{24}$ hydrocarbyl group which may contain a heteroatom. $R^{14}$ to $R^{21}$ are each independently hydrogen or a $C_1$-$C_{24}$ hydrocarbyl group which may contain a heteroatom, a pair of $R^{14}$ and $R^{15}$, $R^{15}$ and $R^{16}$, $R^{16}$ and $R^{17}$, $R^{17}$ and $R^{18}$, $R^{18}$ and $R^{19}$, $R^{19}$ and $R^{20}$, or $R^{20}$ and $R^{21}$ may bond together to form a ring with the nitrogen atom to which they are attached, or the nitrogen atoms to which they are attached and intervening carbon atom, the ring optionally containing an ether bond. $R^{22}$ to $R^{29}$ are each independently hydrogen or a $C_1$-$C_{24}$ hydrocarbyl group which may contain a heteroatom, a pair of $R^{22}$ and $R^{23}$, $R^{23}$ and $R^{24}$, $R^{24}$ and $R^{25}$, $R^{25}$ and $R^{26}$, $R^{26}$ and $R^{27}$, or $R^{27}$ and $R^{28}$ may bond together to form a ring with the nitrogen atom to which they are attached, or the nitrogen atoms to which they are attached and intervening phosphorus atom, a pair of $R^{22}$ and $R^{23}$, $R^{24}$ and $R^{25}$, $R^{26}$ and $R^{27}$, or $R^{28}$ and $R^{29}$ may bond together to form a group having the formula (A)-3-1, and $R^{23}$ may be a group having the formula (A)-3-2 when $R^{22}$ is hydrogen.

(A)-3-1

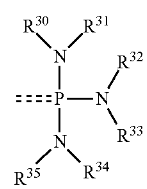

(A)-3-2

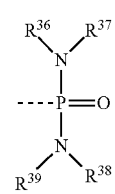

Herein $R^{30}$ to $R^{39}$ are each independently hydrogen or a $C_1$-$C_{24}$ hydrocarbyl group which may contain a heteroatom, a pair of $R^{30}$ and $R^{31}$, $R^{31}$ and $R^{32}$, $R^{32}$ and $R^{33}$, $R^{33}$ and $R^{34}$, $R^{34}$ and $R^{35}$, $R^{36}$ and $R^{37}$, or $R^{38}$ and $R^{39}$ may bond together to form a ring with the nitrogen atom to which they are attached, or the nitrogen atoms to which they are attached and intervening phosphorus atom, a pair of $R^{30}$ and $R^{31}$, $R^{32}$ and $R^{33}$, or $R^{34}$ and $R^{35}$ may bond together to form a group having the formula (A)-3-1. The broken line designates a valence bond.

The resist composition may further comprise an acid generator capable of generating a sulfonic acid, sulfonimide or sulfonemethide.

In a preferred embodiment, the base polymer comprises recurring units having the formula (a1) or recurring units having the formula (a2).

(a1)

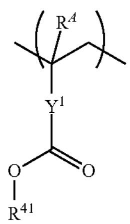

(a2)

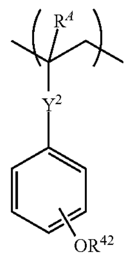

Herein $R^A$ is each independently hydrogen or methyl, $R^{41}$ and $R^{42}$ each are an acid labile group, $Y^1$ is a single bond, phenylene group, naphthylene group, or $C_1$-$C_{12}$ linking group containing an ester bond and/or lactone ring, and $Y^2$ is a single bond or ester bond.

Typically the resist composition is a chemically amplified positive resist composition.

In another embodiment, the base polymer is free of an acid labile group. Typically the resist composition is a chemically amplified negative resist composition.

In a further preferred embodiment, the base polymer comprises recurring units of at least one type selected from recurring units having the formulae (f1) to (f3).

(f1)

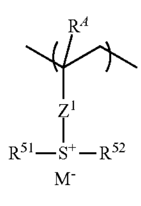

(f2)

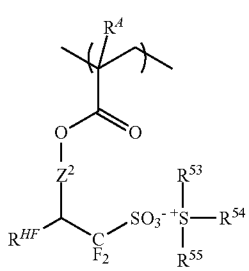

-continued (f3)

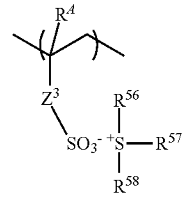

Herein $R^A$ is each independently hydrogen or methyl. $Z^1$ is a single bond, phenylene group, —O—$Z^{11}$—, —C(═O)—O—$Z^{11}$— or —C(═O)—NH—$Z^{11}$—, wherein $Z^{11}$ is a $C_1$-$C_6$ aliphatic hydrocarbylene group or phenylene group, which may contain a carbonyl, ester bond, ether bond or hydroxyl moiety. $Z^2$ is a single bond, —$Z^{21}$—C(═O)—O—, —$Z^{21}$—O— or —$Z^{21}$—O—C(═O)—, wherein $Z^{21}$ is a $C_1$-$C_{12}$ saturated hydrocarbylene group which may contain a carbonyl moiety, ester bond or ether bond. $Z^3$ is a single bond, methylene, ethylene, phenylene, fluorinated phenylene, —O—$Z^{31}$—, —C(═O)—O—$Z^{31}$—, or —C(═O)—NH—$Z^{31}$—, wherein $Z^{31}$ is a $C_1$-$C_6$ aliphatic hydrocarbylene group, phenylene group, fluorinated phenylene group, or trifluoromethyl-substituted phenylene group, which may contain a carbonyl moiety, ester bond, ether bond or hydroxyl moiety. $R^{51}$ to $R^{58}$ are each independently a $C_1$-$C_{20}$ hydrocarbyl group which may contain a heteroatom, any two of $R^{53}$, $R^{54}$ and $R^{55}$ or any two of $R^{56}$, $R^{57}$ and $R^{58}$ may bond together to form a ring with the sulfur atom to which they are attached. $R^{HF}$ is hydrogen or trifluoromethyl. $M^-$ is a non-nucleophilic counter ion.

The resist composition may further comprise an organic solvent and/or a surfactant.

In another aspect, the invention provides a process for forming a pattern comprising the steps of applying the resist composition defined above to form a resist film on a substrate, exposing the resist film to high-energy radiation, and developing the exposed resist film in a developer.

Preferably, the high-energy radiation is ArF excimer laser radiation of wavelength 193 nm, KrF excimer laser radiation of wavelength 248 nm, EB or EUV of wavelength 3 to 15 nm.

Advantageous Effects of Invention

A resist film contains the salt of an iodized or brominated phenol compound with a 2,5,8,9-tetraaza-1-phosphabicyclo[3.3.3]undecane, biguanide or phosphazene compound. Because of inclusion of iodine or bromine featuring substantial light absorption, the salt exhibits a sensitizing effect due to secondary electrons released therefrom upon exposure. Bulky and strongly basic 2,5,8,9-tetraaza-1-phosphabicyclo[3.3.3]undecane, biguanide and phosphazene compounds exert an acid diffusion suppressing effect and a high dissolution contrast. Thus the resist film containing the salt exhibits a high resolution, wide focus margin, high sensitivity, and minimal LWR or improved CDU as a positive or negative resist film subject to aqueous alkaline development or as a negative resist film subject to organic solvent development.

DESCRIPTION OF EMBODIMENTS

As used herein, the singular forms "a," "an" and "the" include plural referents unless the context clearly dictates otherwise. "Optional" or "optionally" means that the subsequently described event or circumstances may or may not occur, and that description includes instances where the event or circumstance occurs and instances where it does not. The notation (Cn-Cm) means a group containing from n to m carbon atoms per group. In chemical formulae, the broken line designates a valence bond, Me stands for methyl, and Ac for acetyl. As used herein, the term "iodized" or "brominated" indicates that a compound is substituted with iodine or bromine or a compound contains iodine or bromine.

The abbreviations and acronyms have the following meaning.

EB: electron beam

EUV: extreme ultraviolet

Mw: weight average molecular weight

Mn: number average molecular weight

Mw/Mn: molecular weight dispersity

GPC: gel permeation chromatography

PEB: post-exposure bake

PAG: photoacid generator

LWR: line width roughness

CDU: critical dimension uniformity

Resist Composition

The resist composition of the invention is defined as comprising a base polymer and a salt, the salt consisting of an anion derived from an iodized or brominated phenol compound and a cation derived from a 2,5,8,9-tetraaza-1-phosphabicyclo[3.3.3]undecane, biguanide or phosphazene compound. The salt is collectively referred to as "iodized or brominated phenol salt," hereinafter.

The iodized or brominated phenol salt undergoes ion exchange with sulfonic acid, sulfonimide or sulfonmethide generated from an acid generator, especially sulfonic acid containing fluorinated alkyl, bissulfonimide or trissulfonmethide, whereupon a 2,5,8,9-tetraaza-1-phosphabicyclo[3.3.3]undecane, biguanide or phosphazene cation forms a salt with a fluorinated alkyl-containing sulfonic acid, bissulfonimide or trissulfonmethide and an iodized or brominated phenol compound is released. The 2,5,8,9-tetraaza-1-phosphabicyclo[3.3.3]undecane, biguanide or phosphazene has an acid trapping ability and an acid diffusion suppressing effect. That is, the iodized or brominated phenol salt functions as a quencher in the resist composition. Since the iodized or brominated phenol salt is not photosensitive and thus not photo-decomposable, it retains a sufficient acid trapping ability even in the exposed region, suppressing acid diffusion from the exposed region to the unexposed region.

Besides the iodized or brominated phenol salt, an amine compound, ammonium salt, sulfonium salt or iodonium salt may be separately added as another quencher to the resist composition of the invention. The ammonium salt, sulfonium salt or iodonium salt added as the quencher is preferably an ammonium, sulfonium or iodonium salt of carboxylic acid, sulfonic acid, sulfonamide or saccharin. The carboxylic acid may or may not be fluorinated at α-position.

The acid diffusion suppressing effect and contrast enhancing effect of the iodized or brominated phenol salt are valid in both the positive or negative pattern formation by aqueous alkaline development and the negative pattern formation by organic solvent development.

Iodized or Brominated Phenol Salt

The iodized or brominated phenol salt typically has the formula (A).

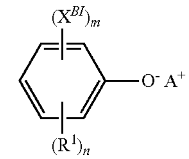

(A)

In formula (A), m is an integer of 1 to 5, and n is an integer of 0 to 4, and 1 m+n 5.

$X^{BI}$ is iodine or bromine.

$R^1$ is hydroxyl, an optionally fluorinated or chlorinated $C_1$-$C_6$ saturated hydrocarbyl group, an optionally fluorinated or chlorinated $C_1$-$C_6$ saturated hydrocarbyloxy group, an optionally fluorinated or chlorinated $C_2$-$C_6$ saturated hydrocarbyloxycarbonyl group, formyl, an optionally fluorinated or chlorinated $C_2$-$C_6$ saturated hydrocarbylcarbonyl group, an optionally fluorinated or chlorinated $C_2$-$C_6$ saturated hydrocarbylcarbonyloxy group, an optionally fluorinated or chlorinated $C_1$-$C_4$ saturated hydrocarbylsulfonyloxy group, a $C_6$-$C_{10}$ aryl group, fluorine, chlorine, amino, nitro, cyano, —$NR^{1A}$—C(═O)—$R^{1B}$, or —$NR^{1A}$—C(═O)—O—$R^{1B}$. $R^{1A}$ is hydrogen or a $C_1$-$C_6$ saturated hydrocarbyl group. $R^{1B}$ is a $C_1$-$C_6$ saturated hydrocarbyl group or a $C_2$-$C_8$ unsaturated aliphatic hydrocarbyl group.

The $C_1$-$C_6$ saturated hydrocarbyl group may be straight, branched or cyclic and examples thereof include methyl, ethyl, n-propyl, isopropyl, cyclopropyl, n-butyl, isobutyl, sec-butyl, tert-butyl, cyclobutyl, n-pentyl, cyclopentyl, n-hexyl, and cyclohexyl. Examples of the saturated hydrocarbyl moiety of the $C_1$-$C_6$ saturated hydrocarbyloxy group, $C_2$-$C_6$ saturated hydrocarbyloxycarbonyl group, $C_2$-$C_6$ saturated hydrocarbylcarbonyl group, $C_2$-$C_6$ saturated hydrocarbylcarbonyloxy group, and $C_1$-$C_4$ saturated hydrocarbylsulfonyloxy group are as exemplified just above for the saturated hydrocarbyl group. Examples of the $C_6$-$C_{10}$ aryl group include phenyl and naphthyl.

The $C_2$-$C_8$ unsaturated aliphatic hydrocarbyl group may be straight, branched or cyclic and examples thereof include vinyl, 1-propenyl, 2-propenyl, butenyl, hexenyl, and cyclohexenyl.

Examples of the anion of the salt having formula (A) are given below, but not limited thereto.

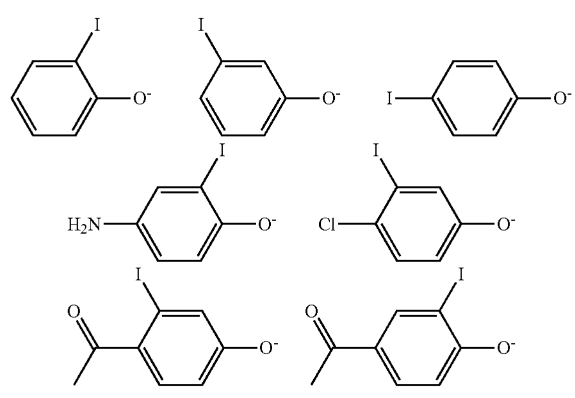

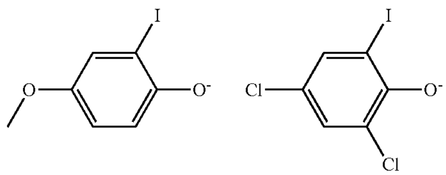
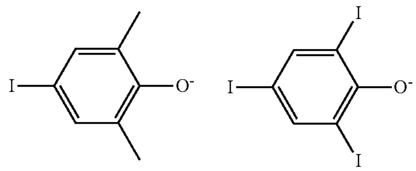
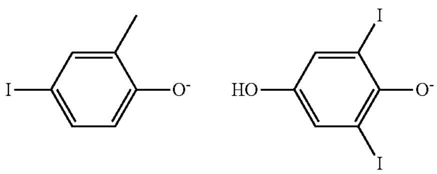
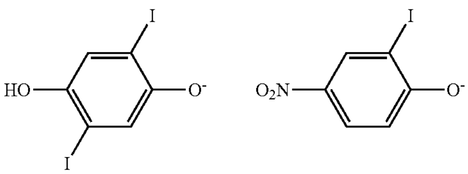
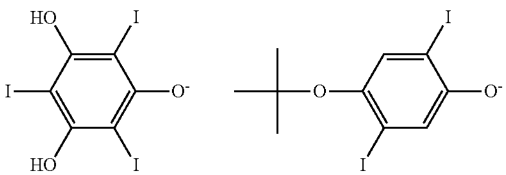
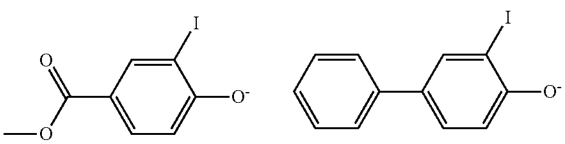
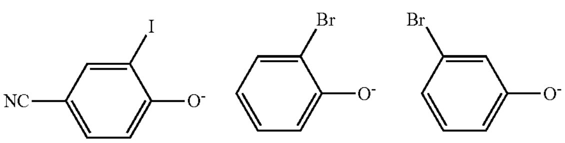
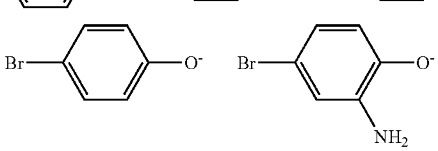
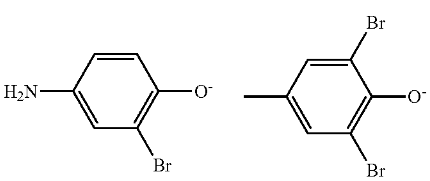
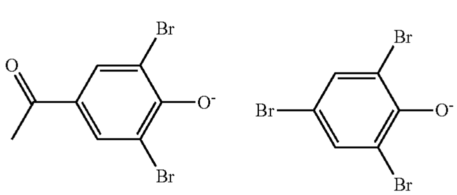
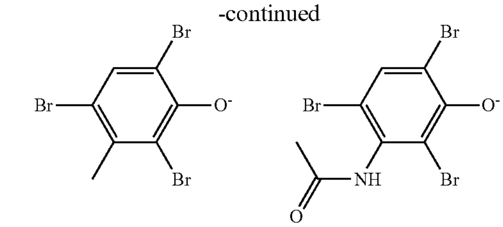
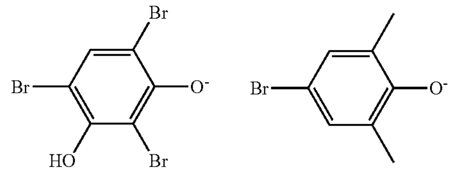
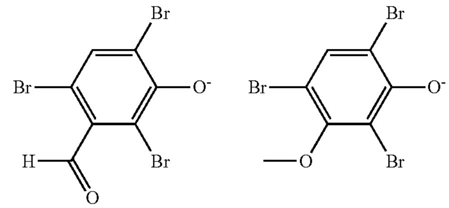
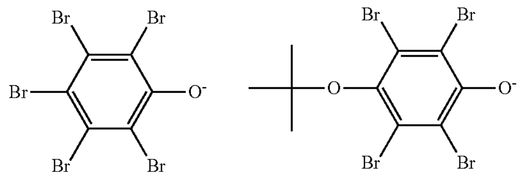
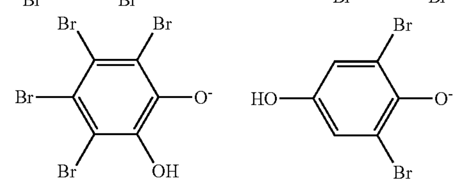
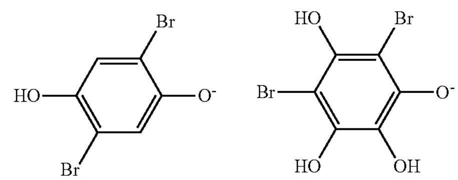
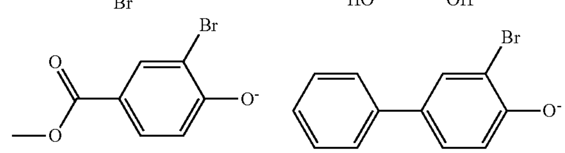
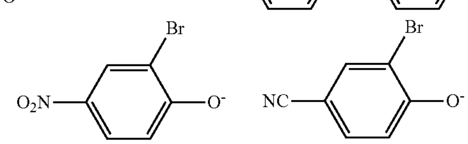
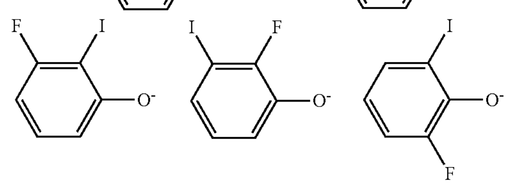
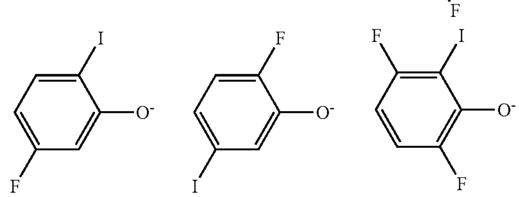

-continued

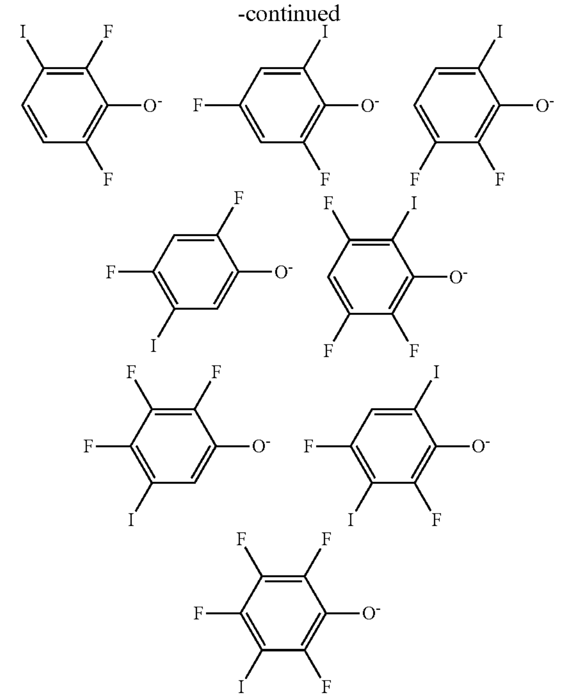

In formula (A), $A^+$ is a cation having the formula (A)-1, (A)-2 or (A)-3.

(A)-1

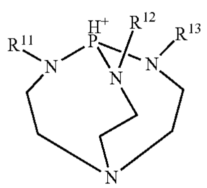

(A)-2

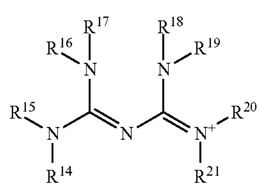

(A)-3

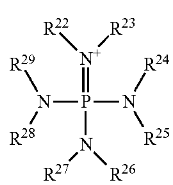

In formula (A)-1, $R^{11}$ to $R^{13}$ are each independently a $C_1$-$C_{24}$ hydrocarbyl group which may contain a heteroatom.

In formula (A)-2, $R^{14}$ to $R^{21}$ are each independently hydrogen or a $C_1$-$C_{24}$ hydrocarbyl group which may contain a heteroatom. A pair of $R^{14}$ and $R^{15}$, $R^{15}$ and $R^{16}$, $R^{16}$ and $R^{17}$, $R^{17}$ and $R^{18}$, $R^{18}$ and $R^{19}$, $R^{19}$ and $R^{20}$, or $R^{20}$ and $R^{21}$ may bond together to form a ring with the nitrogen atom to which they are attached or the nitrogen atoms to which they are attached and the intervening carbon atom(s). The ring may contain an ether bond.

In formula (A)-3, $R^{22}$ to $R^{29}$ are each independently hydrogen or a $C_1$-$C_{24}$ hydrocarbyl group which may contain a heteroatom. A pair of $R^{22}$ and $R^{23}$, $R^{23}$ and $R^{24}$, $R^{24}$ and $R^{25}$, $R^{25}$ and $R^{26}$, $R^{26}$ and $R^{27}$, or $R^{27}$ and $R^{28}$ may bond together to form a ring with the nitrogen atom to which they are attached or the nitrogen atoms to which they are attached and the intervening phosphorus atom. $R^{22}$ and $R^{23}$, $R^{24}$ and $R^{25}$, $R^{26}$ and $R^{27}$, or $R^{28}$ and $R^{29}$, taken together, may form a group having the formula (A)-3-1. $R^{23}$ may be a group having the formula (A)-3-2 when $R^{22}$ is hydrogen.

(A)-3-1

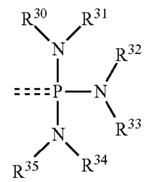

(A)-3-2

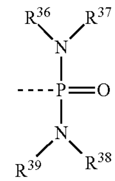

In formulae (A)-3-1 and (A)-3-2, $R^{30}$ to $R^{39}$ are each independently hydrogen or a $C_1$-$C_{24}$ hydrocarbyl group which may contain a heteroatom. A pair of $R^{30}$ and $R^{31}$, $R^{31}$ and $R^{32}$, $R^{32}$ and $R^{33}$, $R^{33}$ and $R^{34}$, $R^{34}$ and $R^{35}$, $R^{36}$ and $R^{37}$, or $R^{38}$ and $R^{39}$ may bond together to form a ring with the nitrogen atom to which they are attached or the nitrogen atoms to which they are attached and the intervening phosphorus atom. $R^{30}$ and $R^{31}$, $R^{32}$ and $R^{33}$, or $R^{34}$ and $R^{35}$, taken together, may form a group having the formula (A)-3-1.

The $C_1$-$C_{24}$ hydrocarbyl group may be saturated or unsaturated and straight, branched or cyclic. Examples thereof include alkyl groups such as methyl, ethyl, n-propyl, isopropyl, n-butyl, isobutyl, sec-butyl, tert-butyl, n-pentyl, n-hexyl, n-heptyl, n-octyl, n-nonyl, n-decyl, n-undecyl and n-dodecyl; cyclic saturated hydrocarbyl groups such as cyclopropyl, cyclobutyl, cyclopentyl, cyclohexyl, cyclopentylmethyl, cyclopentylethyl, cyclohexylmethyl, cyclohexylethyl, norbornyl, and adamantyl; alkenyl groups such as vinyl, 1-propenyl, 2-propenyl, 1-butenyl, 2-butenyl, 3-butenyl, pentenyl and hexenyl; alkynyl groups such as ethynyl, 1-propynyl, 2-propynyl, butynyl, pentynyl, and hexynyl; cyclic unsaturated aliphatic hydrocarbyl groups such as cyclopentenyl and cyclohexenyl; aryl groups such as phenyl, methylphenyl, ethylphenyl, n-propylphenyl, isopropylphenyl, n-butylphenyl, isobutylphenyl, sec-butylphenyl, tert-butylphenyl, naphthyl, methylnaphthyl, ethylnaphthyl, n-propylnaphthyl, isopropylnaphthyl, n-butylnaphthyl, isobutylnaphthyl, sec-butylnaphthyl, tert-butylnaphthyl, and fluorenyl; and aralkyl groups such as benzyl, phenethyl, naphthylmethyl, and fluorenylmethyl. In the foregoing groups, some or all hydrogen atoms may be substituted by a moiety containing a heteroatom such as oxygen, sulfur, nitrogen or halogen, and some carbon may be replaced by a moiety containing a heteroatom such as oxygen, sulfur or nitrogen, so that the group may contain a halogen, sulfone, amino, hydroxyl, thiol, nitro, ester bond, ether bond, sulfide bond, sulfoxide, carbonate, carbamate or amide bond.

Examples of the 2,5,8,9-tetraaza-1-phosphabicyclo[3.3.3]undecane cation having formula (A)-1 are shown below, but not limited thereto.

-continued
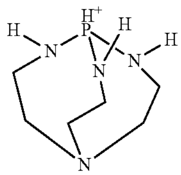
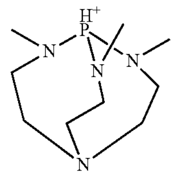
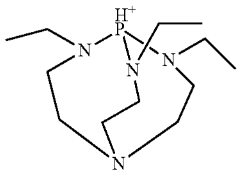
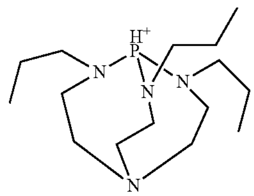
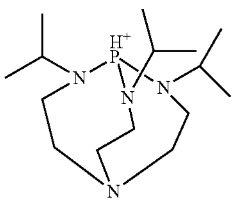
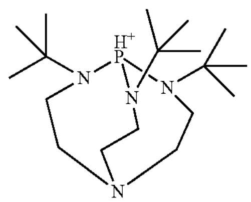
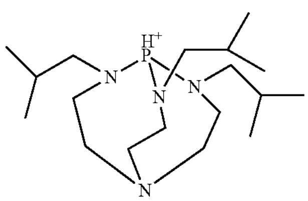
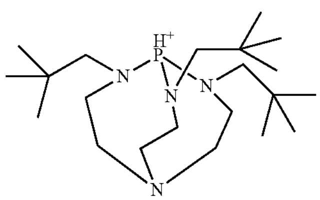
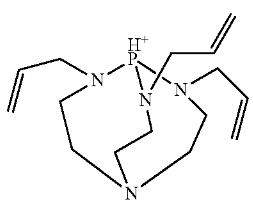
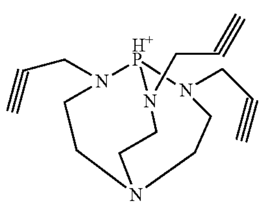
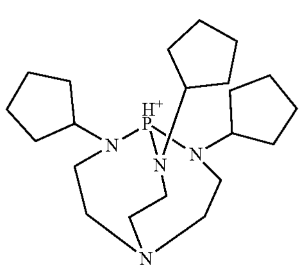
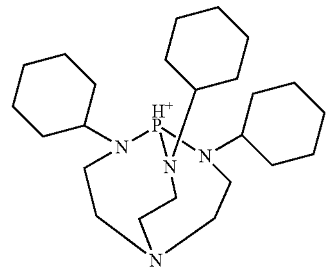
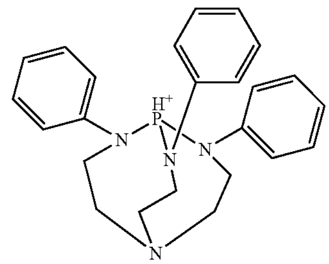
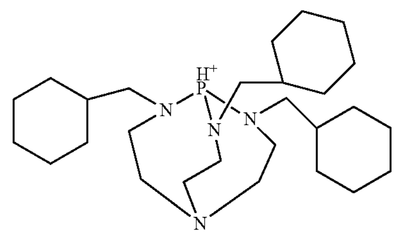
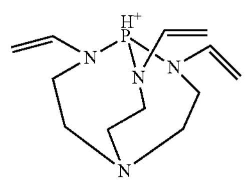
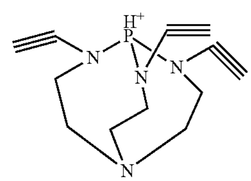
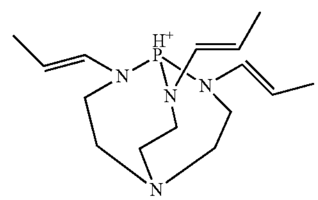
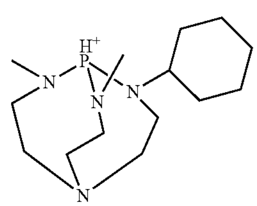
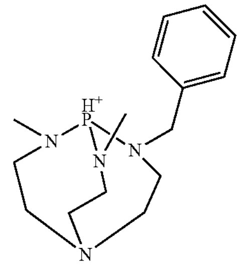
Examples of the biguanide cation having formula (A)-2 are shown below, but not limited thereto.

-continued
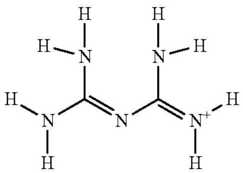
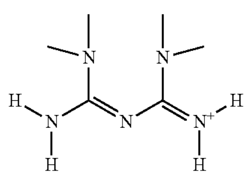
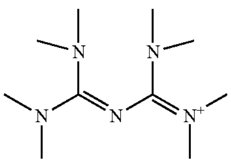
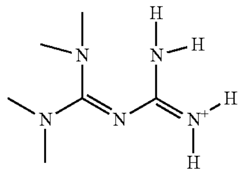
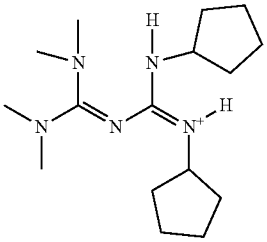
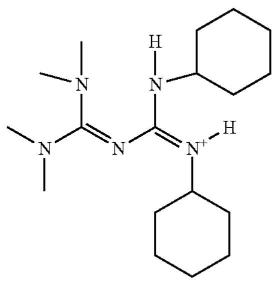
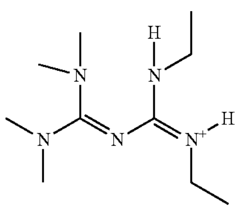
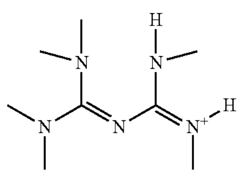
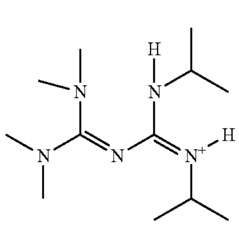
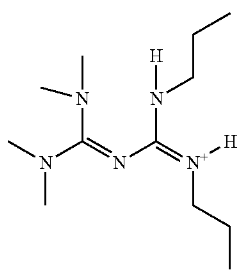
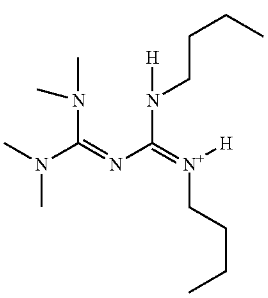
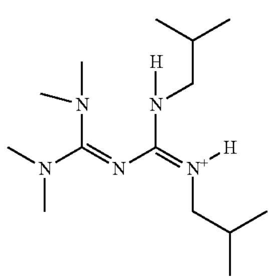
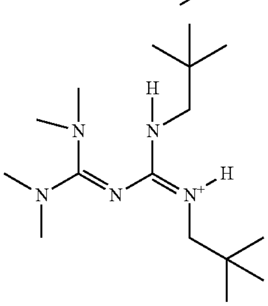
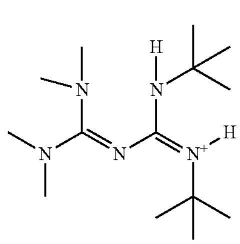
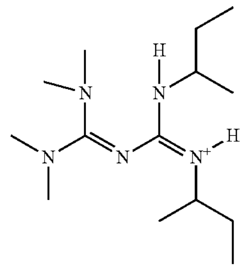
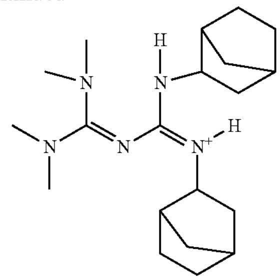
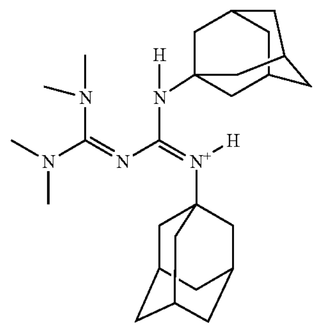
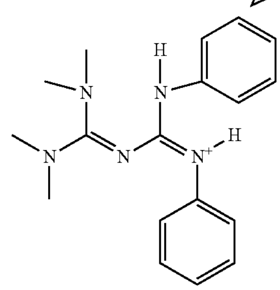
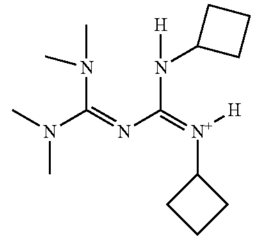
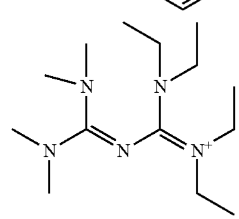
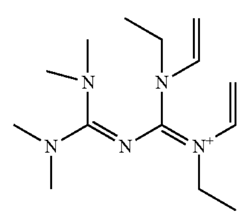
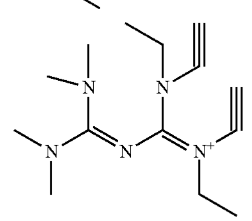
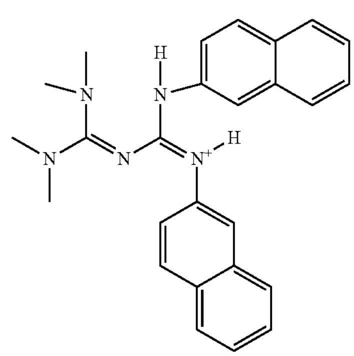

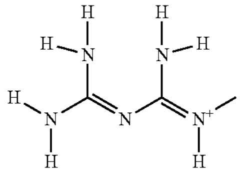
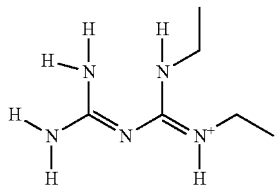
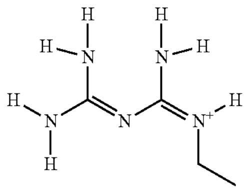
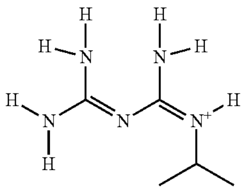
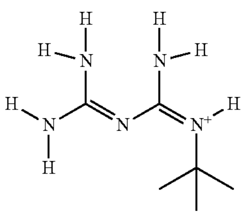
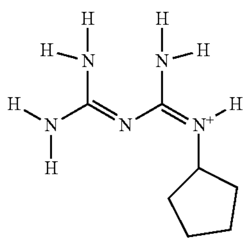
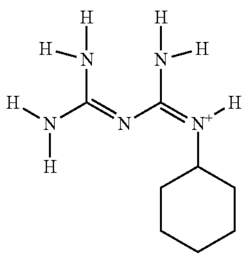
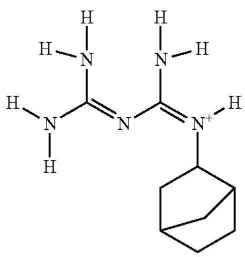
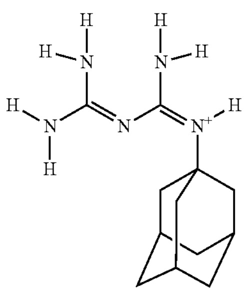
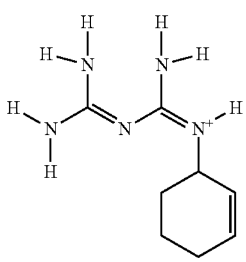
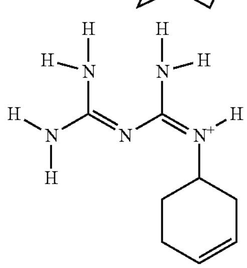
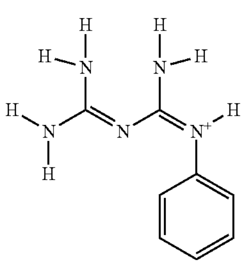
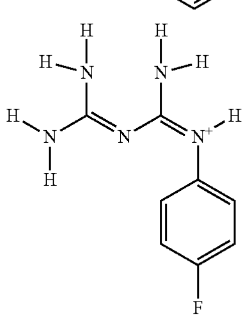
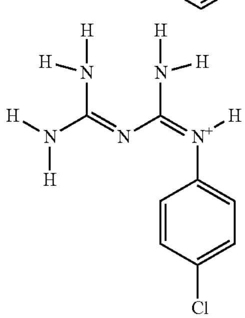
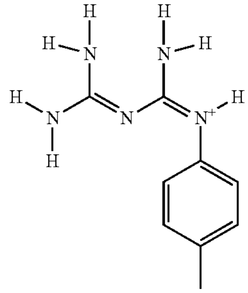
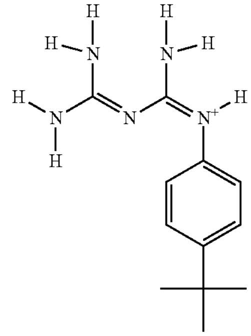
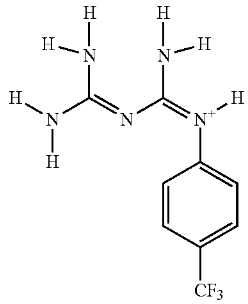
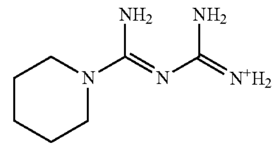
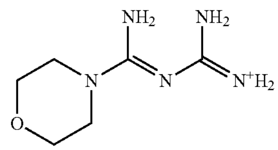
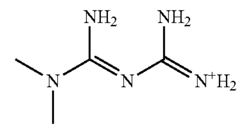
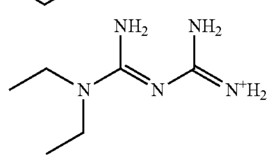
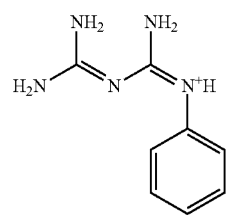
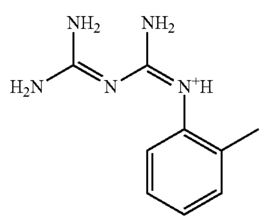
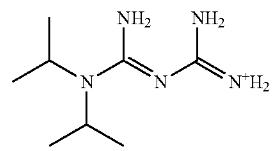
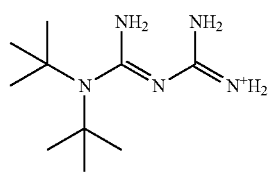
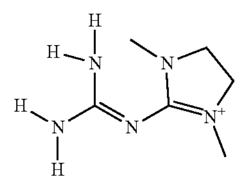
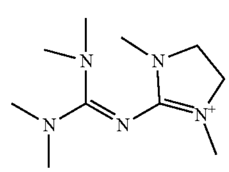
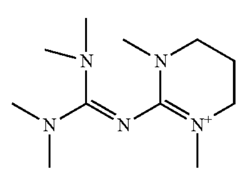
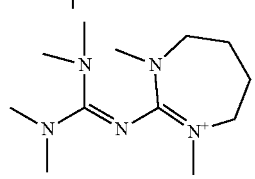
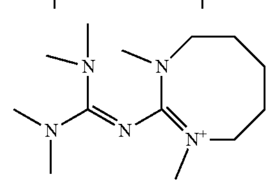

-continued
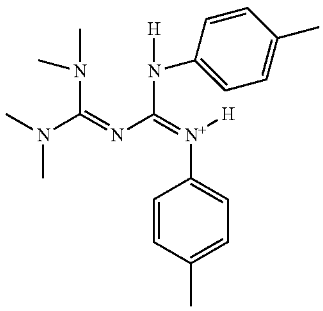
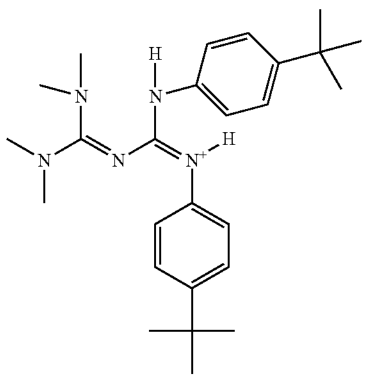
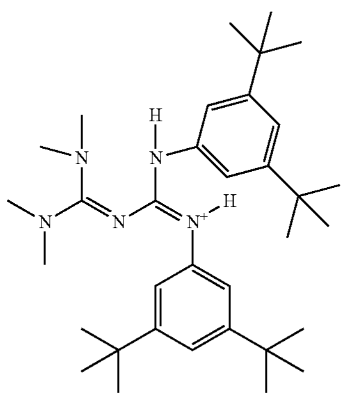
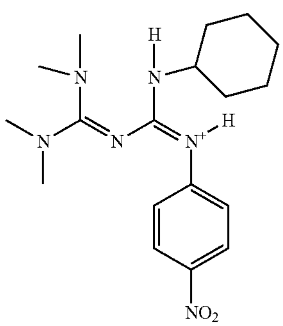
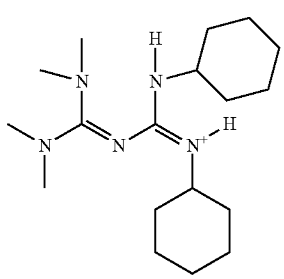
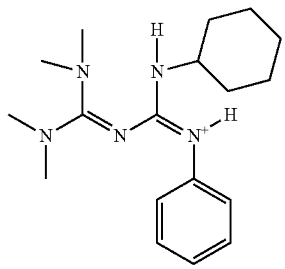
-continued
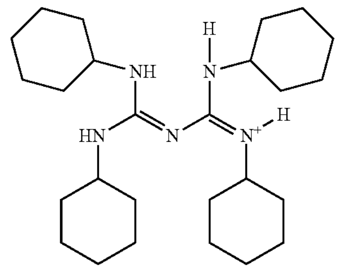
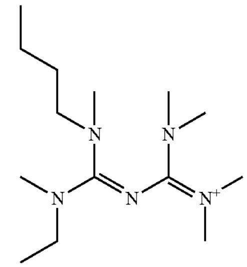
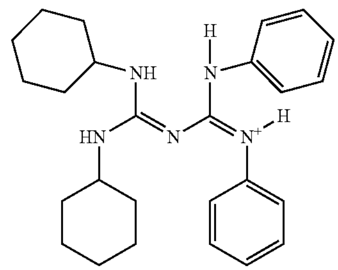
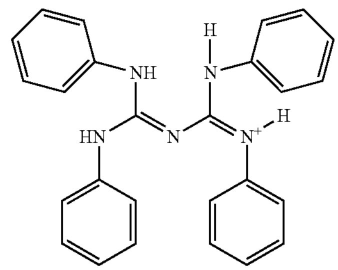
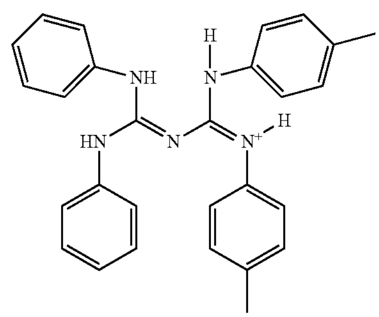
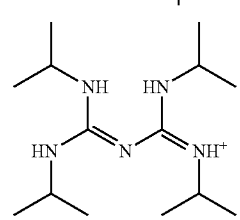
Examples of the phosphazene cation having formula (A)-3 are shown below, but not limited thereto.
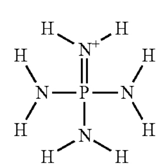
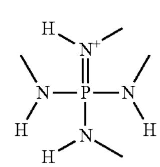
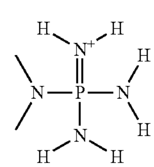

-continued
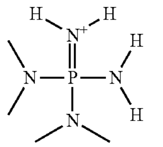
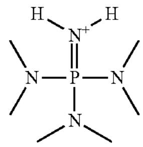
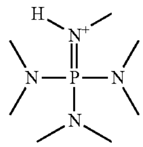
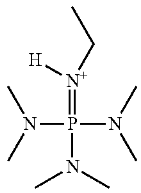
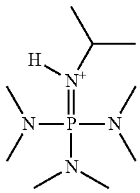
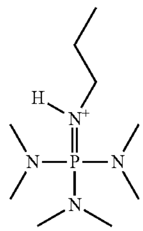
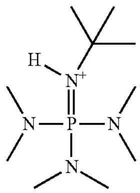
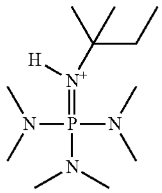
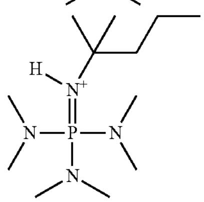
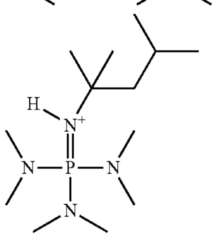
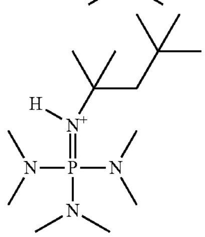
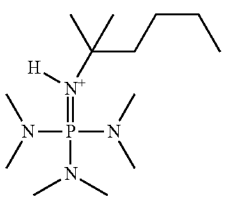
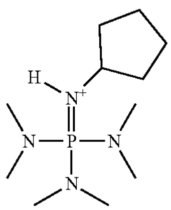
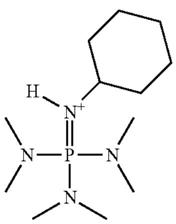
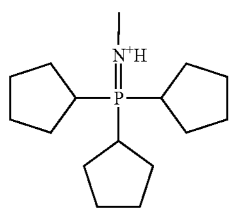
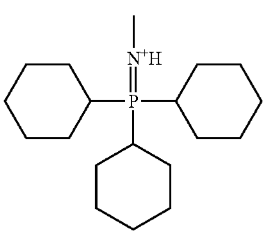
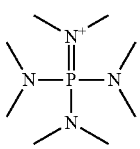
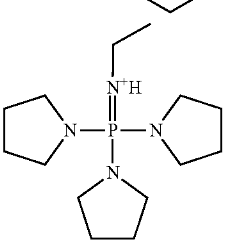
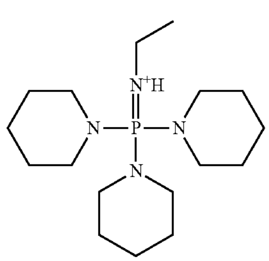
-continued
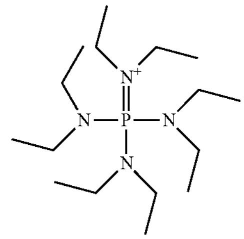
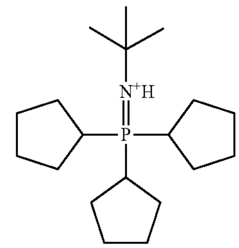
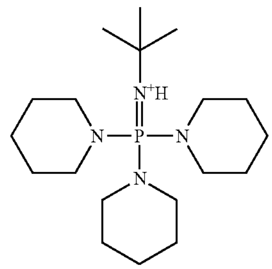
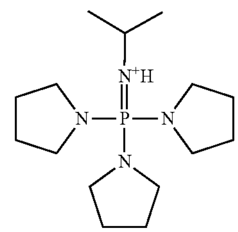
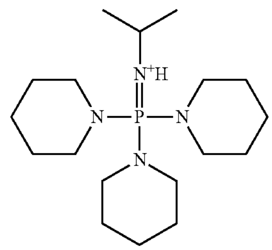
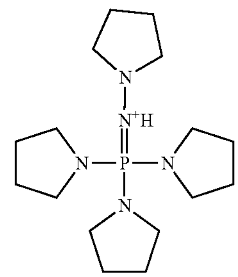
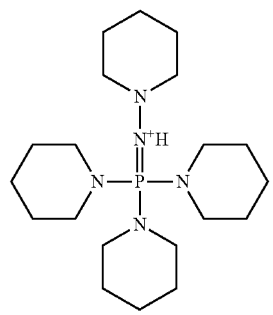
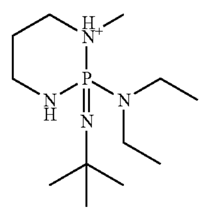
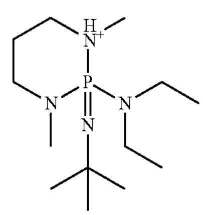
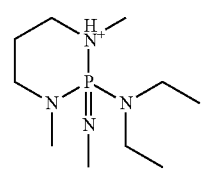
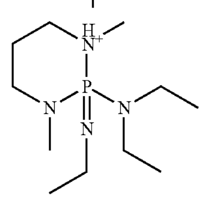
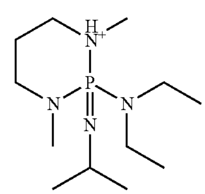
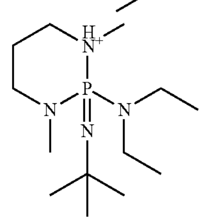
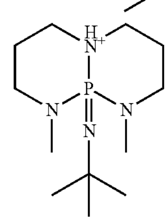
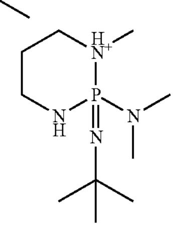

-continued

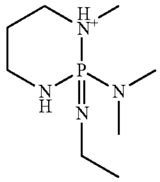
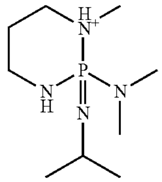
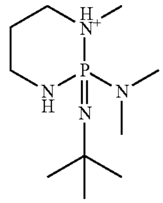
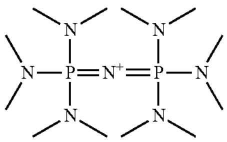
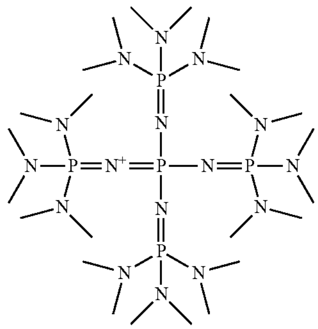
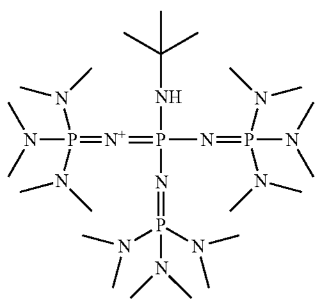
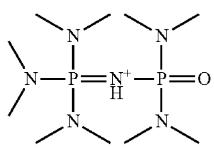
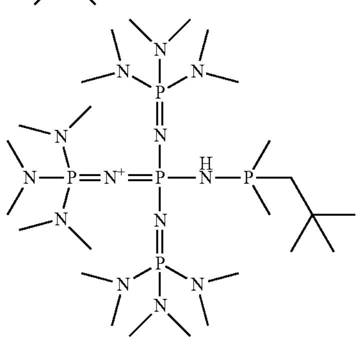
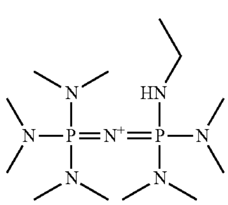
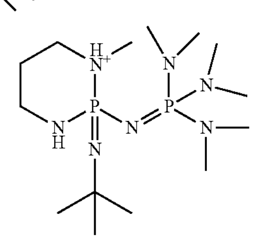
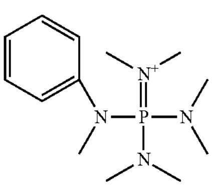
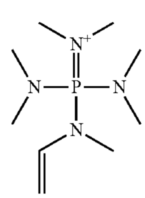
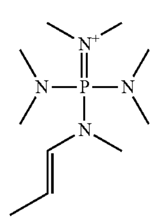

-continued

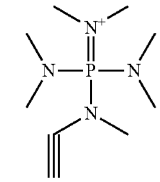
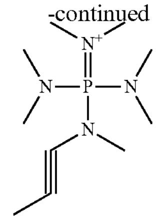
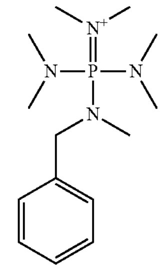
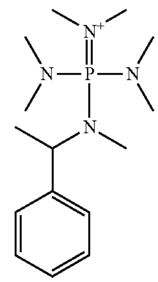
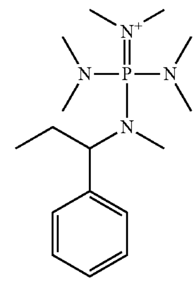
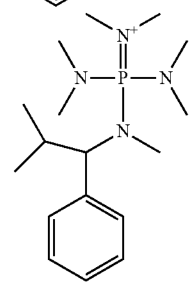
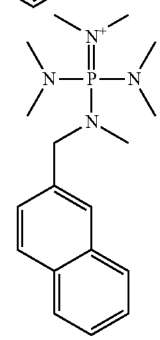
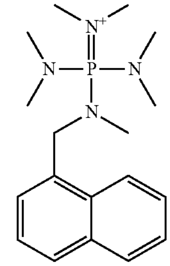
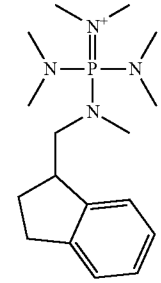
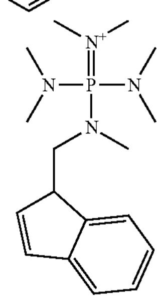
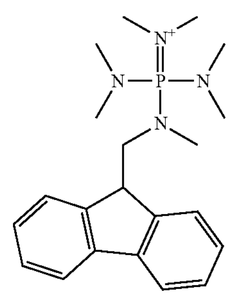

In the cationic 2,5,8,9-tetraaza-1-phosphabicyclo[3.3.3]undecane, biguanide or phosphazene compound, positive charges are delocalized among plural nitrogen atoms. Therefore, points of trapping the anion of sulfonic acid, sulfonimide or sulfonmethide for neutralization are distributed everywhere. Thus the anion is quickly trapped. The cationic 2,5,8,9-tetraaza-1-phosphabicyclo[3.3.3]undecane, biguanide or phosphazene compound is an effective quencher having a high basicity and a high trapping ability.

With respect to the synthesis method, the iodized or brominated phenol salt may be synthesized, for example, by mixing a 2,5,8,9-tetraaza-1-phosphabicyclo[3.3.3]undecane, biguanide or phosphazene compound with an iodized or brominated phenol compound.

Since the iodized or brominated phenol salt contains iodine or bromine of relatively large atomic weight in the molecule, it is substantially absorptive to EUV or EB. Iodine or bromine has many electron orbits in its molecule and releases many secondary electrons upon EUV exposure. The secondary electrons thus released provide energy transfer to an acid generator, achieving a high sensitizing effect. This leads to a high sensitivity and low acid diffusion, achieving improvements in both factors of LWR or CDU and sensitivity.

In view of sensitivity and acid diffusion suppressing effect, the iodized or brominated phenol salt is preferably present in the resist composition in an amount of 0.001 to 50 parts, more preferably 0.01 to 20 parts by weight per 100 parts by weight of the base polymer to be described below.

Base Polymer

In the case of a positive resist composition, the base polymer in the resist composition is a polymer comprising acid labile group-containing recurring units. The acid labile group-containing recurring units are preferably recurring units having the formula (a1) or recurring units having the formula (a2). Sometimes these recurring units are simply referred to as recurring units (a1) and (a2).

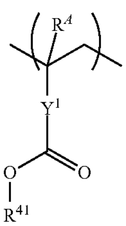
(a1)

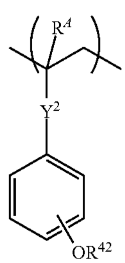
(a2)

Herein $R^A$ is each independently hydrogen or methyl. $R^{41}$ and $R^{42}$ are each independently an acid labile group. $Y^1$ is a single bond, phenylene, naphthylene, or a $C_1$-$C_{12}$ linking group containing at least one of ester bond and lactone ring. $Y^2$ is a single bond or ester bond. $R^{41}$ and $R^{42}$ may be the same or different when the base polymer contains both recurring units (a1) and (a2).

Examples of the monomer from which recurring units (a1) are derived are shown below, but not limited thereto. Herein $R^A$ and $R^{41}$ are as defined above.

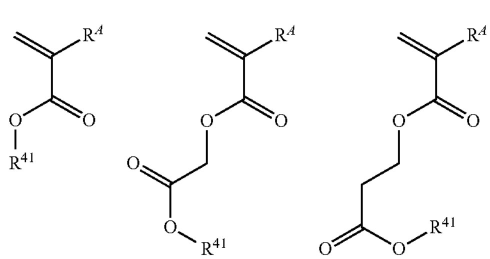

-continued

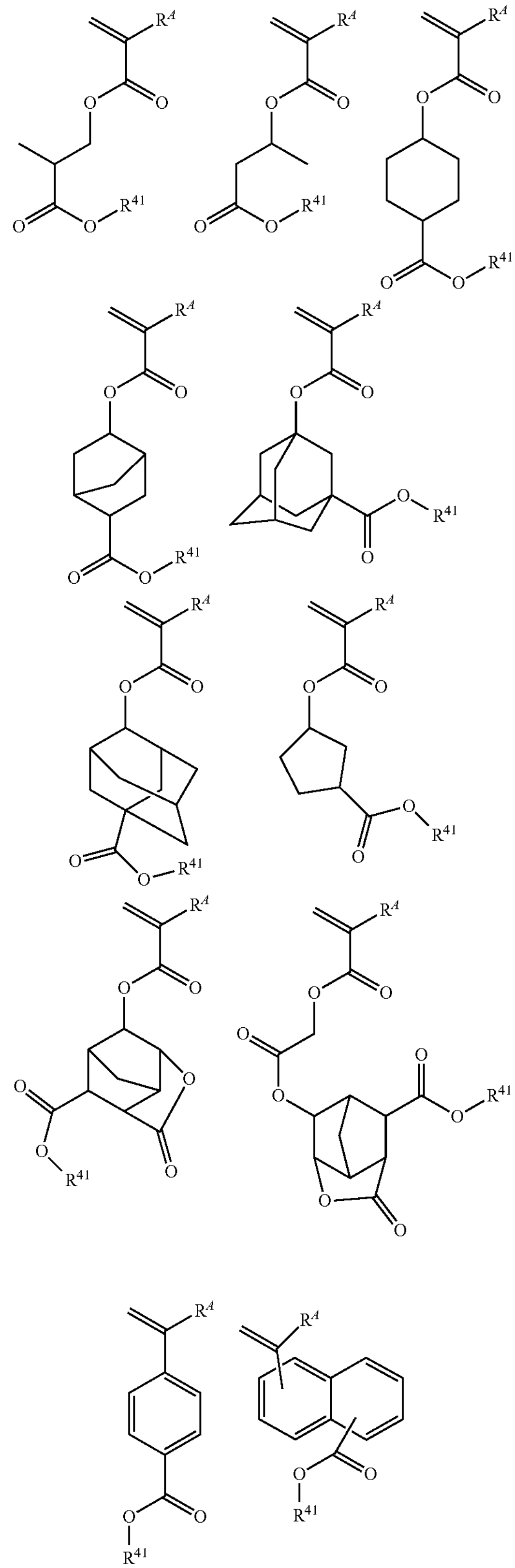

Examples of the monomer from which recurring units (a2) are derived are shown below, but not limited thereto. Herein $R^A$ and $R^{42}$ are as defined above.

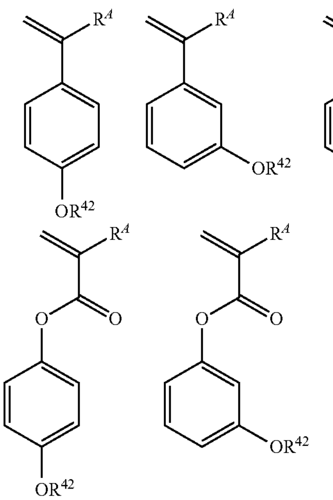

The acid labile groups represented by $R^{41}$ and $R^{42}$ in formulae (a1) and (a2) may be selected from a variety of such groups, for example, those groups described in JP-A 2013-080033 (U.S. Pat. No. 8,574,817) and JP-A 2013-083821 (U.S. Pat. No. 8,846,303).

Typical of the acid labile group are groups of the following formulae (AL-1) to (AL-3).

(AL-1)

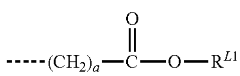

(AL-2)

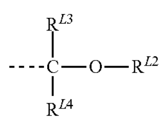

(AL-3)

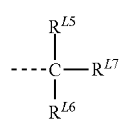

In formulae (AL-1) and (AL-2), $R^{L1}$ and $R^{L2}$ are each independently a $C_1$-$C_{40}$ hydrocarbyl group which may contain a heteroatom such as oxygen, sulfur, nitrogen or fluorine. The hydrocarbyl group may be saturated or unsaturated and straight, branched or cyclic. Preferred are $C_1$-$C_{40}$, especially $C_1$-$C_{20}$ saturated hydrocarbyl groups.

In formula (AL-1), "a" is an integer of 0 to 10, preferably 1 to 5.

In formula (AL-2), $R^{L3}$ and IVA are each independently hydrogen or a $C_1$-$C_{20}$ hydrocarbyl group which may contain a heteroatom such as oxygen, sulfur, nitrogen or fluorine. The hydrocarbyl group may be saturated or unsaturated and straight, branched or cyclic. Preferred are $C_1$-$C_{20}$ saturated hydrocarbyl groups. Any two of $R^{L2}$, $R^{L3}$ and $R^{L4}$ may bond together to form a ring, typically alicyclic, with the carbon atom or carbon and oxygen atoms to which they are attached, the ring containing 3 to 20 carbon atoms, preferably 4 to 16 carbon atoms.

In formula (AL-3), $R^{L5}$, $R^{L6}$ and $R^{L7}$ are each independently a $C_1$-$C_{20}$ hydrocarbyl group which may contain a heteroatom such as oxygen, sulfur, nitrogen or fluorine. The hydrocarbyl group may be saturated or unsaturated and straight, branched or cyclic. Preferred are $C_1$-$C_{20}$ saturated hydrocarbyl groups. Any two of $R^{L5}$, $R^{L6}$ and $R^{L7}$ may bond together to form a ring, typically alicyclic, with the carbon atom to which they are attached, the ring containing 3 to 20 carbon atoms, preferably 4 to 16 carbon atoms.

The base polymer may further comprise recurring units (b) having a phenolic hydroxyl group as an adhesive group. Examples of suitable monomers from which recurring units (b) are derived are given below, but not limited thereto. Herein $R^A$ is as defined above.

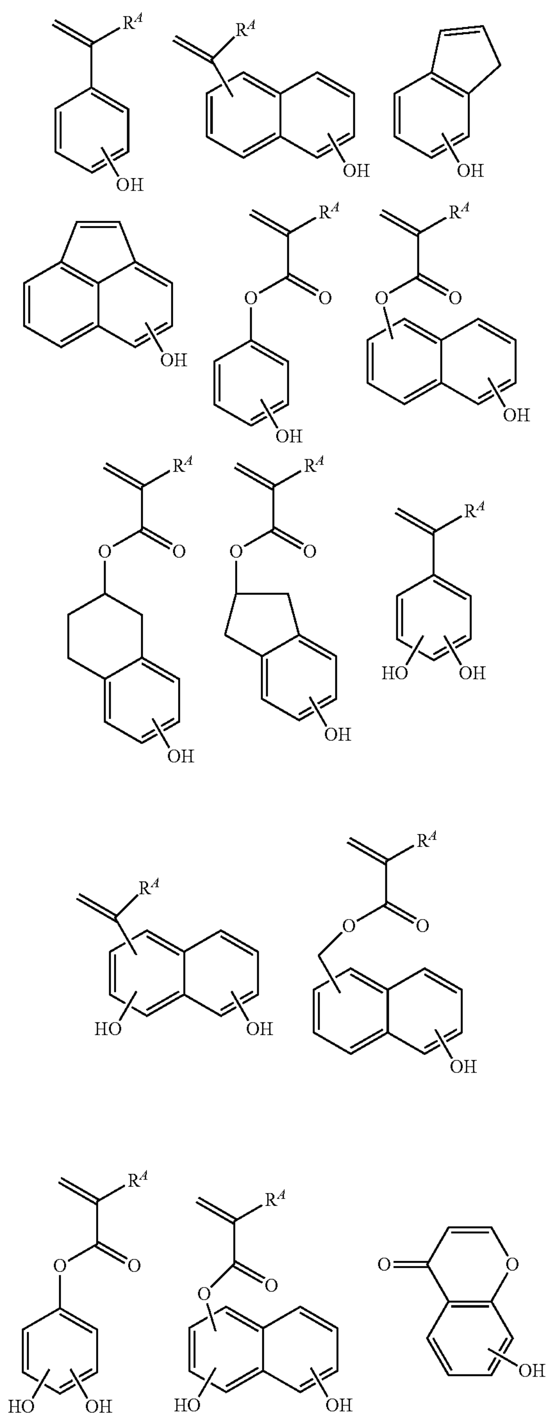

-continued

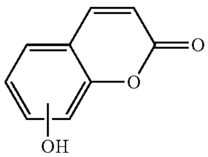
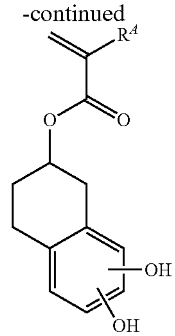
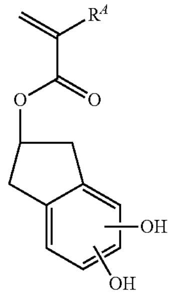

Further, recurring units (c) having another adhesive group selected from hydroxyl (other than the foregoing phenolic hydroxyl), lactone ring, sultone ring, ether bond, ester bond, sulfonate bond, carbonyl, sulfonyl, cyano and carboxyl groups may also be incorporated in the base polymer. Examples of suitable monomers from which recurring to units (c) are derived are given below, but not limited thereto. Herein $R^A$ is as defined above.

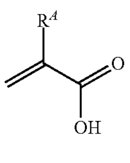
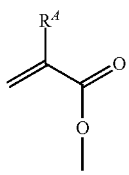
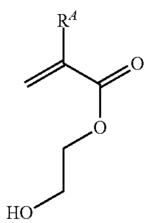
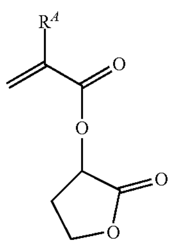
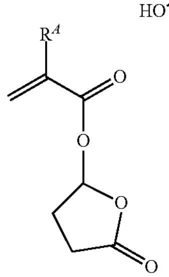
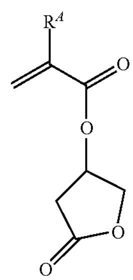
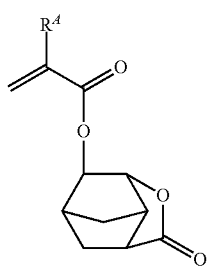
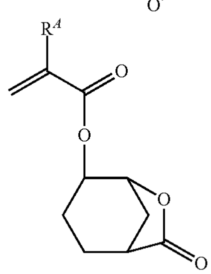
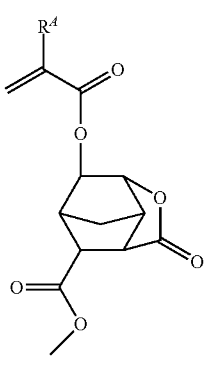
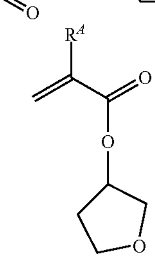
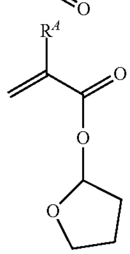

-continued

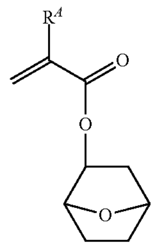
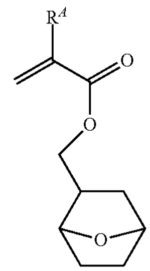
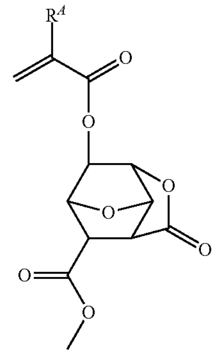
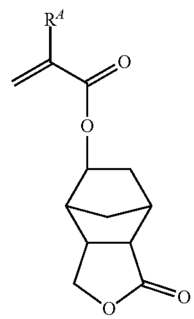
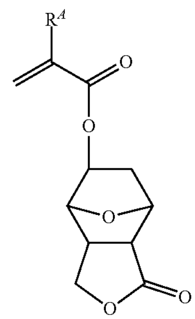
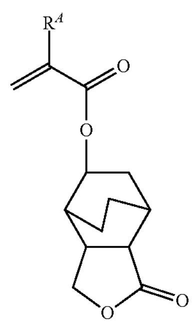
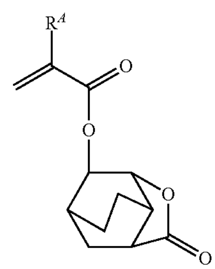
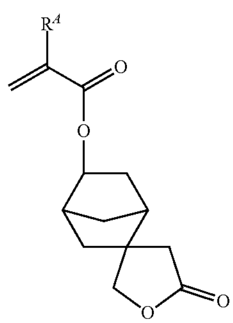
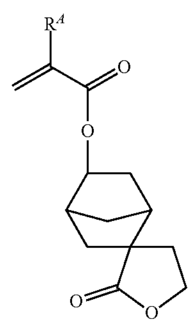
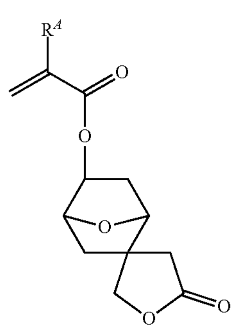
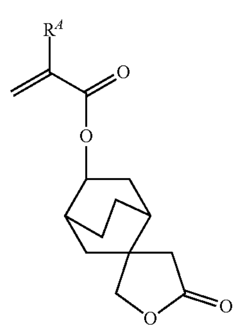

-continued
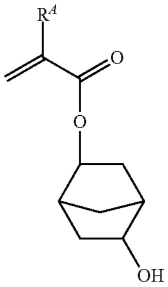
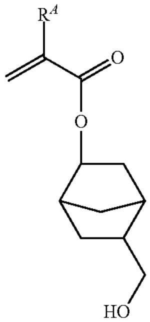
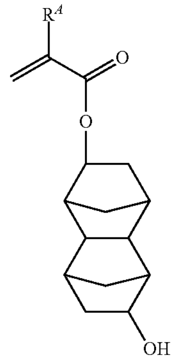
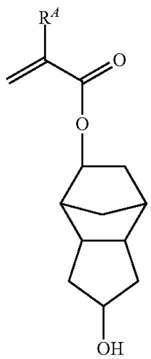
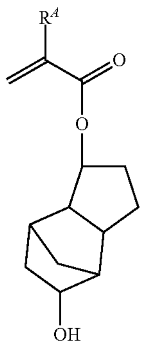
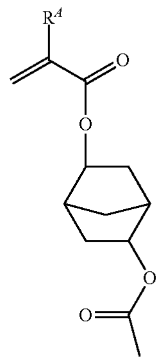
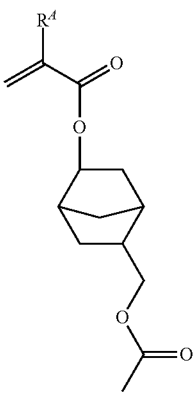
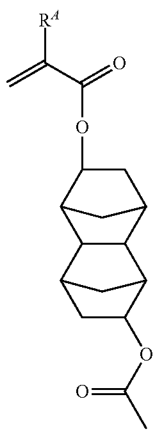
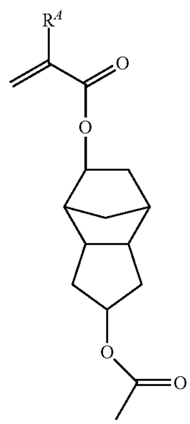
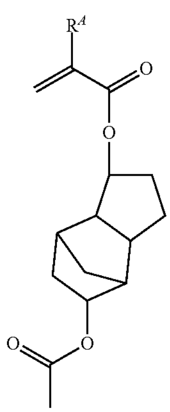
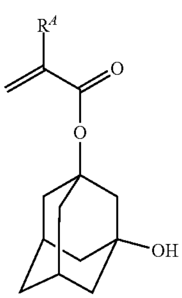
-continued
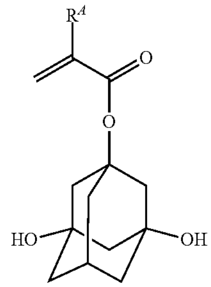
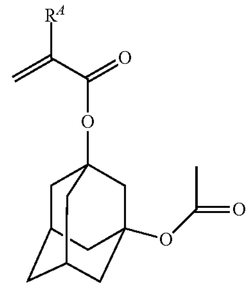
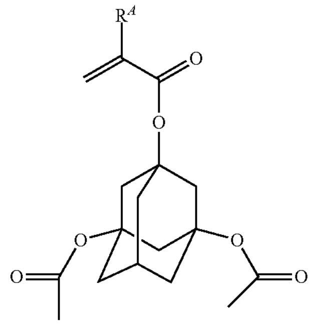
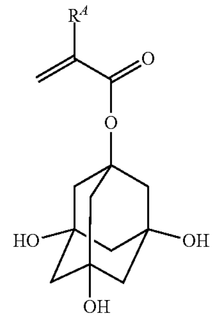
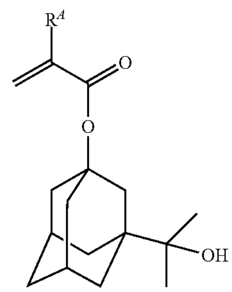
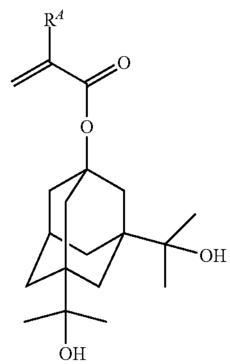
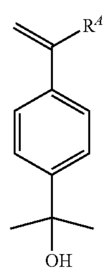
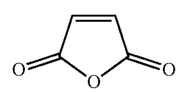
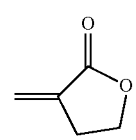
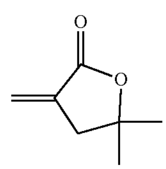
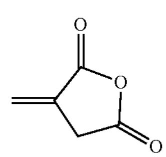
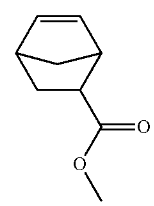
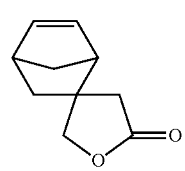
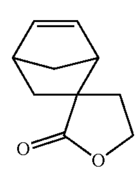
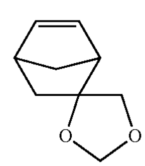

-continued
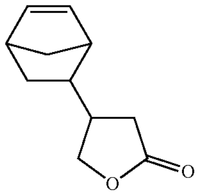
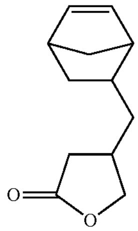
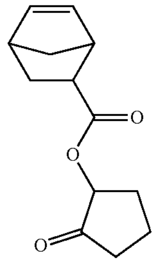
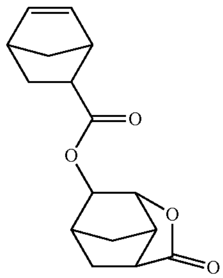
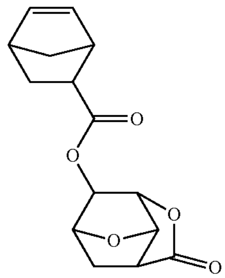
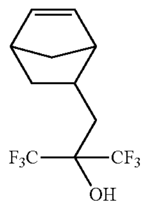
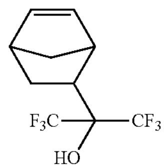
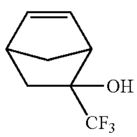
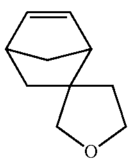
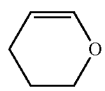
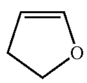
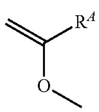
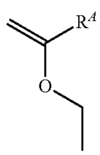
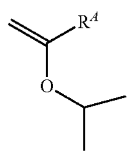
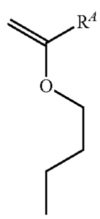
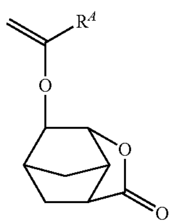
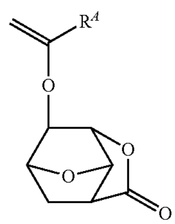
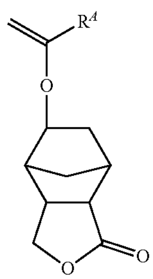
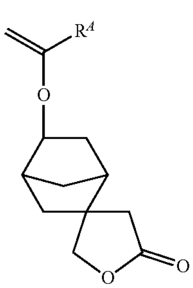
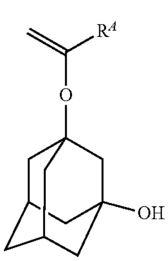
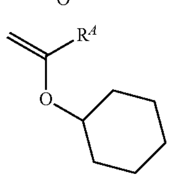
-continued
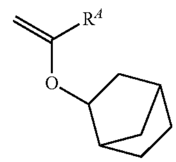
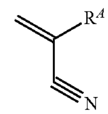
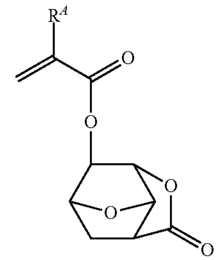
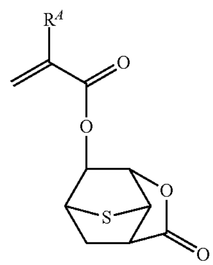
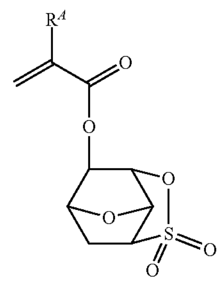
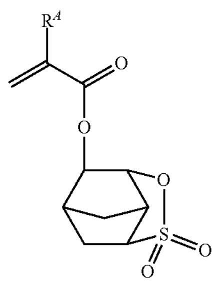
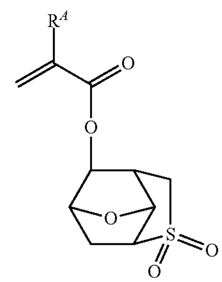
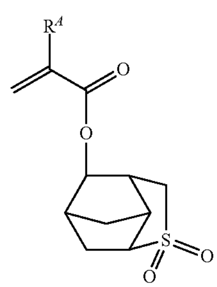
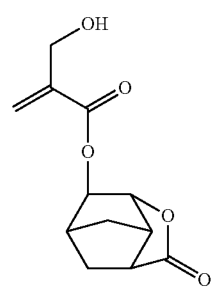
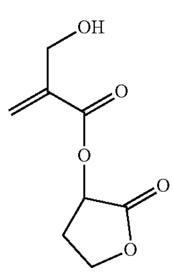
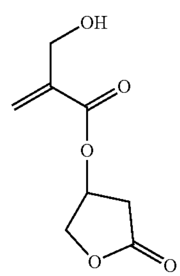
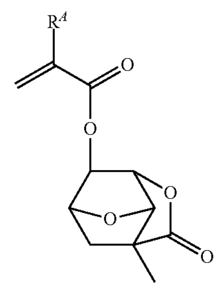
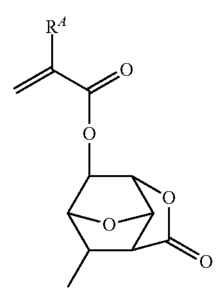
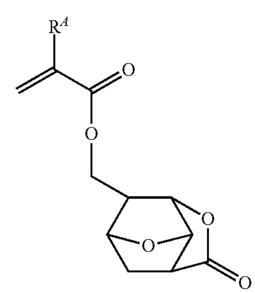

-continued
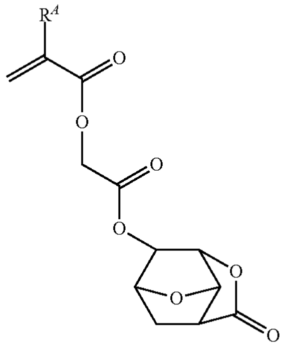
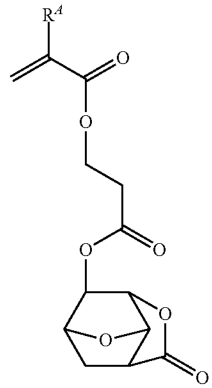
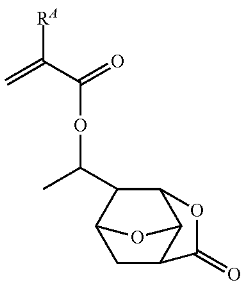
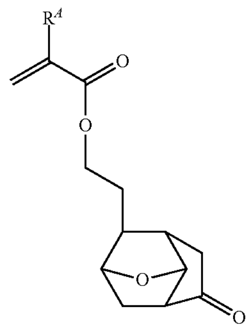
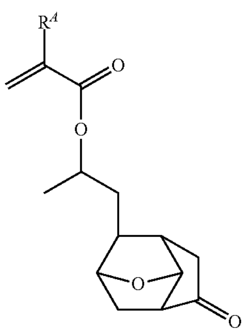
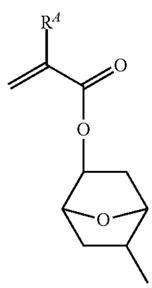
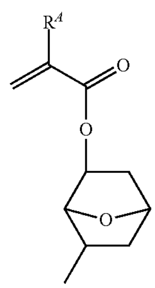
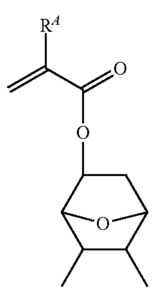
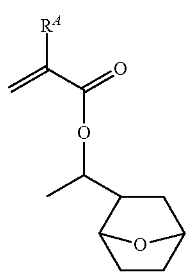
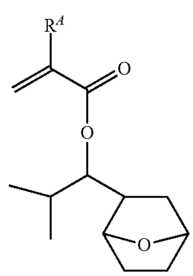
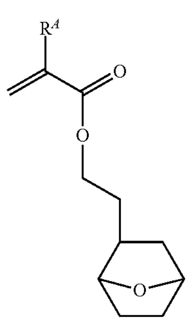
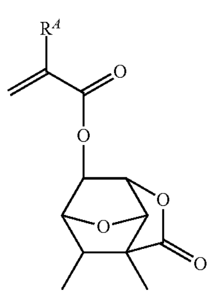
-continued
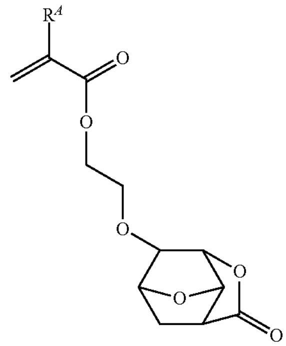
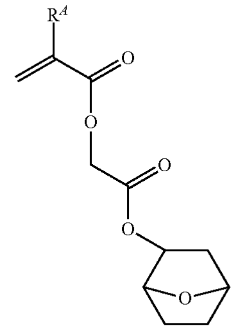
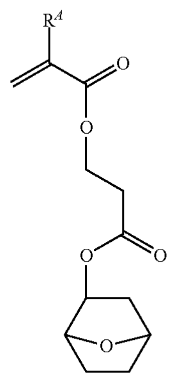
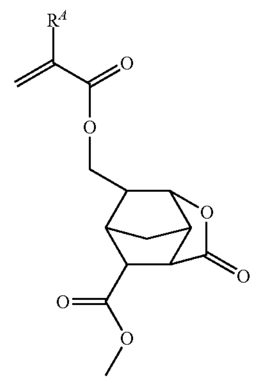
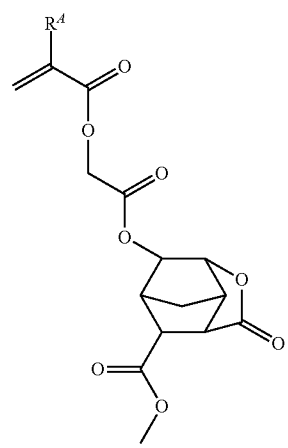
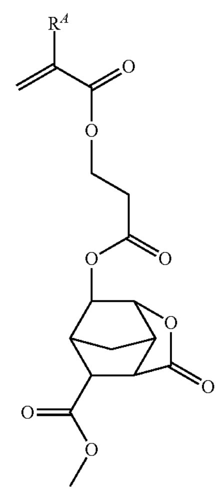
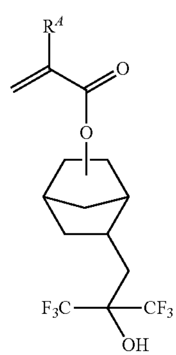
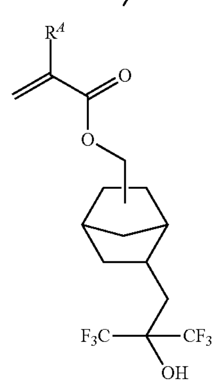

-continued
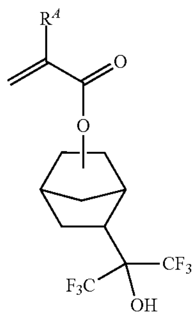
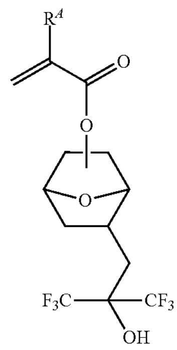
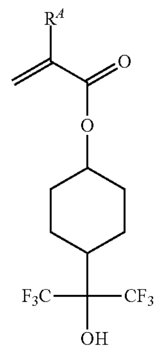
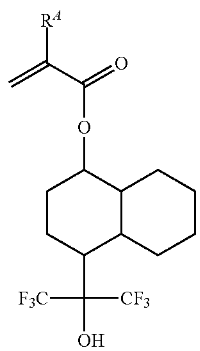
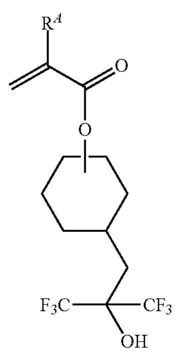
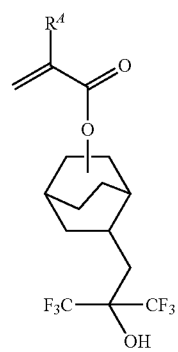
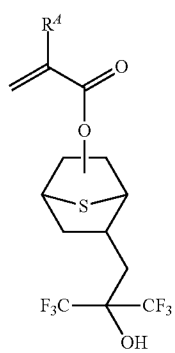
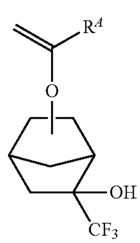
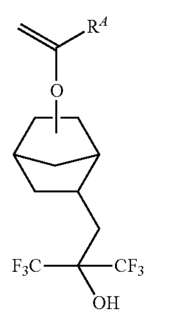
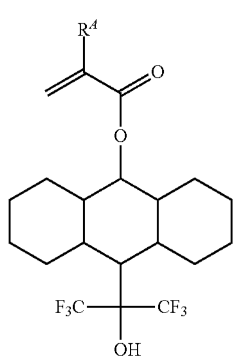
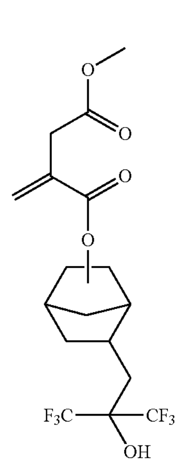
-continued
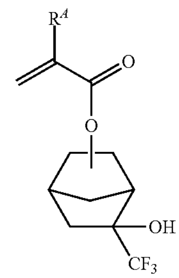
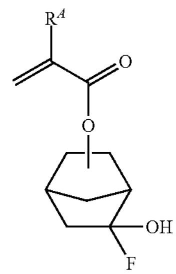
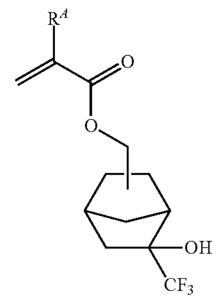
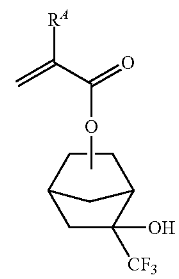
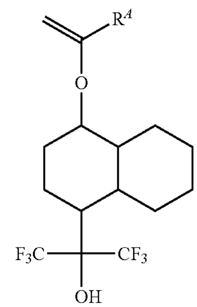
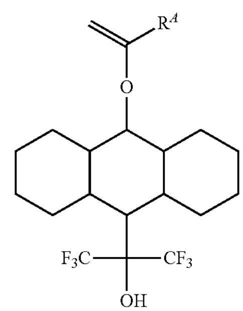
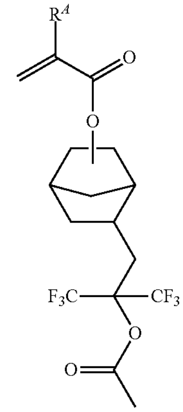
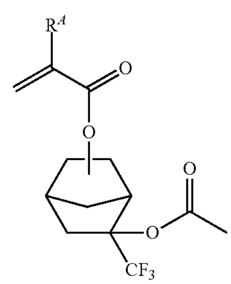
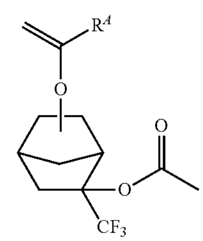
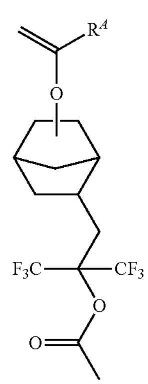
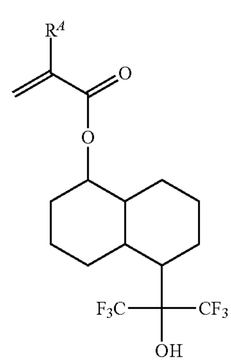
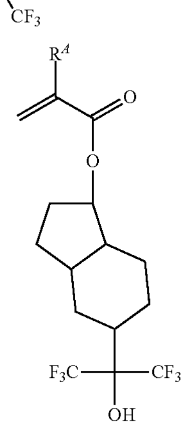

-continued
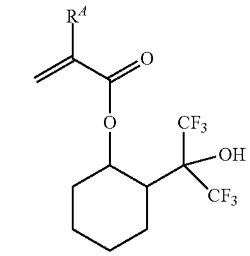
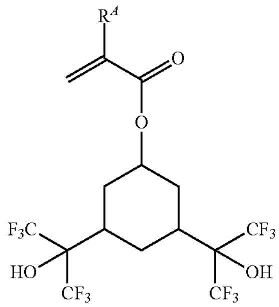
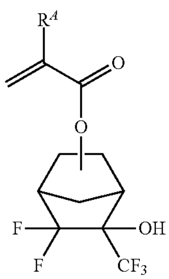
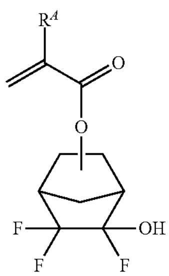
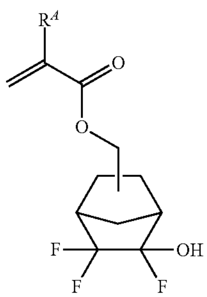
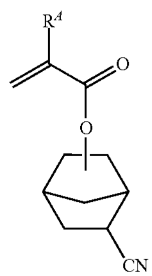
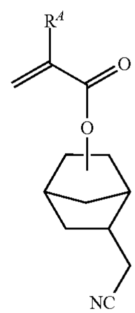
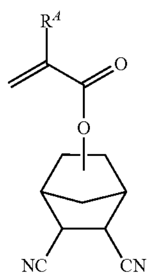
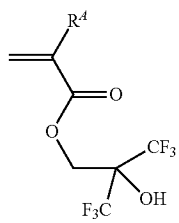
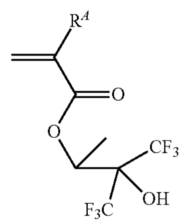
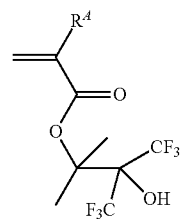
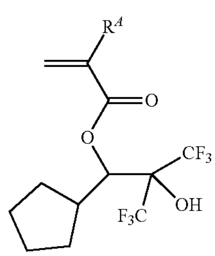
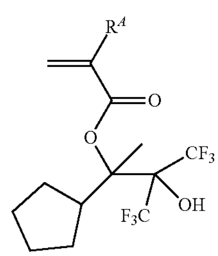
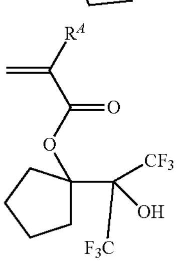
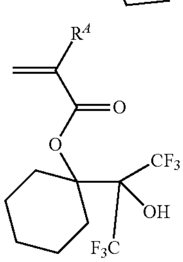
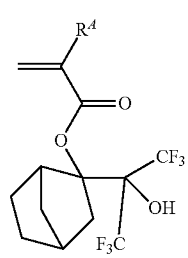
-continued
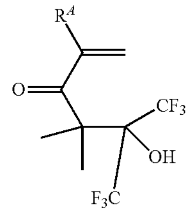
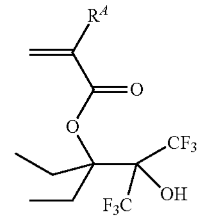
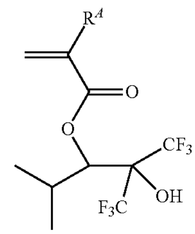
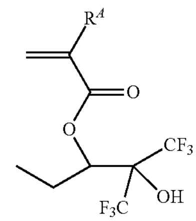
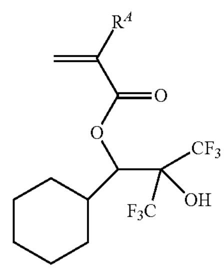
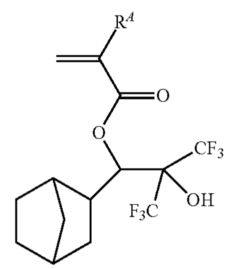
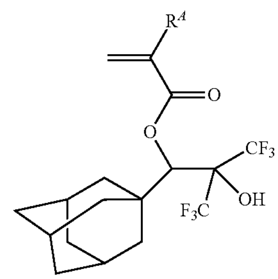
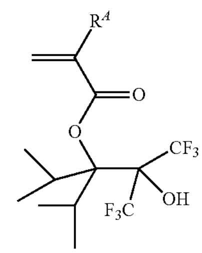
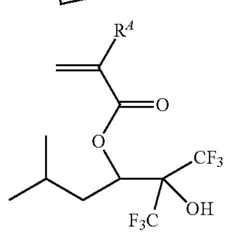
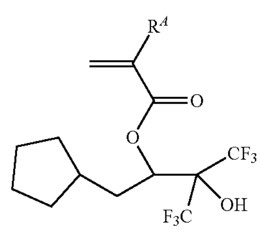
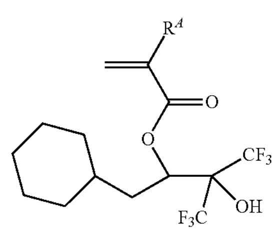
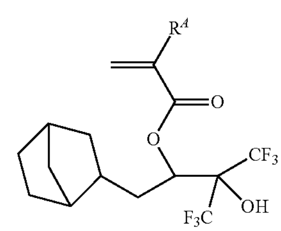
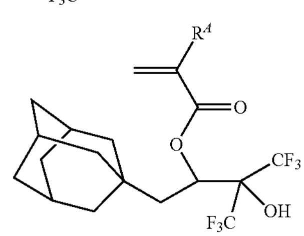

-continued
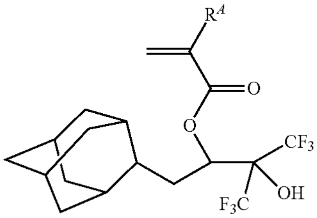
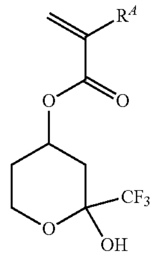
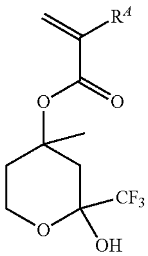
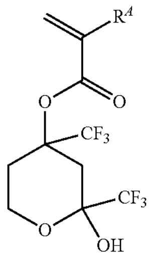
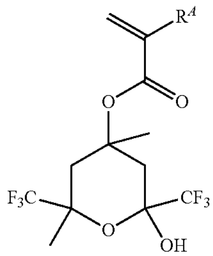
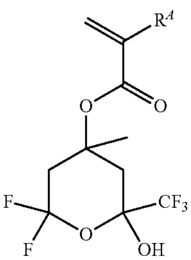
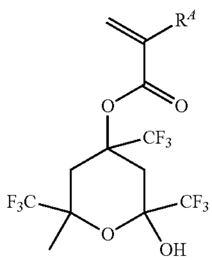
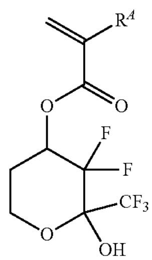
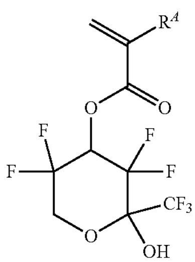
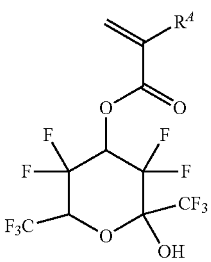
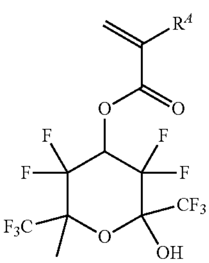
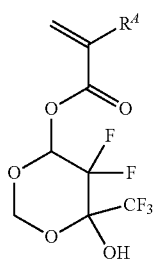
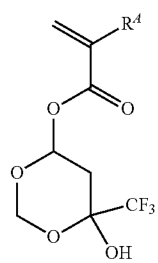
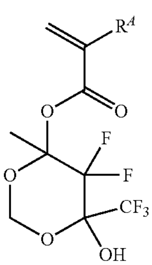
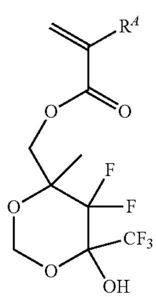
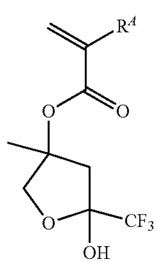
-continued
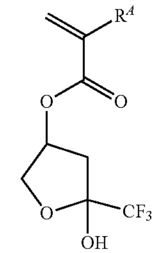
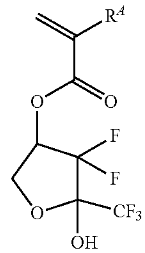
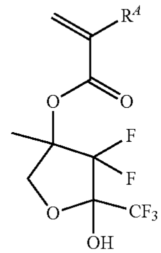
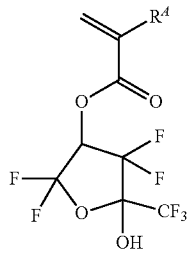
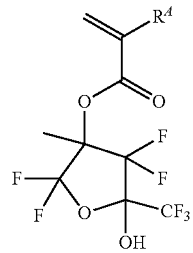
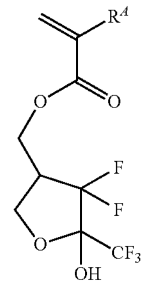
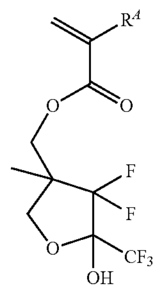
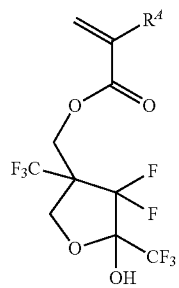
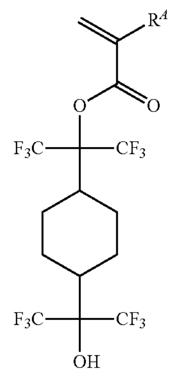
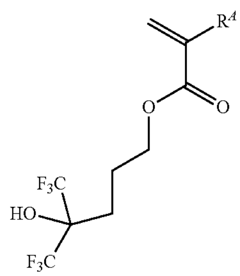
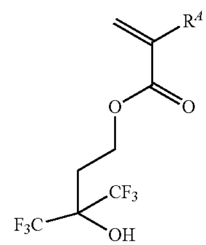
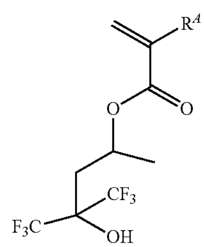
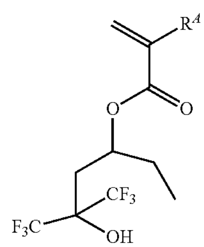

-continued
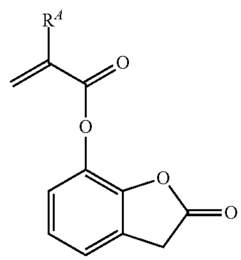
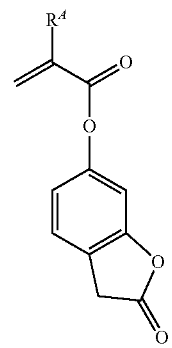
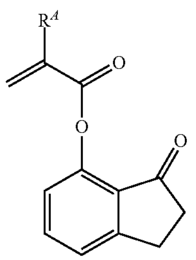
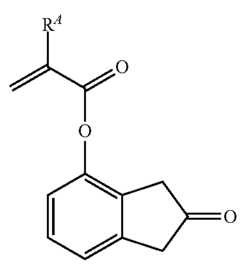
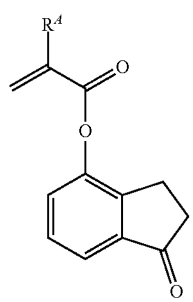
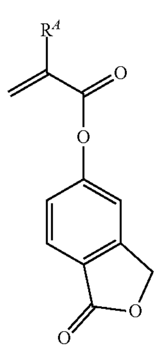
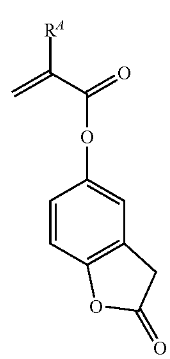
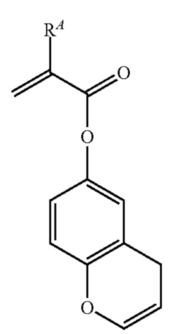
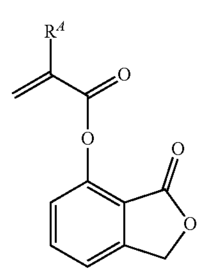
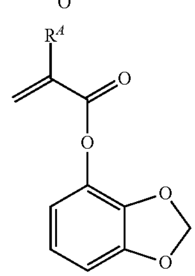
-continued
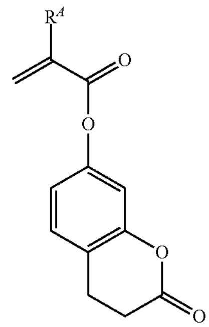
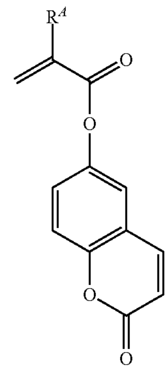
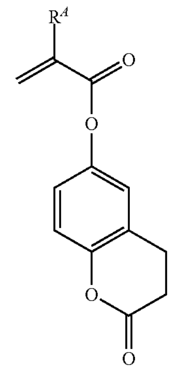
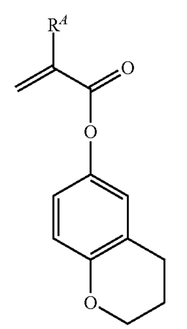
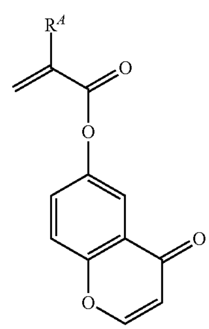
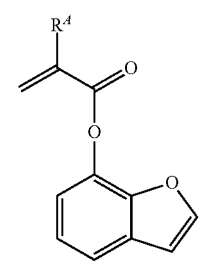
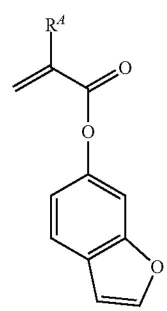
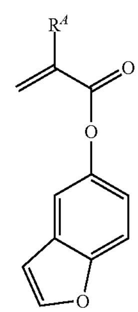
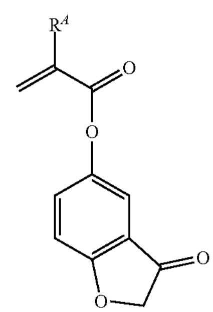
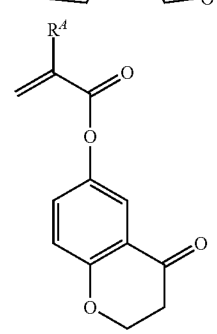
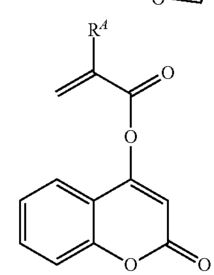
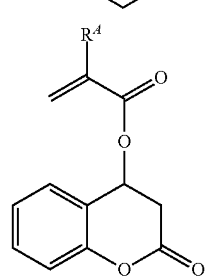
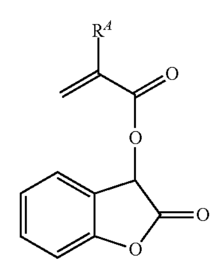

-continued
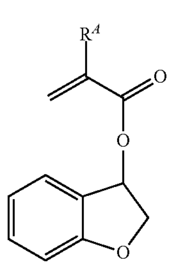
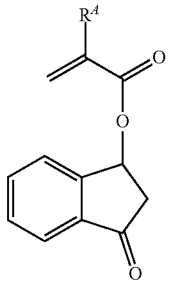
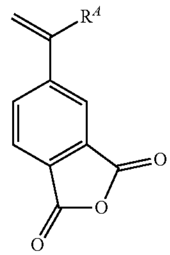
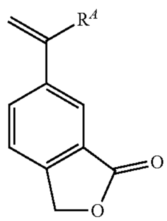
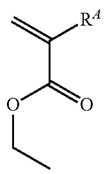
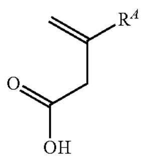
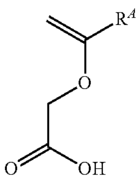
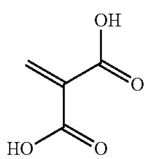
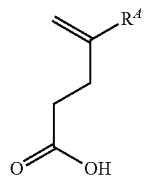
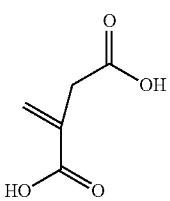
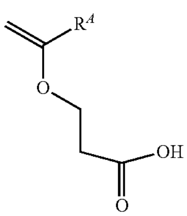
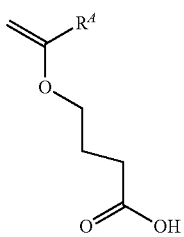
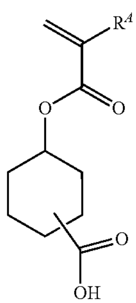
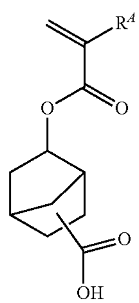
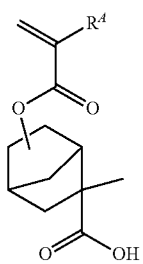
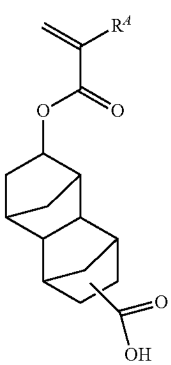
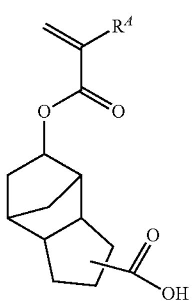
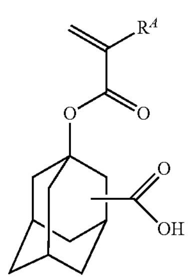
-continued
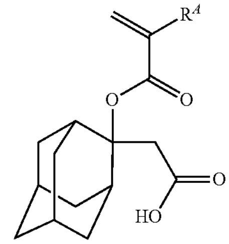
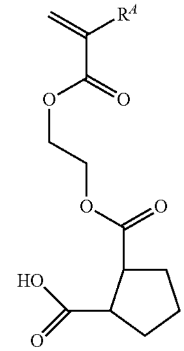
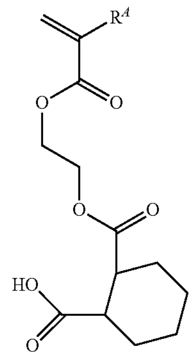
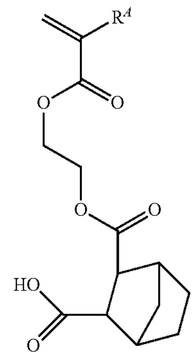
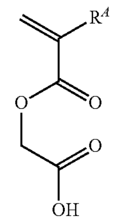
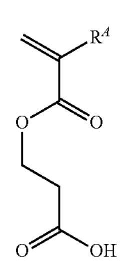
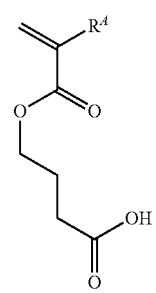
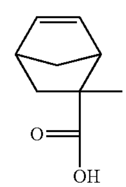
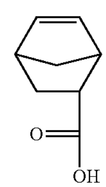
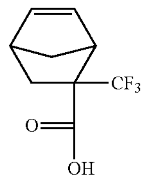
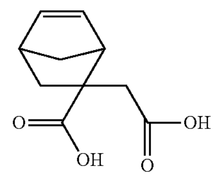
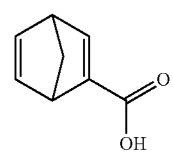
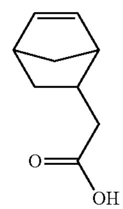
In another preferred embodiment, the base polymer may further comprise recurring units (d) derived from indene, benzofuran, benzothiophene, acenaphthylene, chromone, coumarin, and norbornadiene, or derivatives thereof. Examples of suitable monomers from which recurring units (d) are derived are given below, but not limited thereto.

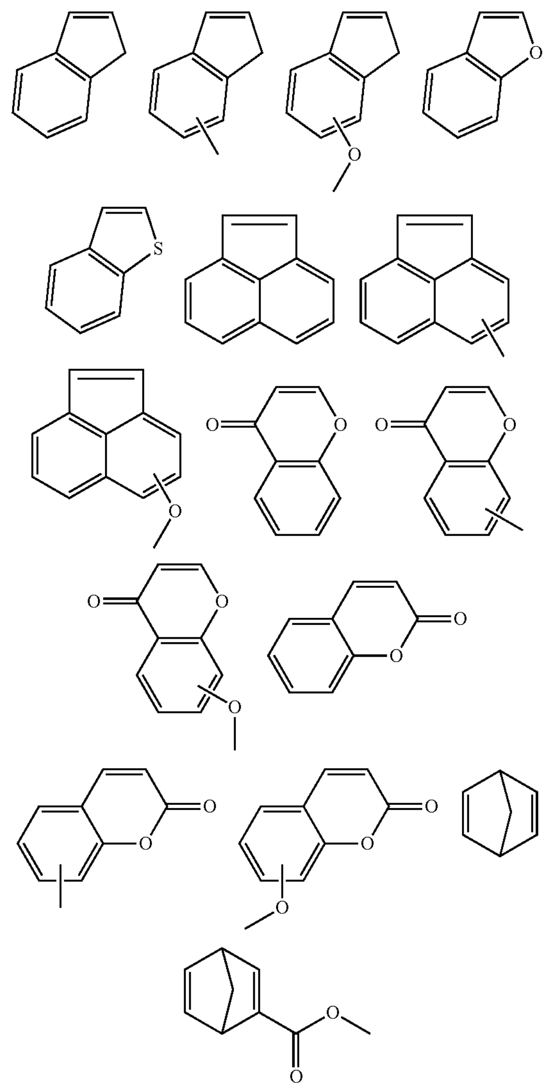

The base polymer may further include recurring units (e) which are derived from styrene, vinylnaphthalene, vinylanthracene, vinylpyrene, methyleneindene, vinylpyridine, or vinylcarbazole.

In a further embodiment, recurring units (0 derived from an onium salt having a polymerizable unsaturated bond may be incorporated in the base polymer. The preferred recurring units (f) include recurring units having formula (f1), recurring units having formula (f2), and recurring units having formula (f3). These units are simply referred to as recurring units (f1), (f2) and (f3), which may be used alone or in combination of two or more types.

(f1)

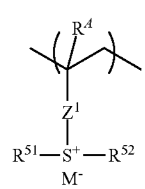

-continued (f2)

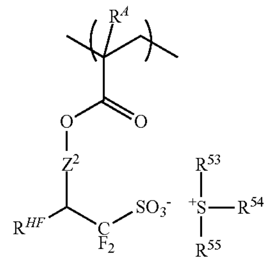

(f3)

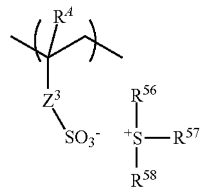

In formulae (f1) to (f3), $R^A$ is each independently hydrogen or methyl. $Z^1$ is a single bond, phenylene, —O—Z"—, —C(═O)—O—Z"—, or —C(═O)—NH—Z"—, wherein $Z^{11}$ is a $C_1$-$C_6$ aliphatic hydrocarbylene group or phenylene group, which may contain a carbonyl moiety, ester bond, ether bond or hydroxyl moiety. $Z^2$ is a single bond, —$Z^{21}$—C(═O)—O—, or —$Z^{21}$—O—C(═O)—, wherein $Z^{21}$ is a $C_1$-$C_{12}$ saturated hydrocarbylene group which may contain a carbonyl moiety, ester bond or ether bond. $Z^3$ is a single bond, methylene, ethylene, phenylene, fluorinated phenylene, —C(═O)—O—$Z^{31}$—, or —C(═O)—NH—$Z^{31}$—, wherein $Z^{31}$ is a $C_1$-$C_6$ aliphatic hydrocarbylene group, phenylene, fluorinated phenylene or trifluoromethyl-substituted phenylene group, which may contain a carbonyl moiety, ester bond, ether bond or hydroxyl moiety. The aliphatic hydrocarbylene groups may be saturated or unsaturated and straight, branched or cyclic. The saturated hydrocarbylene groups may be straight, branched or cyclic.

In formulae (f1) to (f3), $R^{51}$ to $R^{58}$ are each independently a $C_1$-$C_{20}$ hydrocarbyl group which may contain a heteroatom. The hydrocarbyl group may be saturated or unsaturated and straight, branched or cyclic. Examples thereof include $C_1$-$C_{20}$ alkyl groups, $C_6$-$C_{20}$ aryl groups, and $C_7$-$C_{20}$ aralkyl groups. In these groups, some or all hydrogen atoms may be substituted by $C_1$-$C_{10}$ saturated hydrocarbyl, halogen, trifluoromethyl, cyano, nitro, hydroxyl, mercapto, $C_1$-$C_{10}$ saturated hydrocarbyloxy, $C_2$-$C_{10}$ saturated hydrocarbyloxycarbonyl or $C_2$-$C_{10}$ saturated hydrocarbylcarbonyloxy, or some carbon may be replaced by a carbonyl moiety, ether bond or ester bond. Any two of $R^{53}$, $R^{54}$ and $R^{55}$, or any two of $R^{56}$, $R^{57}$ and $R^{58}$ may bond together to form a ring with the sulfur atom to which they are attached. Examples of the ring are as will be exemplified for the ring that $R^{101}$ and $R^{102}$ in formula (1-1), taken together, form with the sulfur atom to which they are attached.

In formula (f2), $R^{HF}$ is hydrogen or trifluoromethyl.

In formula (f1), $M^-$ is a non-nucleophilic counter ion. Examples thereof include halide ions such as chloride and bromide ions; fluoroalkylsulfonate ions such as triflate, 1,1,1-trifluoroethanesulfonate, and nonafluorobutanesulfonate; arylsulfonate ions such as tosylate, benzenesulfonate, 4-fluorobenzenesulfonate, and 1,2,3,4,5-pentafluorobenzenesulfonate; alkylsulfonate ions such as mesylate and butanesulfonate; sulfonimide ions such as bis(trifluoromethylsulfonyl)imide, bis(perfluoroethylsulfonyl)imide and bis(perfluorobutylsulfonyl)imide; and sulfonemethide ions such as tris(trifluoromethylsulfonyl)methide and tris(perfluoroethylsulfonyl)methide.

Also included are sulfonate ions having fluorine substituted at α-position as represented by the formula (f1-1) and sulfonate ions having fluorine substituted at α- and β-positions as represented by the formula (f1-2).

$$R^{61}—CF_2—SO_3^- \quad \text{(f1-1)}$$

(f1-2)

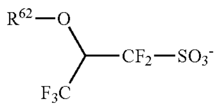

In formula (f1-1), $R^{61}$ is hydrogen or a $C_1$-$C_{20}$ hydrocarbyl group which may contain an ether bond, ester bond, carbonyl moiety, lactone ring, or fluorine atom. The hydrocarbyl group may be saturated or unsaturated and straight, branched or cyclic. Examples thereof are as will be exemplified for the hydrocarbyl group represented by $R^{107}$ in formula (1A').

In formula (f1-2), $R^{62}$ is hydrogen, or a $C_1$-$C_{30}$ hydrocarbyl group, $C_2$-$C_{30}$ hydrocarbylcarbonyl group, or aryloxy group, which may contain an ether bond, ester bond, carbonyl moiety or lactone ring. The hydrocarbyl group and hydrocarbyl moiety of the hydrocarbylcarbonyl group may be saturated or unsaturated and straight, branched or cyclic. Examples thereof are as will be exemplified for the hydrocarbyl group represented by $R^{107}$ in formula (1A').

Examples of the cation in the monomer from which recurring unit (f1) is derived are shown below, but not limited thereto. $R^A$ is as defined above.

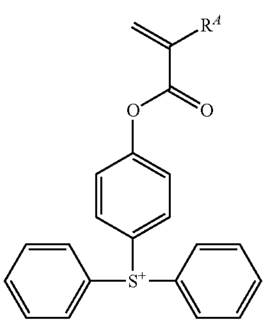

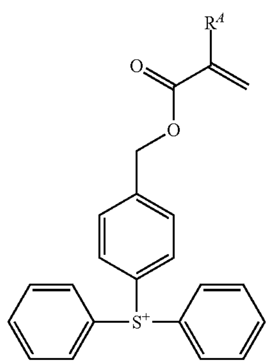

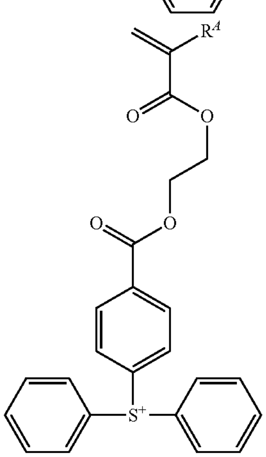

-continued

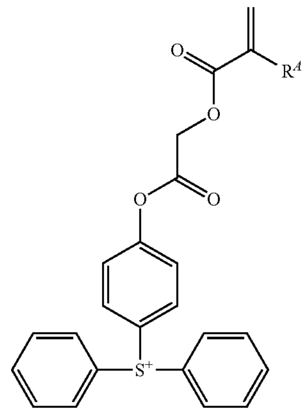

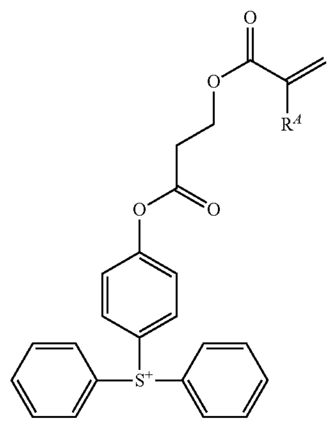

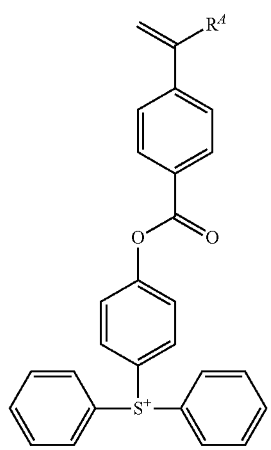

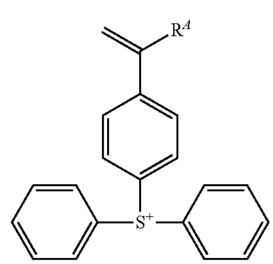

-continued
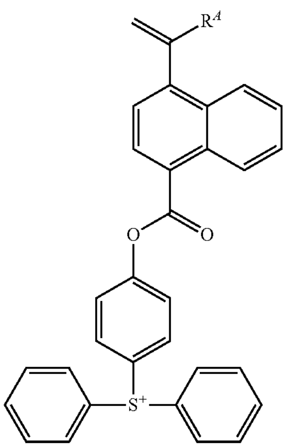
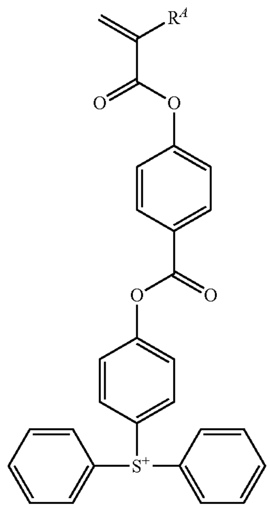
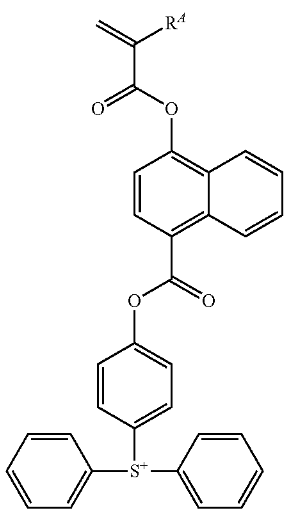
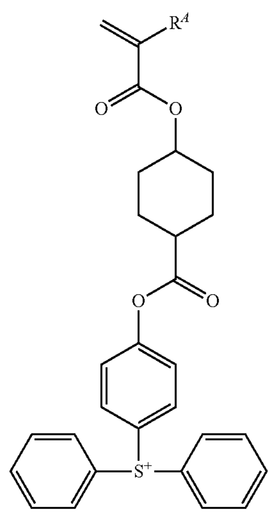
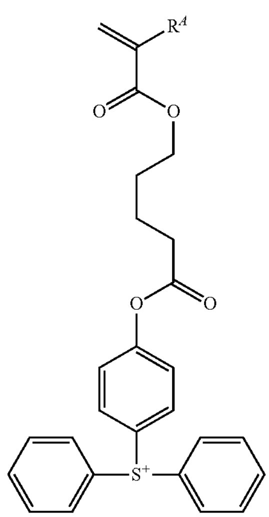
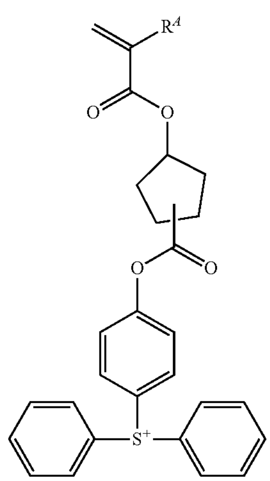
-continued
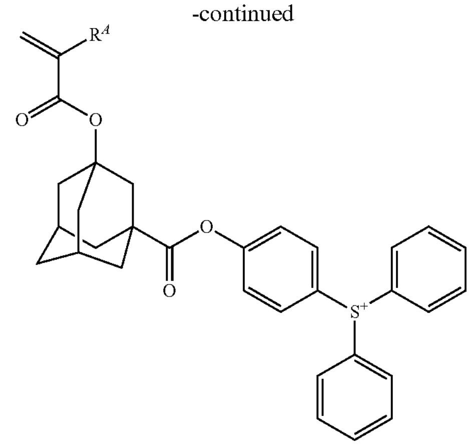
Examples of the cation in the monomer from which recurring unit (f2) or (f3) is derived are as will be exemplified for the cation in the sulfonium salt having formula (1-1).
Examples of the anion in the monomer from which recurring unit (f2) is derived are shown below, but not limited thereto. $R^A$ is as defined above.
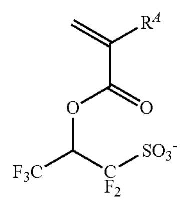
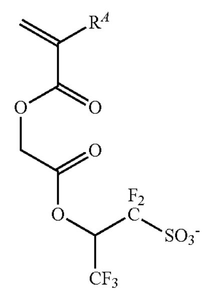
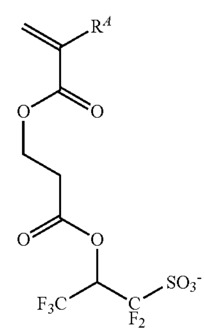
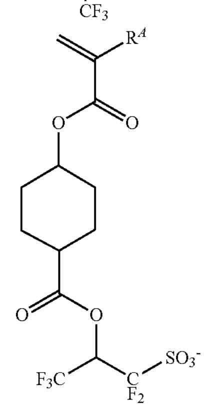
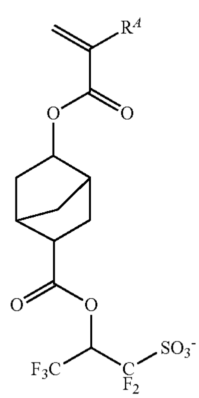
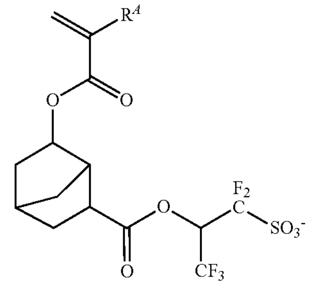

-continued
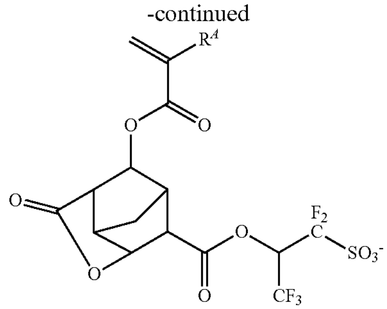
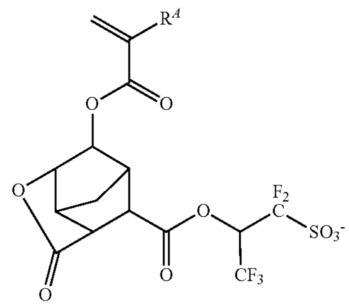
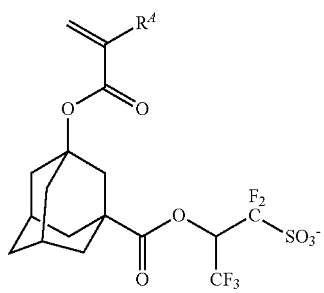
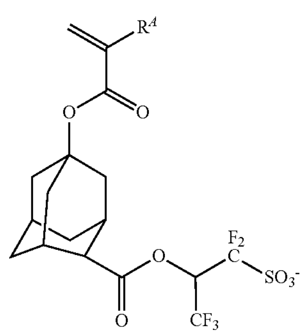
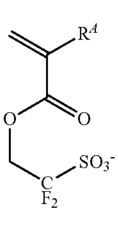
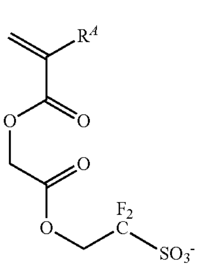
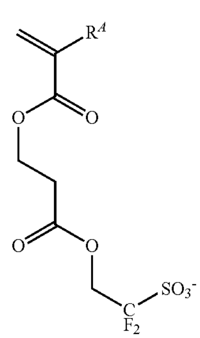
-continued
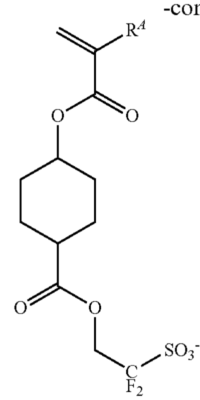
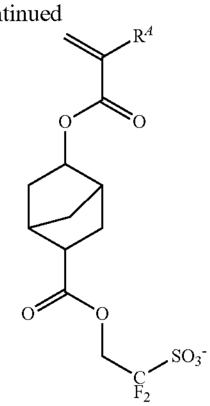
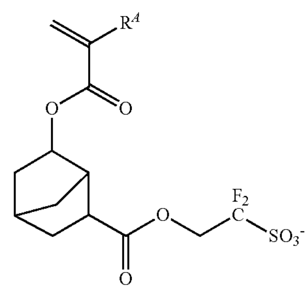
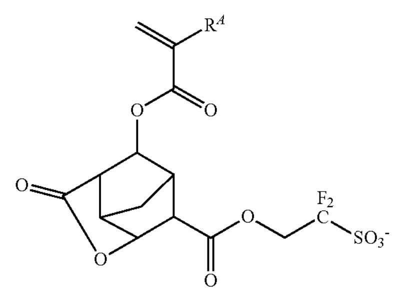
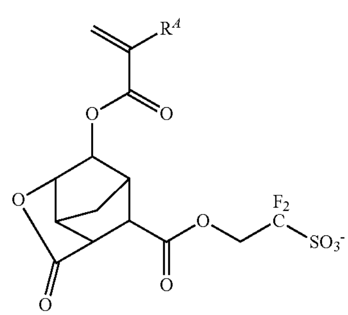
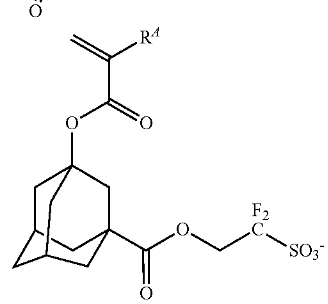

-continued

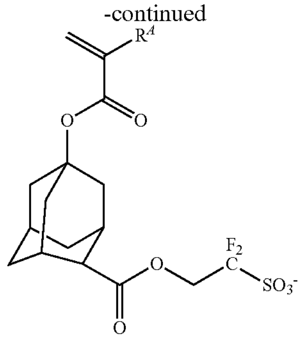

Examples of the anion in the monomer from which recurring unit (f3) is derived are shown below, but not limited thereto. $R^A$ is as defined above.

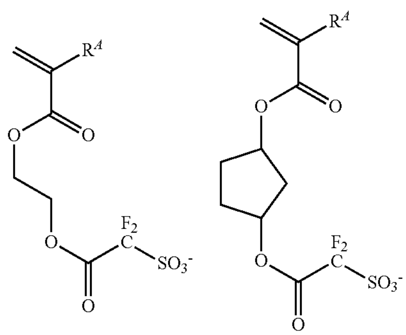

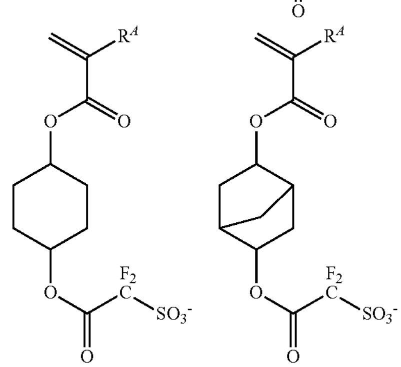

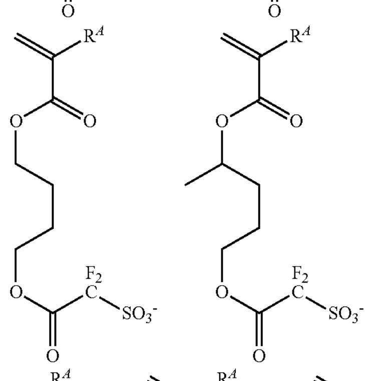

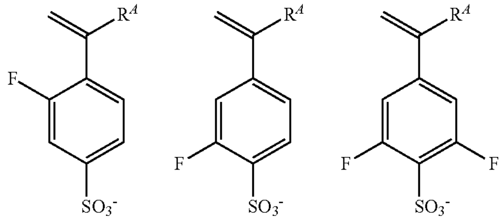

-continued

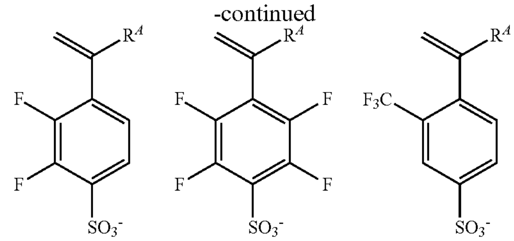

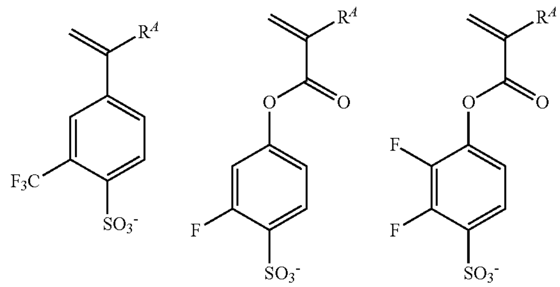

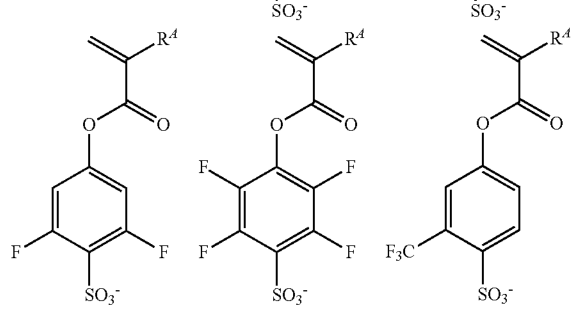

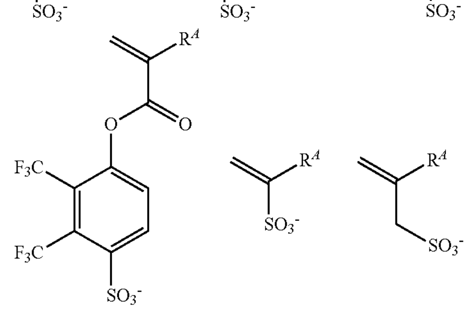

The attachment of an acid generator to the polymer main chain is effective in restraining acid diffusion, thereby preventing a reduction of resolution due to blur by acid diffusion. Also LWR or CDU is improved since the acid generator is uniformly distributed. Where a base polymer comprising recurring units (f) is used, an acid generator of addition type (to be described later) may be omitted.

The base polymer for formulating the positive resist composition comprises recurring units (a1) or (a2) having an acid labile group as essential component and additional recurring units (b), (c), (d), (e), and (f) as optional components. A fraction of units (a1), (a2), (b), (c), (d), (e), and (f) is: preferably $0 \le a1 < 1.0$, $0 \le a2 < 1.0$, $0 < a1+a2 < 1.0$, $0 \le b \le 0.9$, $0 \le c \le 0.9$, $0 \le d \le 0.8$, $0 \le e \le 0.8$, and $0 \le f \le 0.5$; more preferably $0 \le a1 \le 0.9$, $0 \le a2 \le 0.9$, $0.1 \le a1+a2 \le 0.9$, $0 \le b \le 0.8$, $0 \le c \le 0.8$, $0 \le d \le 0.7$, $0 \le e \le 0.7$, and $0 \le f \le 0.4$; and even more preferably $0 \le a1 \le 0.8$, $0 \le a2 \le 0.8$, $0.1 \le a1+a2 \le 0.8$, $0 \le b \le 0.75$, $0 \le c \le 0.75$, $0 \le d \le 0.6$, $0 \le e \le 0.6$, and $0 \le f \le 0.3$. Notably, $f=f1+f2+f3$, meaning that unit (f) is at least one of units (f1) to (f3), and $a1+a2+b+c+d+e+f=1.0$.

For the base polymer for formulating the negative resist composition, an acid labile group is not necessarily essential. The base polymer comprises recurring units (b), and optionally recurring units (c), (d), (e), and/or (f). A fraction of these units is: preferably 0<b≤1.0, 0≤c≤0.9, 0≤d≤0.8, 0≤e≤0.8, and 0≤f≤0.5; more preferably 0.2≤b≤1.0, 0≤c≤0.8, 0≤d≤0.7, 0≤e≤0.7, and 0≤f≤0.4; and even more preferably 0.3≤b≤1.0, 0≤c≤0.75, 0≤d≤0.6, 0≤e≤0.6, and 0≤f≤0.3. Notably, f=f1+f2+f3, meaning that unit (f) is at least one of units (0) to (f3), and b+c+d+e+f=1.0.

The base polymer may be synthesized by any desired methods, for example, by dissolving one or more monomers selected from the monomers corresponding to the foregoing recurring units in an organic solvent, adding a radical polymerization initiator thereto, and heating for polymerization. Examples of the organic solvent which can be used for polymerization include toluene, benzene, tetrahydrofuran, diethyl ether, and dioxane. Examples of the polymerization initiator used herein include 2,2'-azobisisobutyronitrile (AIBN), 2,2'-azobis(2,4-dimethylvaleronitrile), dimethyl 2,2-azobis(2-methylpropionate), benzoyl peroxide, and lauroyl peroxide. Preferably the polymerization temperature is 50 to 80° C., and the reaction time is 2 to 100 hours, more preferably 5 to 20 hours.

In the case of a monomer having a hydroxyl group, the hydroxyl group may be replaced by an acetal group susceptible to deprotection with acid, typically ethoxyethoxy, prior to polymerization, and the polymerization be followed by deprotection with weak acid and water. Alternatively, the hydroxyl group may be replaced by an acetyl, formyl, pivaloyl or similar group prior to polymerization, and the polymerization be followed by alkaline hydrolysis.

When hydroxystyrene or hydroxyvinylnaphthalene is copolymerized, an alternative method is possible. Specifically, acetoxystyrene or acetoxyvinylnaphthalene is used instead of hydroxystyrene or hydroxyvinylnaphthalene, and after polymerization, the acetoxy group is deprotected by alkaline hydrolysis, for thereby converting the polymer product to hydroxystyrene or hydroxyvinylnaphthalene. For alkaline hydrolysis, a base such as aqueous ammonia or triethylamine may be used. Preferably the reaction temperature is −20° C. to 100° C., more preferably 0° C. to 60° C., and the reaction time is 0.2 to 100 hours, more preferably 0.5 to 20 hours.

The base polymer should preferably have a weight average molecular weight (Mw) in the range of 1,000 to 500,000, and more preferably 2,000 to 30,000, as measured by GPC versus polystyrene standards using tetrahydrofuran (THF) solvent. With too low a Mw, the resist composition may become less heat resistant. A polymer with too high a Mw may lose alkaline solubility and give rise to a footing phenomenon after pattern formation.

If a base polymer has a wide molecular weight distribution or dispersity (Mw/Mn), which indicates the presence of lower and higher molecular weight polymer fractions, there is a possibility that foreign matter is left on the pattern or the pattern profile is degraded. The influences of Mw and Mw/Mn become stronger as the pattern rule becomes finer. Therefore, the base polymer should preferably have a narrow dispersity (Mw/Mn) of 1.0 to 2.0, especially 1.0 to 1.5, in order to provide a resist composition suitable for micropatterning to a small feature size.

It is understood that a blend of two or more polymers which differ in compositional ratio, Mw or Mw/Mn is acceptable.

Acid Generator

The resist composition may comprise an acid generator capable of generating a strong acid (referred to as acid generator of addition type, hereinafter). As used herein, the term "strong acid" refers to a compound having a sufficient acidity to induce deprotection reaction of an acid labile group on the base polymer in the case of a chemically amplified positive resist composition, or a compound having a sufficient acidity to induce acid-catalyzed polarity switch reaction or crosslinking reaction in the case of a chemically amplified negative resist composition. The inclusion of such an acid generator ensures that the iodized or brominated phenol salt functions as a quencher and the inventive resist composition functions as a chemically amplified positive or negative resist composition.

The acid generator is typically a compound (PAG) capable of generating an acid upon exposure to actinic ray or radiation. Although the PAG used herein may be any compound capable of generating an acid upon exposure to high-energy radiation, those compounds capable of generating sulfonic acid, sulfonimide or sulfonmethide are preferred. Suitable PAGs include sulfonium salts, iodonium salts, sulfonyldiazomethane, N-sulfonyloxyimide, and oxime-O-sulfonate acid generators. Exemplary PAGs are described in JP-A 2008-111103, paragraphs [0122]-[0142] (U.S. Pat. No. 7,537,880).

As the PAG used herein, sulfonium salts having the formula (1-1) and iodonium salts having the formula (1-2) are also preferred.

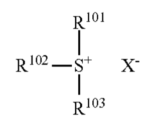

(1-1)

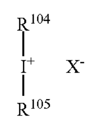

(1-2)

In formulae (1-1) and (1-2), $R^{101}$ to $R^{205}$ are each independently fluorine, chlorine, bromine, iodine, or a $C_1$-$C_{20}$ hydrocarbyl group which may contain a heteroatom.

The hydrocarbyl group may be saturated or unsaturated and straight, branched or cyclic. Examples thereof include $C_1$-$C_{20}$ alkyl groups such as methyl, ethyl, n-propyl, isopropyl, n-butyl, isobutyl, sec-butyl, tert-butyl, n-pentyl, n-hexyl, n-octyl, n-nonyl, n-decyl, undecyl, dodecyl, tridecyl, tetradecyl, pentadecyl, heptadecyl, octadecyl, nonadecyl and icosyl; $C_3$-$C_{20}$ cyclic saturated hydrocarbyl groups such as cyclopropyl, cyclopentyl, cyclohexyl, cyclopropylmethyl, 4-methylcyclohexyl, cyclohexylmethyl, norbornyl, and adamantyl; $C_2$-$C_{20}$ alkenyl groups such as vinyl, propenyl, butenyl, and hexenyl; $C_2$-$C_{20}$ cyclic unsaturated aliphatic hydrocarbyl groups such as cyclohexenyl and norbomenyl; $C_2$-Cao alkynyl groups such as ethynyl, propynyl, and butynyl; $C_6$-$C_{20}$ aryl groups such as phenyl, methylphenyl, ethylphenyl, n-propylphenyl, isopropylphenyl, n-butylphenyl, isobutylphenyl, sec-butylphenyl, tert-butylphenyl, naphthyl, methylnaphthyl, ethylnaphthyl, n-propylnaphthyl, isopropylnaphthyl, n-butylnaphthyl, isobutylnaphthyl, sec-butylnaphthyl, and tert-butylnaphthyl; and $C_7$-$C_{20}$ aralkyl groups such as benzyl and phenethyl. In the foregoing groups, some hydrogen may be substituted by a moiety containing a heteroatom such as oxygen, sulfur, nitrogen or halogen, and some carbon may be replaced by a moiety containing a heteroatom such as oxygen, sulfur or nitrogen, so that the group may contain a hydroxyl, cyano, carbonyl, ether bond, ester bond, sulfonate bond, carbonate, lactone ring, sultone ring, carboxylic anhydride, or haloalkyl moiety.

$R^{101}$ and $R^{102}$ may bond together to form a ring with the sulfur atom to which they are attached. Preferred rings are of the structures shown below.
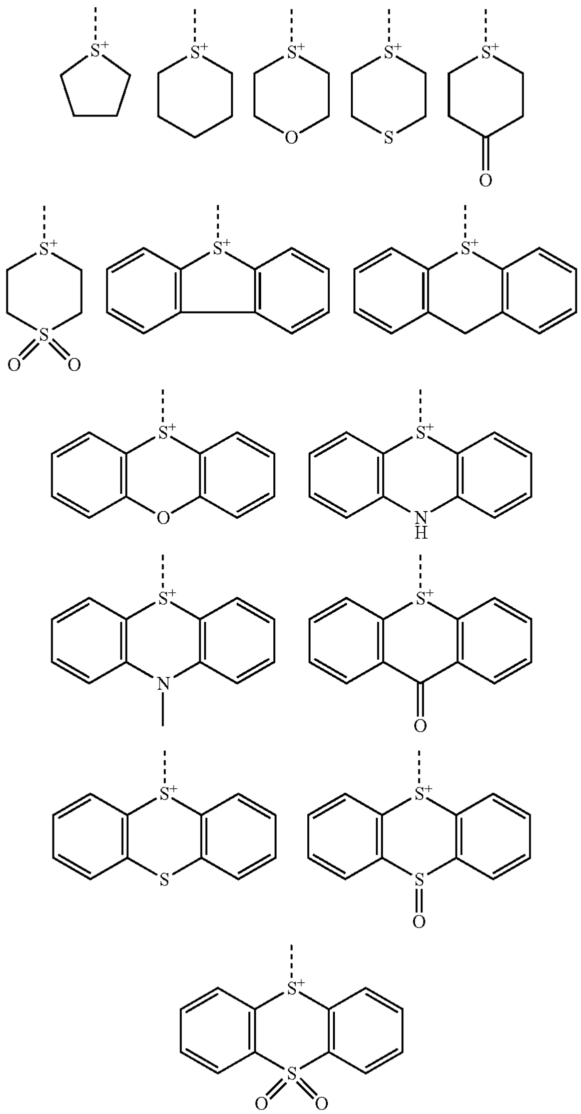
Herein the broken line designates an attachment to $R^{103}$.
Examples of the cation in the sulfonium salt having formula (1-1) are shown below, but not limited thereto.
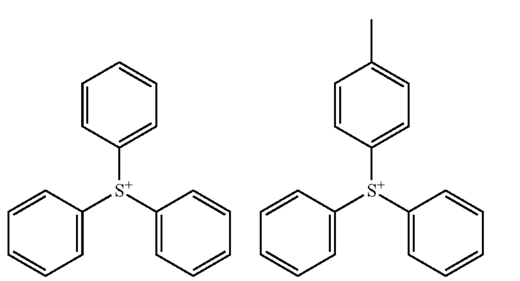
-continued
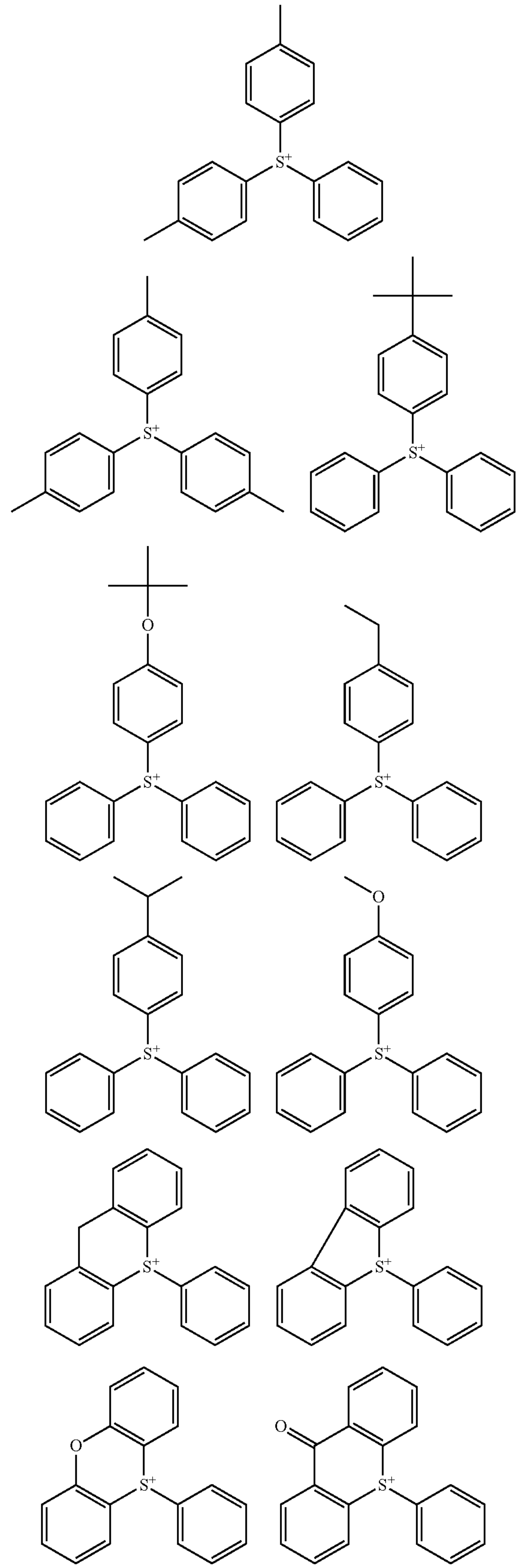

-continued
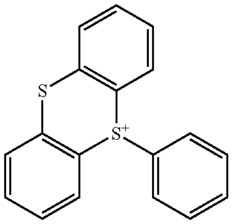
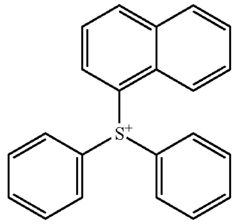
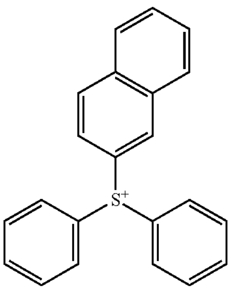
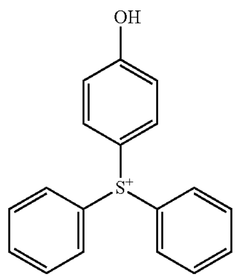
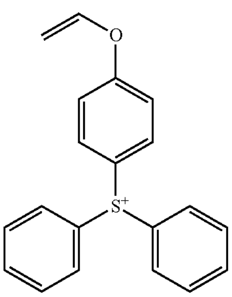
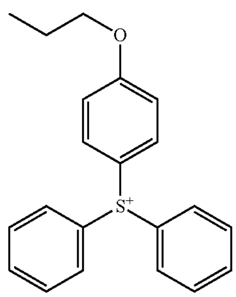
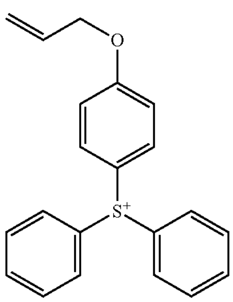
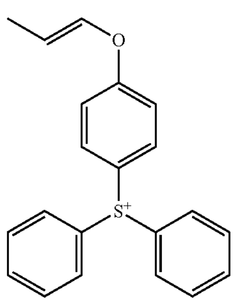
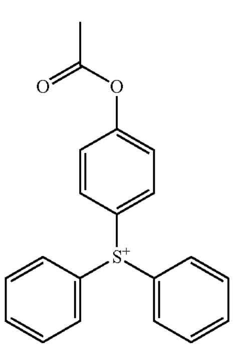
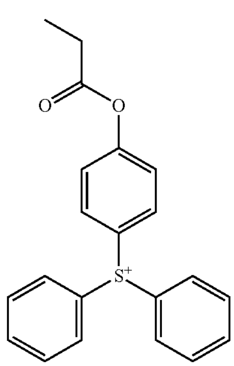
-continued
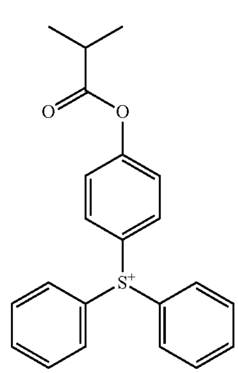
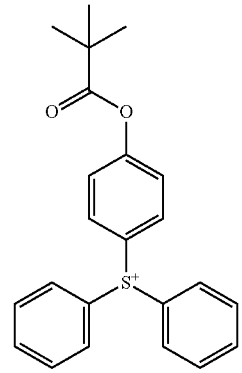
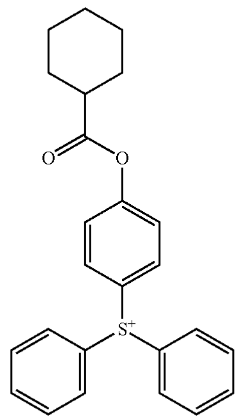
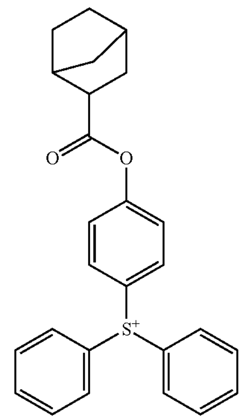
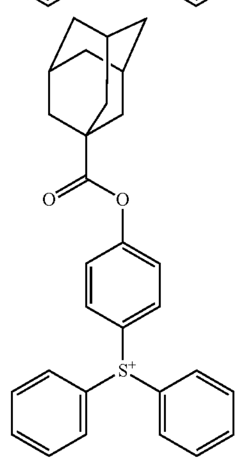
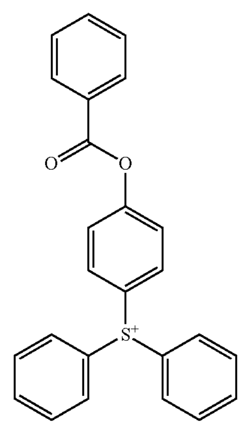
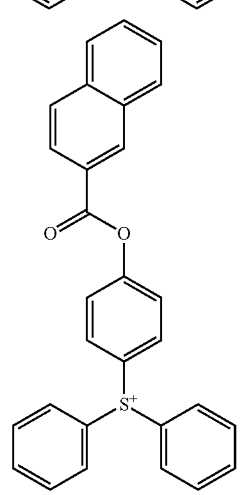
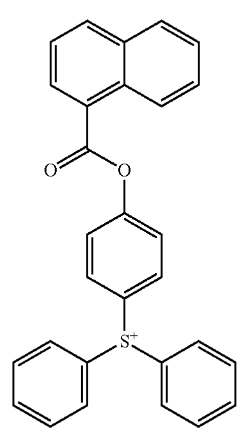

-continued
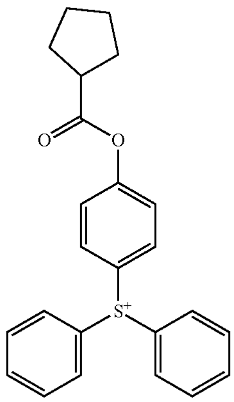
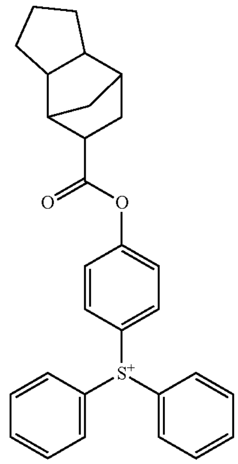
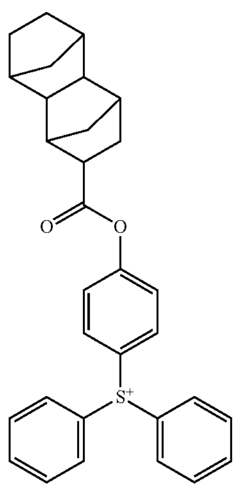
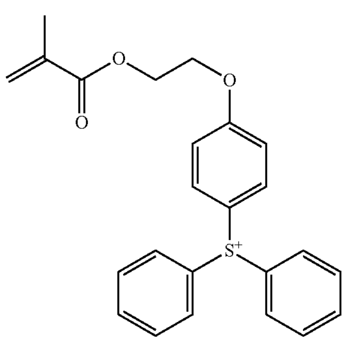
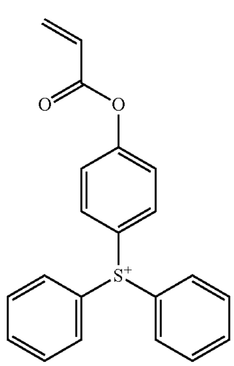
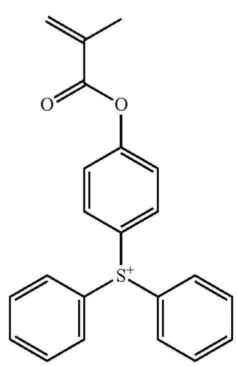
-continued
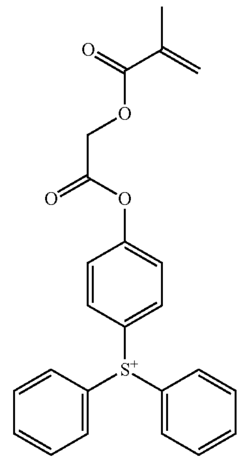
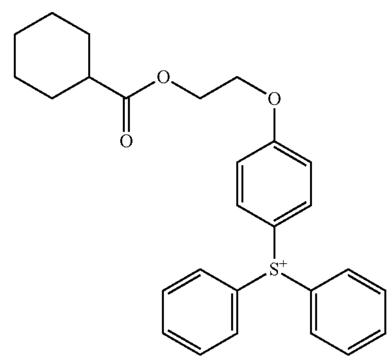
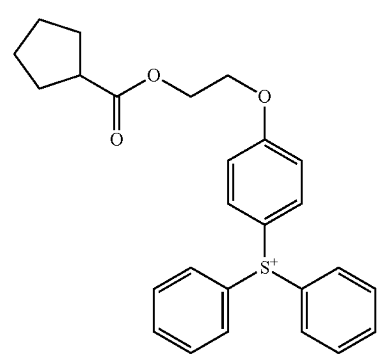
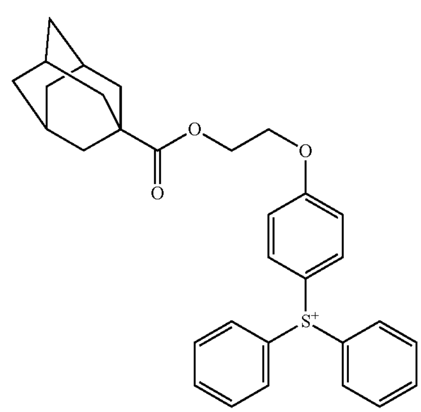

-continued
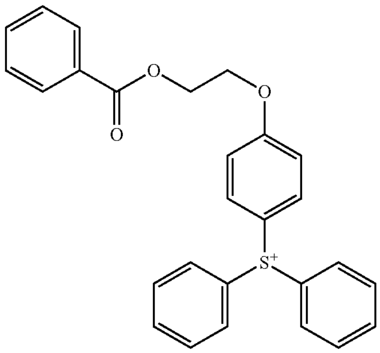
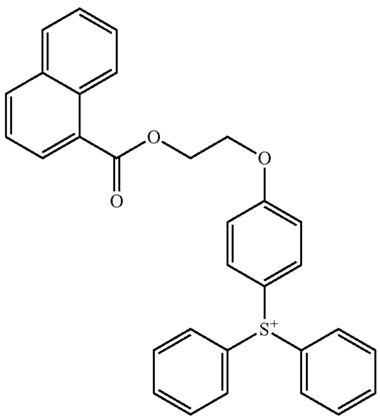
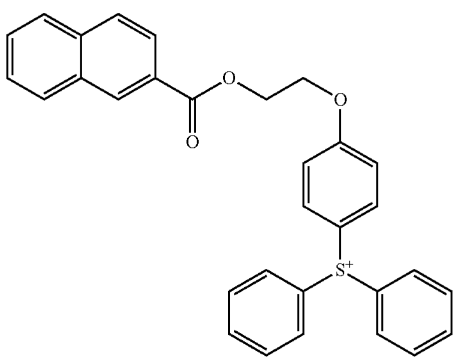
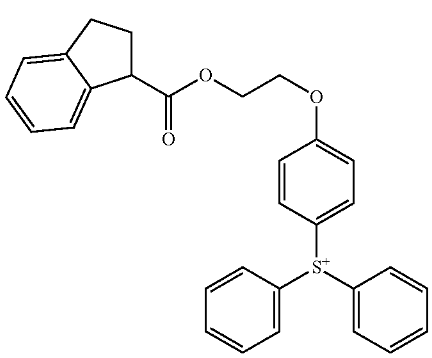
-continued
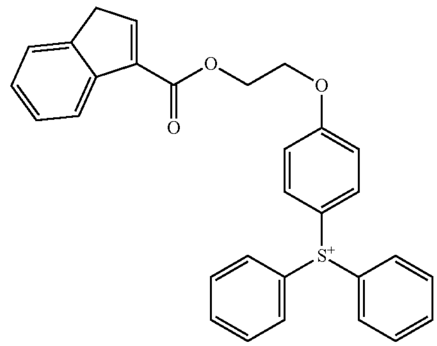
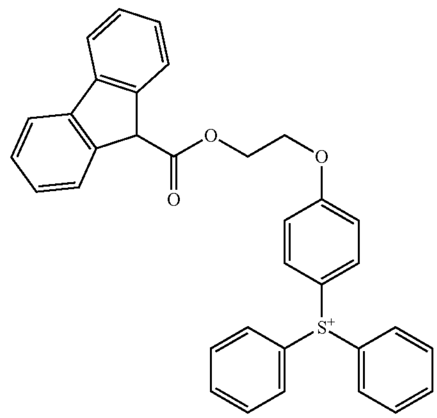
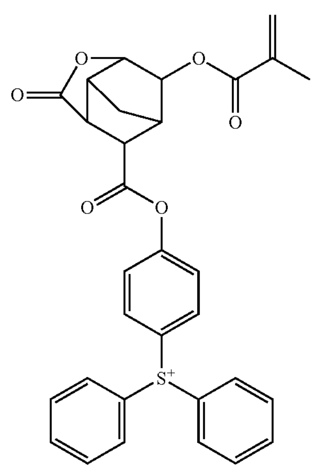
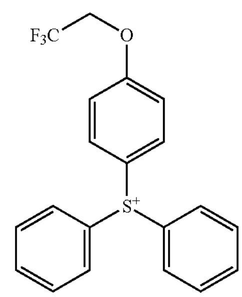
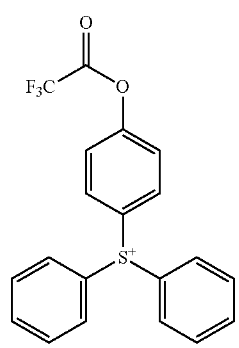
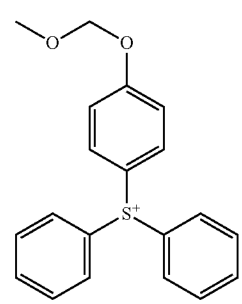

-continued
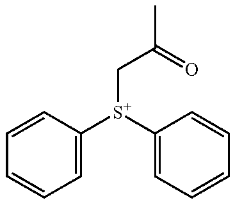
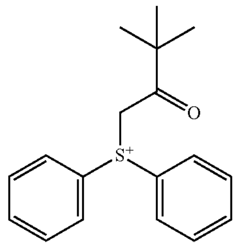
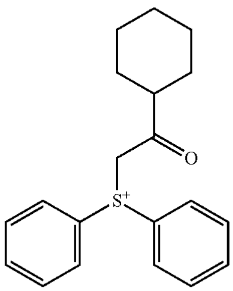
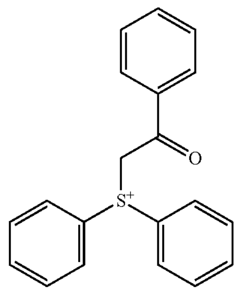
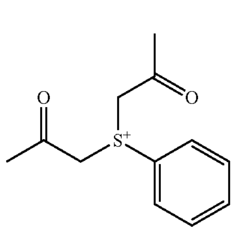
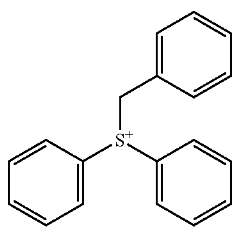
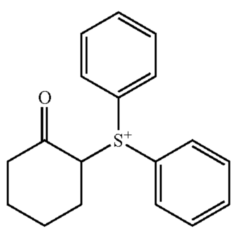
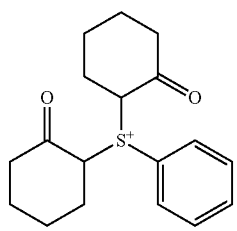
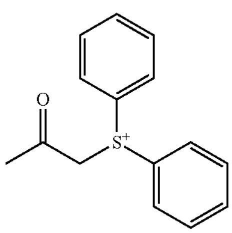
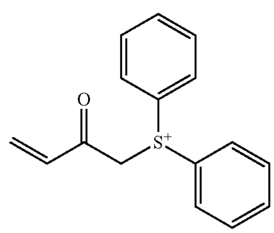
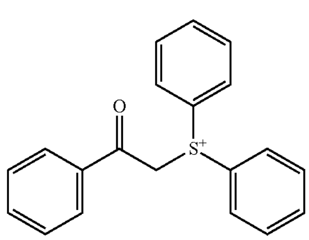
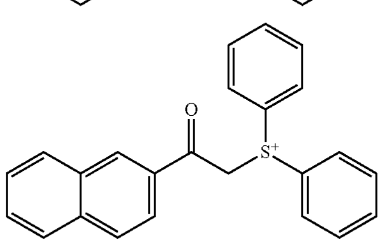
-continued
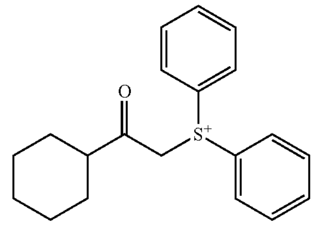
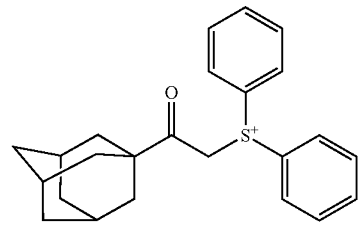
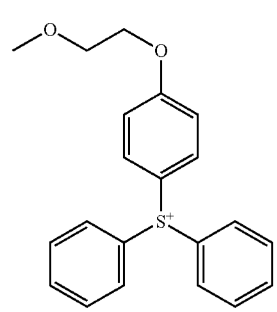
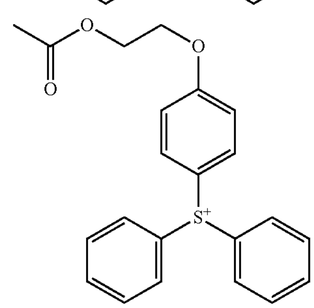
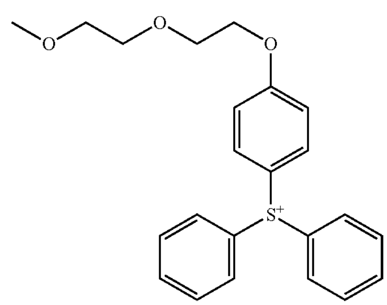
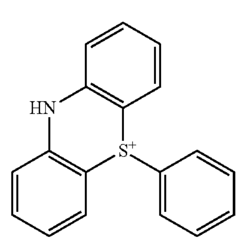
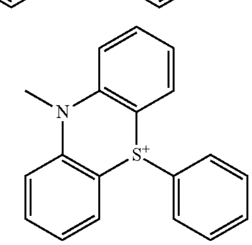

-continued
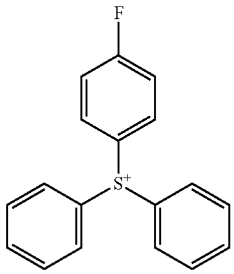
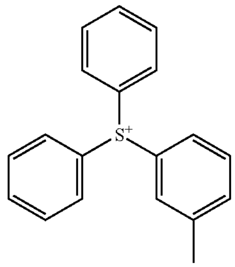
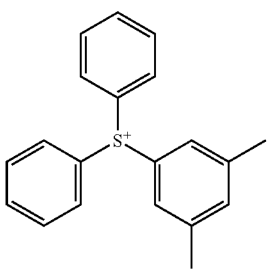
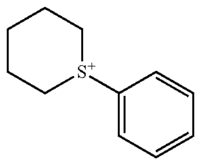
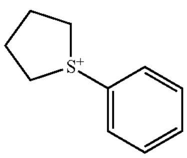
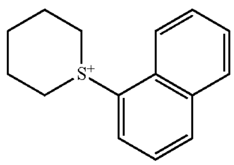
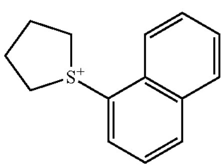
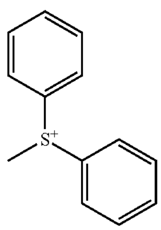
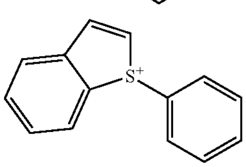
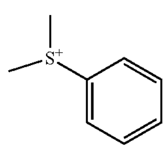
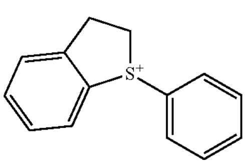
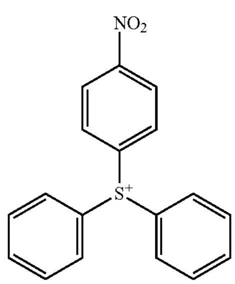
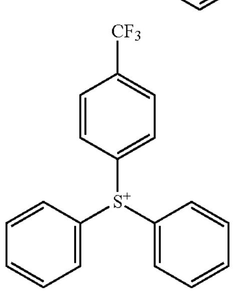
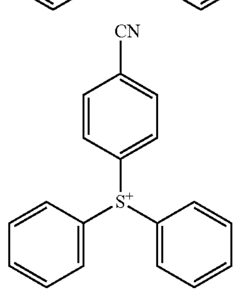
-continued
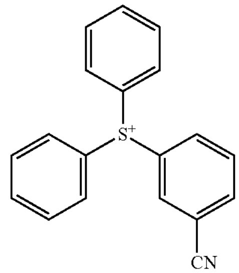
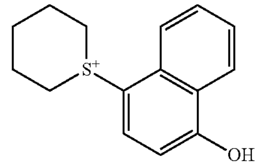
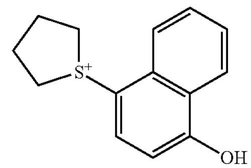
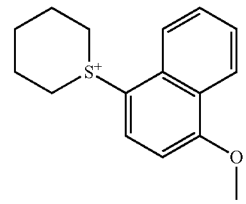
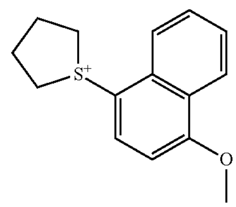
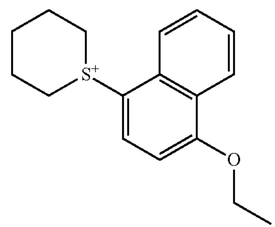
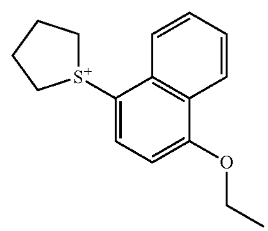
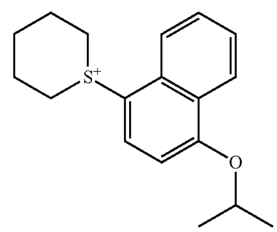
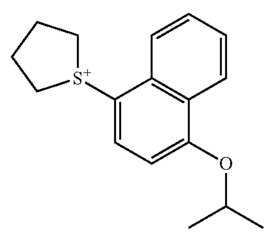
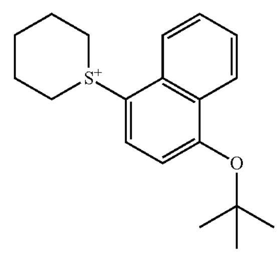
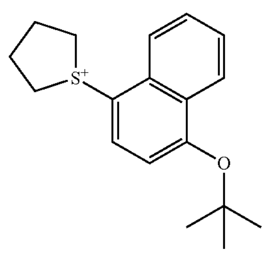
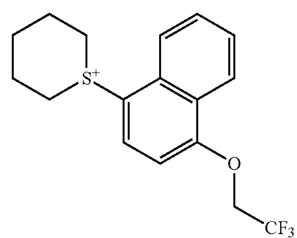
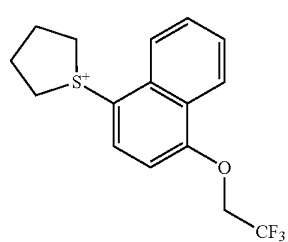

-continued
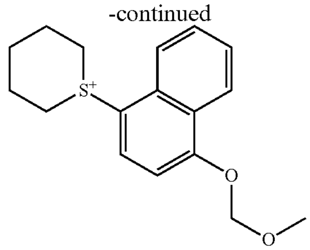
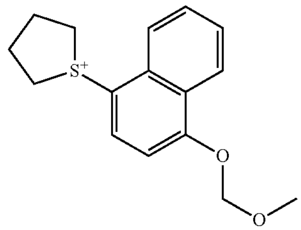
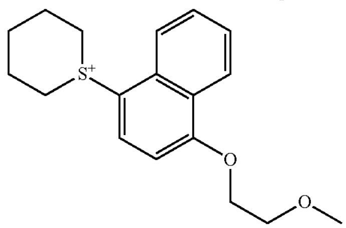
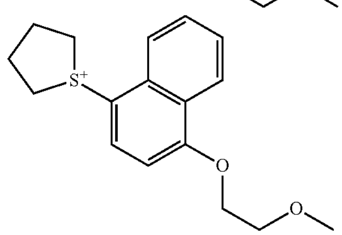
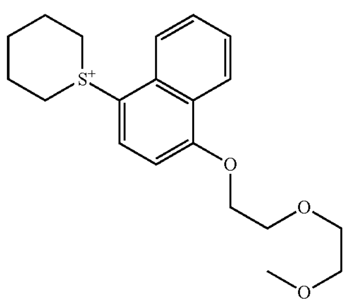
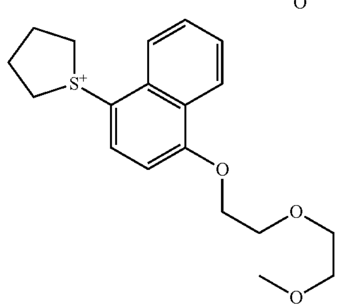
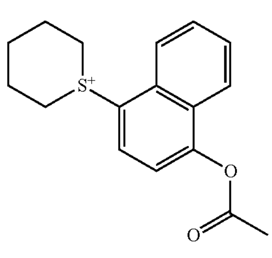
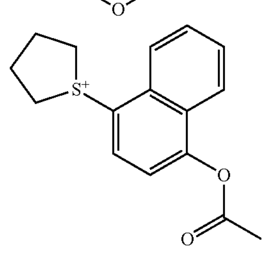
-continued
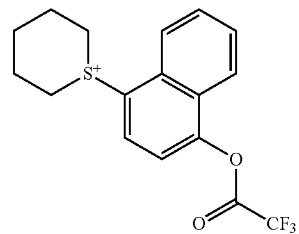
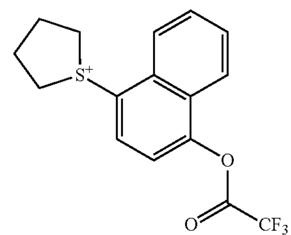
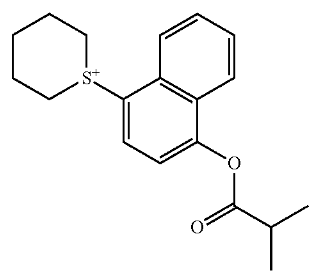
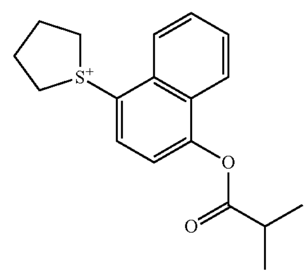
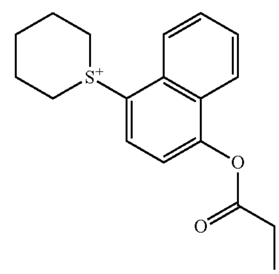
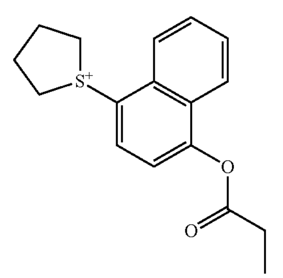
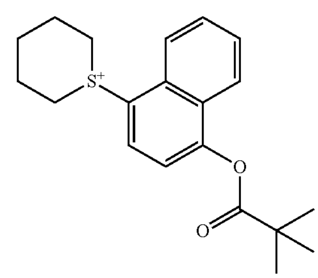
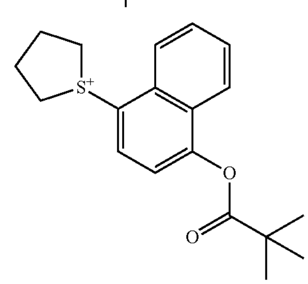

-continued
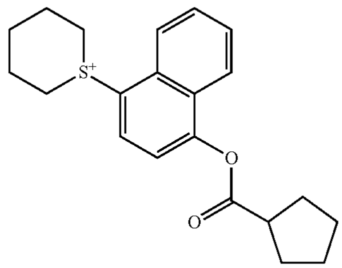
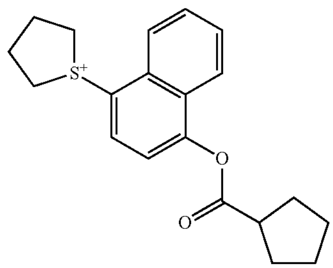
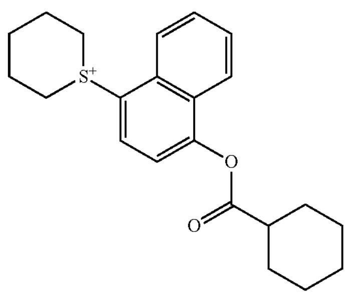
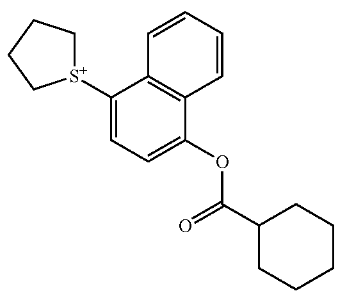
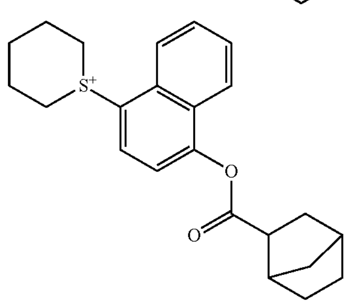
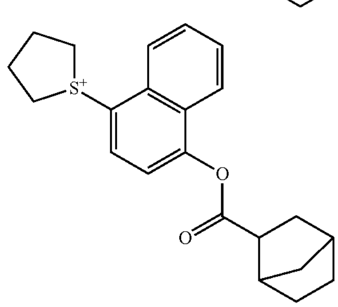
-continued
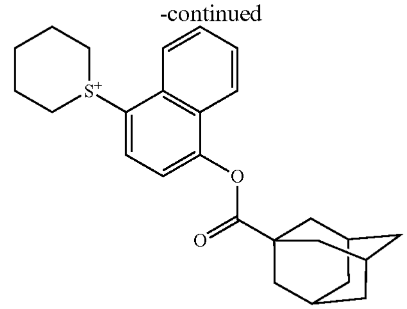
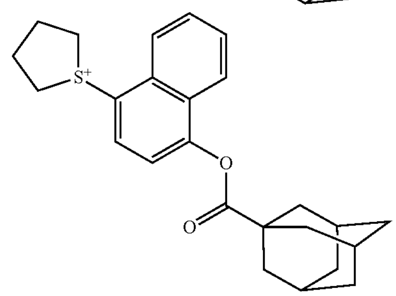
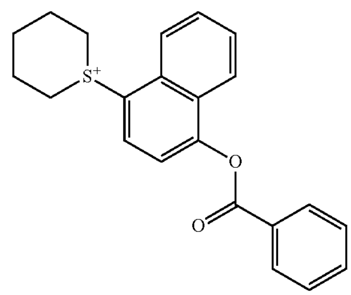
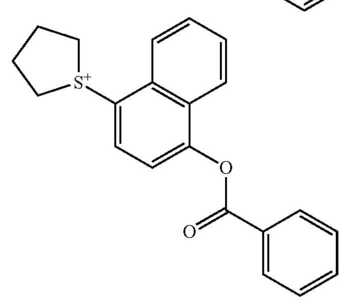
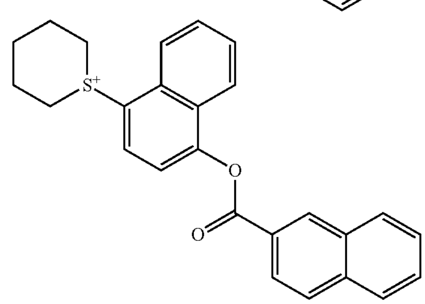
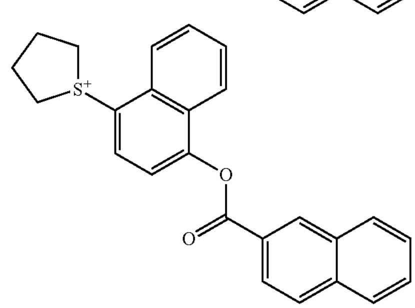

-continued
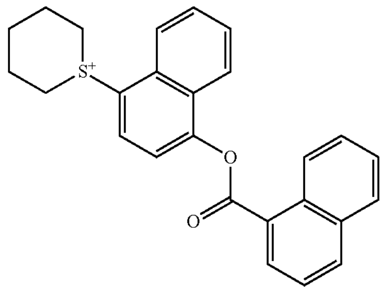
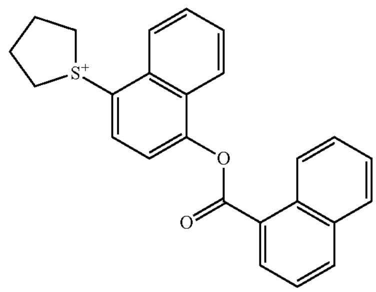
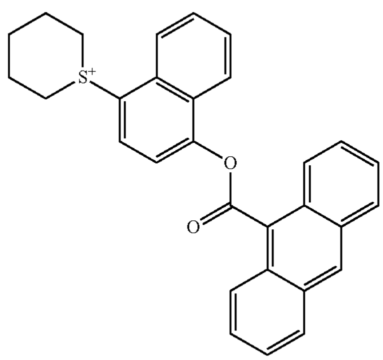
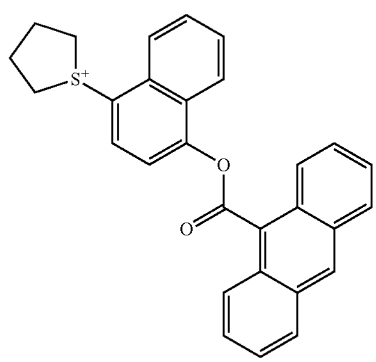
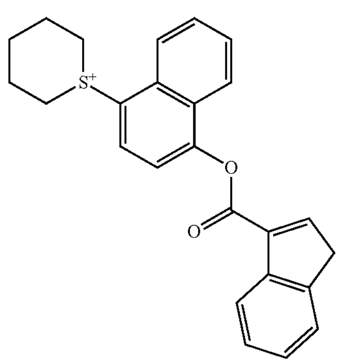
-continued
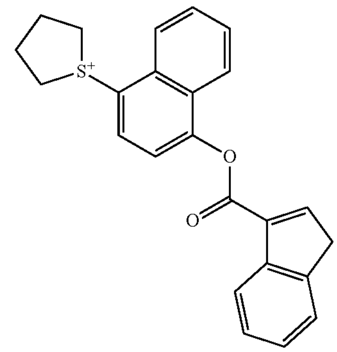
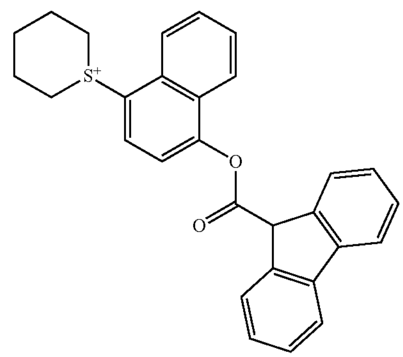
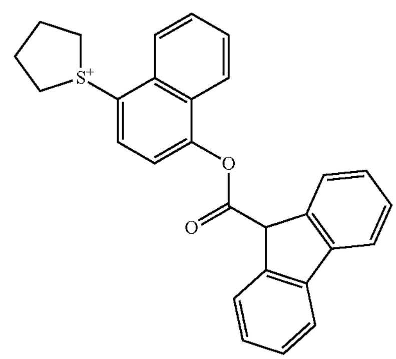
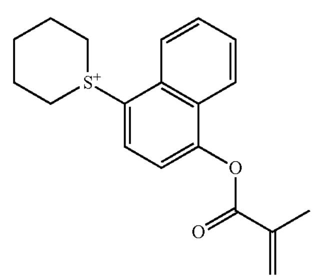
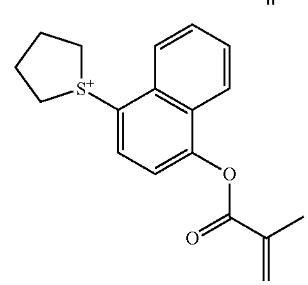

-continued
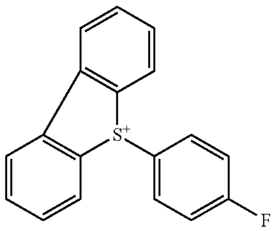
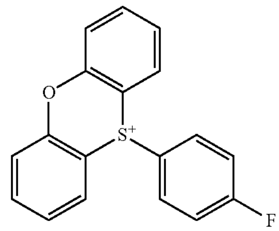
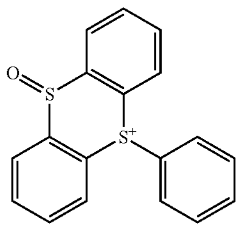
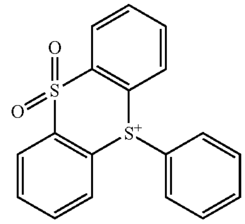
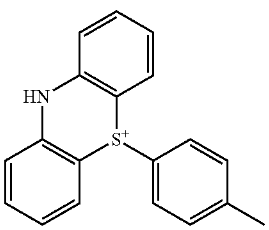
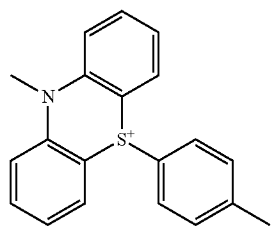
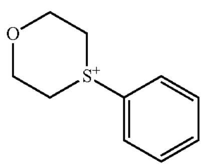
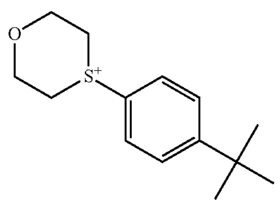
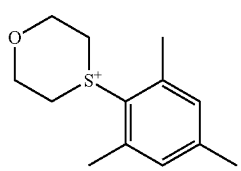
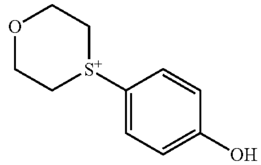
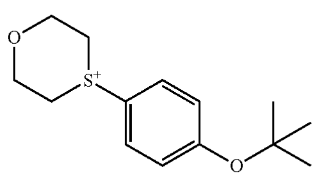
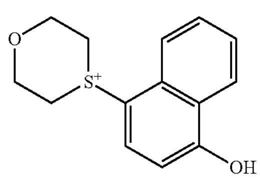
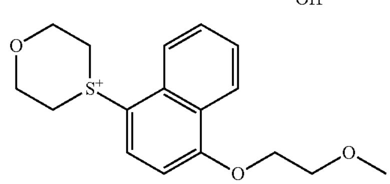
-continued
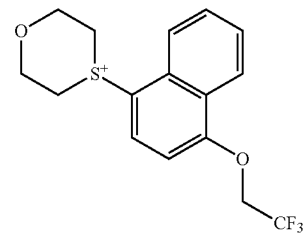
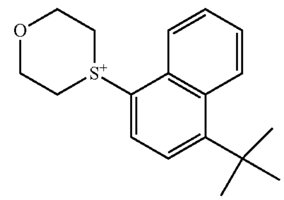
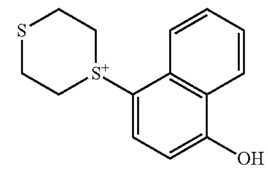
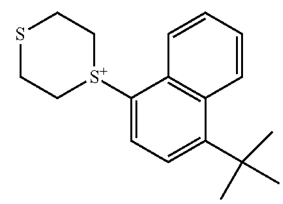
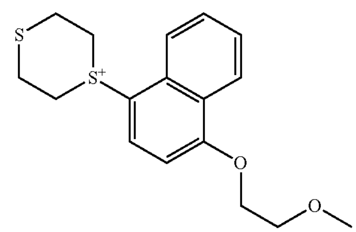
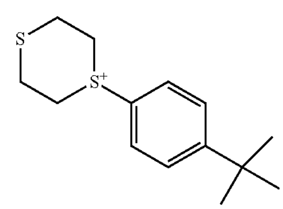
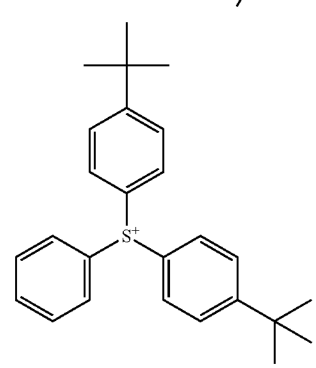

-continued
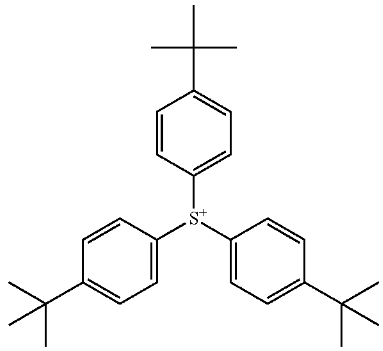
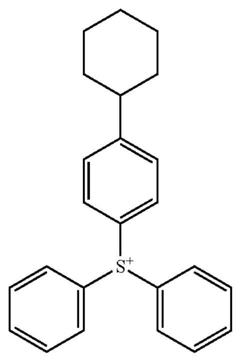
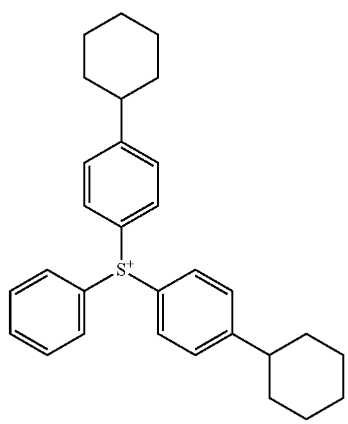
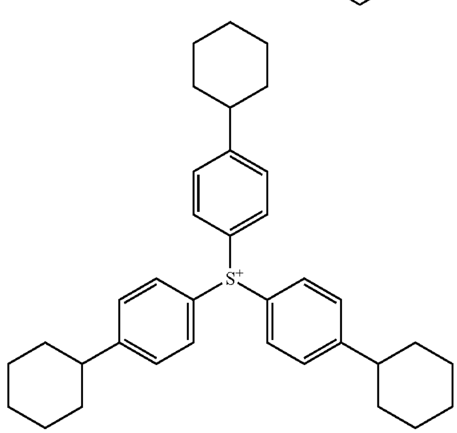
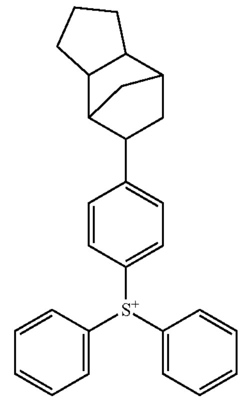
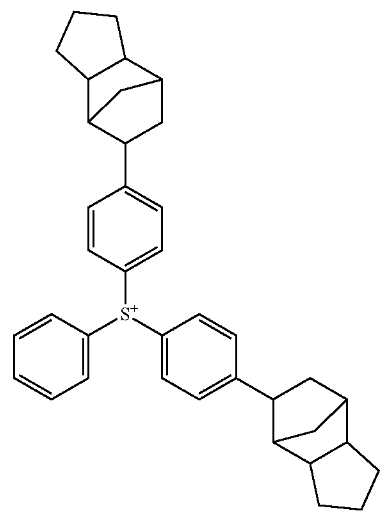
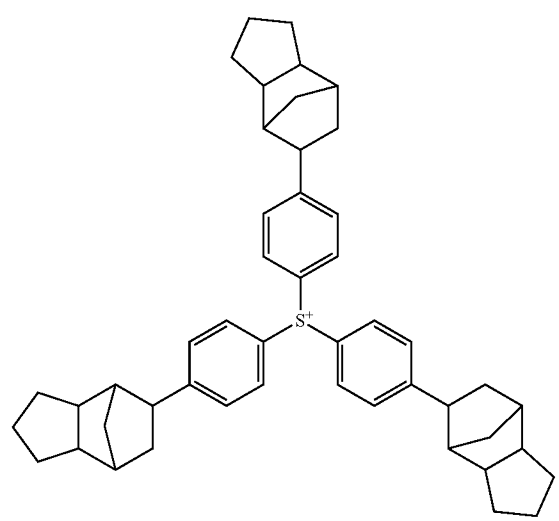

-continued
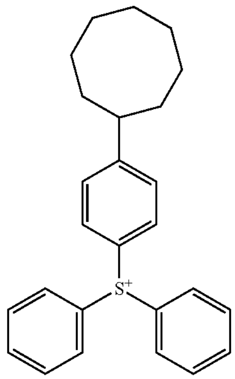
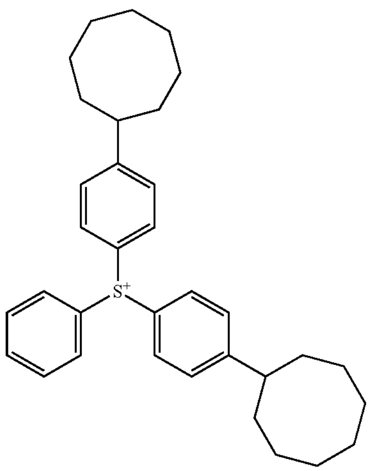
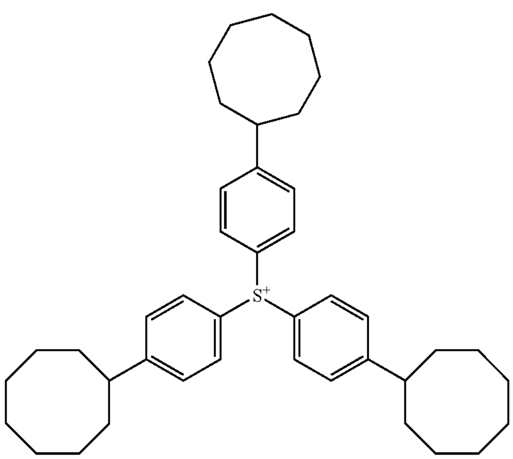
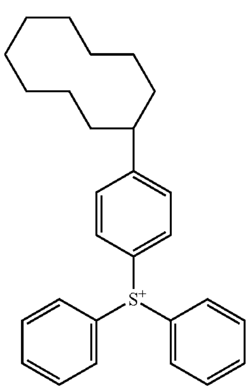
-continued
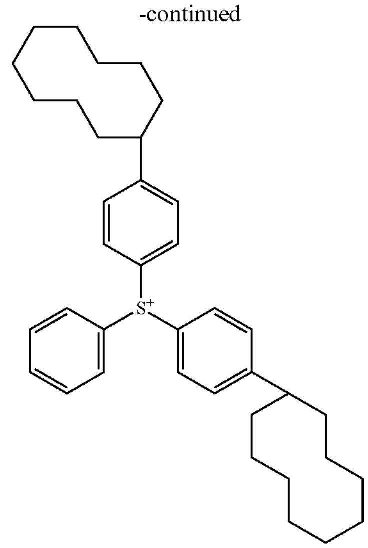
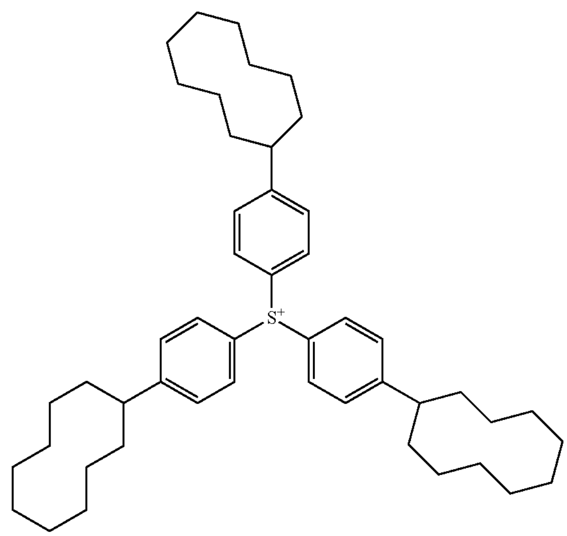
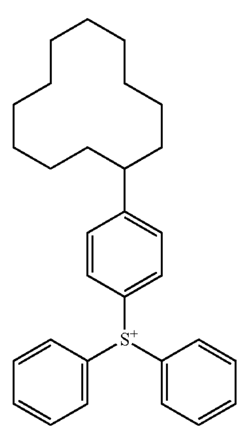

-continued
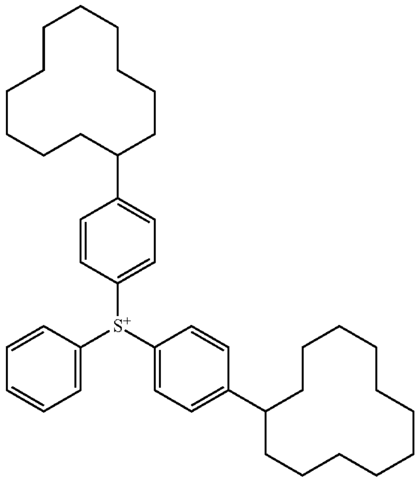
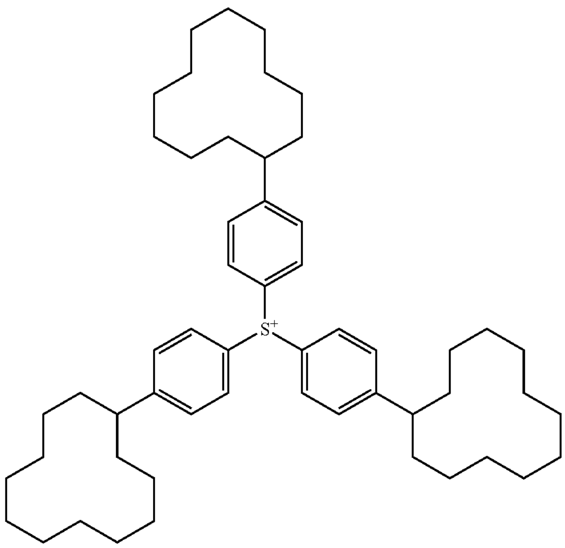
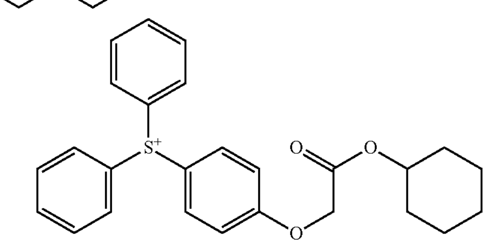
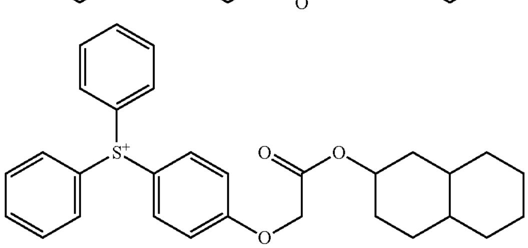
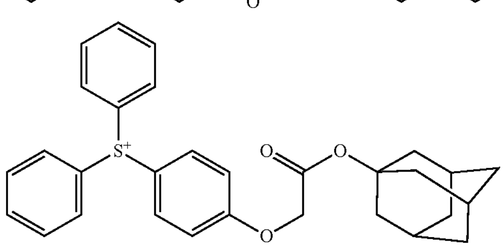
-continued
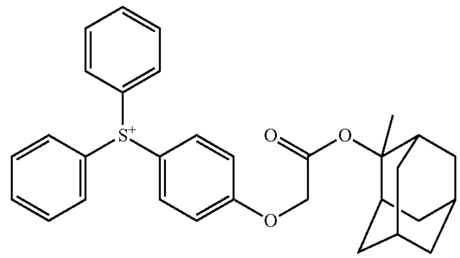
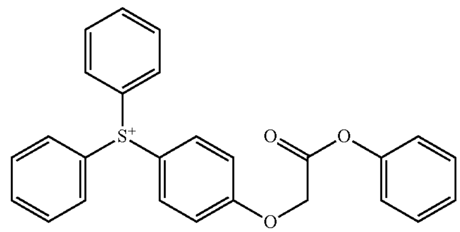
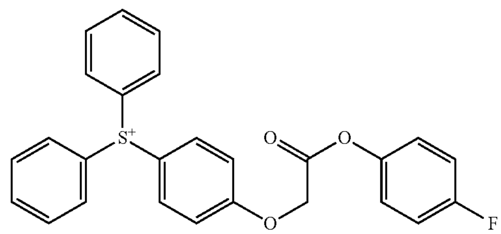
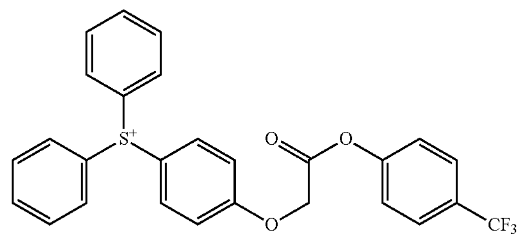
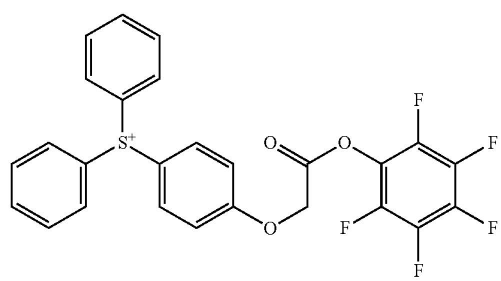
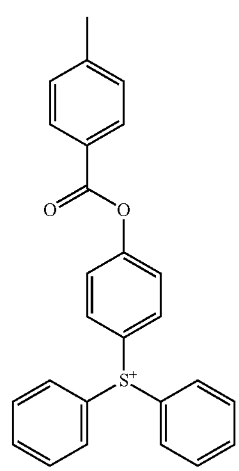
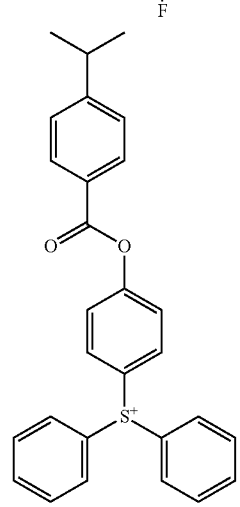

-continued
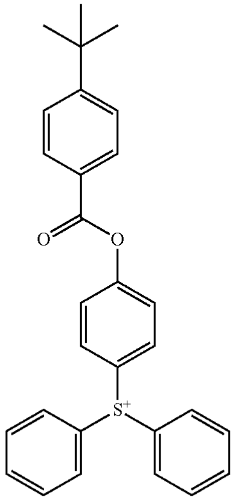
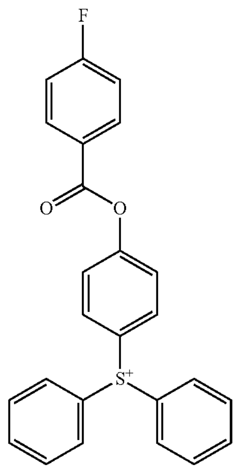
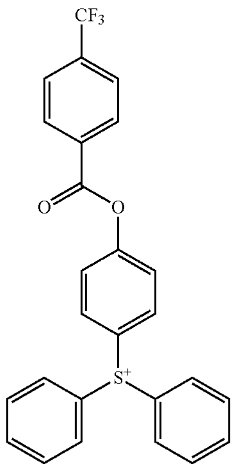
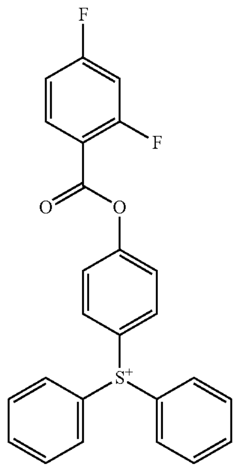
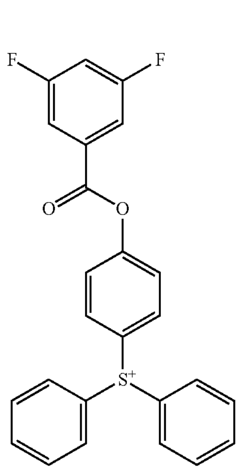
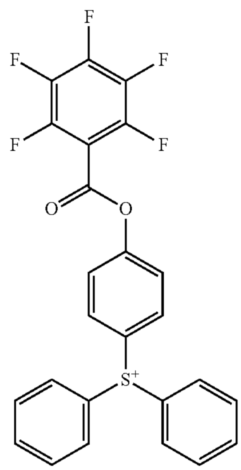
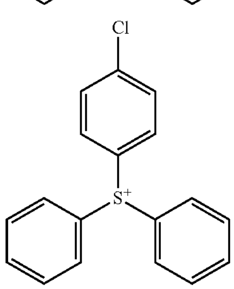
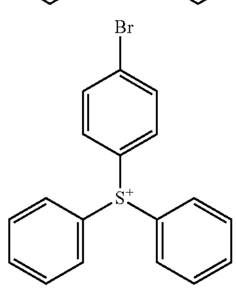
-continued
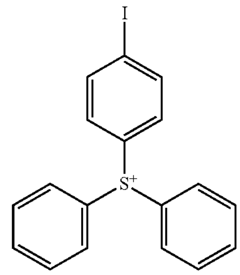
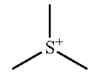
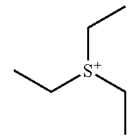
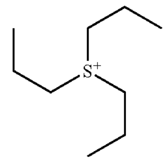
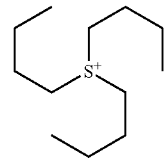
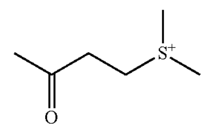
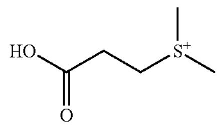
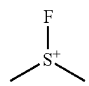
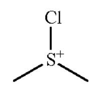
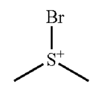
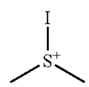
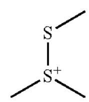
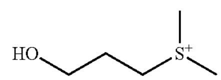
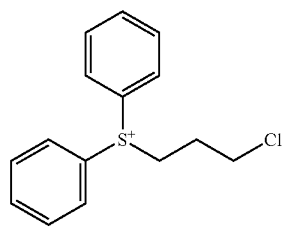
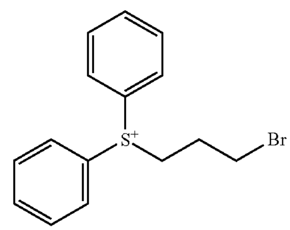
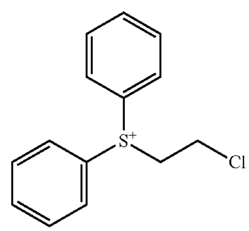
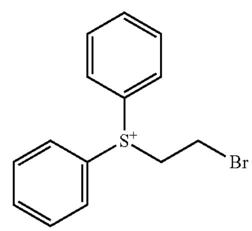
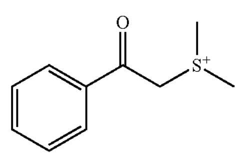
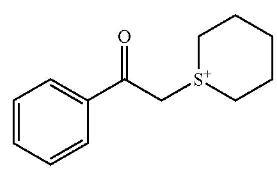
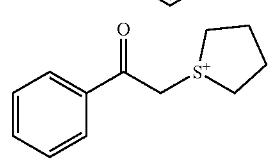
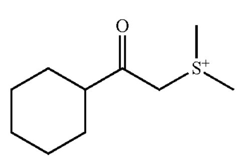
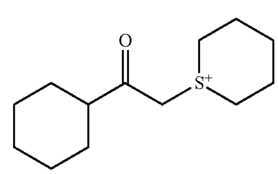

-continued
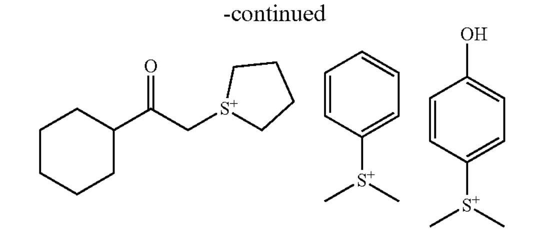
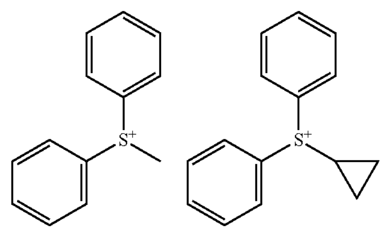
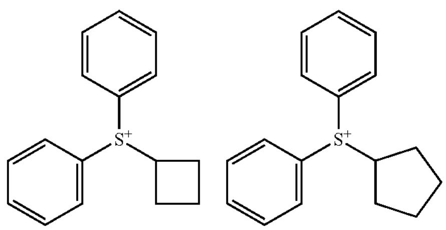
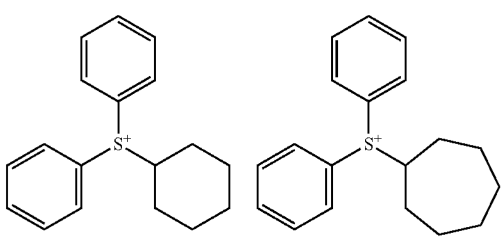
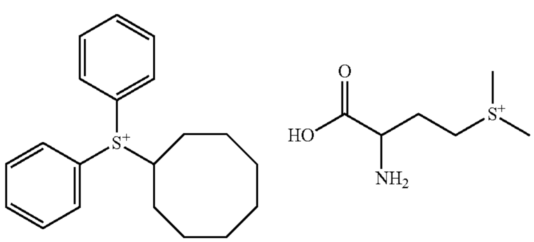
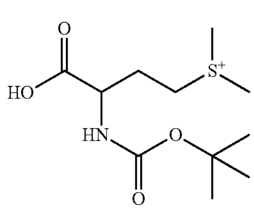
Examples of the cation in the iodonium salt having formula (1-2) are shown below, but not limited thereto.
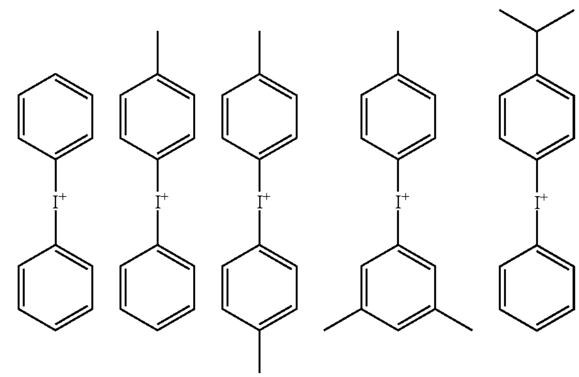
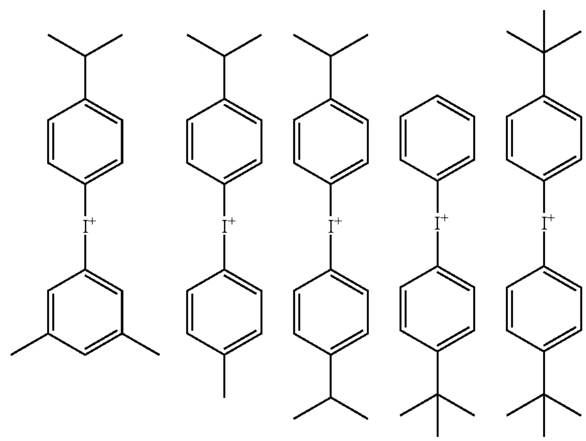
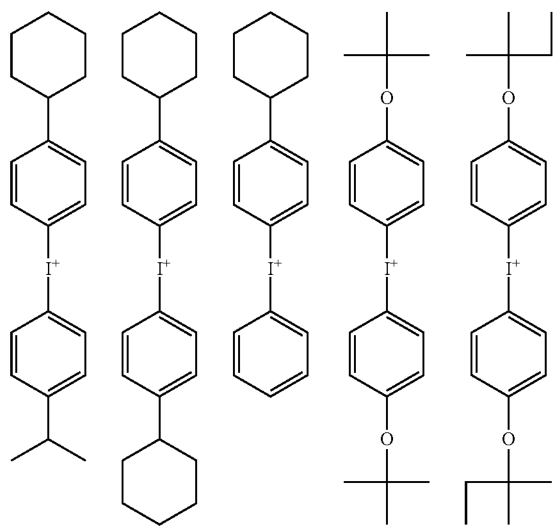
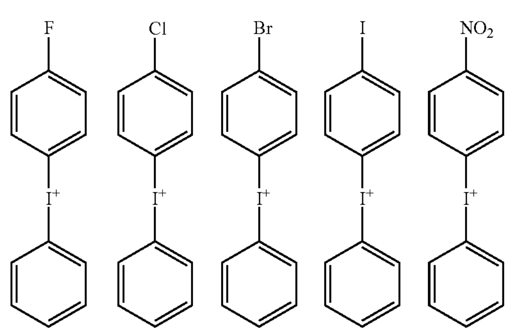

-continued

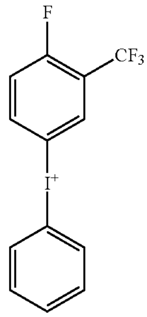

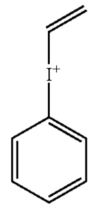

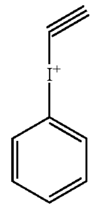

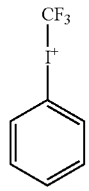

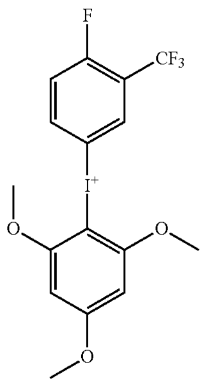

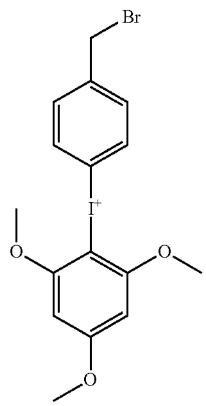

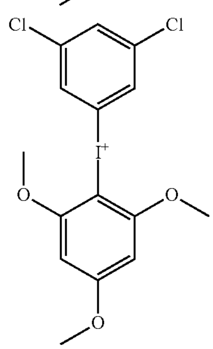

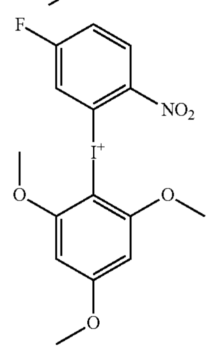

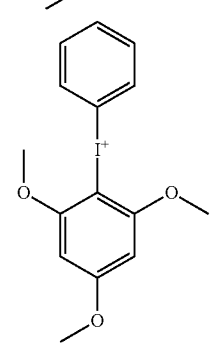

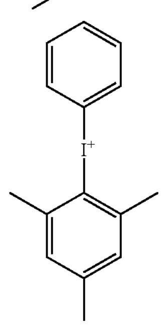

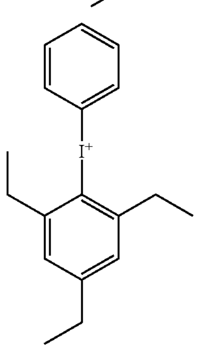

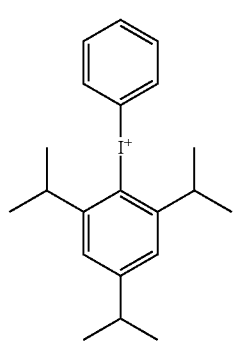

-continued

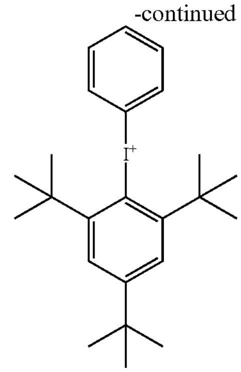

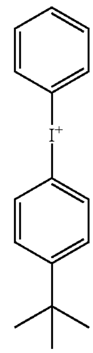

In formulae (1-1) and (1-2), $X^-$ is an anion of the following formula (1A), (1B), (1C) or (1D).

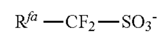

(1A)

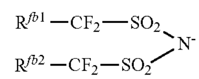

(1B)

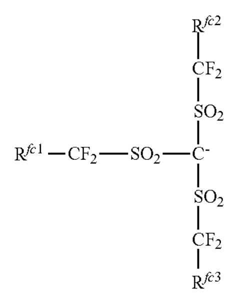

(1C)

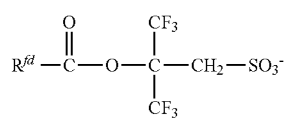

(1D)

In formula (1A), $R^{fa}$ is fluorine or a $C_1$-$C_{40}$ hydrocarbyl group which may contain a heteroatom. The hydrocarbyl group may be saturated or unsaturated and straight, branched or cyclic. Examples thereof include those exemplified later for $R^{107}$ in formula (1A').

Of the anions of formula (1A), an anion having the formula (1A') is preferred.

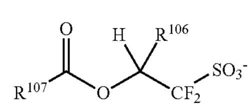

(1A')

In formula (1A'), $R^{106}$ is hydrogen or trifluoromethyl, preferably trifluoromethyl.

$R^{107}$ is a $C_1$-$C_{38}$ hydrocarbyl group which may contain a heteroatom. As the heteroatom, oxygen, nitrogen, sulfur and halogen atoms are preferred, with oxygen being most preferred. Of the hydrocarbyl groups represented by $R^{107}$, those groups of 6 to 30 carbon atoms are preferred from the aspect of achieving a high resolution in forming patterns of fine feature size. The hydrocarbyl group may be saturated or unsaturated and straight, branched or cyclic. Examples thereof include alkyl groups such as methyl, ethyl, propyl, isopropyl, butyl, isobutyl, sec-butyl, tert-butyl, pentyl, neopentyl, hexyl, heptyl, 2-ethylhexyl, nonyl, undecyl, tridecyl, pentadecyl, heptadecyl, and icosanyl; cyclic saturated hydrocarbyl groups such as cyclopentyl, cyclohexyl, 1-adamantyl, 2-adamantyl, 1-adamantylmethyl, norbornyl, norbornylmethyl, tricyclodecanyl, tetracyclododecanyl, tetracyclododecanylmethyl, and dicyclohexylmethyl; unsaturated aliphatic hydrocarbyl groups such as allyl and 3-cyclohexenyl; aryl groups such as phenyl, 1-naphthyl and 2-naphthyl; and aralkyl groups such as benzyl and diphenylmethyl. In the foregoing groups, some or all hydrogen atoms may be substituted by a moiety containing a heteroatom such as oxygen, sulfur, nitrogen or halogen, and some carbon may be replaced by a moiety containing a heteroatom such as oxygen, sulfur or nitrogen, so that the group may contain a hydroxyl, cyano, carbonyl, ether bond, ester bond, sulfonate bond, carbonate, lactone ring, sultone ring, carboxylic anhydride, or haloalkyl moiety. Examples of the heteroatom-containing hydrocarbyl group include tetrahydrofuryl, methoxymethyl, ethoxymethyl, methylthiomethyl, acetamidemethyl, trifluoroethyl, (2-methoxyethoxy)methyl, acetoxymethyl, 2-carboxy-1-cyclohexyl, 2-oxopropyl, 4-oxo-1-adamantyl, and 3-oxocyclohexyl.

With respect to the synthesis of the sulfonium salt having an anion of formula (1A'), reference may be made to JP-A 2007-145797, JP-A 2008-106045, JP-A 2009-007327, and JP-A 2009-258695. Also useful are the sulfonium salts described in JP-A 2010-215608, JP-A 2012-041320, JP-A 2012-106986, and JP-A 2012-153644.

Examples of the anion having formula (1A) are shown below, but not limited thereto.

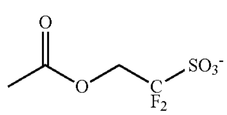
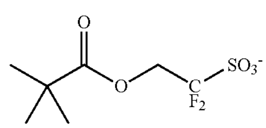
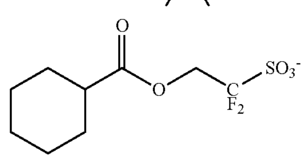
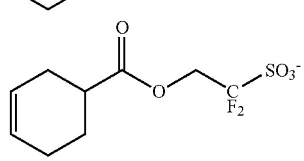
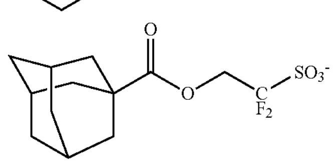
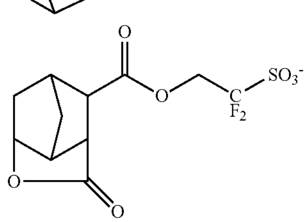

-continued

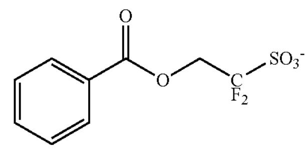
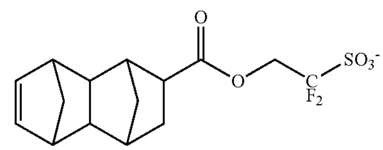
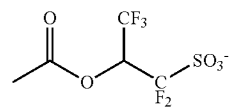
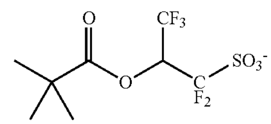
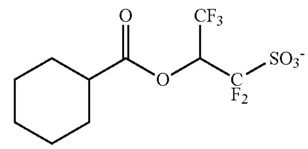
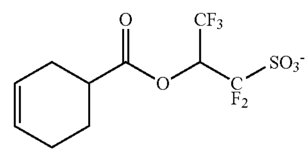
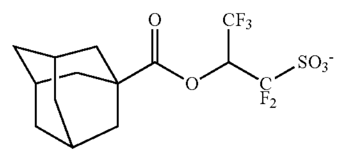
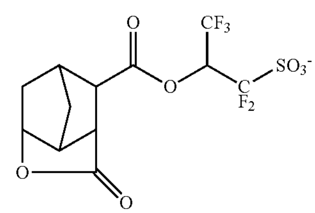
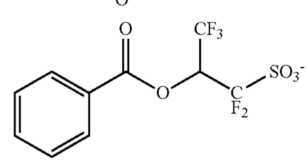
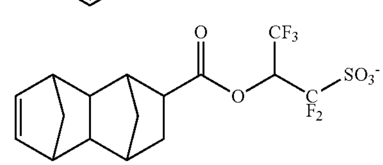
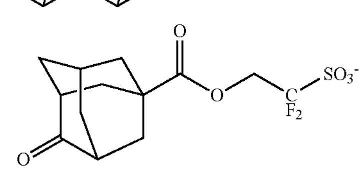
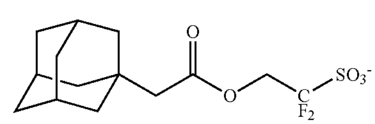

-continued

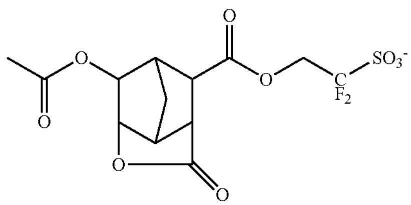

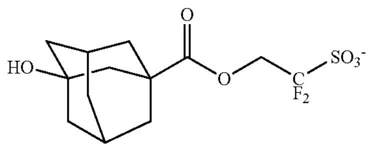

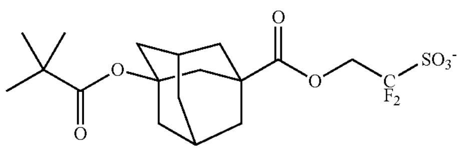

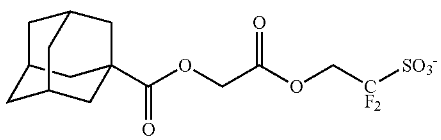

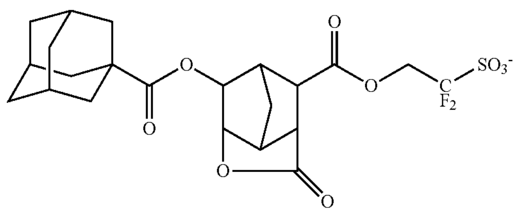

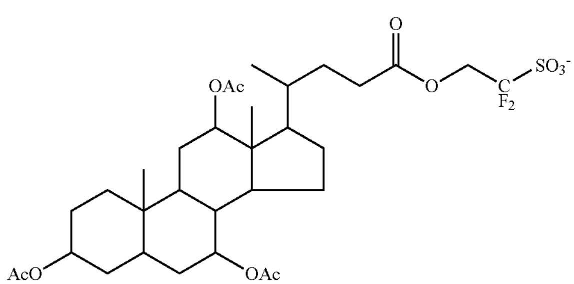

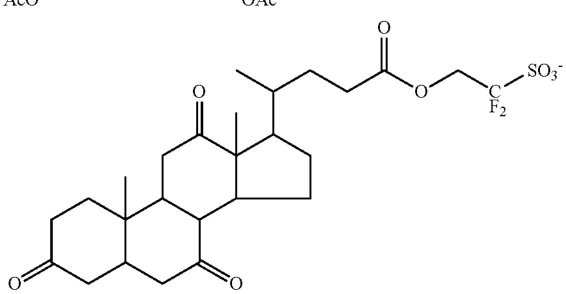

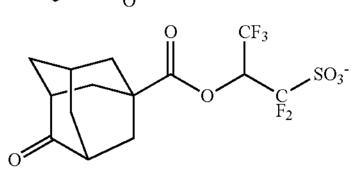

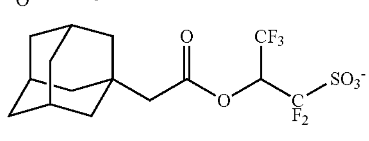

-continued

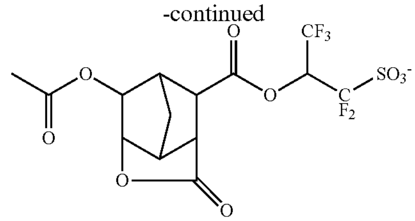

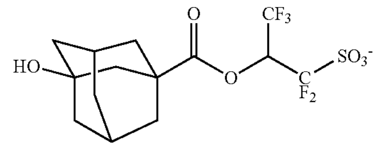

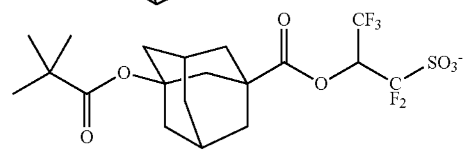

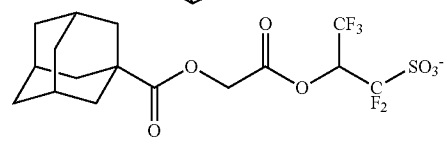

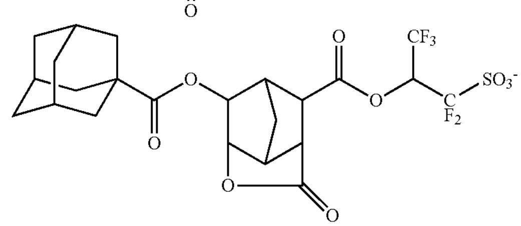

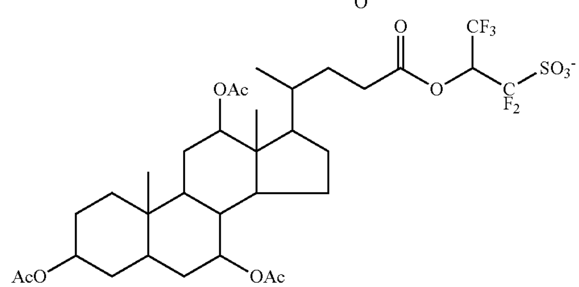

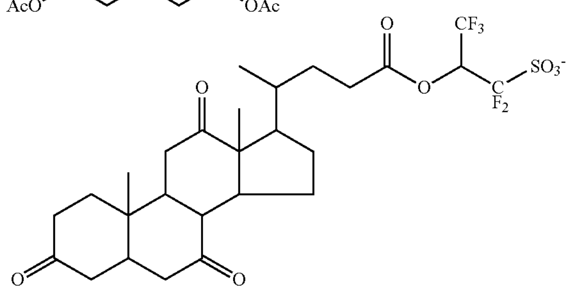

In formula (1B), $R^{fb1}$ and $R^{fb2}$ are each independently fluorine or a $C_1$-$C_{40}$ hydrocarbyl group which may contain a heteroatom. The hydrocarbyl group may be saturated or unsaturated and straight, branched or cyclic, and examples thereof are as exemplified above for $R^{107}$. Preferably $R^{fb1}$ and $R^{fb2}$ are fluorine or $C_1$-$C_4$ straight fluorinated alkyl groups. Also, $R^{fb1}$ and $R^{fb2}$ may bond together to form a ring with the linkage: —$CF_2$—$SO_2$—N'—$SO_2$—$CF_2$— to which they are attached. It is preferred that a combination of $R^{fb1}$ and $R^{fb2}$ be a fluorinated ethylene or fluorinated propylene group.

In formula (1C), $R^{fc1}$, $R^{fc2}$ and $R^{fc3}$ are each independently fluorine or a $C_1$-$C_{40}$ hydrocarbyl group which may contain a heteroatom. The hydrocarbyl group may be saturated or unsaturated and straight, branched or cyclic, and examples thereof are as exemplified above for $R^{107}$. Preferably $R^{fc1}$, $R^{fc2}$ and $R^{fc3}$ are fluorine or $C_1$-$C_4$ straight fluorinated alkyl groups. Also, $R^{fc1}$ and $R^{fc2}$ may bond together to form a ring with the linkage: —$CF_2$—$SO_2$—$C^-$—$SO_2$—$CF_2$— to which they are attached. It is preferred that a combination of $R^{fc1}$ and $R^{fc2}$ be a fluorinated ethylene or fluorinated propylene group.

In formula (1D), $R^{fd}$ is a $C_1$-$C_{40}$ hydrocarbyl group which may contain a heteroatom. The hydrocarbyl group may be saturated or unsaturated and straight, branched or cyclic, and examples thereof are as exemplified above for $R^{107}$.

With respect to the synthesis of the sulfonium salt having an anion of formula (1D), reference may be made to JP-A 2010-215608 and JP-A 2014-133723.

Examples of the anion having formula (1D) are shown below, but not limited thereto.

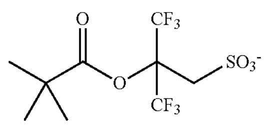

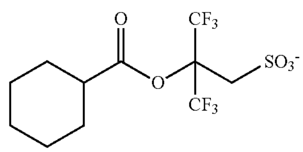

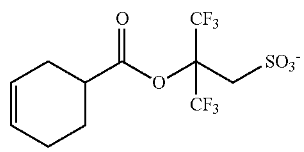

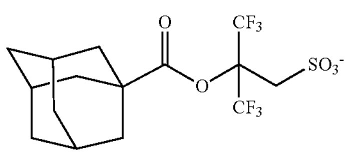

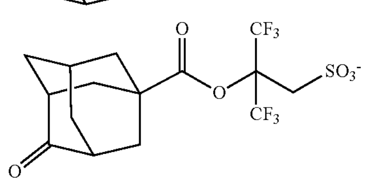

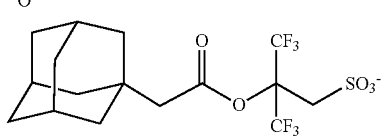

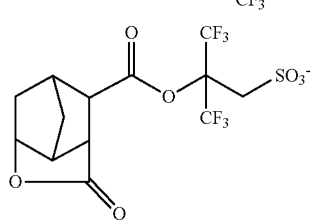

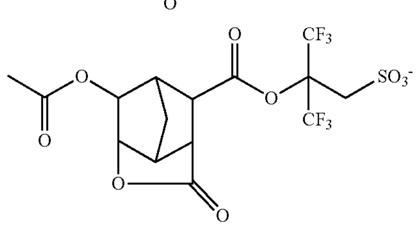

-continued

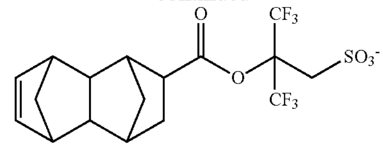

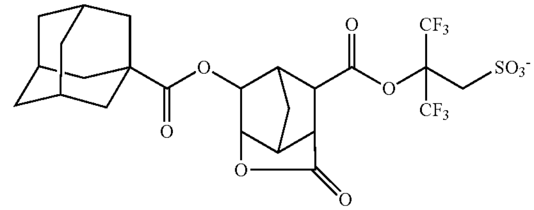

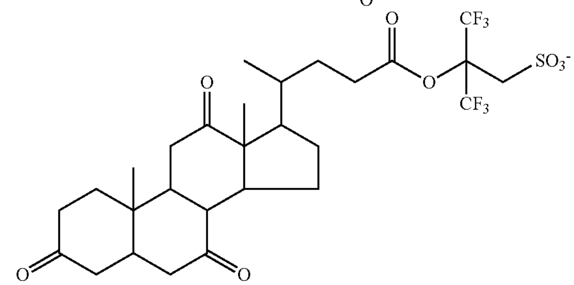

Notably, the compound having the anion of formula (1D) does not have fluorine at the α-position relative to the sulfo group, but two trifluoromethyl groups at the β-position. For this reason, it has a sufficient acidity to sever the acid labile groups in the base polymer. Thus the compound is an effective PAG.

Another preferred PAG is a compound having the formula (2).

$$R^{201}-\underset{\underset{R^{202}}{|}}{S^+}-R^{203}-L^A-\left(\begin{array}{c}X^C\\|\\C\\|\\X^D\end{array}\right)_k-\begin{array}{c}X^A\\|\\C\\|\\X^B\end{array}-SO_3^- \qquad (2)$$

In formula (2), $R^{201}$ and $R^{202}$ are each independently a $C_1$-$C_{30}$ hydrocarbyl group which may contain a heteroatom. $R^{203}$ is a $C_1$-$C_{30}$ hydrocarbylene group which may contain a heteroatom. Any two of $R^{201}$, $R^{202}$ and $R^{203}$ may bond together to form a ring with the sulfur atom to which they are attached. Examples of the ring are as exemplified above for the ring that $R^{101}$ and $R^{102}$ in formula (1-1), taken together, form with the sulfur atom to which they are attached.

The hydrocarbyl groups $R^{201}$ and $R^{202}$ may be saturated or unsaturated and straight, branched or cyclic. Examples thereof include alkyl groups such as methyl, ethyl, propyl, isopropyl, n-butyl, sec-butyl, tert-butyl, n-pentyl, tert-pentyl, n-hexyl, n-octyl, 2-ethylhexyl, n-nonyl, and n-decyl; cyclic saturated hydrocarbyl groups such as cyclopentyl, cyclohexyl, cyclopentylmethyl, cyclopentylethyl, cyclopentylbutyl, cyclohexylmethyl, cyclohexylethyl, cyclohexylbutyl, norbornyl, tricyclo[5.2.1.$0^{2,6}$]decanyl, and adamantyl; aryl groups such as phenyl, naphthyl, and anthracenyl. In the foregoing groups, some hydrogen may be substituted by a moiety containing a heteroatom such as oxygen, sulfur, nitrogen or halogen, and some carbon may be replaced by a moiety containing a heteroatom such as oxygen, sulfur or nitrogen, so that the group may contain a hydroxyl, cyano, carbonyl, ether bond, ester bond, sulfonate bond, carbonate, lactone ring, sultone ring, carboxylic anhydride or haloalkyl moiety.

The hydrocarbylene group $R^{203}$ may be saturated or unsaturated and straight, branched or cyclic. Examples thereof include alkanediyl groups such as methylene, ethylene, propane-1,3-diyl, butane-1,4-diyl, pentane-1,5-diyl, hexane-1,6-diyl, heptane-1,7-diyl, octane-1,8-diyl, nonane-1,9-diyl, decane-1,10-diyl, undecane-1,11-diyl, dodecane-1,12-diyl, tridecane-1,13-diyl, tetradecane-1,14-diyl, pentadecane-1,15-diyl, hexadecane-1,16-diyl, and heptadecane-1,17-diyl; cyclic saturated hydrocarbylene groups such as cyclopentanediyl, cyclohexanediyl, norbornanediyl and adamantanediyl; and arylene groups such as phenylene, methylphenylene, ethylphenylene, n-propylphenylene, isopropylphenylene, n-butylphenylene, isobutylphenylene, sec-butylphenylene, tert-butylphenylene, naphthylene, methylnaphthylene, ethylnaphthylene, n-propylnaphthylene, isopropylnaphthylene, n-butylnaphthylene, isobutylnaphthylene, sec-butylnaphthylene, and tert-butylnaphthylene. In these groups, some or all of the hydrogen atoms may be substituted by a moiety containing a heteroatom such as oxygen, sulfur, nitrogen or halogen, or some carbon may be replaced by a moiety containing a heteroatom such as oxygen, sulfur or nitrogen, so that the group may contain a hydroxyl, cyano, carbonyl, ether bond, ester bond, sulfonate bond, carbonate, lactone ring, sultone ring, carboxylic anhydride or haloalkyl moiety. Of the heteroatoms, oxygen is to preferred.

In formula (2), $L^A$ is a single bond, ether bond or a $C_1$-$C_{20}$ hydrocarbylene group which may contain a heteroatom. The hydrocarbylene group may be saturated or unsaturated and straight, branched or cyclic. Examples thereof are as exemplified above for $R^{203}$.

In formula (2), $X^A$, $X^B$, $X^C$ and $X^D$ are each independently hydrogen, fluorine or trifluoromethyl, with the proviso that at least one of $X^A$, $X^B$, $X^C$ and $X^D$ is fluorine or trifluoromethyl, and k is an integer of 0 to 3.

Of the PAGs having formula (2), those having formula (2') are preferred.

(2')

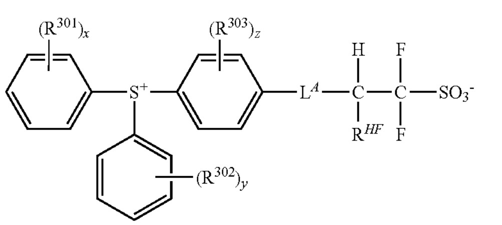

In formula (2'), $L^A$ is as defined above. $R^{HF}$ is hydrogen or trifluoromethyl, preferably trifluoromethyl. $R^{301}$, $R^{302}$ and $R^{303}$ are each independently hydrogen or a $C_1$-$C_{20}$ hydrocarbyl group which may contain a heteroatom. The hydrocarbyl group may be saturated or unsaturated and straight, branched or cyclic. Examples thereof are as exemplified above for $R^{107}$ in formula (1A'). The subscripts x and y are each independently an integer of 0 to 5, and z is an integer of 0 to 4.

Of the foregoing PAGs, those having an anion of formula (1A') or (1D) are especially preferred because of reduced acid diffusion and high solubility in the resist solvent. Also those having an anion of formula (2') are especially preferred because of extremely reduced acid diffusion.

Also a sulfonium or iodonium salt having an iodized or brominated aromatic ring-containing anion may be used as the PAG. Suitable are sulfonium and iodonium salts having the formulae (3-1) and (3-2).

(3-1)

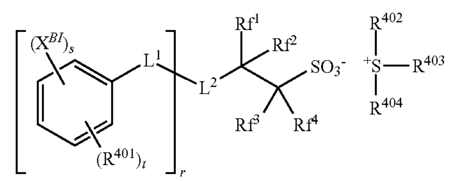

(3-2)

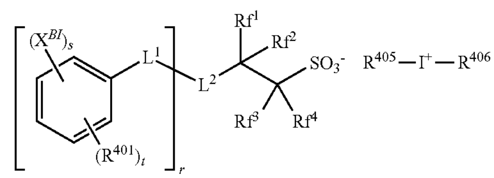

In formulae (3-1) and (3-2), r is an integer of 1 to 3, s is an integer of 1 to 5, t is an integer of 0 to 3, and $1 \leq s+t \leq 5$. Preferably, s is an integer of 1 to 3, more preferably 2 or 3, and t is an integer of 0 to 2.

$X^{BI}$ is iodine or bromine, and may be the same or different when r and/or s is 2 or more.

$L^1$ is a single bond, ether bond, ester bond, or a $C_1$-$C_6$ saturated hydrocarbylene group which may contain an ether bond or ester bond. The saturated hydrocarbylene group may be straight, branched or cyclic.

$L^2$ is a single bond or a $C_1$-$C_{20}$ divalent linking group when r=1, or a $C_1$-Cao (r+1)-valent linking group when r=2 or 3, the linking group optionally containing an oxygen, sulfur or nitrogen atom.

$R^{401}$ is a hydroxyl group, carboxyl group, fluorine, chlorine, bromine, amino group, or a $C_1$-$C_{20}$ saturated hydrocarbyl, $C_1$-$C_{20}$ saturated hydrocarbyloxy, $C_2$-$C_{10}$ saturated hydrocarbyloxycarbonyl, $C_2$-$C_{20}$ saturated hydrocarbylcarbonyloxy or $C_1$-$C_{20}$ saturated hydrocarbylsulfonyloxy group, which may contain fluorine, chlorine, bromine, hydroxyl, amino or ether bond, or —$NR^{401A}$—C(═O)—$R^{401B}$ or —$NR^{401A}$—C(═O)—O—$R^{401B}$. $R^{401A}$ is hydrogen or a $C_1$-$C_6$ saturated hydrocarbyl group which may contain halogen, hydroxyl, $C_1$-$C_6$ saturated hydrocarbyloxy, $C_2$-$C_6$ saturated hydrocarbylcarbonyl or $C_2$-$C_6$ saturated hydrocarbylcarbonyloxy moiety. $R^{401B}$ is a $C_1$-$C_{16}$ aliphatic hydrocarbyl or $C_6$-$C_{12}$ aryl group, which may contain halogen, hydroxyl, $C_1$-$C_6$ saturated hydrocarbyloxy, $C_2$-$C_6$ saturated hydrocarbylcarbonyl or $C_2$-$C_6$ saturated hydrocarbylcarbonyloxy moiety. The aliphatic hydrocarbyl group may be saturated or unsaturated and straight, branched or cyclic. The saturated hydrocarbyl, saturated hydrocarbyloxy, saturated hydrocarbyloxycarbonyl, saturated hydrocarbylcarbonyl, and saturated hydrocarbylcarbonyloxy groups may be straight, branched or cyclic. Groups $R^{401}$ may be the same or different when r and/or s is 2 or more. Of these, $R^{401}$ is preferably hydroxyl, —$NR^{401A}$—C(═O)—$R^{401B}$—$NR^{401A}$—C(═O)—O—$R^{401B}$, fluorine, chlorine, bromine, methyl or methoxy.

In formulae (3-1) and (3-2), $Rf^1$ to $Rf^4$ are each independently hydrogen, fluorine or trifluoromethyl, at least one of $Rf^1$ to $Rf^4$ is fluorine or trifluoromethyl, or $Rf^1$ and $Rf^2$, taken together, may form a carbonyl group. Preferably, both $Rf^3$ and $Rf^4$ are fluorine.

$R^{402}$, $R^{403}$, $R^{404}$, $R^{405}$ and $R^{406}$ are each independently a $C_1$-$C_{20}$ hydrocarbyl group which may contain a heteroatom. The hydrocarbyl group may be saturated or unsaturated and straight, branched or cyclic. Examples thereof include $C_1$-$C_{20}$ alkyl, $C_3$-$C_{20}$ cycloalkyl, $C_2$-$C_{20}$ alkenyl, $C_2$-$C_{20}$ alkynyl, $C_6$-$C_{20}$ aryl, and $C_7$-$C_{20}$ aralkyl groups. In these groups, some or all of the hydrogen atoms may be substituted by hydroxyl, carboxyl, halogen, cyano, nitro, mercapto, sultone, sulfone, or sulfonium salt-containing moieties, and some carbon may be replaced by an ether bond, ester bond, carbonyl moiety, amide bond, carbonate moiety or sulfonic acid ester bond. Any two of $R^{402}$, $R^{403}$ and $R^{404}$ may bond together to form a ring with the sulfur atom to which they are attached. Exemplary rings are the same as described above for the ring that $R^{101}$ and $R^{102}$ in formula (1-1), taken together, form with the sulfur atom to which they are attached.

Examples of the cation in the sulfonium salt having formula (3-1) include those exemplified above as the cation in the sulfonium salt having formula (1-1). Examples of the cation in the iodonium salt having formula (3-2) include those exemplified above as the cation in the iodonium salt having formula (1-2).

Examples of the anion in the onium salts having formulae (3-1) and (3-2) are shown below, but not limited thereto. Herein $X^{BI}$ is as defined above.

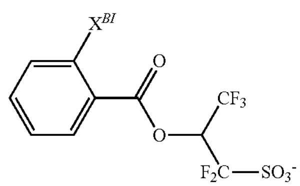

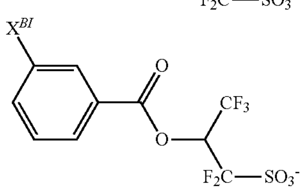

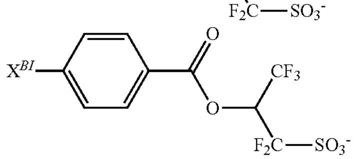

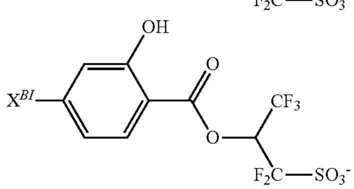

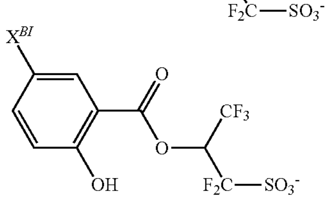

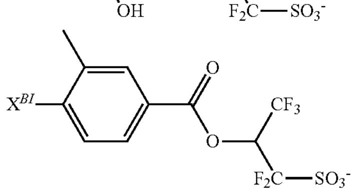

-continued

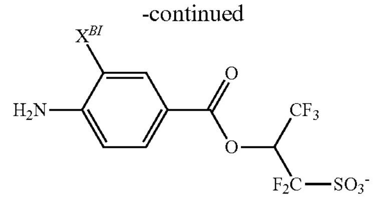

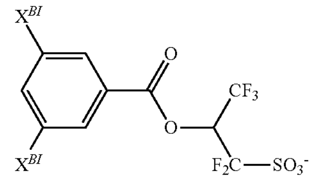

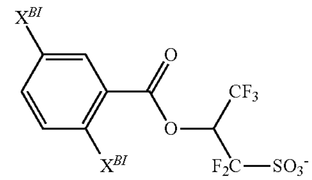

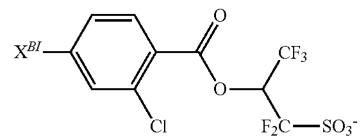

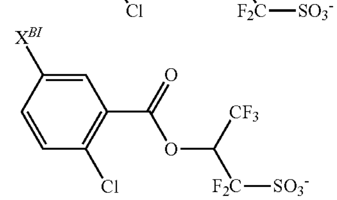

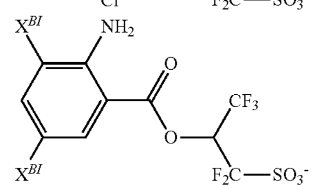

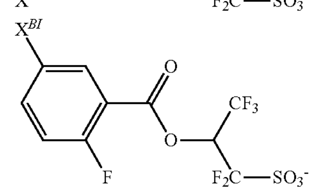

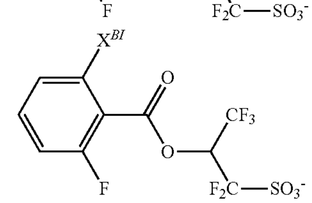

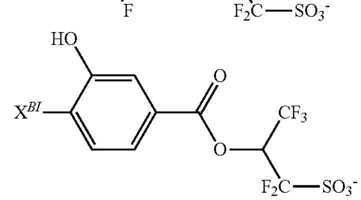

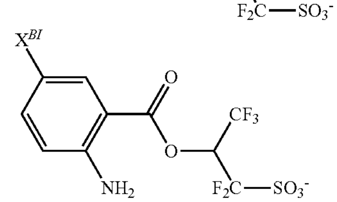

-continued
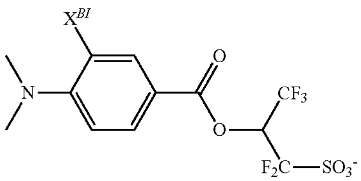
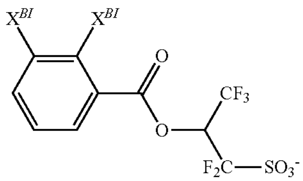
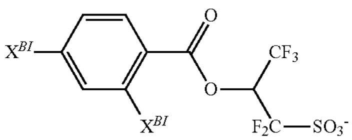
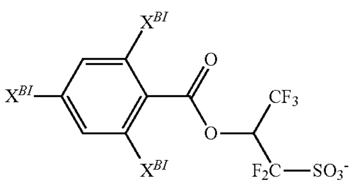
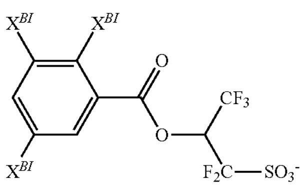
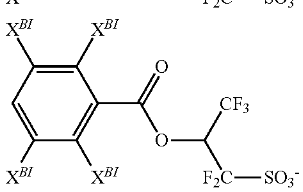
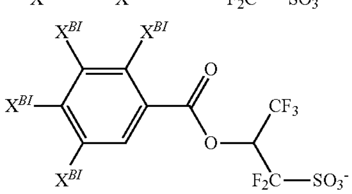
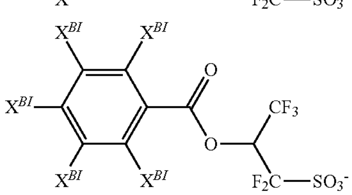
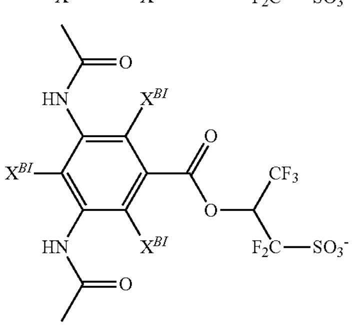
-continued
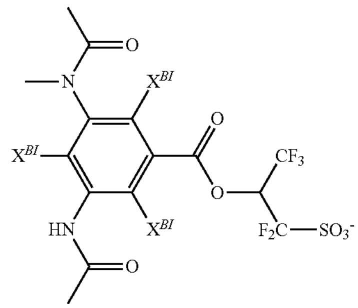
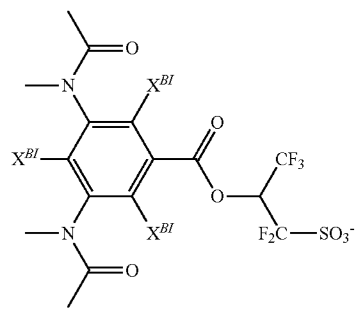
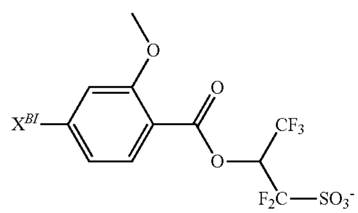
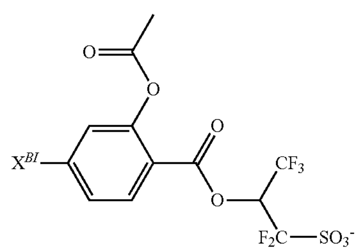
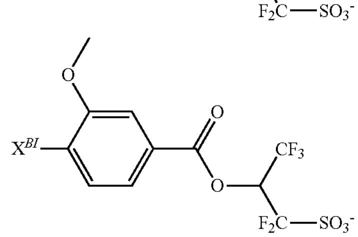
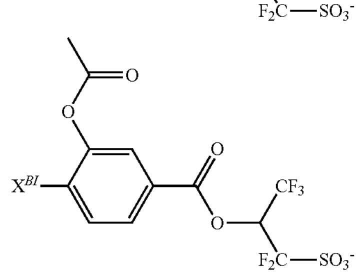

-continued
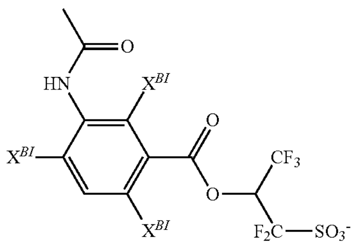
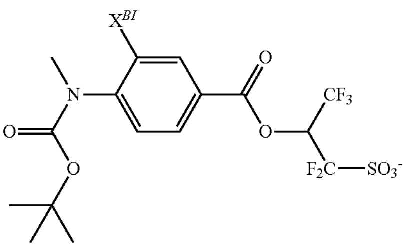
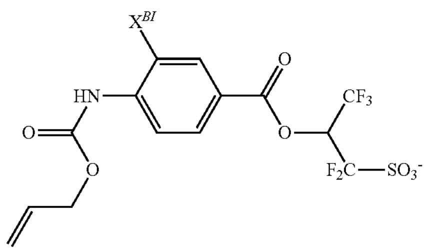
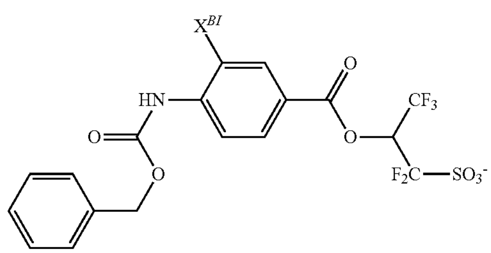
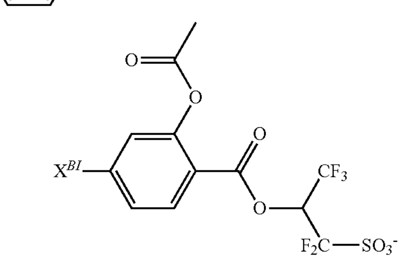
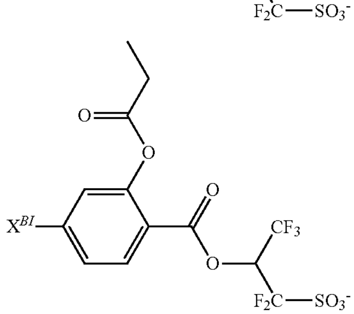
-continued
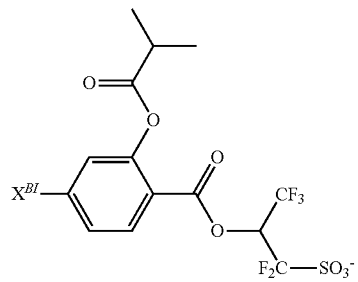
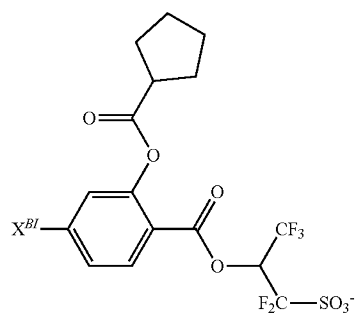
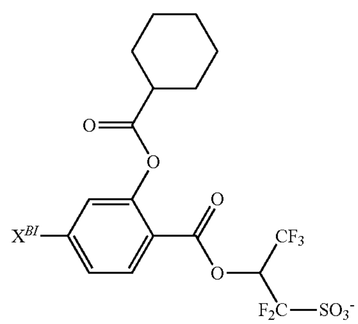
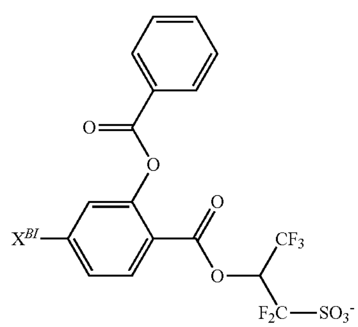
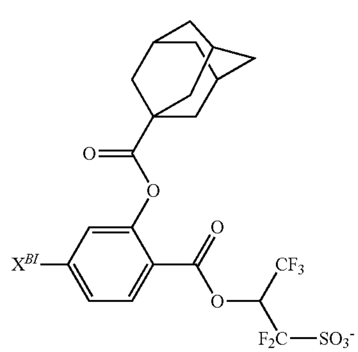

-continued
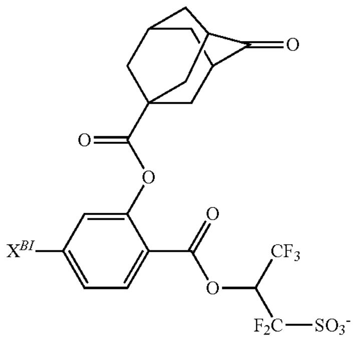
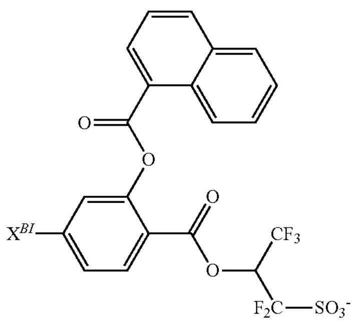
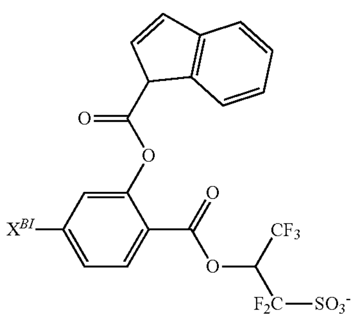
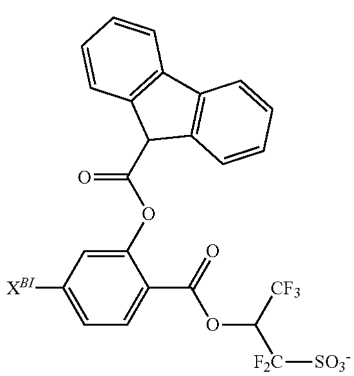
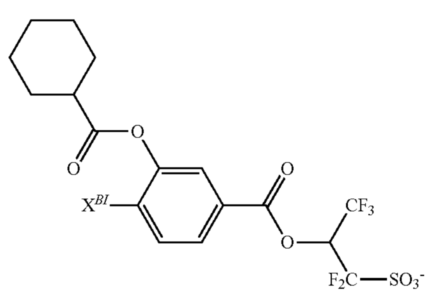
-continued
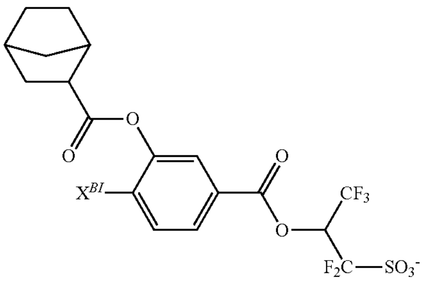
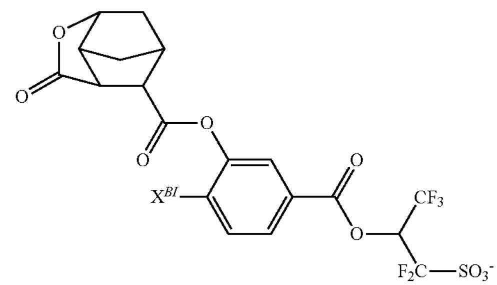
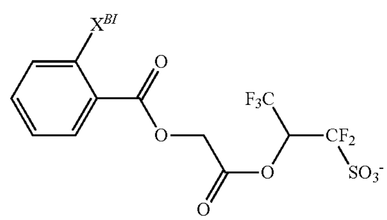
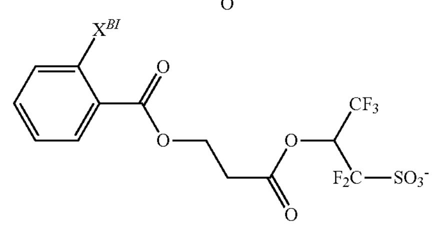
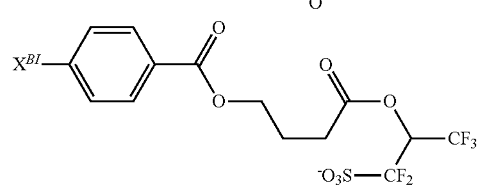
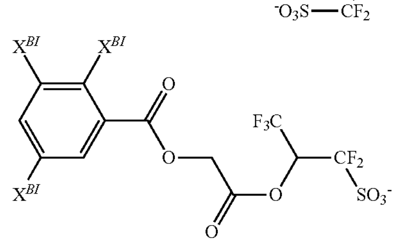
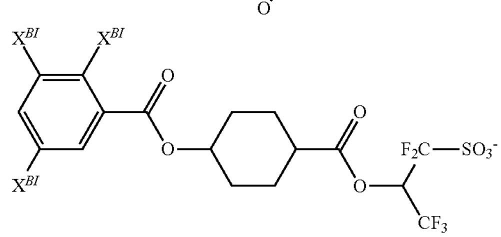

-continued
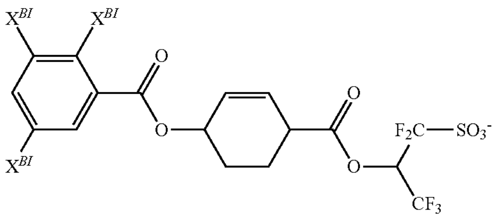
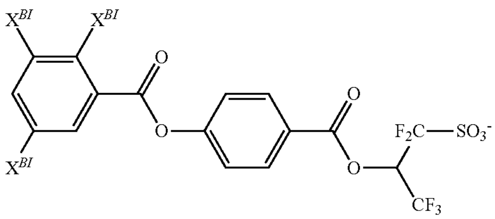
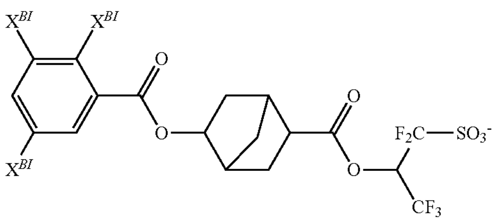
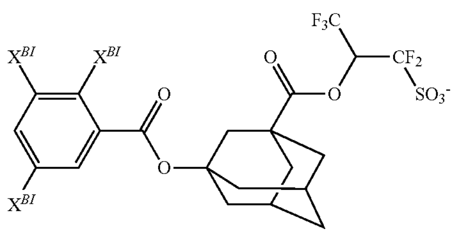
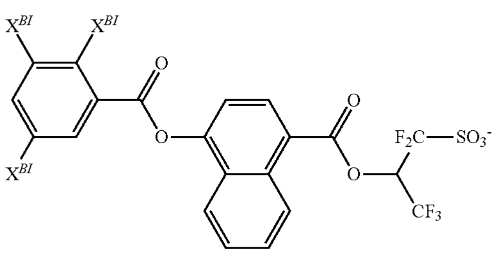
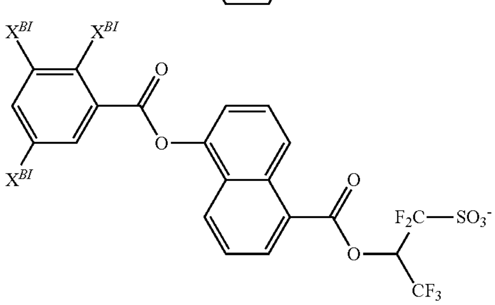
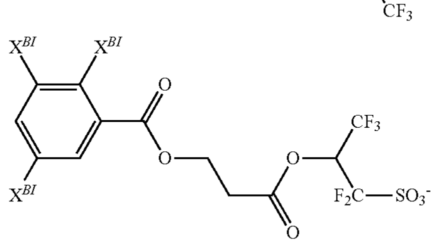
-continued
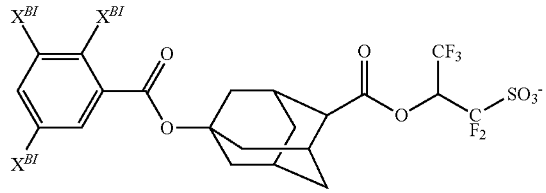
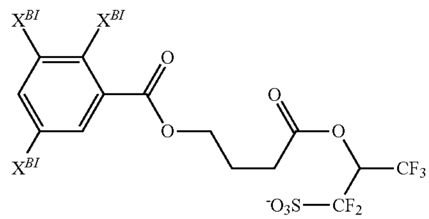
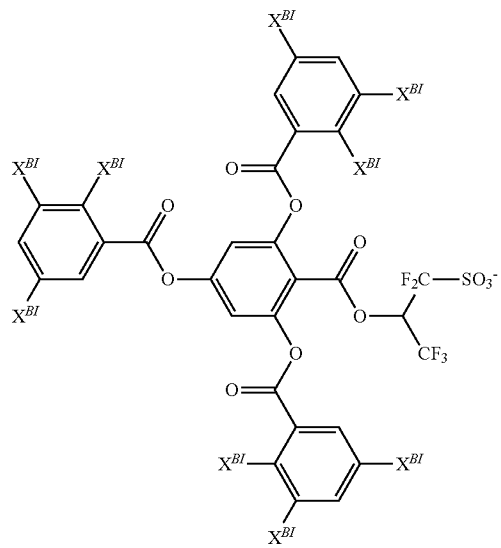
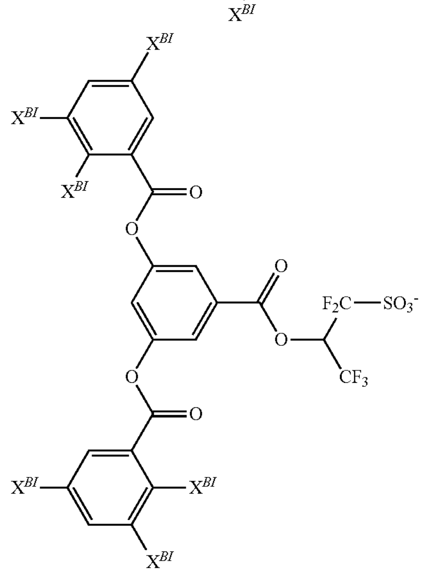
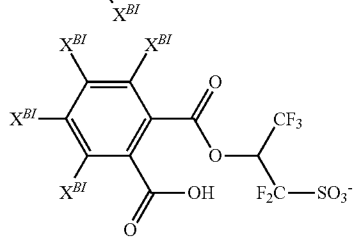

-continued
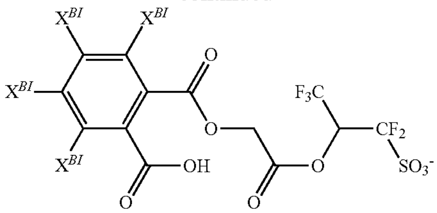
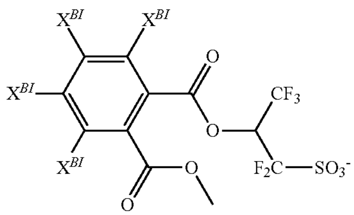
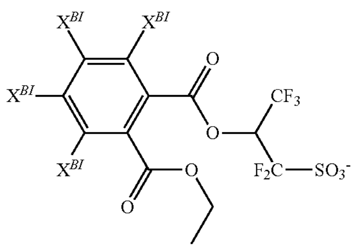
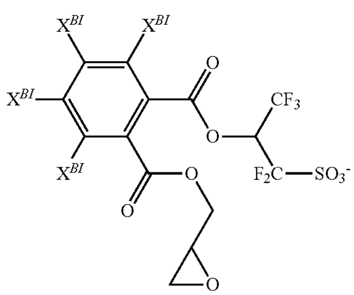
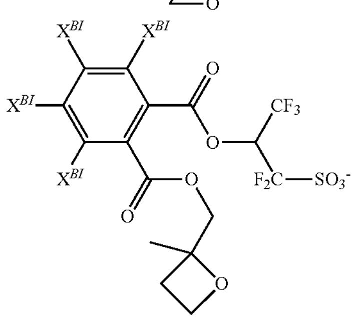
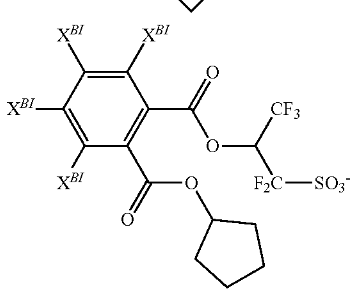
-continued
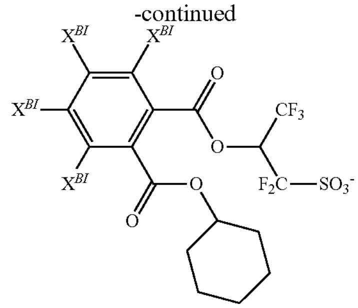
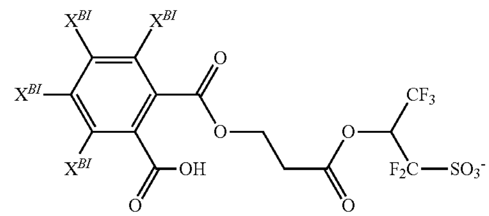
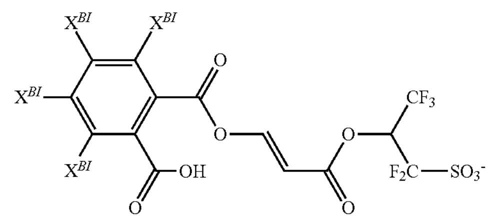
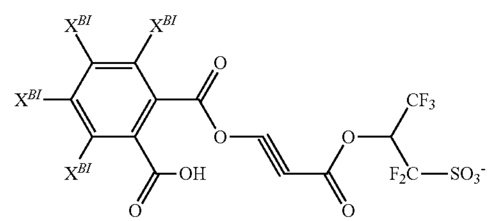
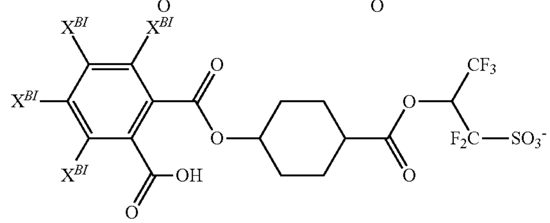
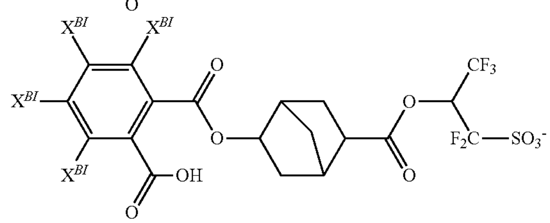
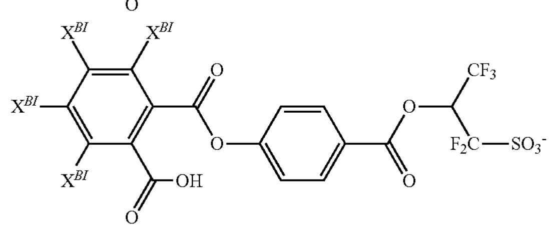

-continued
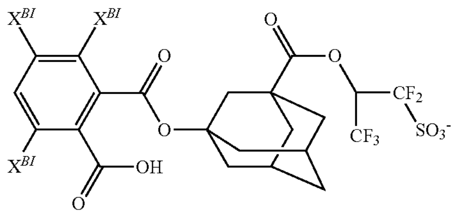
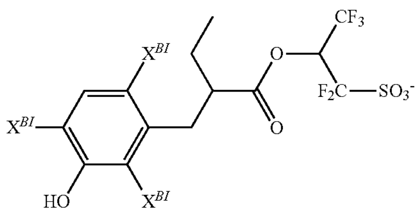
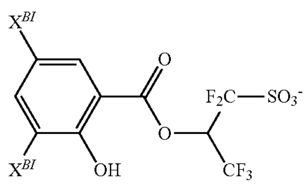
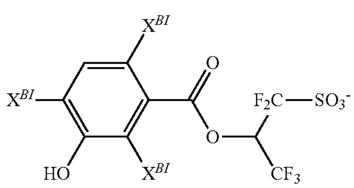
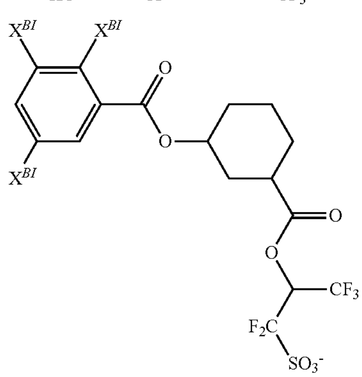
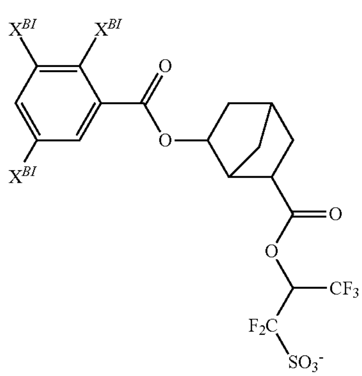
-continued
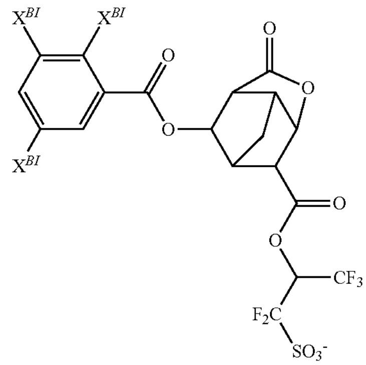
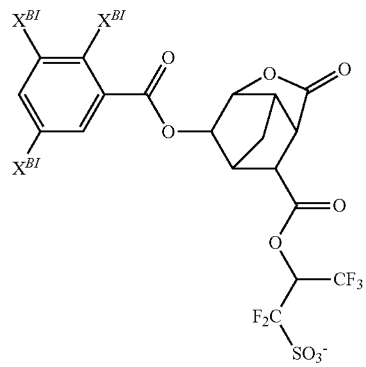
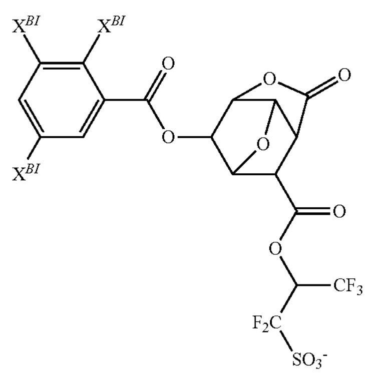
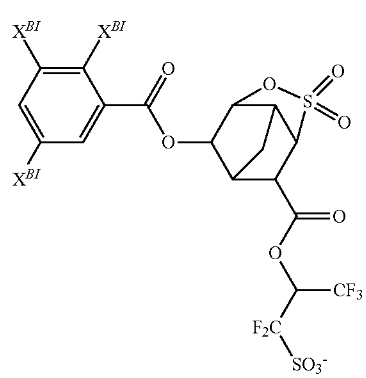

-continued
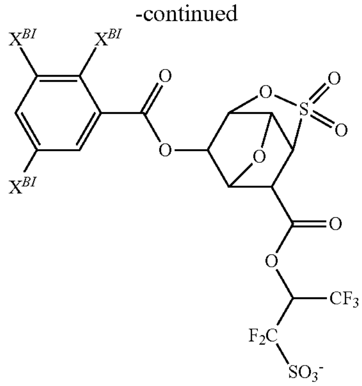
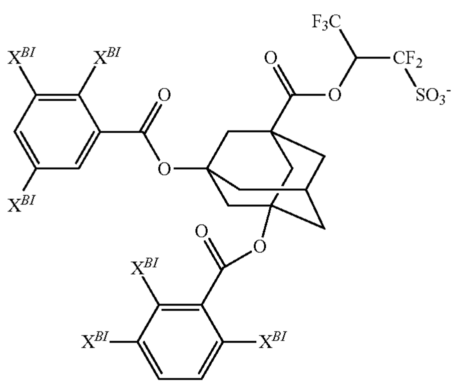
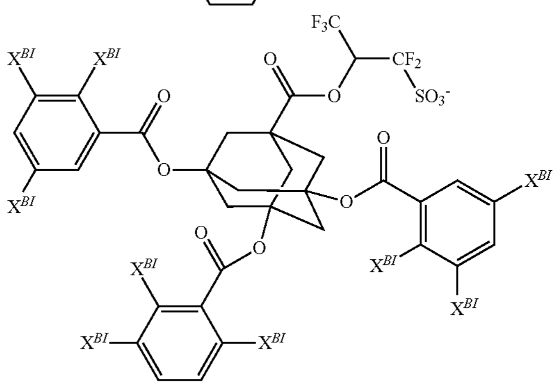
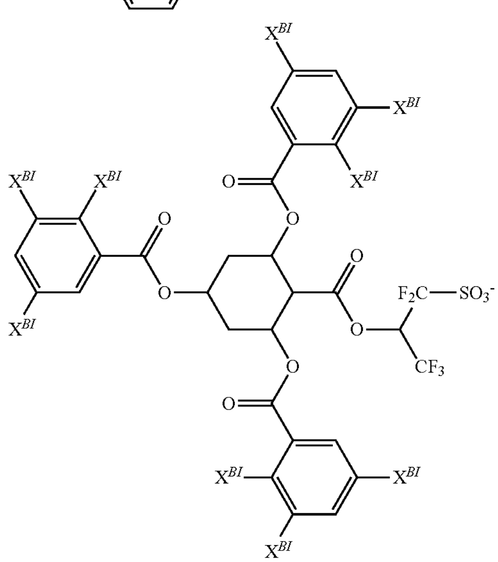
-continued
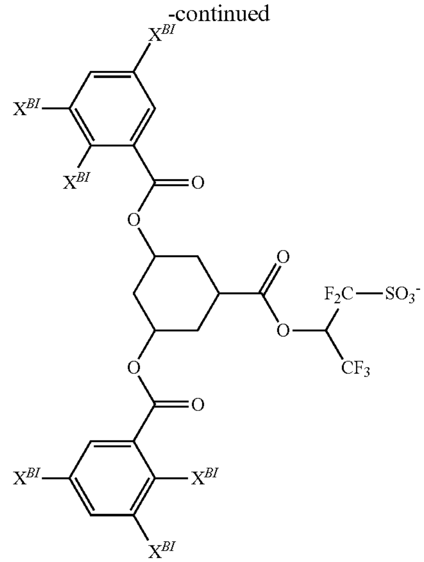
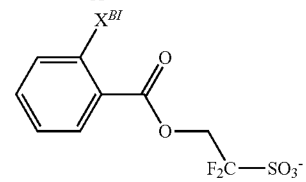
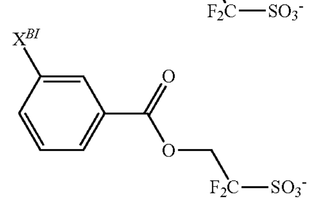
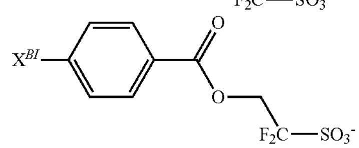
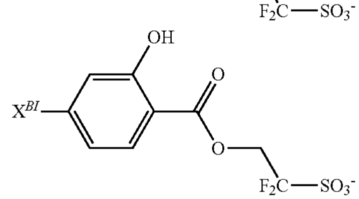
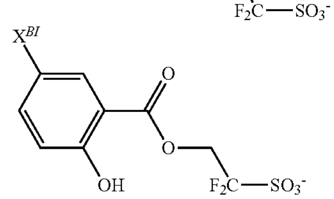
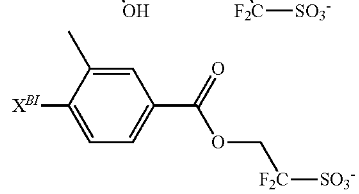
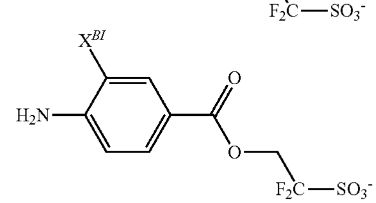

-continued
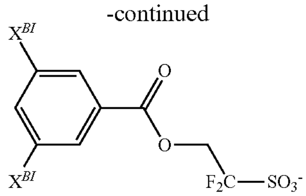
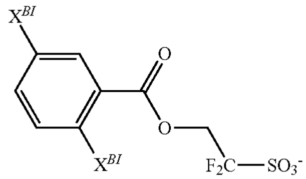
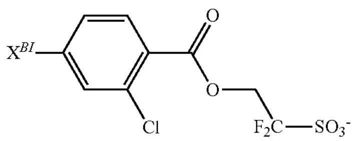
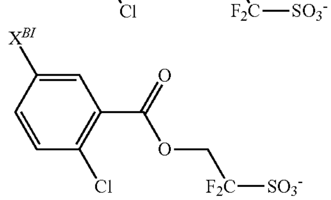
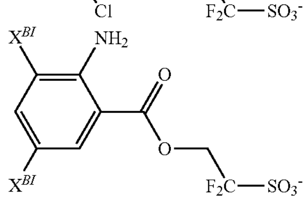
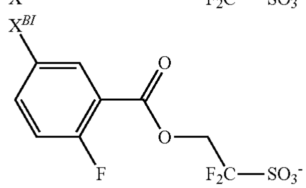
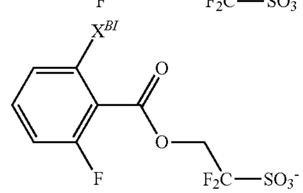
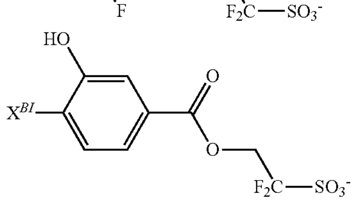
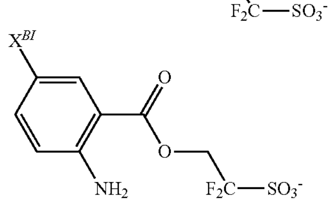
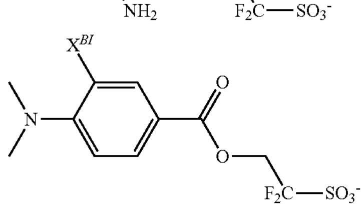
-continued
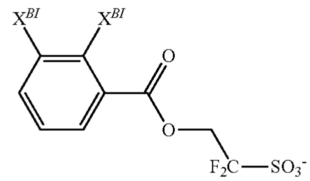
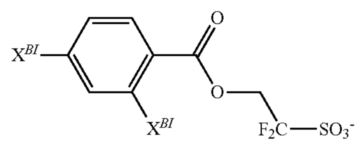
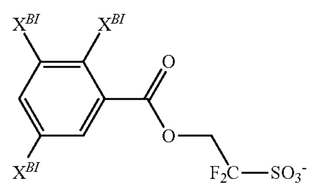
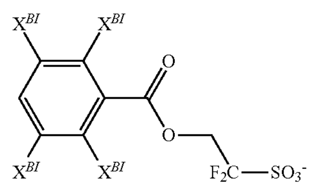
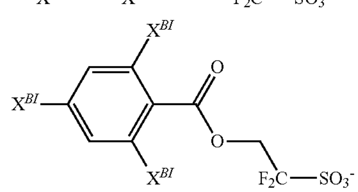
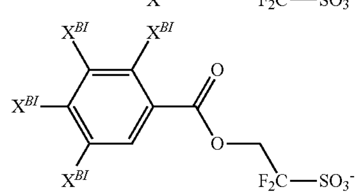
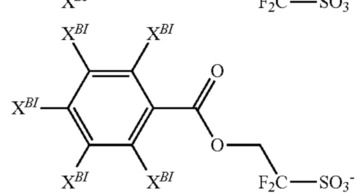
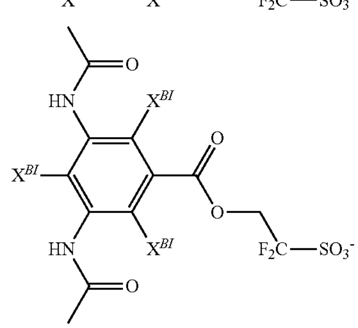

-continued
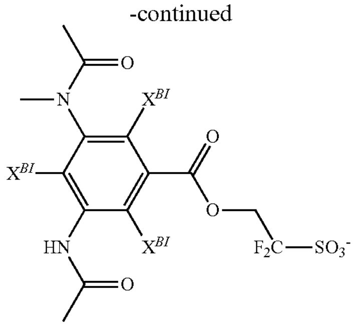
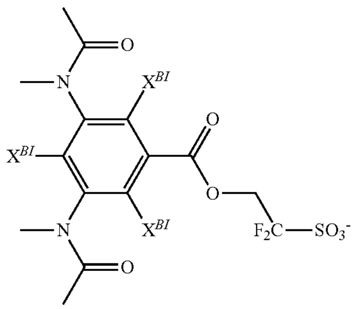
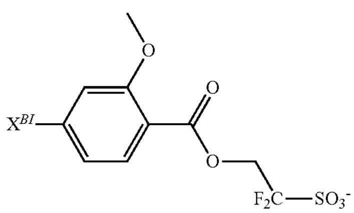
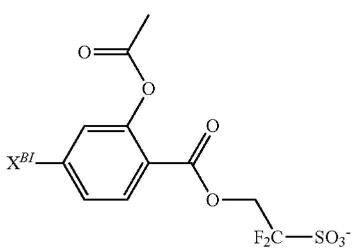
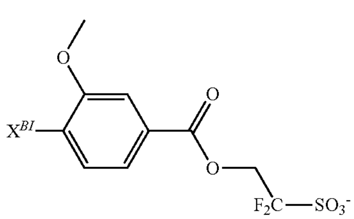
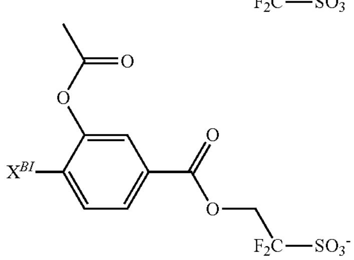
-continued
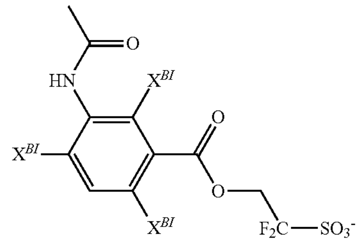
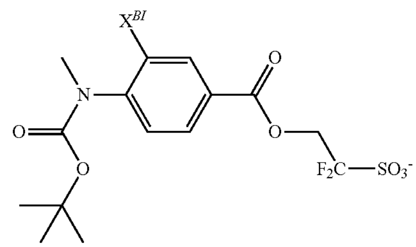
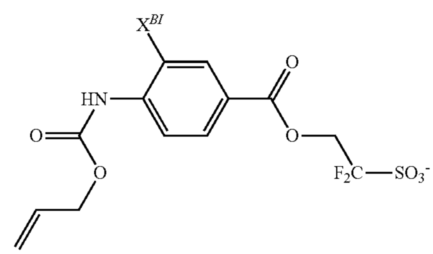
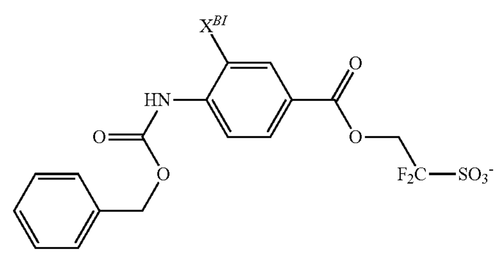
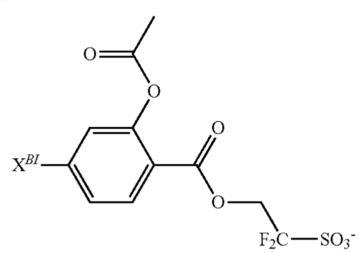
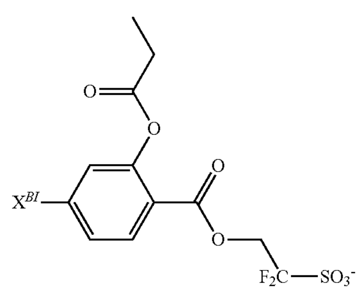

-continued
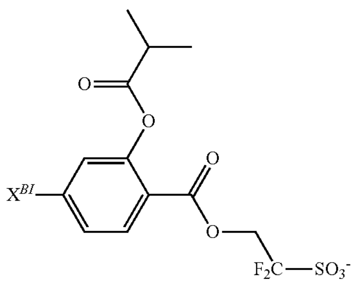
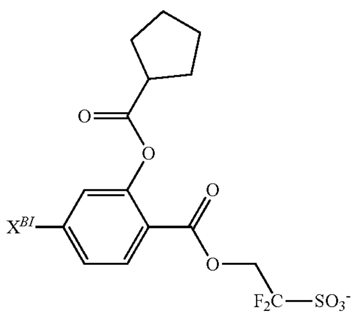
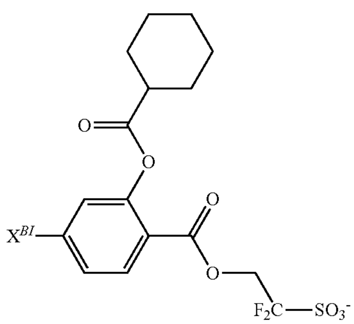
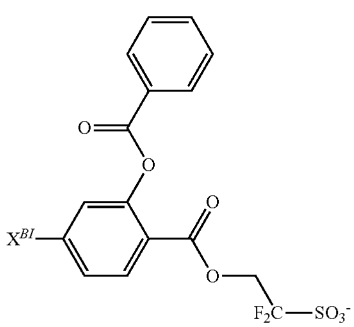
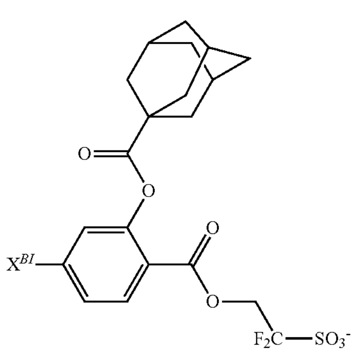
-continued
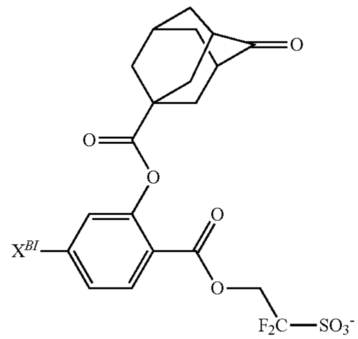
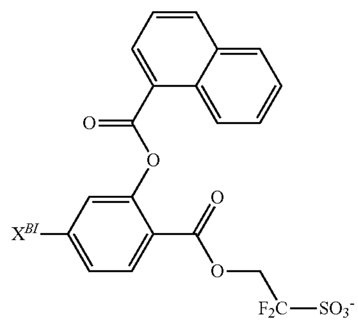
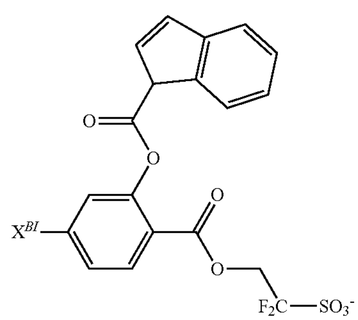
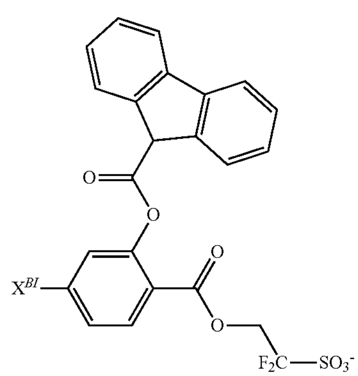
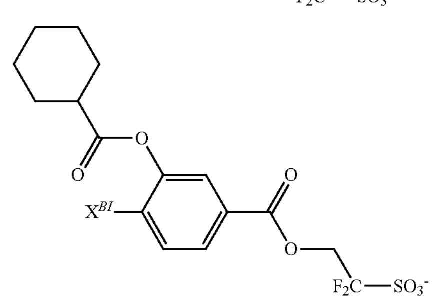

-continued
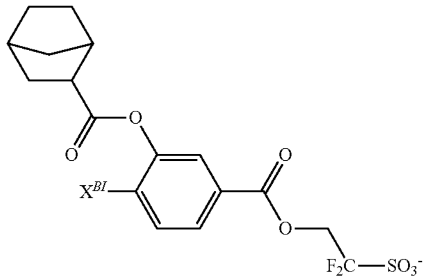
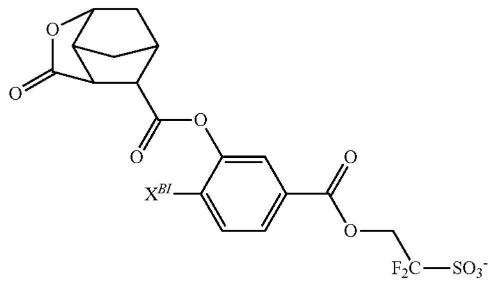
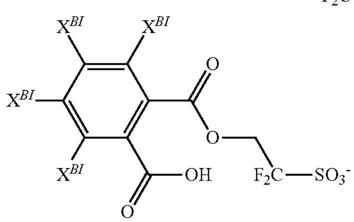
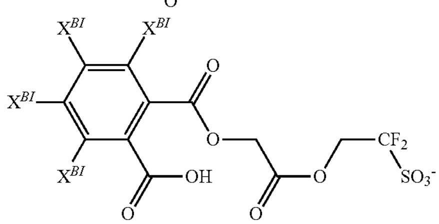
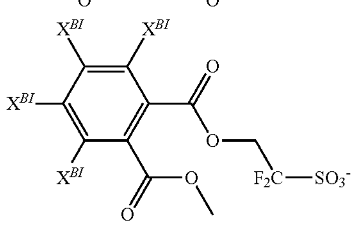
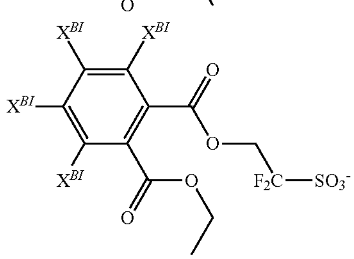
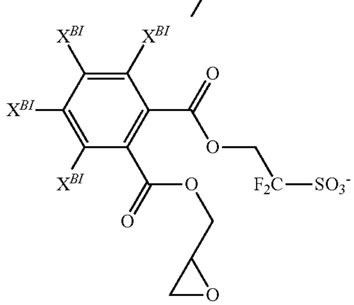
-continued
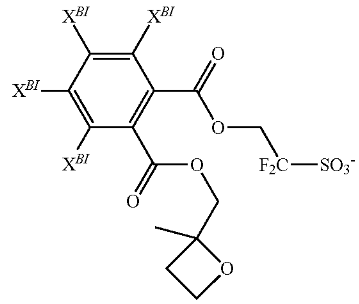
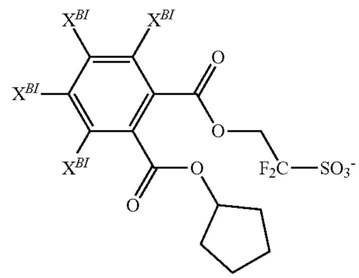
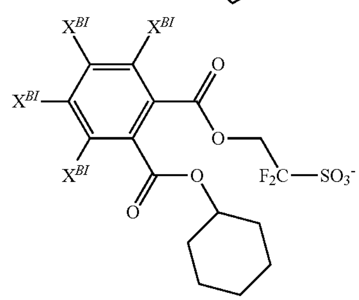
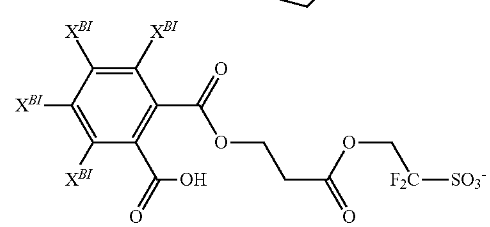
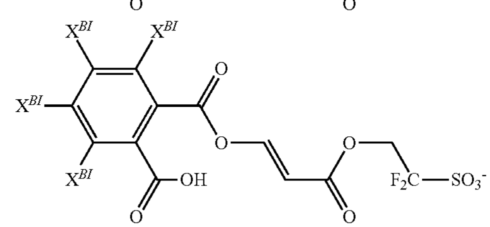
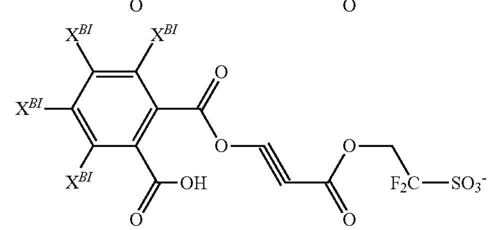
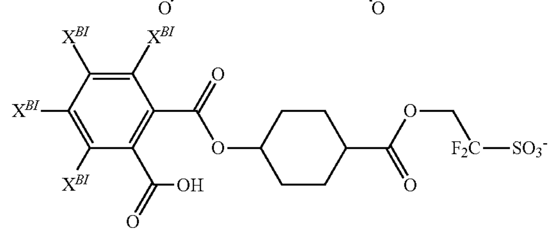

-continued
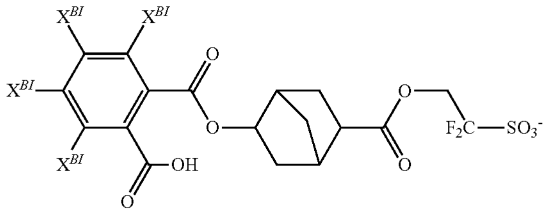
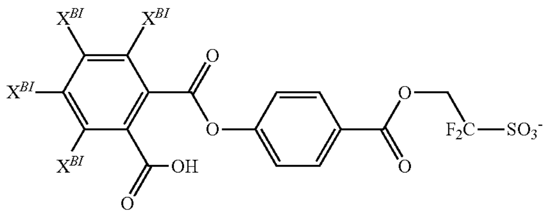
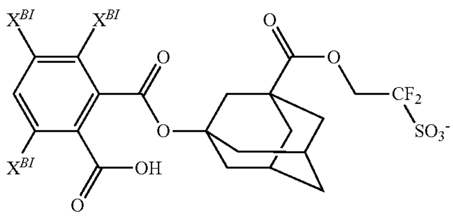
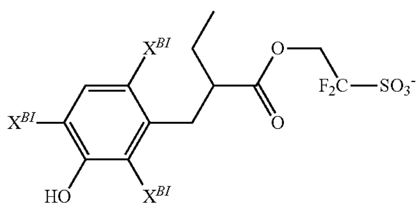
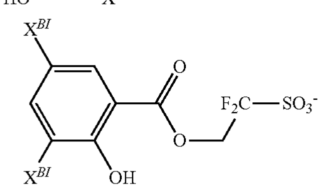
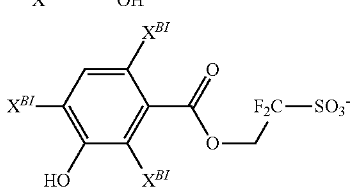
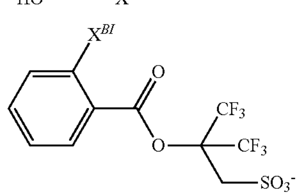
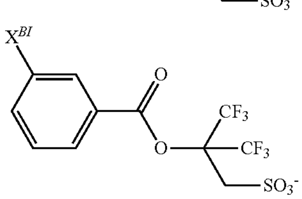
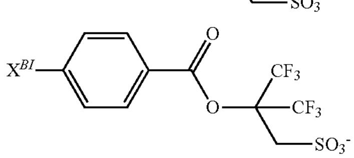
-continued
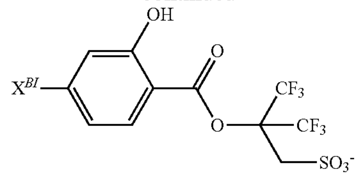
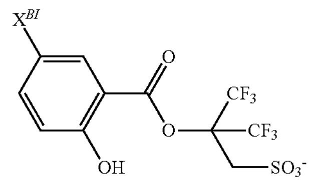
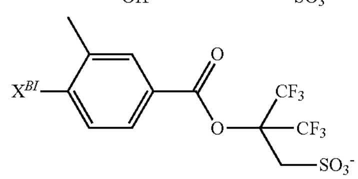
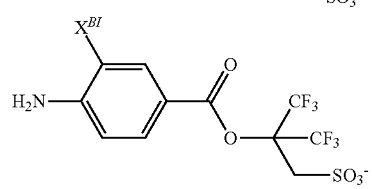
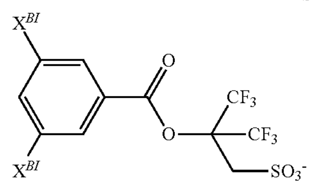
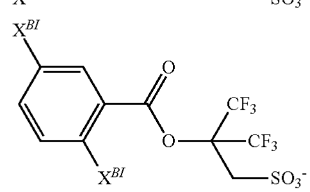
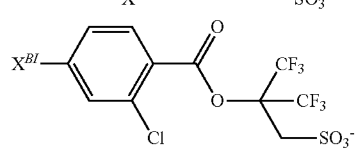
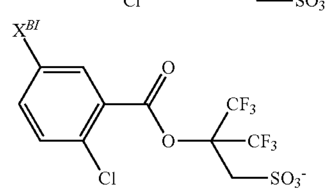
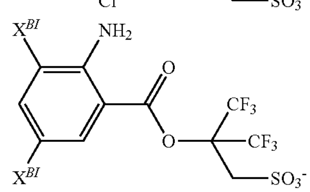
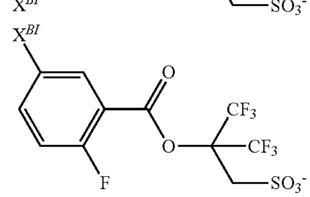

-continued
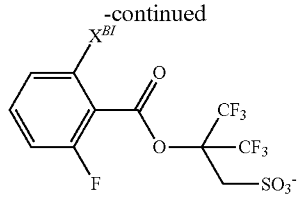
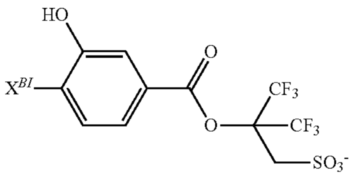
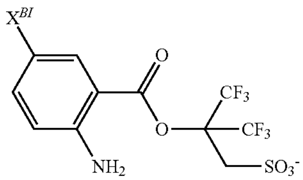
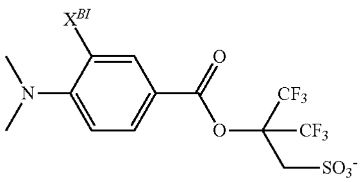
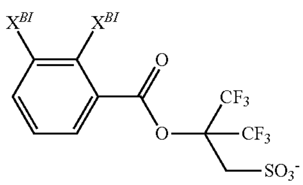
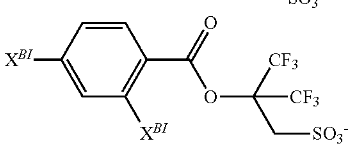
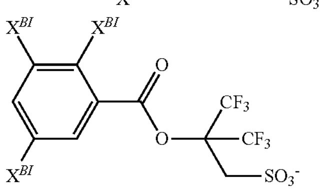
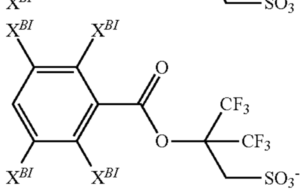
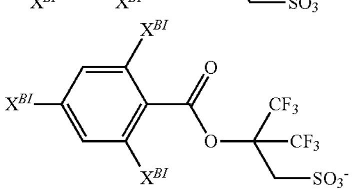
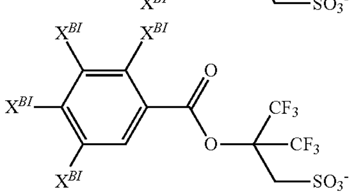
-continued
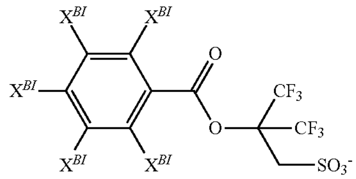
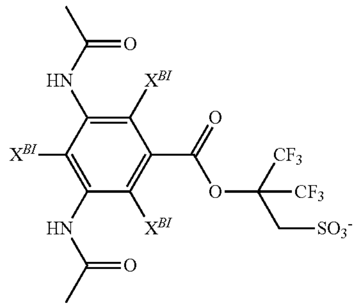
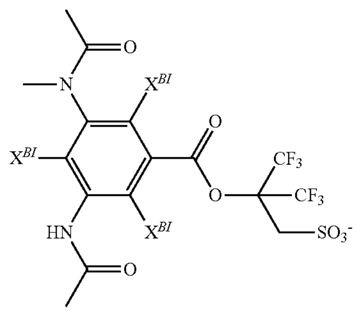
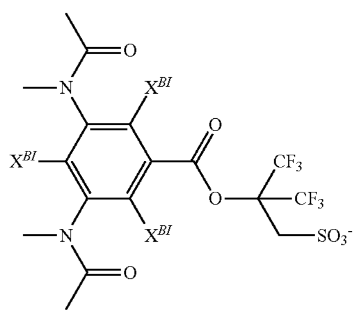
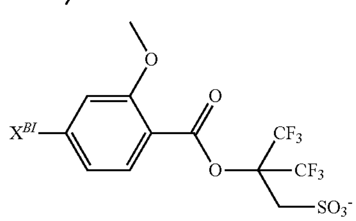
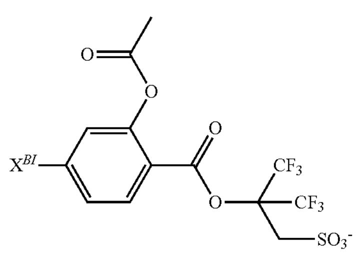

-continued
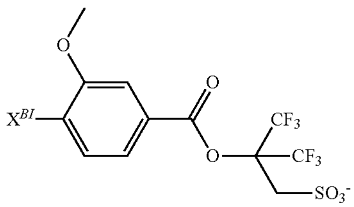
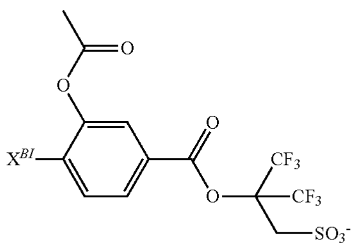
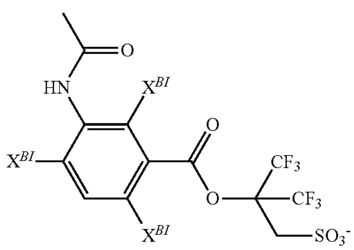
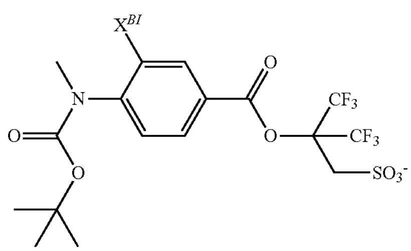
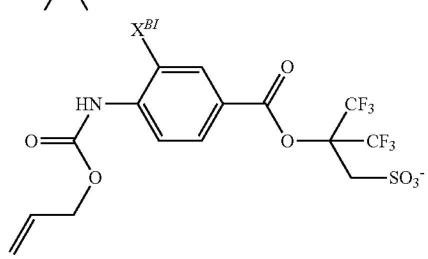
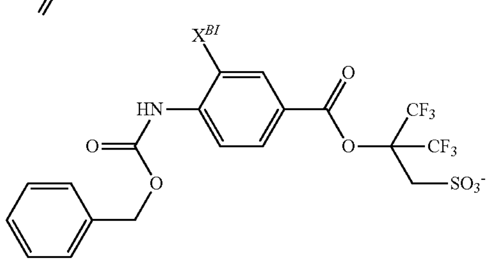
-continued
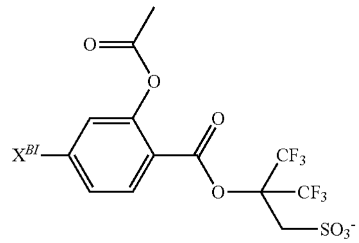
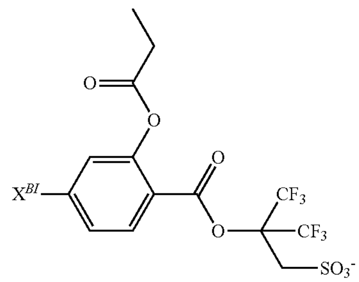
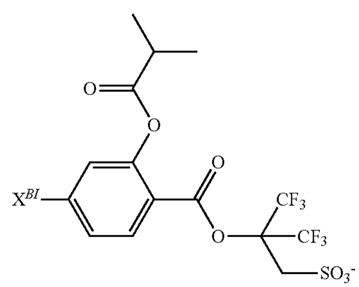
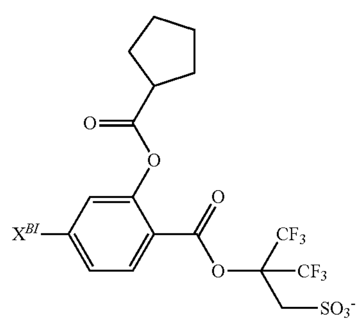
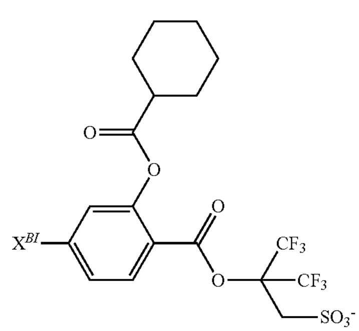

-continued
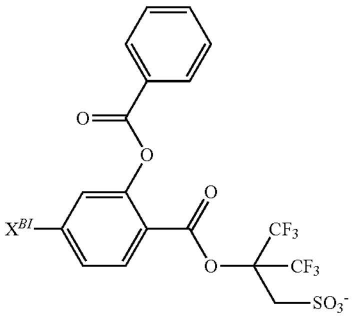
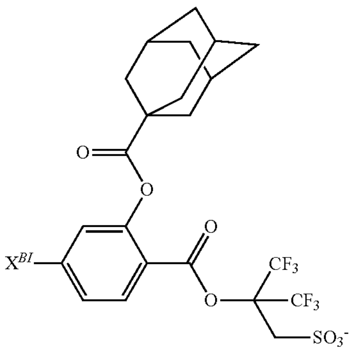
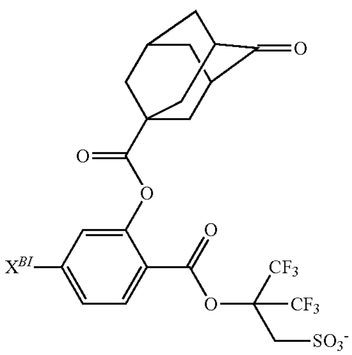
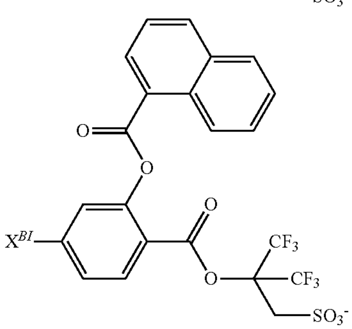
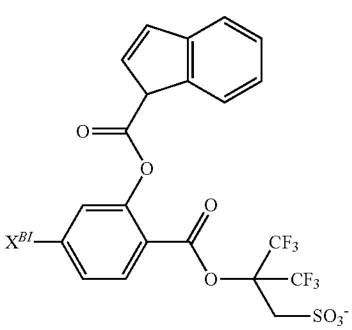
-continued
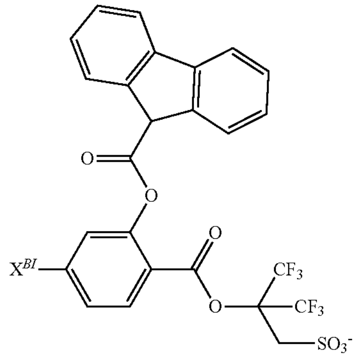
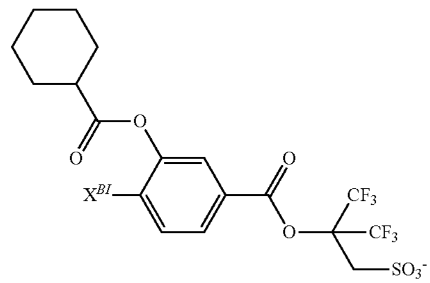
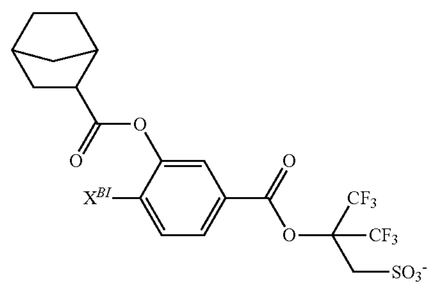
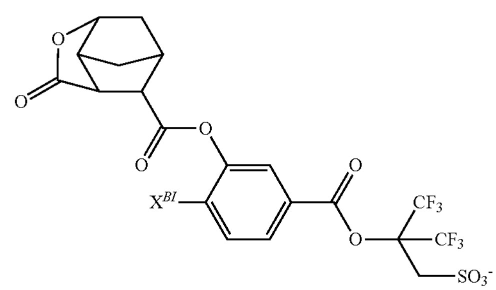
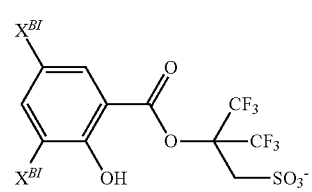
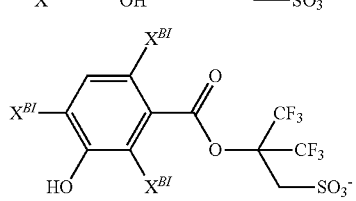

-continued
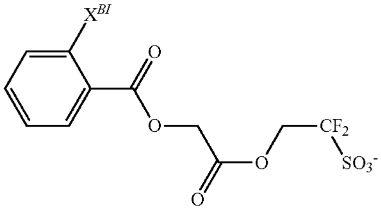
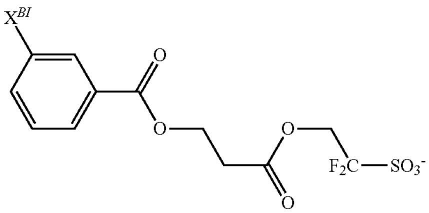
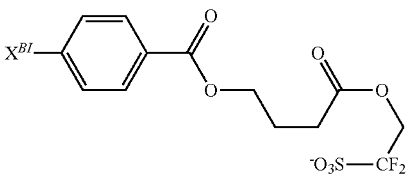
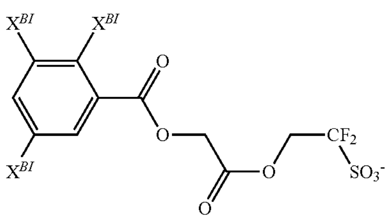
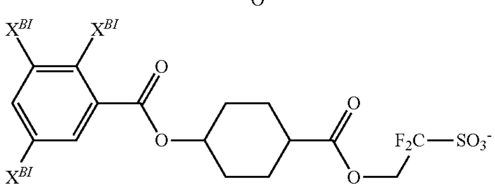
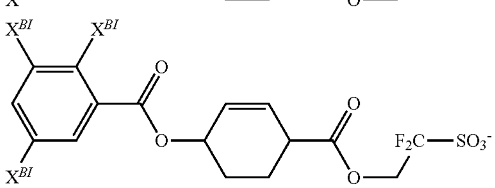
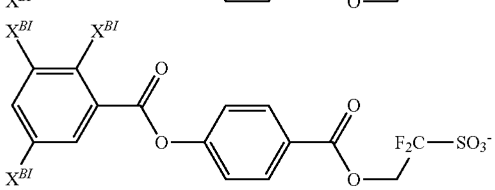
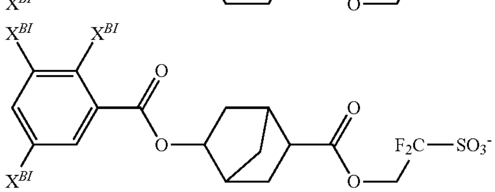
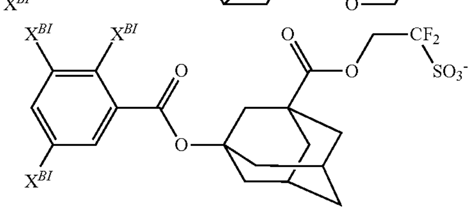
-continued
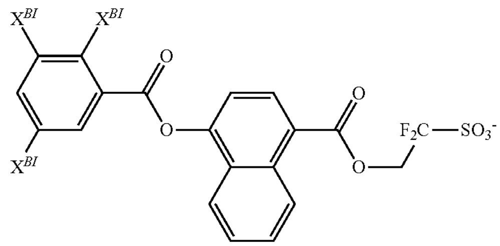
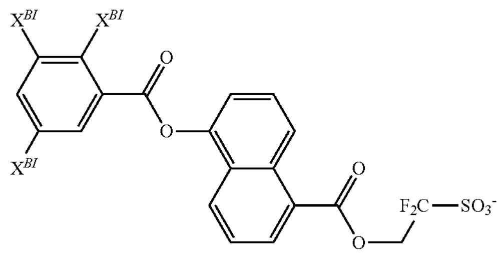
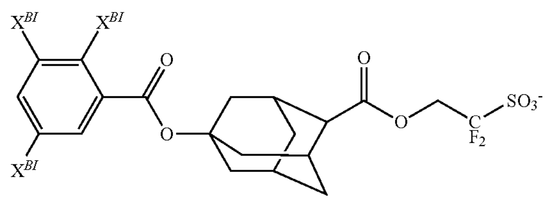
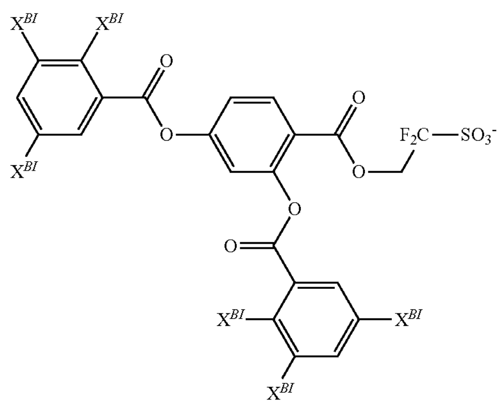
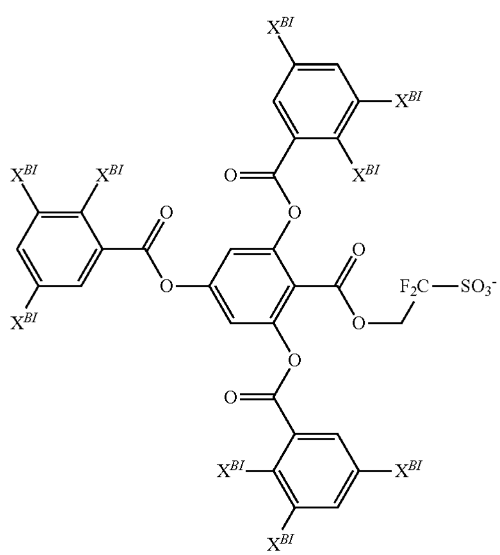

-continued
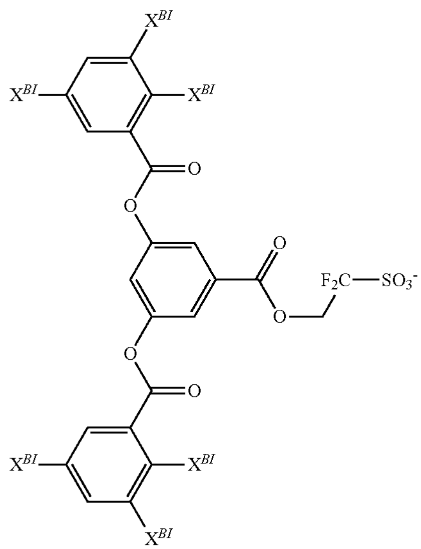
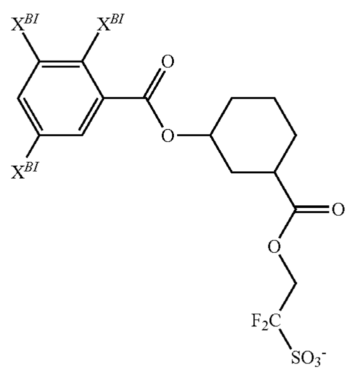
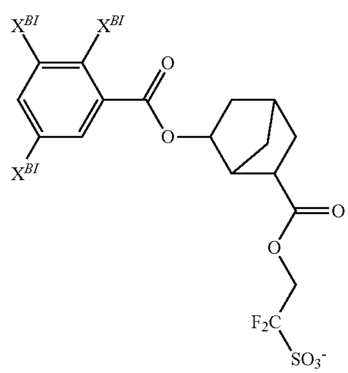
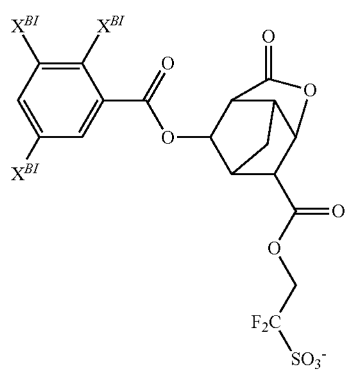
-continued
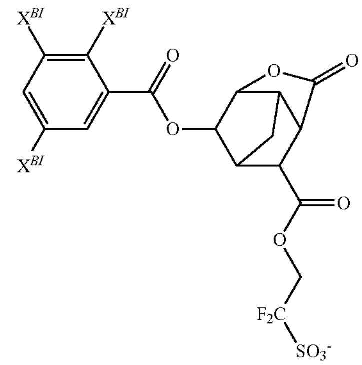
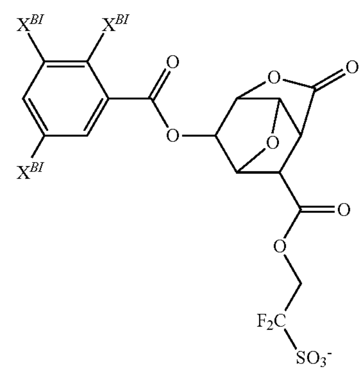
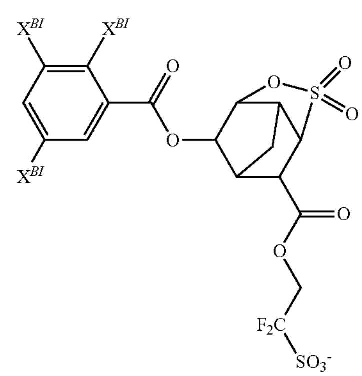
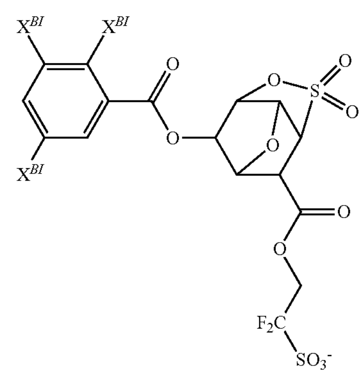

-continued
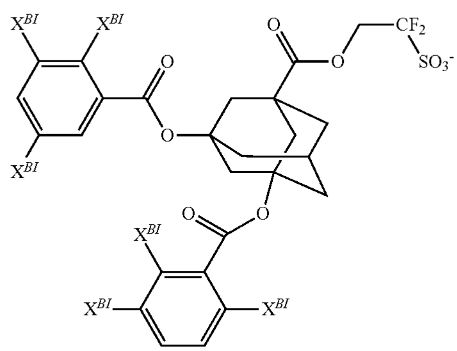
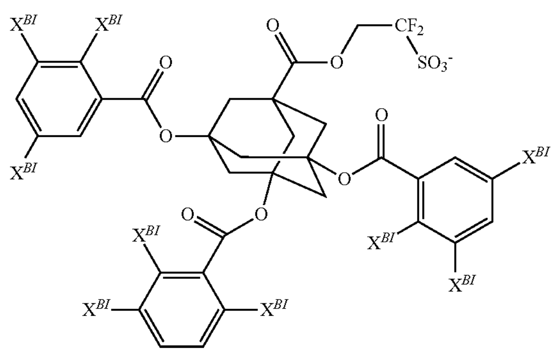
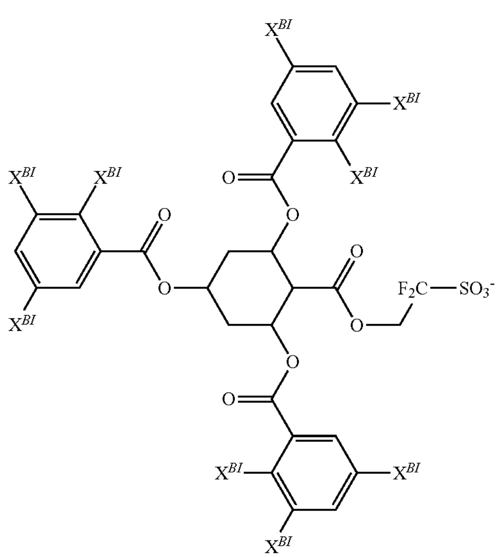
-continued
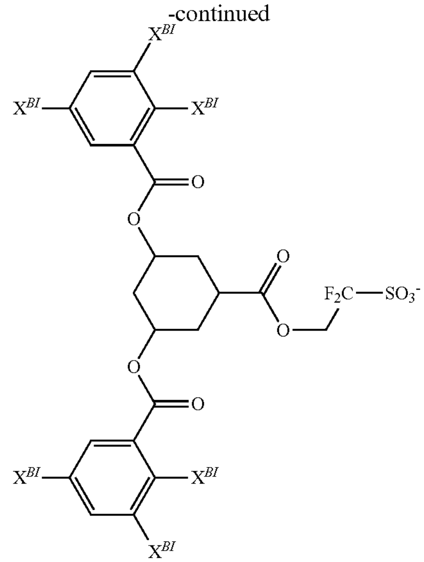
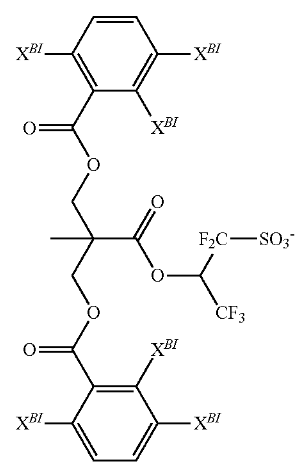
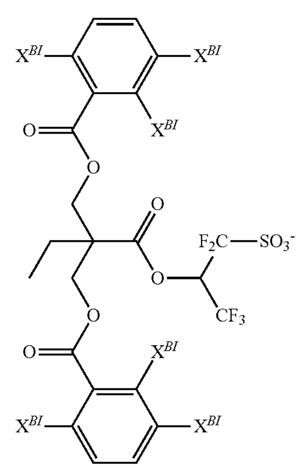

-continued
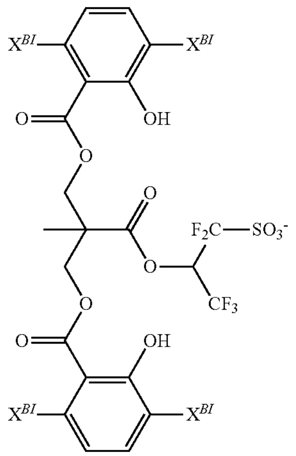
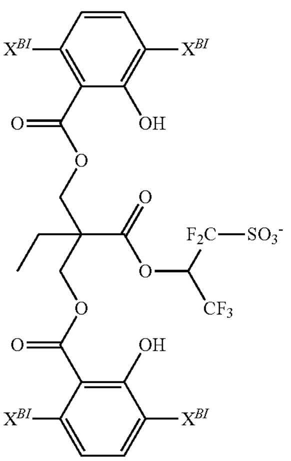
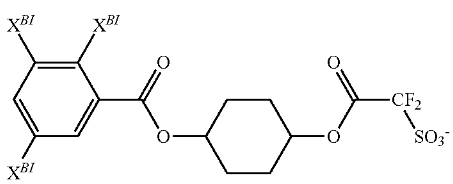
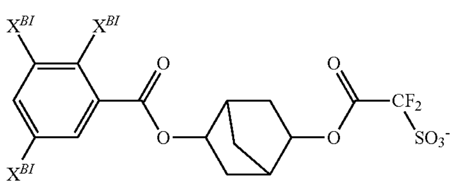
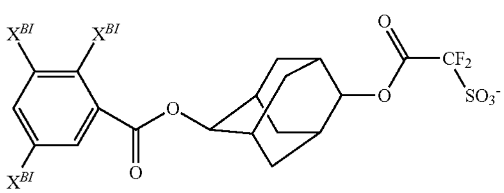
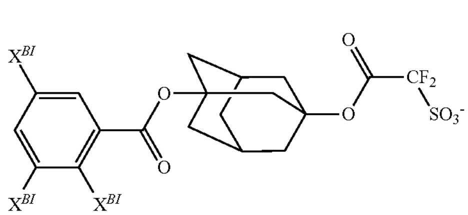
-continued
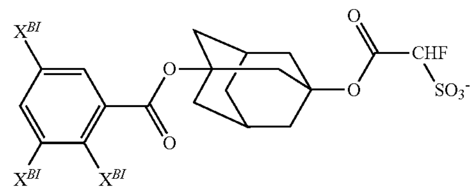
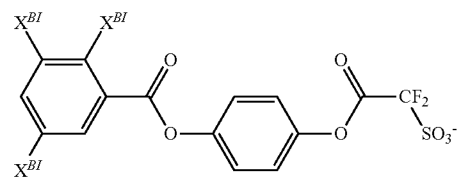
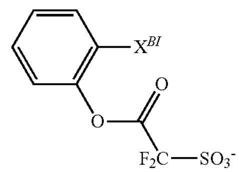
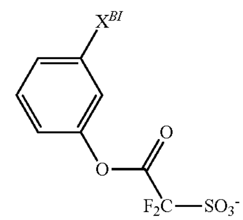
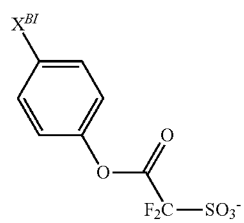
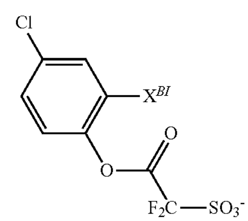
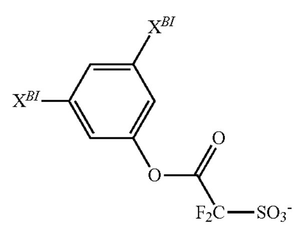
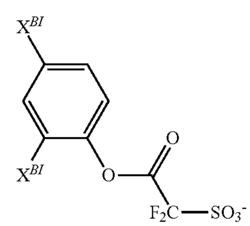
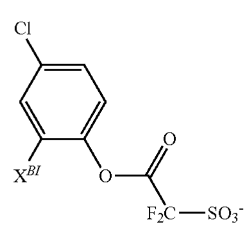
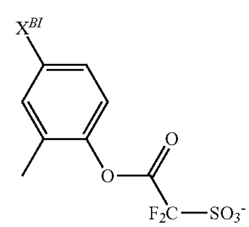
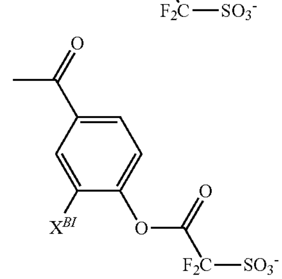
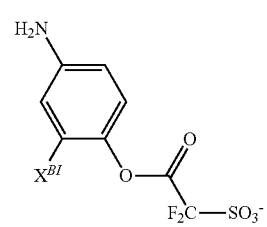

-continued
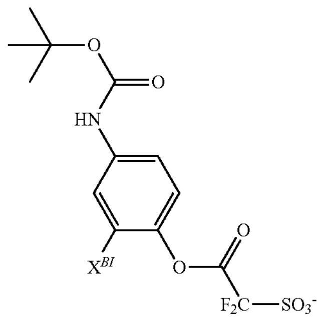
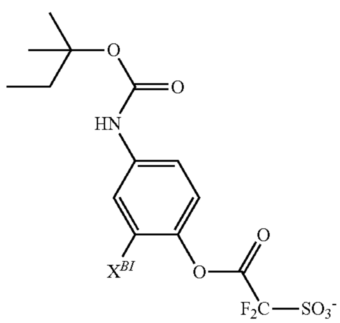
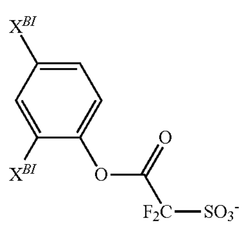
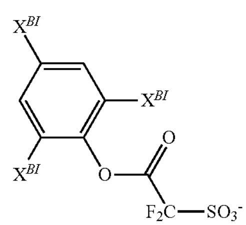
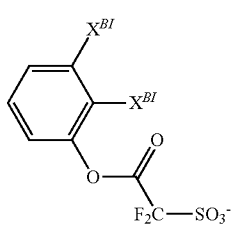
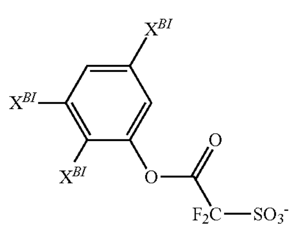
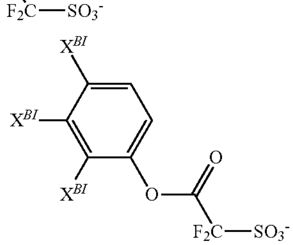
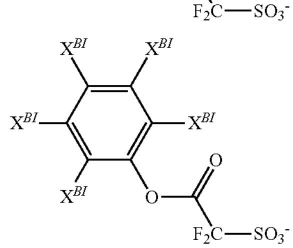
-continued
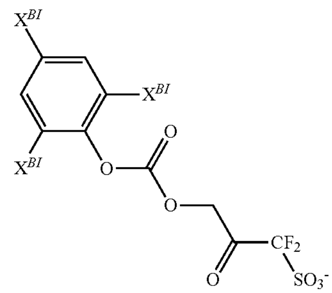
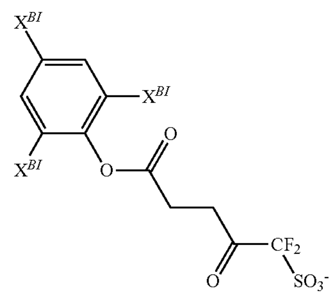
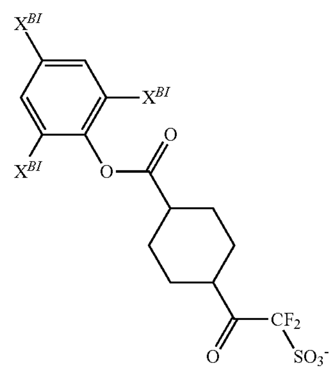
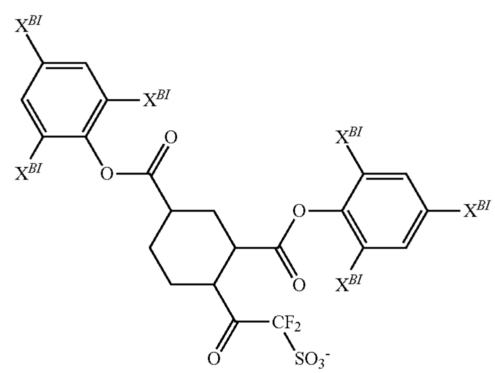
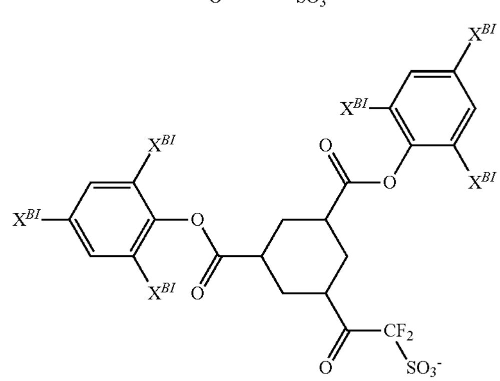

-continued
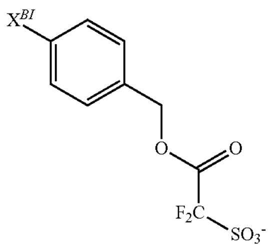
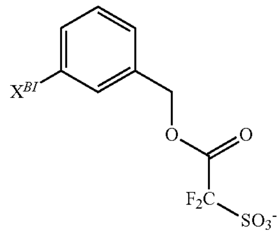
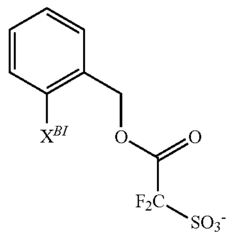
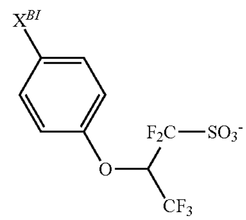
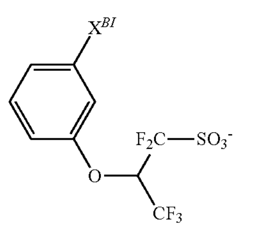
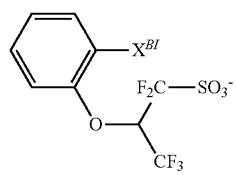
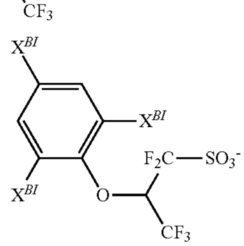
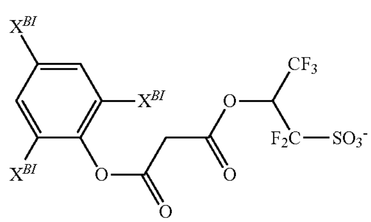
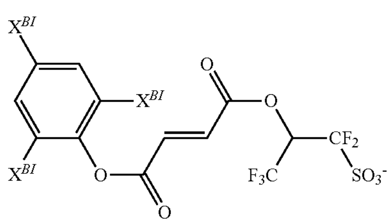
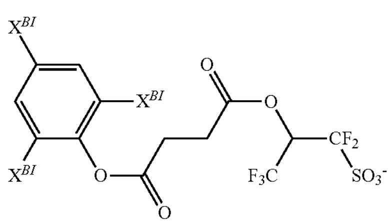
-continued
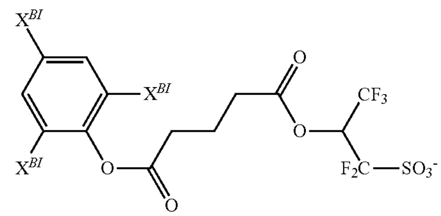
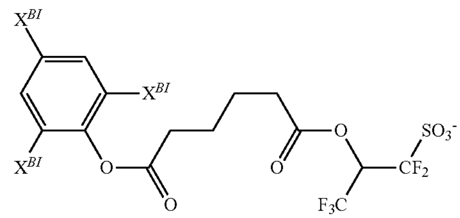
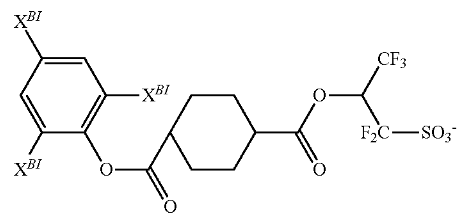
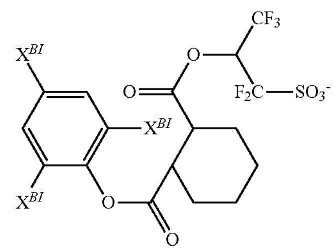
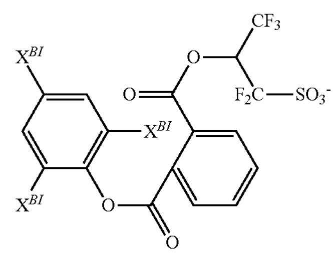
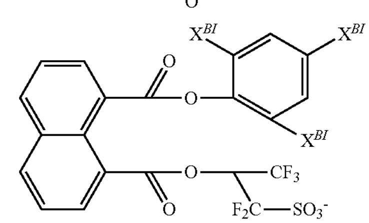
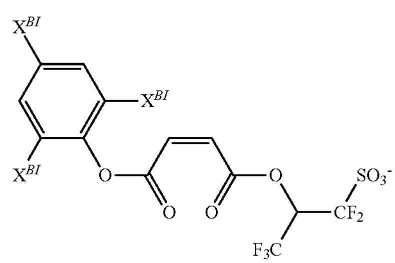

-continued
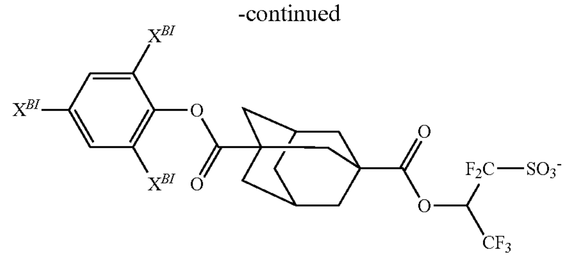
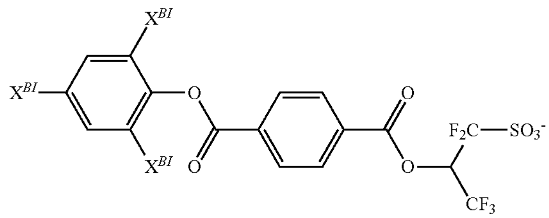
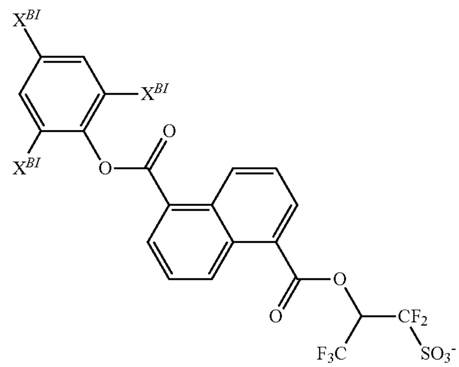
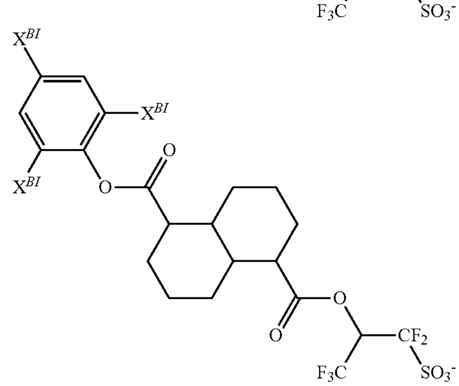
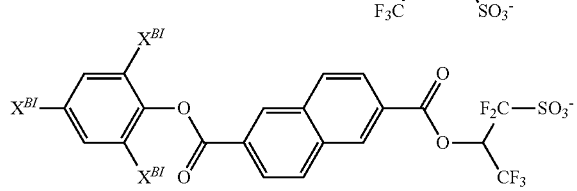
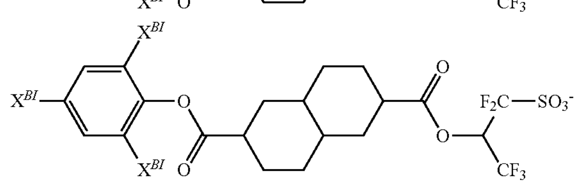
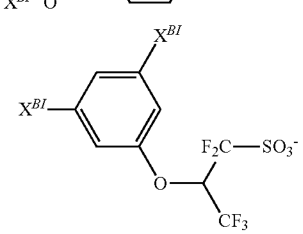
-continued
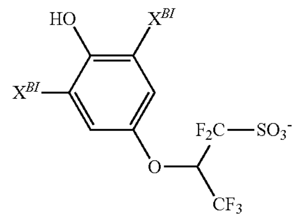
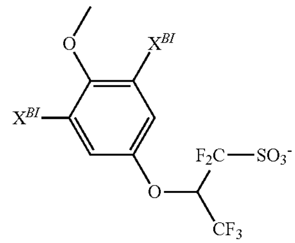
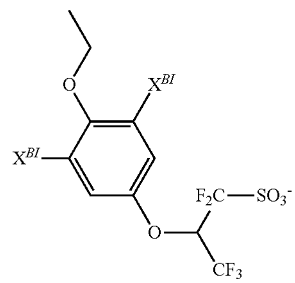
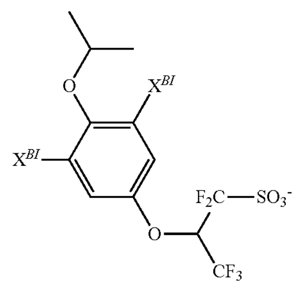
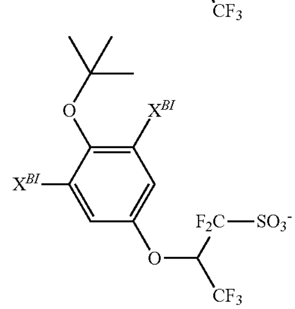
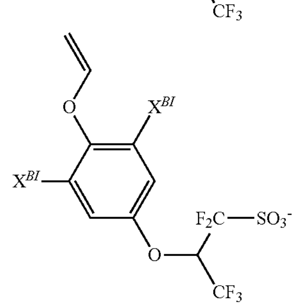

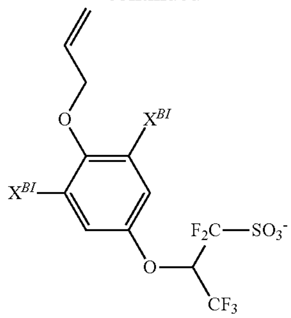
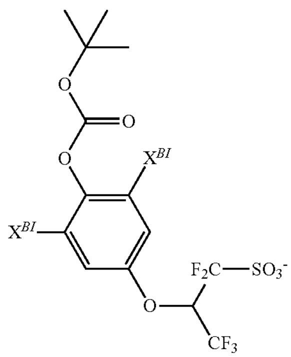
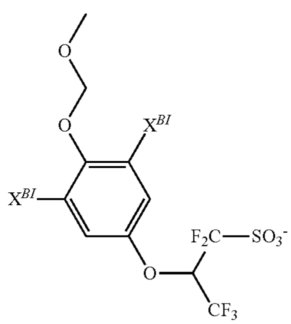
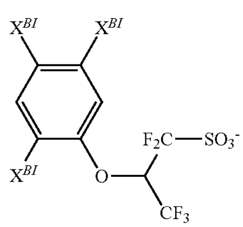
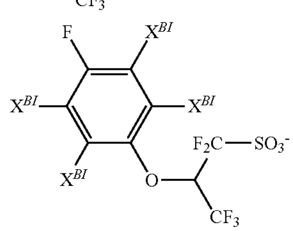
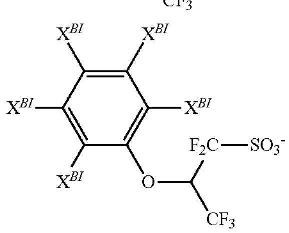
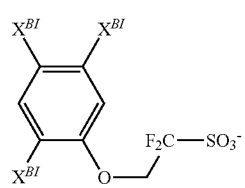
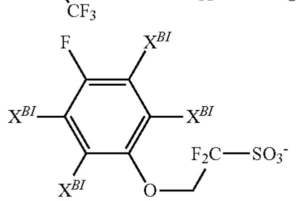
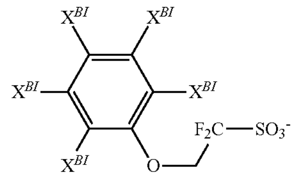
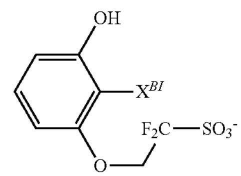
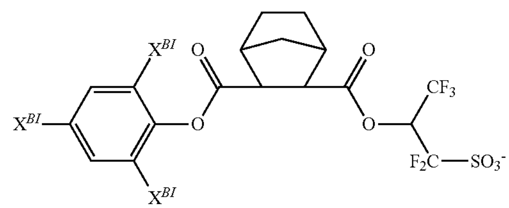
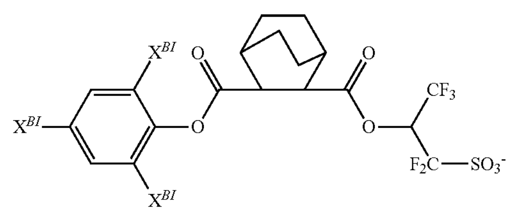
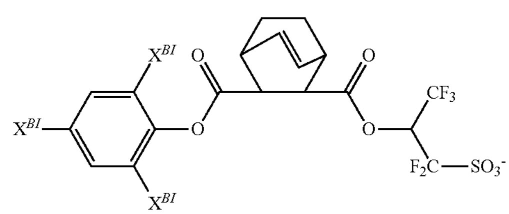
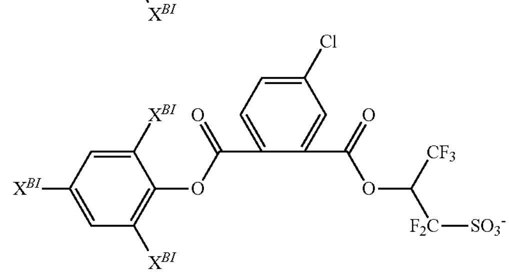
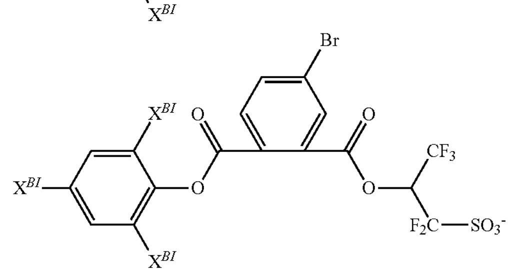
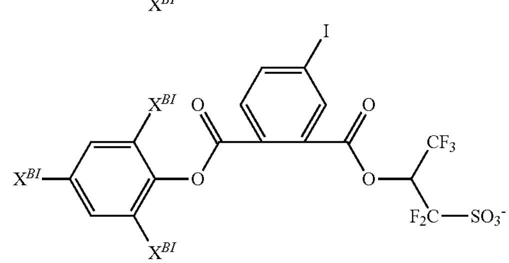

-continued
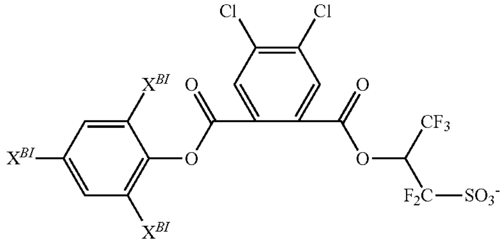
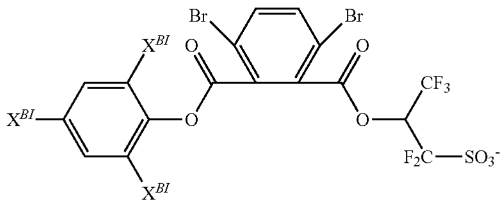
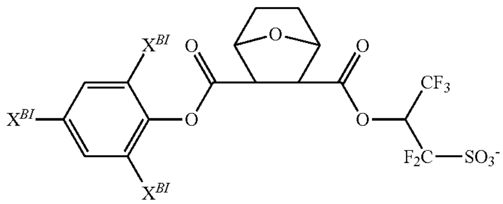
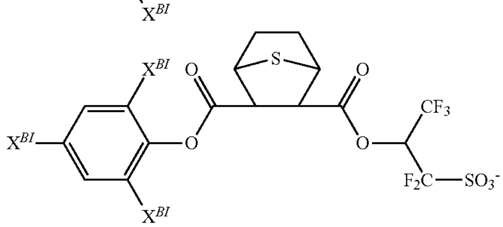
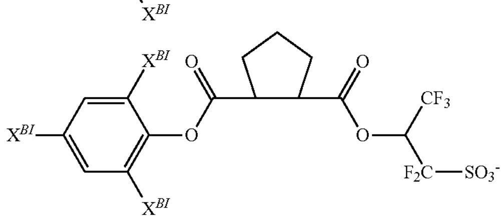
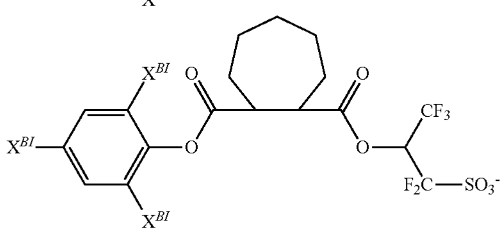
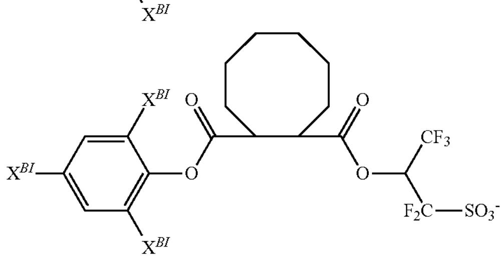
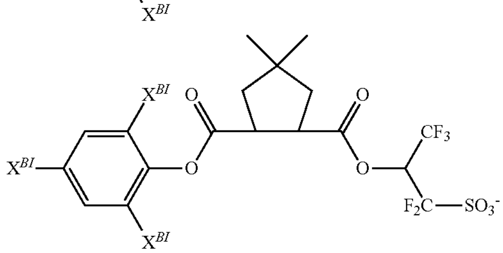
-continued
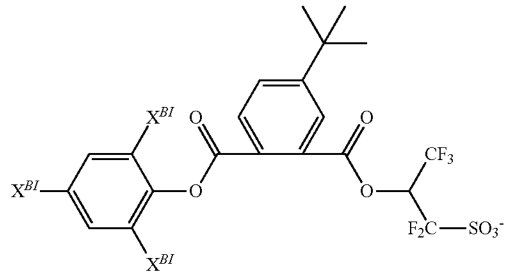
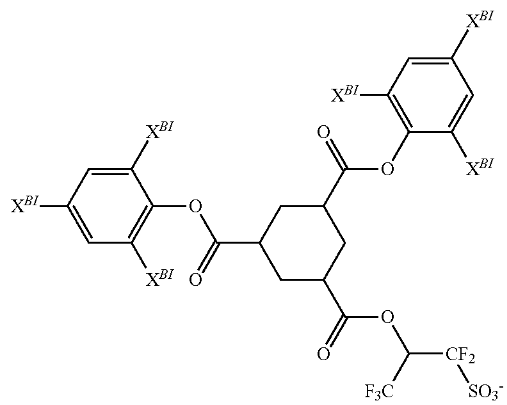
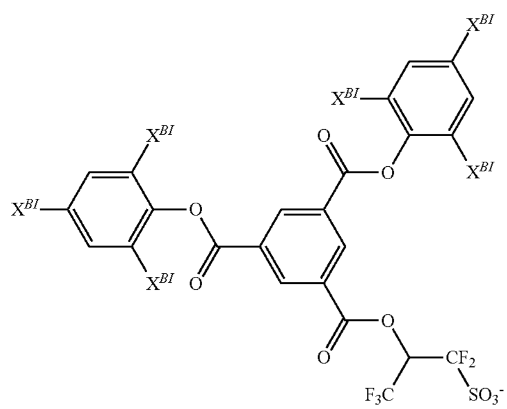
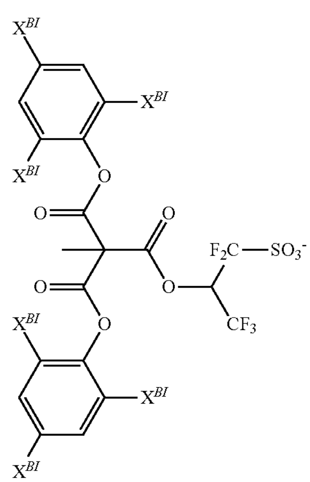

-continued
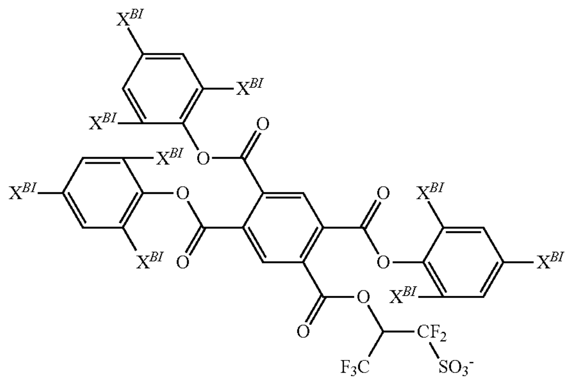
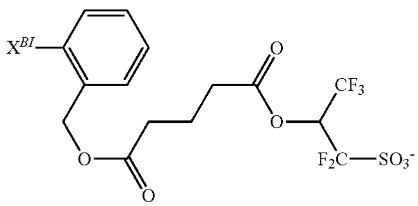
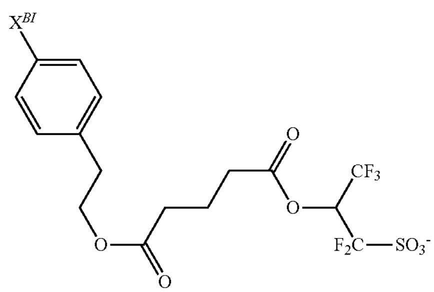
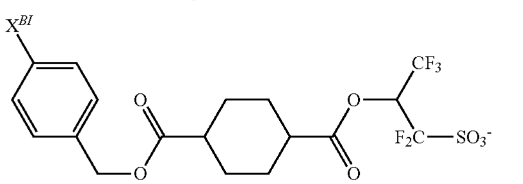
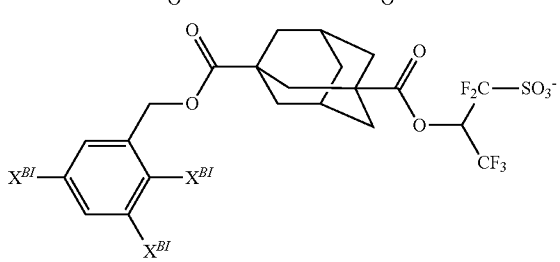
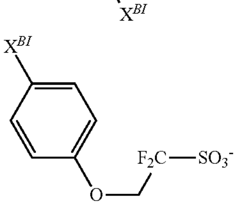
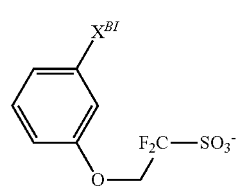
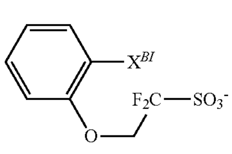
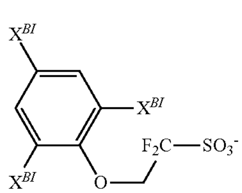
-continued
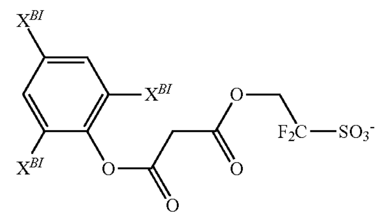
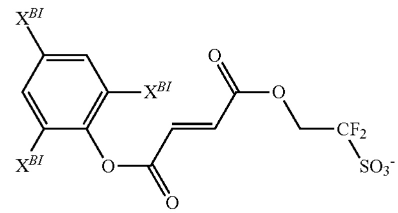
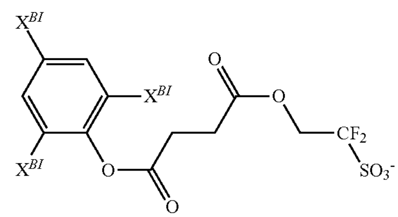
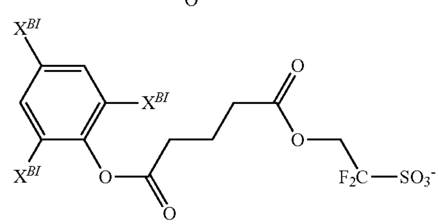
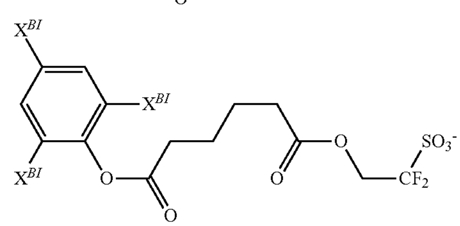
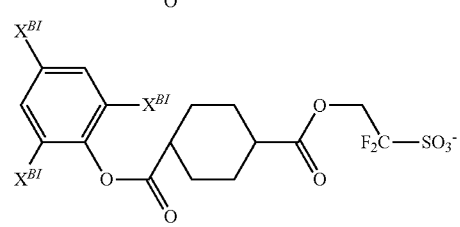
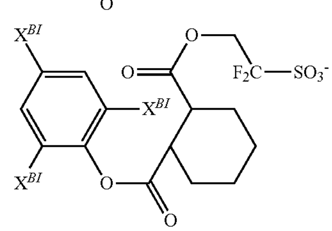
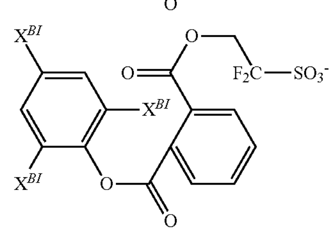

-continued
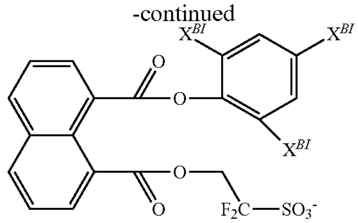
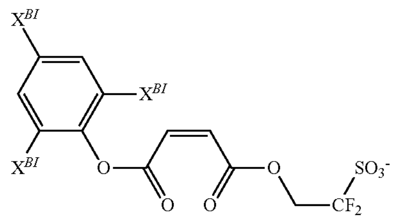
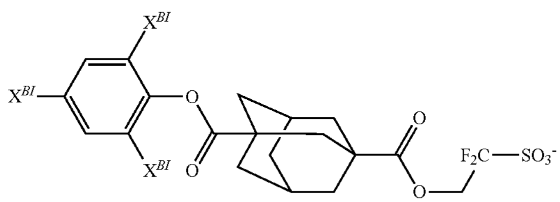
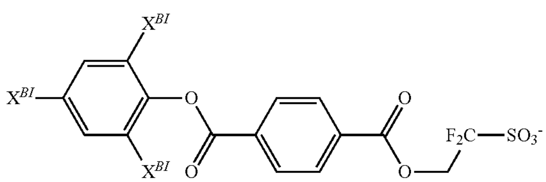
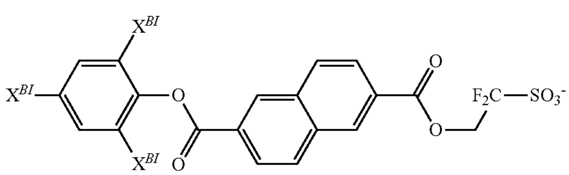
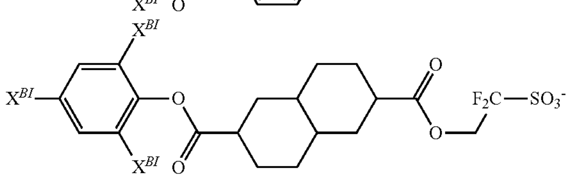
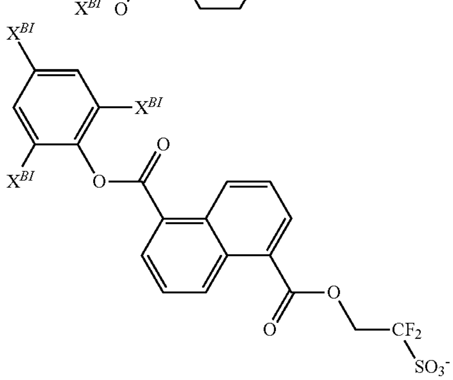
-continued
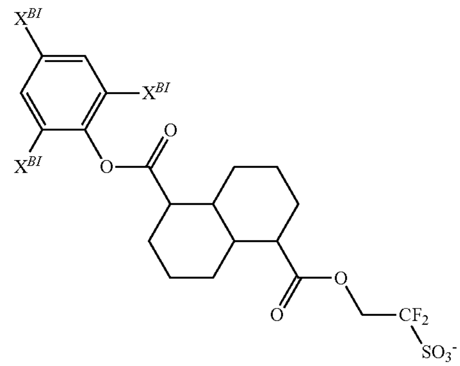
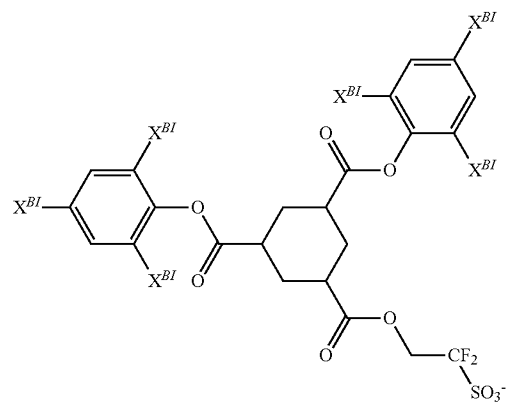
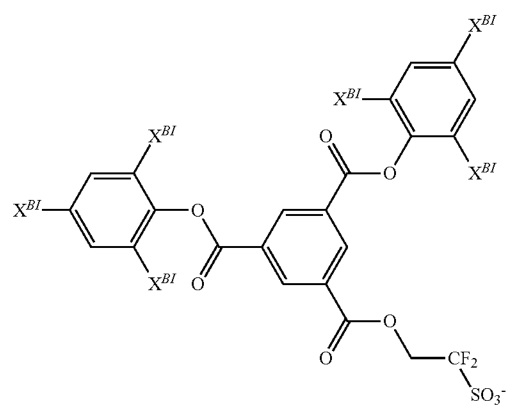
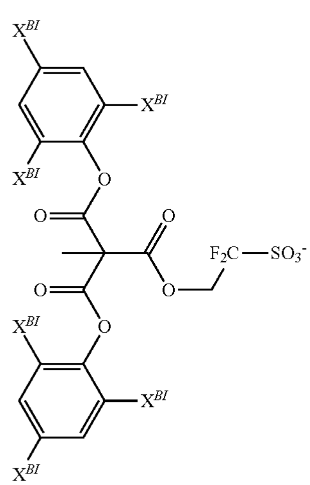

-continued
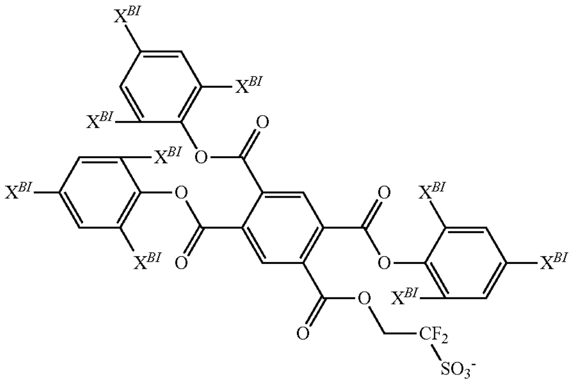
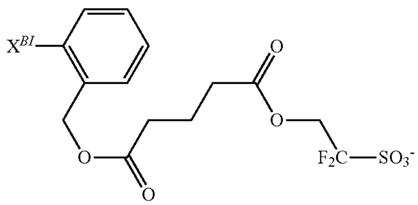
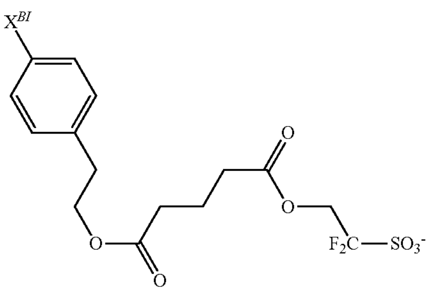
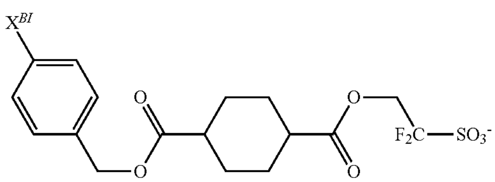
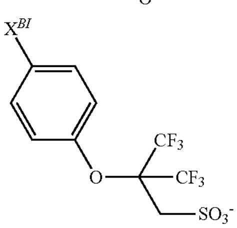
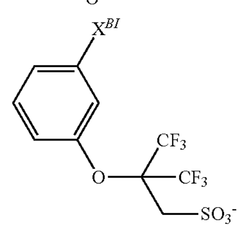
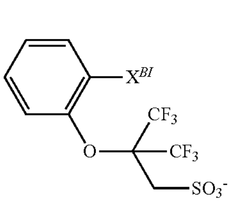
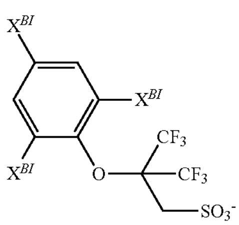
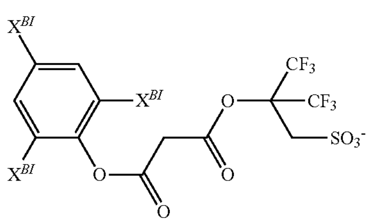
-continued
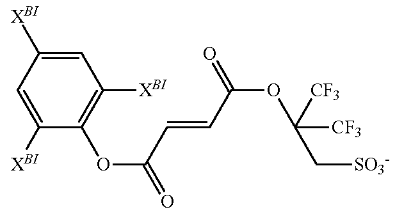
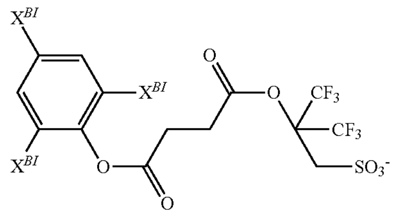
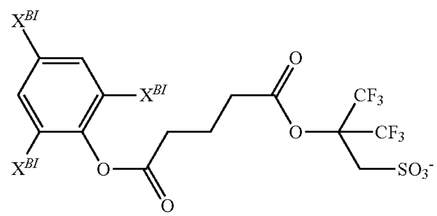
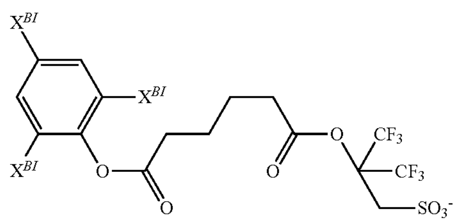
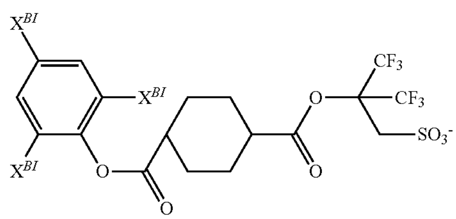
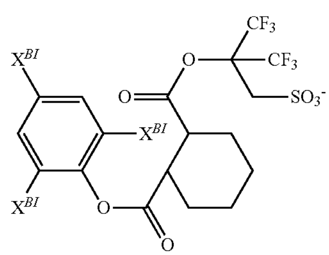
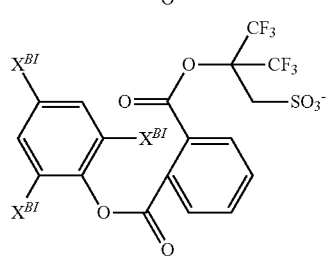

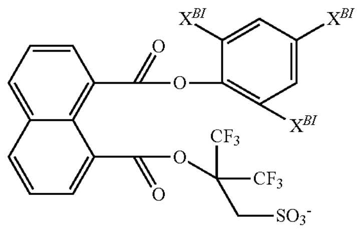
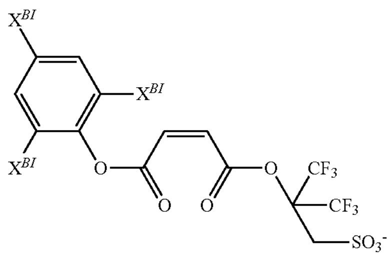
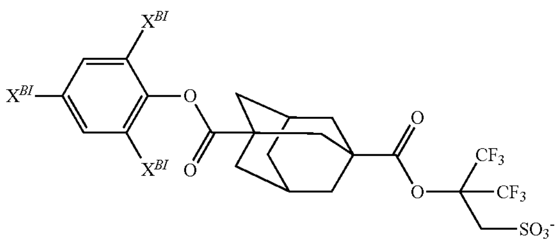
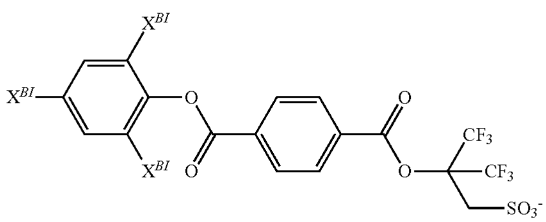
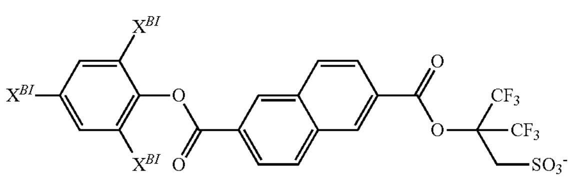
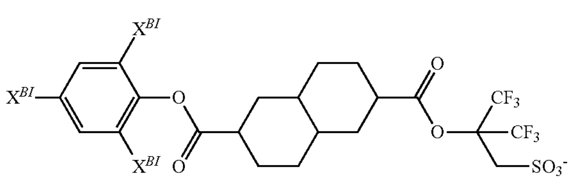
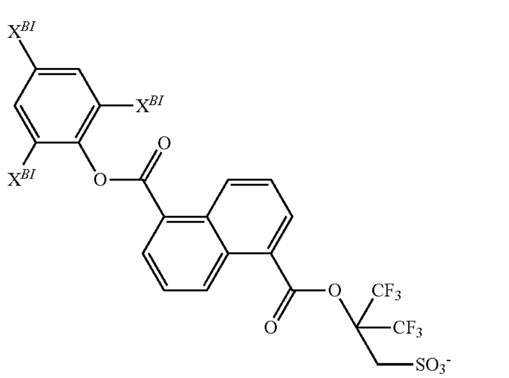
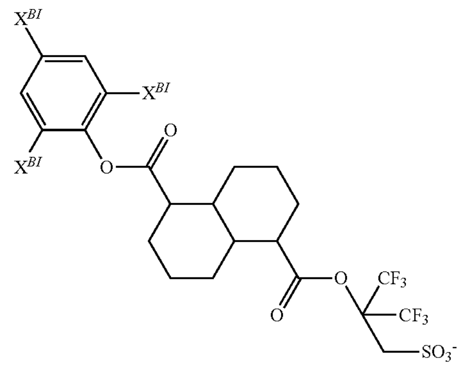
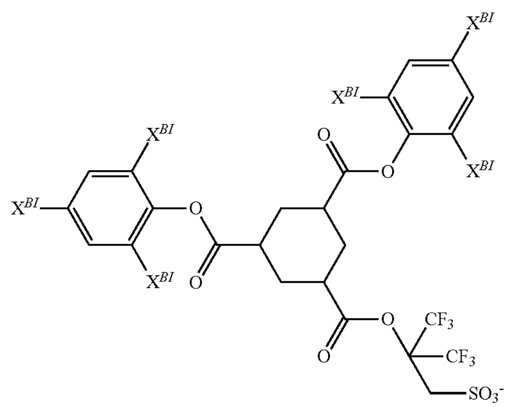
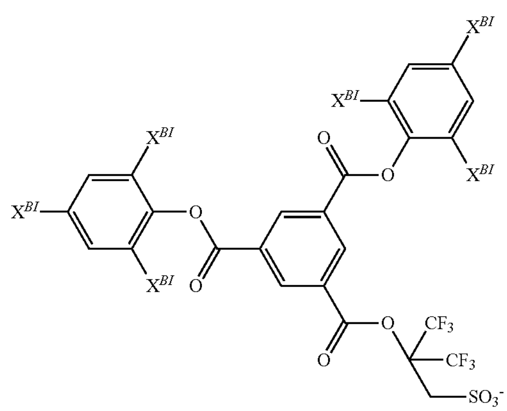
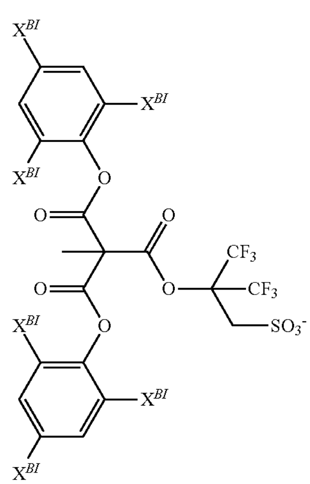

-continued

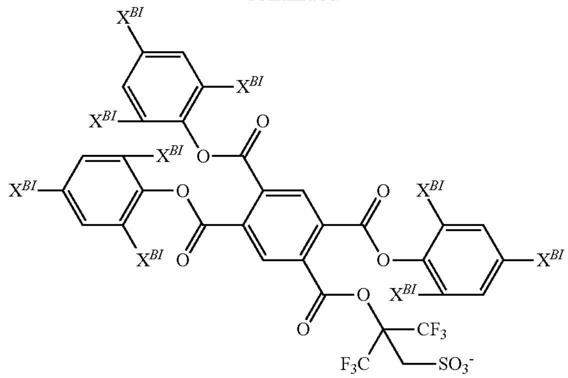

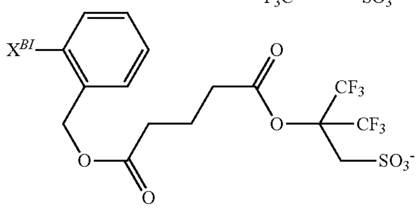

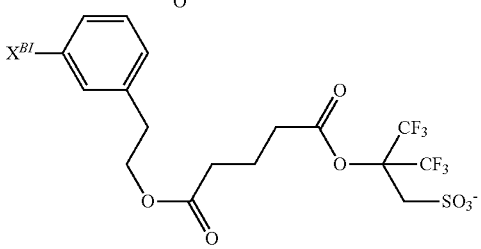

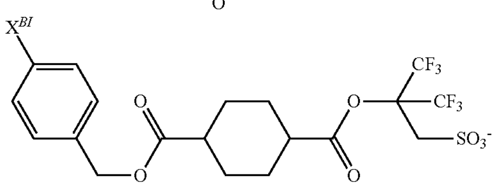

When used, the acid generator of addition type is preferably added in an amount of 0.1 to 50 parts, and more preferably 1 to 40 parts by weight per 100 parts by weight of the base polymer. The resist composition functions as a chemically amplified resist composition when the base polymer includes recurring units (0 and/or the resist composition contains the acid generator of addition type.

Organic Solvent

An organic solvent may be added to the resist composition. The organic solvent used herein is not particularly limited as long as the foregoing and other components are soluble therein. Examples of the organic solvent are described in JP-A 2008-111103, paragraphs [0144]-[0145] (U.S. Pat. No. 7,537,880). Exemplary solvents include ketones such as cyclohexanone, cyclopentanone, methyl-2-n-pentyl ketone and 2-heptanone; alcohols such as 3-methoxybutanol, 3-methyl-3-methoxybutanol, 1-methoxy-2-propanol, 1-ethoxy-2-propanol and diacetone alcohol (DAA); ethers such as propylene glycol monomethyl ether (PGME), ethylene glycol monomethyl ether, propylene glycol monoethyl ether, ethylene glycol monoethyl ether, propylene glycol dimethyl ether, and diethylene glycol dimethyl ether; esters such as propylene glycol monomethyl ether acetate (PGMEA), propylene glycol monoethyl ether acetate, ethyl lactate, ethyl pyruvate, butyl acetate, methyl 3-methoxypropionate, ethyl 3-ethoxypropionate, tert-butyl acetate, tert-butyl propionate, and propylene glycol mono-tert-butyl ether acetate; and lactones such as γ-butyrolactone, which may be used alone or in admixture.

The organic solvent is preferably added in an amount of 100 to 10,000 parts, and more preferably 200 to 8,000 parts by weight per 100 parts by weight of the base polymer.

Other Components

With the foregoing components, other components such as a surfactant, dissolution inhibitor, and crosslinker may be blended in any desired combination to formulate a chemically amplified positive or negative resist composition. This positive or negative resist composition has a very high sensitivity in that the dissolution rate in developer of the base polymer in exposed areas is accelerated by catalytic reaction. In addition, the resist film has a high dissolution contrast, resolution, exposure latitude, and process adaptability, and provides a good pattern profile after exposure, and minimal proximity bias because of restrained acid diffusion. By virtue of these advantages, the composition is fully useful in commercial application and suited as a pattern-forming material for the fabrication of VLSIs.

Exemplary surfactants are described in JP-A 2008-111103, paragraphs [0165]-[0166]. Inclusion of a surfactant may improve or control the coating characteristics of the resist composition. While the surfactant may be used alone or in admixture, it is preferably added in an amount of 0.0001 to 10 parts by weight per 100 parts by weight of the base polymer.

In the case of positive resist compositions, inclusion of a dissolution inhibitor may lead to an increased difference in dissolution rate between exposed and unexposed areas and a further improvement in resolution. The dissolution inhibitor which can be used herein is a compound having at least two phenolic hydroxyl groups on the molecule, in which an average of from 0 to 100 mol % of all the hydrogen atoms on the phenolic hydroxyl groups are replaced by acid labile groups or a compound having at least one carboxyl group on the molecule, in which an average of 50 to 100 mol % of all the hydrogen atoms on the carboxyl groups are replaced by acid labile groups, both the compounds having a molecular weight of 100 to 1,000, and preferably 150 to 800. Typical are bisphenol A, trisphenol, phenolphthalein, cresol novolac, naphthalenecarboxylic acid, adamantanecarboxylic acid, and cholic acid derivatives in which the hydrogen atom on the hydroxyl or carboxyl group is replaced by an acid labile group, as described in U.S. Pat. No. 7,771,914 (JP-A 2008-122932, paragraphs [0155][0178]).

In the positive resist composition, the dissolution inhibitor is preferably added in an amount of 0 to 50 parts, more preferably 5 to 40 parts by weight per 100 parts by weight of the base polymer. The dissolution inhibitor may be used alone or in admixture.

In the case of negative resist compositions, a negative pattern may be formed by adding a crosslinker to reduce the dissolution rate of a resist film in exposed area. Suitable crosslinkers which can be used herein include epoxy compounds, melamine compounds, guanamine compounds, glycoluril compounds and urea compounds having substituted thereon at least one group selected from among methylol, alkoxymethyl and acyloxymethyl groups, isocyanate compounds, azide compounds, and compounds having a double bond such as an alkenyl ether group. These compounds may be used as an additive or introduced into a polymer side chain as a pendant. Hydroxy-containing compounds may also be used as the crosslinker. The crosslinker may be used alone or in admixture.

Of the foregoing crosslinkers, examples of the epoxy compound include tris(2,3-epoxypropyl) isocyanurate, trimethylolmethane triglycidyl ether, trimethylolpropane triglycidyl ether, and triethylolethane triglycidyl ether. Examples of the melamine compound include hexamethylol melamine, hexamethoxymethyl melamine, hexamethylol melamine compounds having 1 to 6 methylol groups methoxymethylated and mixtures thereof, hexamethoxyethyl melamine, hexaacyloxymethyl melamine, hexamethylol melamine compounds having 1 to 6 methylol groups acyloxymethylated and mixtures thereof. Examples of the guanamine compound include tetramethylol guanamine, tetramethoxymethyl guanamine, tetramethylol guanamine compounds having 1 to 4 methylol groups methoxymethylated and mixtures thereof, tetramethoxyethyl guanamine, tetraacyloxyguanamine, tetramethylol guanamine compounds having 1 to 4 methylol groups acyloxymethylated and mixtures thereof. Examples of the glycoluril compound include tetramethylol glycoluril, tetramethoxyglycoluril, tetramethoxymethyl glycoluril, tetramethylol glycoluril compounds having 1 to 4 methylol groups methoxymethylated and mixtures thereof, tetramethylol glycoluril compounds having 1 to 4 methylol groups acyloxymethylated and mixtures thereof. Examples of the urea compound include tetramethylol urea, tetramethoxymethyl urea, tetramethylol urea compounds having 1 to 4 methylol groups methoxymethylated and mixtures thereof, and tetramethoxyethyl urea.

Suitable isocyanate compounds include tolylene diisocyanate, diphenylmethane diisocyanate, hexamethylene diisocyanate and cyclohexane diisocyanate. Suitable azide compounds include 1,1'-biphenyl-4,4'-bisazide, 4,4'-methylidenebisazide, and 4,4'-oxybisazide. Examples of the alkenyl ether group-containing compound include ethylene glycol divinyl ether, triethylene glycol divinyl ether, 1,2-propanediol divinyl ether, 1,4-butanediol divinyl ether, tetramethylene glycol divinyl ether, neopentyl glycol divinyl ether, trimethylol propane trivinyl ether, hexanediol divinyl ether, 1,4-cyclohexanediol divinyl ether, pentaerythritol trivinyl ether, pentaerythritol tetravinyl ether, sorbitol tetravinyl ether, sorbitol pentavinyl ether, and trimethylol propane trivinyl ether.

In the negative resist composition, the crosslinker is preferably added in an amount of 0 to 50 parts, more preferably 1 to 40 parts by weight per 100 parts by weight of the base polymer.

In the resist composition of the invention, a quencher other than the inventive iodized or brominated phenol salt may be blended. The other quencher is typically selected from conventional basic compounds. Conventional basic compounds include primary, secondary, and tertiary aliphatic amines, mixed amines, aromatic amines, heterocyclic amines, nitrogen-containing compounds with carboxyl group, nitrogen-containing compounds with sulfonyl group, nitrogen-containing compounds with hydroxyl group, nitrogen-containing compounds with hydroxyphenyl group, alcoholic nitrogen-containing compounds, amide derivatives, imide derivatives, and carbamate derivatives. Also included are primary, secondary, and tertiary amine compounds, specifically amine compounds having a hydroxyl group, ether bond, ester bond, lactone ring, cyano group, or sulfonic acid ester bond as described in JP-A 2008-111103, paragraphs [0146]-[0164], and compounds having a carbamate group as described in JP 3790649. Addition of a basic compound may be effective for further suppressing the diffusion rate of acid in the resist film or correcting the pattern profile.

Onium salts such as sulfonium salts, iodonium salts and ammonium salts of sulfonic acids which are not fluorinated at α-position as described in U.S. Pat. No. 8,795,942 (JP-A 2008-158339) and similar onium salts of carboxylic acid may also be used as the other quencher. While an α-fluorinated sulfonic acid, sulfonimide, and sulfonemethide are necessary to deprotect the acid labile group of carboxylic acid ester, an α-non-fluorinated sulfonic acid and a carboxylic acid are released by salt exchange with an α-non-fluorinated onium salt. An α-non-fluorinated sulfonic acid and a carboxylic acid function as a quencher because they do not induce deprotection reaction.

Also useful are quenchers of polymer type as described in U.S. Pat. No. 7,598,016 (JP-A 2008-239918). The polymeric quencher segregates at the resist surface after coating and thus enhances the rectangularity of resist pattern. When a protective film is applied as is often the case in the immersion lithography, the polymeric quencher is also effective for preventing a film thickness loss of resist pattern or rounding of pattern top.

The other quencher is preferably added in an amount of 0 to 5 parts, more preferably 0 to 4 parts by weight per 100 parts by weight of the base polymer. The other quencher may be used alone or in admixture.

To the resist composition, a water repellency improver may also be added for improving the water repellency on surface of a resist film as spin coated. The water repellency improver may be used in the topcoatless immersion lithography. Suitable water repellency improvers include polymers having a fluoroalkyl group and polymers having a specific structure with a 1,1,1,3,3,3-hexafluoro-2-propanol residue and are described in JP-A 2007-297590 and JP-A 2008-111103, for example. The water repellency improver to be added to the resist composition should be soluble in the alkaline developer and organic solvent developer. The water repellency improver of specific structure with a 1,1,1,3,3,3-hexafluoro-2-propanol residue is well soluble in the developer. A polymer having an amino group or amine salt copolymerized as recurring units may serve as the water repellent additive and is effective for preventing evaporation of acid during PEB, thus preventing any hole pattern opening failure after development. The water repellency improver may be used alone or in admixture. An appropriate amount of the water repellency improver is 0 to 20 parts, more preferably 0.5 to 10 parts by weight per 100 parts by weight of the base polymer.

Also, an acetylene alcohol may be blended in the resist composition. Suitable acetylene alcohols are described in JP-A 2008-122932, paragraphs [0179]-[0182]. An appropriate amount of the acetylene alcohol blended is 0 to 5 parts by weight per 100 parts by weight of the base polymer.

Pattern Forming Process

The resist composition is used in the fabrication of various integrated circuits. Pattern formation using the resist composition may be performed by well-known lithography processes. The process generally involves coating, exposure, and development. If necessary, any additional steps may be added.

For example, the resist composition is first applied onto a substrate on which an integrated circuit is to be formed (e.g., Si, $SiO_2$, SiN, SiON, TiN, WSi, BPSG, SOG, or organic antireflective coating) or a substrate on which a mask circuit is to be formed (e.g., Cr, CrO, CrON, $MoSi_2$, or $SiO_2$) by a suitable coating technique such as spin coating, roll coating, flow coating, dipping, spraying or doctor coating. The coating is prebaked on a hot plate at a temperature of 60 to 150° C. for 10 seconds to 30 minutes, preferably at 80 to 120° C. for 30 seconds to 20 minutes. The resulting resist film is generally 0.1 to 2 μm thick.

The resist film is then exposed to a desired pattern of high-energy radiation such as UV, deep-UV, EB, EUV, x-ray, soft x-ray, excimer laser light, γ-ray or synchrotron radiation. When UV, deep-UV, EUV, x-ray, soft x-ray, excimer laser light, γ-ray or synchrotron radiation is used as the high-energy radiation, the resist film is exposed thereto through a mask having a desired pattern in a dose of preferably about 1 to 200 $mJ/cm^2$, more preferably about 10 to 100 $mJ/cm^2$. When EB is used as the high-energy radiation, the resist film is exposed thereto through a mask having a desired pattern or directly in a dose of preferably about 0.1 to 100 $\mu C/cm^2$, more preferably about 0.5 to 50 $\mu C/cm^2$. It is appreciated that the inventive resist composition is suited in micropatterning using KrF excimer laser, ArF excimer laser, EB, EUV, x-ray, soft x-ray, γ-ray or synchrotron radiation, especially EB or EUV.

After the exposure, the resist film may be baked (PEB) on a hotplate or in an oven at 30 to 150° C. for 10 seconds to 30 minutes, preferably at 50 to 120° C. for 30 seconds to 20 minutes.

After the exposure or PEB, the resist film is developed in a developer in the form of an aqueous base solution for 3 seconds to 3 minutes, preferably 5 seconds to 2 minutes by conventional techniques such as dip, puddle and spray techniques. A typical developer is a 0.1 to 10 wt %, preferably 2 to 5 wt % aqueous solution of tetramethylammonium hydroxide (TMAH), tetraethylammonium hydroxide (TEAH), tetrapropylammonium hydroxide (TPAH), or tetrabutylammonium hydroxide (TBAH). In the case of positive resist, the resist film in the exposed area is dissolved in the developer whereas the resist film in the unexposed area is not dissolved. In this way, the desired positive pattern is formed on the substrate. Inversely in the case of negative resist, the exposed area of resist film is insolubilized and the unexposed area is dissolved in the developer.

In an alternative embodiment, a positive resist composition comprising a base polymer having an acid labile group is used to form a negative pattern via organic solvent development. The developer used herein is preferably selected from among 2-octanone, 2-nonanone, 2-heptanone, 3-heptanone, 4-heptanone, 2-hexanone, 3-hexanone, diisobutyl ketone, methylcyclohexanone, acetophenone, methylacetophenone, propyl acetate, butyl acetate, isobutyl acetate, pentyl acetate, butenyl acetate, isopentyl acetate, propyl formate, butyl formate, isobutyl formate, pentyl formate, isopentyl formate, methyl valerate, methyl pentenoate, methyl crotonate, ethyl crotonate, methyl propionate, ethyl propionate, ethyl 3-ethoxypropionate, methyl lactate, ethyl lactate, propyl lactate, butyl lactate, isobutyl lactate, pentyl lactate, isopentyl lactate, methyl 2-hydroxyisobutyrate, ethyl 2-hydroxyisobutyrate, methyl benzoate, ethyl benzoate, phenyl acetate, benzyl acetate, methyl phenylacetate, benzyl formate, phenylethyl formate, methyl 3-phenylpropionate, benzyl propionate, ethyl phenylacetate, and 2-phenylethyl acetate, and mixtures thereof.

At the end of development, the resist film is rinsed. As the rinsing liquid, a solvent which is miscible with the developer and does not dissolve the resist film is preferred. Suitable solvents include alcohols of 3 to 10 carbon atoms, ether compounds of 8 to 12 carbon atoms, alkanes, alkenes, and alkynes of 6 to 12 carbon atoms, and aromatic solvents. Specifically, suitable alcohols of 3 to 10 carbon atoms include n-propyl alcohol, isopropyl alcohol, 1-butyl alcohol, 2-butyl alcohol, isobutyl alcohol, t-butyl alcohol, 1-pentanol, 2-pentanol, 3-pentanol, t-pentyl alcohol, neopentyl alcohol, 2-methyl-1-butanol, 3-methyl-1-butanol, 3-methyl-3-pentanol, cyclopentanol, 1-hexanol, 2-hexanol, 3-hexanol, 2,3-dimethyl-2-butanol, 3,3-dimethyl-1-butanol, 3,3-dimethyl-2-butanol, 2-ethyl-1-butanol, 2-methyl-1-pentanol, 2-methyl-2-pentanol, 2-methyl-3-pentanol, 3-methyl-1-pentanol, 3-methyl-2-pentanol, 3-methyl-3-pentanol, 4-methyl-1-pentanol, 4-methyl-2-pentanol, 4-methyl-3-pentanol, cyclohexanol, and 1-octanol. Suitable ether compounds of 8 to 12 carbon atoms include di-n-butyl ether, diisobutyl ether, di-s-butyl ether, di-n-pentyl ether, diisopentyl ether, di-s-pentyl ether, di-t-pentyl ether, and di-n-hexyl ether. Suitable alkanes of 6 to 12 carbon atoms include hexane, heptane, octane, nonane, decane, undecane, dodecane, methylcyclopentane, dimethylcyclopentane, cyclohexane, methylcyclohexane, dimethylcyclohexane, cycloheptane, cyclooctane, and cyclononane. Suitable alkenes of 6 to 12 carbon atoms include hexene, heptene, octene, cyclohexene, methylcyclohexene, dimethylcyclohexene, cycloheptene, and cyclooctene. Suitable alkynes of 6 to 12 carbon atoms include hexyne, heptyne, and octyne. Suitable aromatic solvents include toluene, xylene, ethylbenzene, isopropylbenzene, t-butylbenzene and mesitylene. The solvents may be used alone or in admixture.

Rinsing is effective for minimizing the risks of resist pattern collapse and defect formation. However, rinsing is not essential. If rinsing is omitted, the amount of solvent used may be reduced.

A hole or trench pattern after development may be shrunk by the thermal flow, RELACS® or DSA process. A hole pattern is shrunk by coating a shrink agent thereto, and baking such that the shrink agent may undergo crosslinking at the resist surface as a result of the acid catalyst diffusing from the resist layer during bake, and the shrink agent may attach to the sidewall of the hole pattern. The bake is preferably at a temperature of 70 to 180° C., more preferably 80 to 170° C., for a time of 10 to 300 seconds. The extra shrink agent is stripped and the hole pattern is shrunk.

EXAMPLES

Examples of the invention are given below by way of illustration and not by way of limitation. The abbreviation "pbw" is parts by weight.

Quenchers 1 to 16 used in resist compositions have the structure shown below. Quenchers 1 to 16 were prepared by mixing equi-molar amounts of an iodized or brominated phenol providing the anion shown below and a 2,5,8,9-tetraaza-1-phosphabicyclo[3.3.3]undecane, biguanide or phosphazene compound providing the cation shown below in methanol, and evaporating off the methanol.

Quencher 1

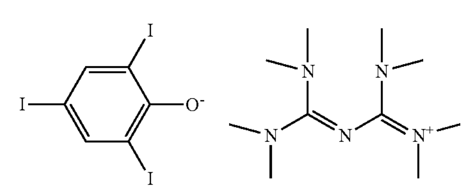

-continued
Quencher 2
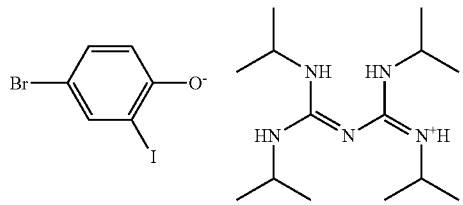
Quencher 3
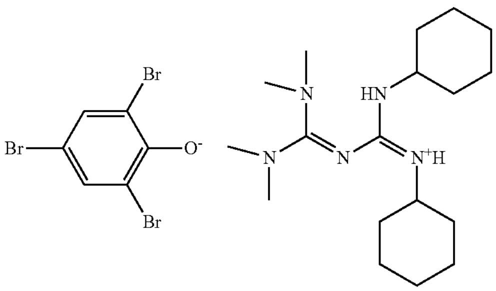
Quencher 4
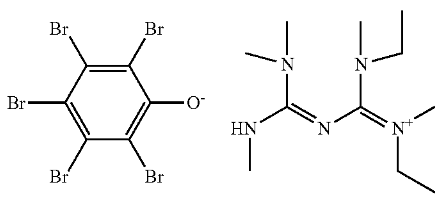
Quencher 5
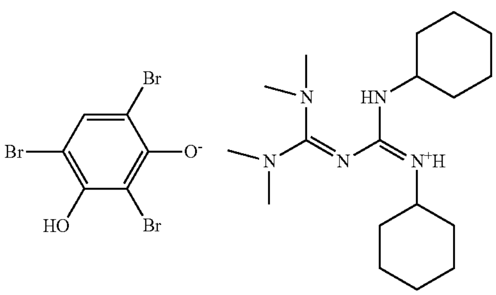
Quencher 6
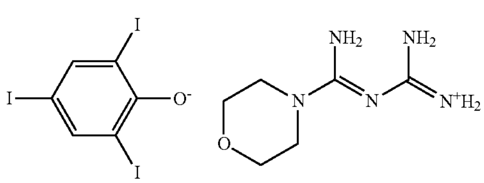
Quencher 7
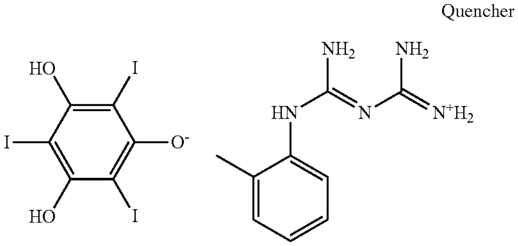
-continued
Quencher 8
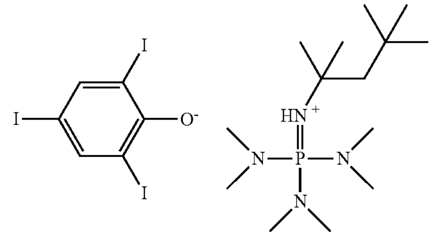
Quencher 9
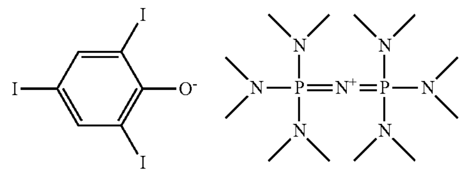
Quencher 10
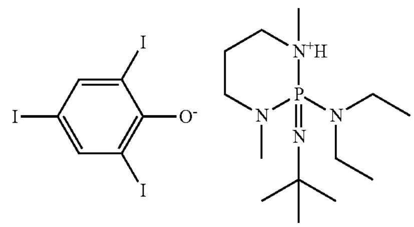
Quencher 11
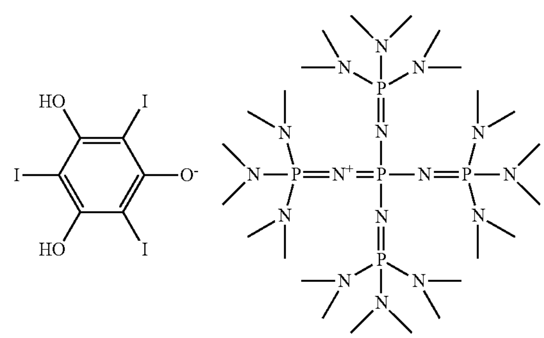
Quencher 12
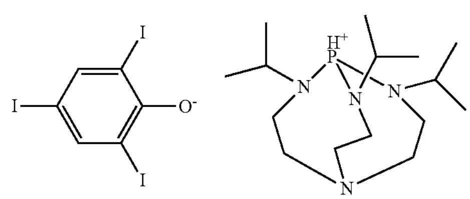
Quencher 13
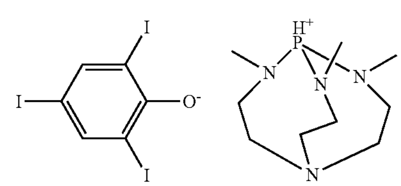
Quencher 14
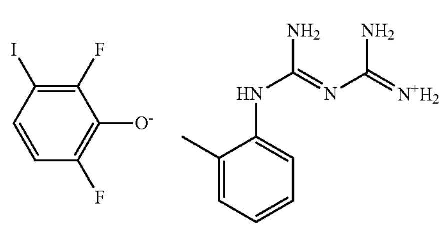

-continued

Quencher 15

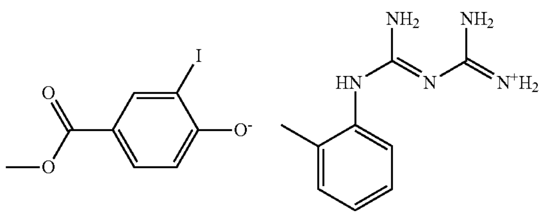

Quencher 16

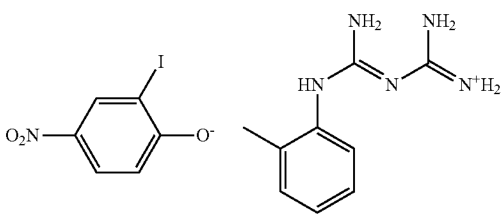

Synthesis Example

Synthesis of Base Polymers (Polymers 1 to 4)

Base polymers were prepared by combining suitable monomers, effecting copolymerization reaction thereof in tetrahydrofuran (THF) solvent, pouring the reaction solution into methanol for crystallization, repeatedly washing with hexane, isolation, and drying. The resulting polymers, designated Polymers 1 to 4, were analyzed for composition by $^{1}H$-NMR spectroscopy, and for Mw and Mw/Mn by GPC versus polystyrene standards using THF solvent.

Polymer 1

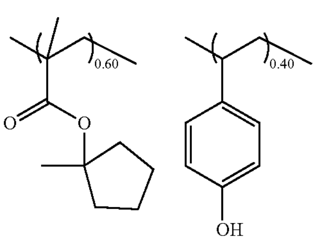

Mw = 8,600
Mw/Mn = 1.73

Polymer 2

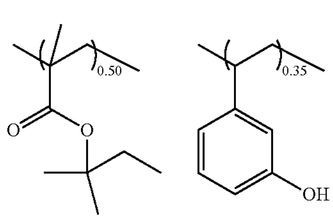

-continued

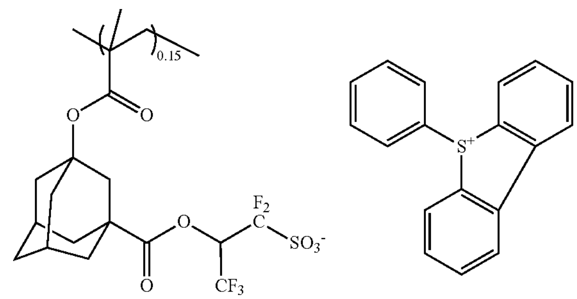

Mw = 8,900
Mw/Mn = 1.89

Polymer 3

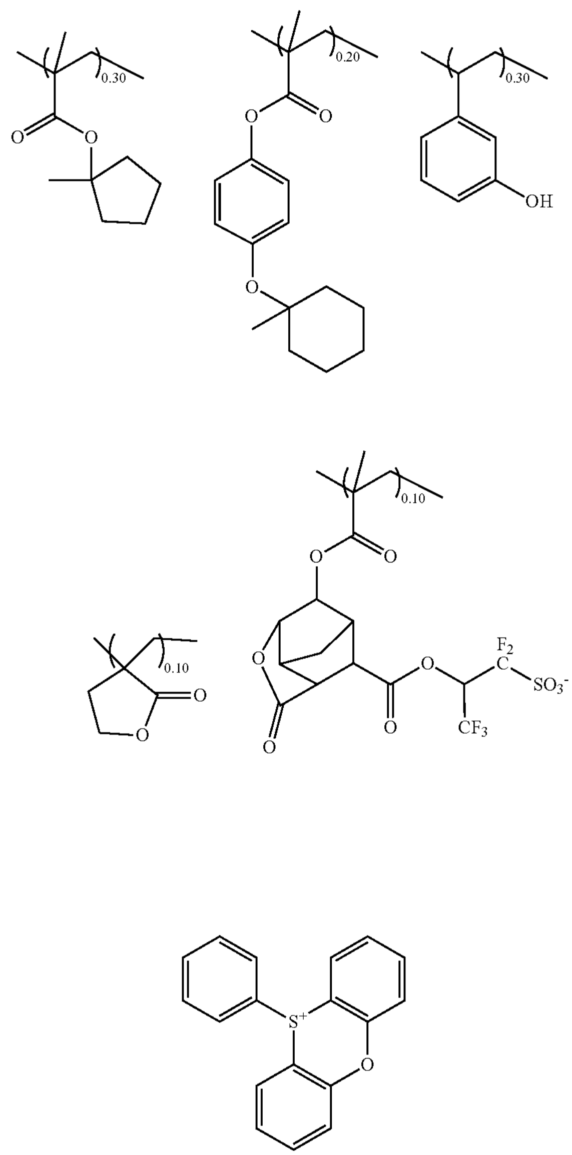

Mw = 7,600
Mw/Mn = 1.73

-continued

Polymer 4

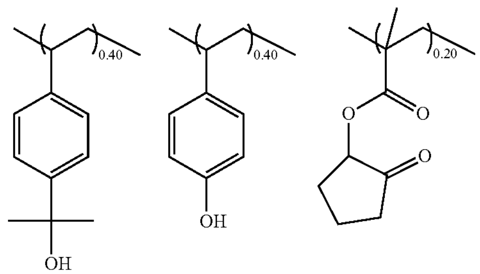

Mw = 6,900
Mw/Mn = 1.62

Examples 1 to 19 and Comparative Examples 1 to 7

Preparation of Resist Compositions

Resist compositions in solution form were prepared by dissolving components in a solvent in accordance with the recipe shown in Tables 1 to 3, and filtering through a filter having a pore size of 0.2 μm. The solvent contained 100 ppm of surfactant FC-4430 (3M). The resist compositions of Examples 1 to 18 and Comparative Examples 1 to 6 were of positive tone, while the resist compositions of Example 19 and Comparative Example 7 were of negative tone.

The components in Tables 1 to 3 are as identified below.

Polymers 1 to 4 of the Above Structural Formulae

Organic Solvents:

PGMEA (propylene glycol monomethyl ether acetate)

CyH (cyclohexanone)

PGME (propylene glycol monomethyl ether)

DAA (diacetone alcohol)

Acid Generators: PAG 1 to PAG 6 of the Following Structural Formulae

PAG 1

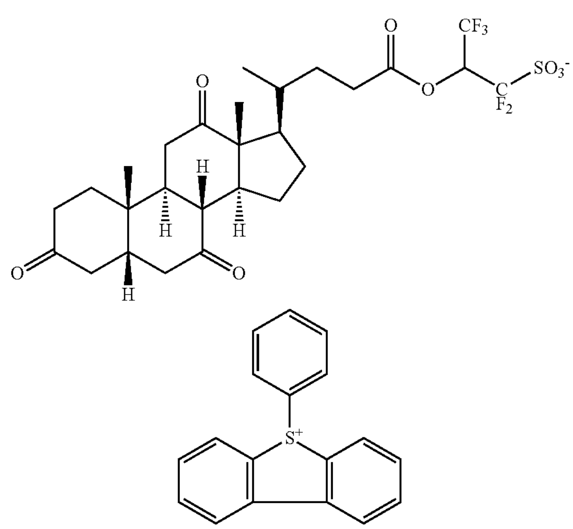

-continued

PAG 2

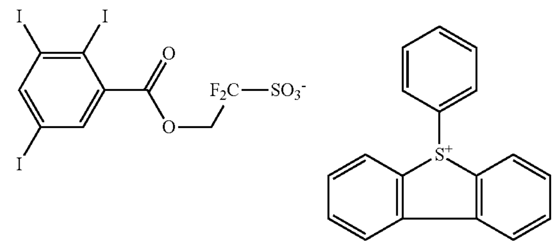

PAG 3

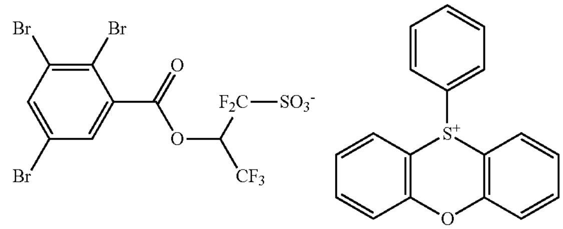

PAG 4

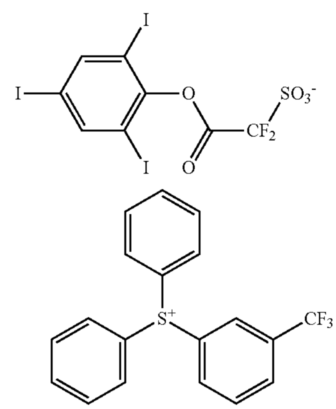

PAG 5

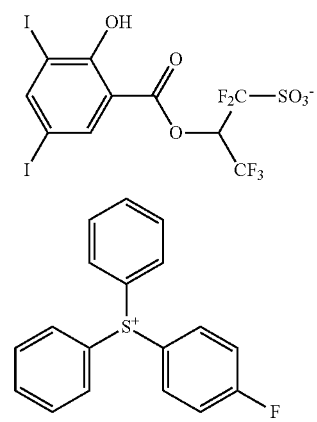

PAG 6

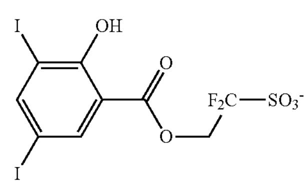

-continued

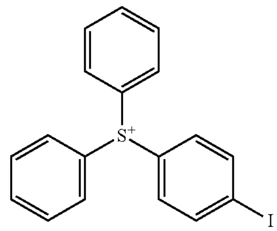

Additive Quenchers 1 to 4:

Additive Quencher 1

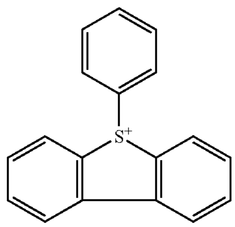

Additive Quencher 2

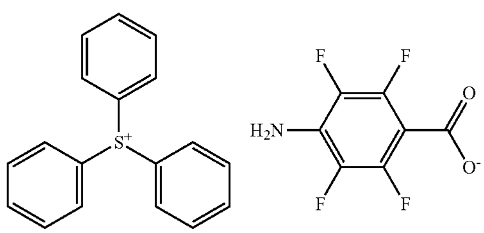

Additive Quencher 3

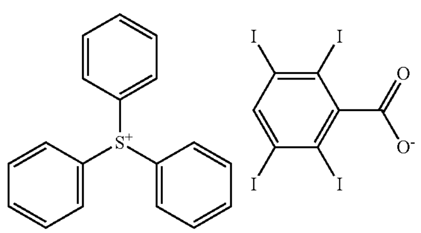

Additive Quencher 4

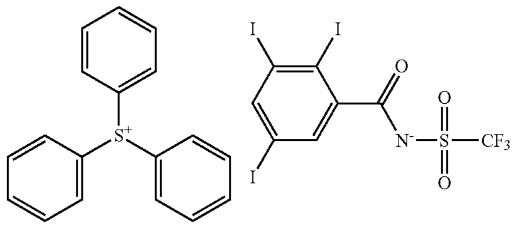

Comparative Quenchers 1 to 6:

Comparative Quencher 1

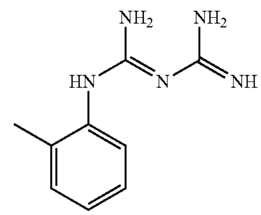

Comparative Quencher 2

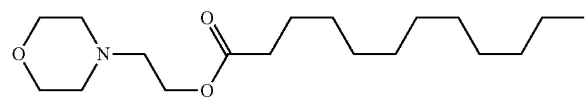

Comparative Quencher 3

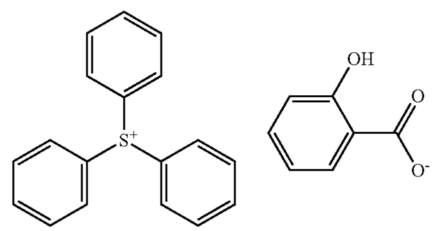

Comparative Quencher 4

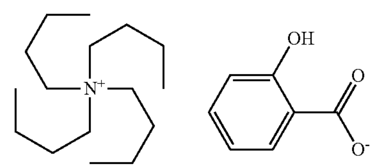

Comparative Quencher 5

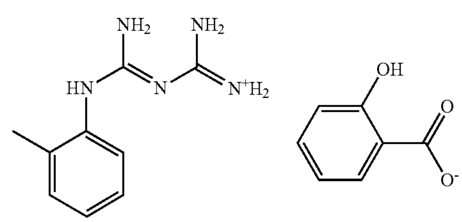

Comparative Quencher 6

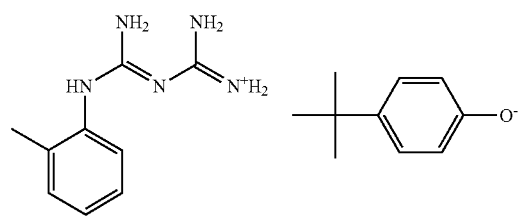

EUV Lithography Test

Each of the resist compositions in Tables 1 to 3 was spin coated on a silicon substrate having a 20-nm coating of silicon-containing spin-on hard mask SHB-A940 (Shin-Etsu Chemical Co., Ltd., silicon content 43 wt %) and prebaked on a hotplate at 105° C. for 60 seconds to form a resist film of 50 nm thick. Using an EUV scanner NXE3300 (ASML, NA 0.33, σ 0.9/0.6, quadrupole illumination), the resist film was exposed to EUV through a mask bearing a hole pattern at a pitch 46 nm (on-wafer size) and +20% bias. The resist film was baked (PEB) on a hotplate at the temperature shown in Tables 1 to 3 for 60 seconds and developed in a 2.38 wt % TMAH aqueous solution for 30 seconds to form a hole pattern having a size of 23 nm in Examples 1 to 18 and Comparative Examples 1 to 6 or a dot pattern having a size of 23 nm in Example 19 and Comparative Example 7.

The resist pattern was observed under CD-SEM (CG-5000, Hitachi High-Technologies Corp.). The exposure dose that provides a hole or dot pattern having a size of 23 nm is reported as sensitivity. The size of 50 holes or dots at that dose was measured, from which a size variation (3σ) was computed and reported as CDU.

The resist composition is shown in Tables 1 to 3 together with the sensitivity and CDU of EUV lithography.

TABLE 1

| | | Polymer (pbw) | Acid generator (pbw) | Quencher (pbw) | Organic solvent (pbw) | PEB temp. (° C.) | Sensitivity (mJ/cm$^2$) | CDU (nm) |
|---|---|---|---|---|---|---|---|---|
| Example | 1 | Polymer 1 (100) | PAG 1 (26.2) | Quencher 1 (6.85) | PGMEA (2,000) DAA (500) | 90 | 34 | 4.2 |
| | 2 | Polymer 1 (100) | PAG 2 (27.1) | Quencher 2 (5.68) | PGMEA (2,000) DAA (500) | 90 | 32 | 4.0 |
| | 3 | Polymer 1 (100) | PAG 3 (25.4) | Quencher 3 (6.52) | PGMEA (2,000) DAA (500) | 90 | 32 | 4.2 |
| | 4 | Polymer 1 (100) | PAG 4 (28.8) | Quencher 4 (7.24) | PGMEA (2,000) DAA (500) | 90 | 29 | 4.3 |
| | 5 | Polymer 1 (100) | PAG 5 (26.5) | Quencher 5 (6.68) | PGMEA (2,000) DAA (500) | 90 | 34 | 4.1 |
| | 6 | Polymer 1 (100) | PAG 6 (27.7) | Quencher 6 (6.43) | PGMEA (2,000) DAA (500) | 90 | 31 | 4.2 |
| | 7 | Polymer 2 (100) | — | Quencher 7 (6.95) | PGMEA (400) CyH (2,000) PGME (100) | 85 | 36 | 3.2 |
| | 8 | Polymer 2 (100) | — | Quencher 8 (7.62) | PGMEA (400) CyH (2,000) PGME (100) | 85 | 34 | 3.3 |
| | 9 | Polymer 2 (100) | — | Quencher 9 (8.11) | PGMEA (400) CyH (2,000) PGME (100) | 85 | 33 | 3.1 |
| | 10 | Polymer 2 (100) | — | Quencher 10 (7.46) | PGMEA (400) CyH (2,000) PGME (100) | 85 | 34 | 3.3 |
| | 11 | Polymer 2 (100) | — | Quencher 11 (6.21) Additive Quencher 1 (2.36) | PGMEA (400) CyH (2,000) PGME (100) | 85 | 33 | 3.0 |
| | 12 | Polymer 2 (100) | — | Quencher 12 (3.86) Additive Quencher 2 (2.36) | PGMEA (400) CyH (2,000) PGME (100) | 85 | 29 | 3.1 |
| | 13 | Polymer 2 (100) | — | Quencher 13 (3.44) Additive Quencher 3 (3.81) | PGMEA (400) CyH (2,000) PGME (100) | 85 | 30 | 3.1 |
| | 14 | Polymer 2 (100) | — | Quencher 11 (6.21) Additive Quencher 4 (4.46) | PGMEA (400) CyH (2,000) PGME (100) | 85 | 28 | 3.2 |
| | 15 | Polymer 3 (100) | — | Quencher 7 (6.95) | PGMEA (400) CyH (2,000) PGME (100) | 80 | 29 | 3.3 |
| | 16 | Polymer 4 (100) | PAG 1 (12) | Quencher 7 (4.17) | PGMEA (2,000) DAA (500) | 120 | 44 | 4.9 |

TABLE 2

| | | Polymer (pbw) | Acid generator (pbw) | Quencher (pbw) | Organic solvent (pbw) | PEB temp. (° C.) | Sensitivity (mJ/cm$^2$) | CDU (nm) |
|---|---|---|---|---|---|---|---|---|
| Example | 14 | Polymer 2 (100) | — | Quencher 14 (4.47) | PGMEA (400) CyH (2,000) PGME (100) | 85 | 33 | 3.0 |
| | 15 | Polymer 2 (100) | — | Quencher 15 (4.69) | PGMEA (400) CyH (2,000) PGME (100) | 85 | 32 | 3.2 |

TABLE 2-continued

| | Polymer (pbw) | Acid generator (pbw) | Quencher (pbw) | Organic solvent (pbw) | PEB temp. (° C.) | Sensitivity (mJ/cm$^2$) | CDU (nm) |
|---|---|---|---|---|---|---|---|
| 16 | Polymer 2 (100) | — | Quencher 16 (4.56) | PGMEA (400) CyH (2,000) PGME (100) | 85 | 35 | 3.3 |
| 17 | Polymer 2 (100) | — | Quencher 11 (6.21) Additive Quencher 4 (4.46) | PGMEA (400) CyH (2,000) PGME (100) | 85 | 3.2 | 28 |
| 18 | Polymer 3 (100) | — | Quencher 7 (6.95) | PGMEA (400) CyH (2,000) PGME (100) | 80 | 29 | 3.3 |
| 19 | Polymer 4 (100) | PAG 4 (12) | Quencher 7 (4.17) | PGMEA (2,000) DAA (500) | 120 | 44 | 4.9 |

TABLE 3

| | | Polymer (pbw) | Acid generator (pbw) | Quencher (pbw) | Organic solvent (pbw) | PEB temp. (° C.) | Sensitivity (mJ/cm$^2$) | CDU (nm) |
|---|---|---|---|---|---|---|---|---|
| Comparative Example | 1 | Polymer 2 (100) | — | Comparative Quencher 1 (1.91) | PGMEA (400) CyH (2,000) PGME (100) | 80 | 52 | 5.7 |
| | 2 | Polymer 2 (100) | — | Comparative Quencher 2 (3.13) | PGMEA (400) CyH (2,000) PGME (100) | 80 | 53 | 5.9 |
| | 3 | Polymer 2 (100) | — | Comparative Quencher 3 (4.00) | PGMEA (400) CyH (2,000) PGME (100) | 80 | 52 | 4.9 |
| | 4 | Polymer 2 (100) | — | Comparative Quencher 4 (3.79) | PGMEA (400) CyH (2,000) PGME (100) | 80 | 50 | 4.4 |
| | 5 | Polymer 2 (100) | — | Comparative Quencher 5 (3.29) | PGMEA (400) CyH (2,000) PGME (100) | 80 | 50 | 5.3 |
| | 6 | Polymer 2 (100) | — | Comparative Quencher 6 (3.41) | PGMEA (400) CyH (2,000) PGME (100) | 80 | 48 | 5.2 |
| | 7 | Polymer 4 (100) | PAG 4 (12) | Comparative Quencher 6 (2.05) | PGMEA (2,000) DAA (500) | 120 | 52 | 6.5 |

It is demonstrated in Tables 1 to 3 that resist compositions comprising an iodized or brominated phenol salt form patterns having a high sensitivity and reduced values of CDU.

Japanese Patent Application No. 2019-167112 is incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

The invention claimed is:

1. A resist composition comprising a base polymer and a salt, the salt consisting of an anion derived from an iodized phenol compound and a cation derived from a 2,5,8,9-tetraaza-1-phosphabicyclo[3.3.3]undecane, biguanide or phosphazene compound, the salt having formula (A):

(A)

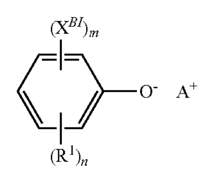

wherein m is 2 or 3, and n is an integer of 0 to 2, 2≤m+n≤5, $X^{BI}$ is iodine, $R^1$ is hydroxyl, an optionally fluorinated or chlorinated $C_1$-$C_6$ saturated hydrocarbyl group, an optionally fluorinated or chlorinated $C_1$-$C_6$ saturated hydrocarbyloxy group, an optionally fluorinated or chlorinated $C_2$-$C_6$ saturated hydrocarbyloxycarbonyl group, formyl, an optionally fluorinated or chlorinated $C_2$-$C_6$ saturated hydrocarbylcarbonyl group, an optionally fluorinated or chlorinated $C_2$-$C_6$ saturated hydrocarbylcarbonyloxy group, an optionally fluorinated or chlorinated $C_1$-$C_4$ saturated hydrocarbylsulfonyloxy group, a $C_6$-$C_{10}$ aryl group, fluorine, chlorine, amino, nitro, cyano, —$NR^{1A}$—C(═O)—$R^{1B}$, or —$NR^{1A}$—C(═O)—O—$R^{1B}$, $R^{1A}$ is hydrogen or a $C_1$-$C_6$ saturated hydrocarbyl group, $R^{1B}$ is a $C_1$-$C_6$ saturated hydrocarbyl group or a $C_2$-$C_8$ unsaturated aliphatic hydrocarbyl group, $A^+$ is a cation having the formula (A)-1, (A)-2 or (A)-3:

(A)-1

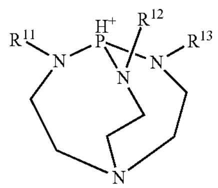

(A)-2

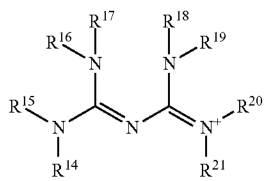

(A)-3

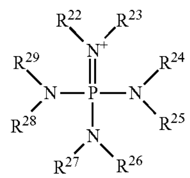

wherein $R^{11}$ to $R^{13}$ are each independently a $C_1$-$C_{24}$ hydrocarbyl group which may contain a heteroatom, $R^{14}$ to $R^{21}$ are each independently hydrogen or a $C_1$-$C_{24}$ hydrocarbyl group which may contain a heteroatom, a pair of $R^{14}$ and $R^{15}$, $R^{15}$ and $R^{16}$, $R^{16}$ and $R^{17}$, $R^{17}$ and $R^{18}$, $R^{18}$ and $R^{19}$, $R^{19}$ and $R^{20}$, or $R^{20}$ and $R^{21}$ may bond together to form a ring with the nitrogen atom to which they are attached, or the nitrogen atoms to which they are attached and intervening carbon atom, the ring optionally containing an ether bond, $R^{22}$ to $R^{29}$ are each independently hydrogen or a $C_1$-$C_{24}$ hydrocarbyl group which may contain a heteroatom, a pair of $R^{22}$ and $R^{23}$, $R^{23}$ and $R^{24}$, $R^{24}$ and $R^{25}$, $R^{25}$ and $R^{26}$, $R^{26}$ and $R^{27}$, or $R^{27}$ and $R^{28}$ may bond together to form a ring with the nitrogen atom to which they are attached, or the nitrogen atoms to which they are attached and intervening phosphorus atom, a pair of $R^{22}$ and $R^{23}$, $R^{24}$ and $R^{25}$, $R^{26}$ and $R^{27}$, or $R^{28}$ and $R^{29}$ may bond together to form a group having the formula (A)-3-1, and $R^{23}$ may be a group having the formula (A)-3-2 when $R^{22}$ is hydrogen, (A)-3-1

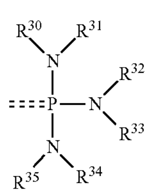

-continued (A)-3-2

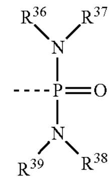

wherein $R^{30}$ to $R^{39}$ are each independently hydrogen or a $C_1$-$C_{24}$ hydrocarbyl group which may contain a heteroatom, a pair of $R^{30}$ and $R^{31}$, $R^{31}$ and $R^{32}$, $R^{32}$ and $R^{33}$, $R^{33}$ and $R^{34}$, $R^{34}$ and $R^{35}$, $R^{36}$ and $R^{37}$, or $R^{38}$ and $R^{39}$ may bond together to form a ring with the nitrogen atom to which they are attached, or the nitrogen atoms to which they are attached and intervening phosphorus atom, a pair of $R^{30}$ and $R^{31}$, $R^{32}$ and $R^{33}$, or $R^{34}$ and $R^{35}$ may bond together to form a group having the formula (A)-3-1, the broken line designates a valence bond.

2. The resist composition of claim 1, further comprising an acid generator capable of generating a sulfonic acid, sulfonimide or sulfonmethide.

3. The resist composition of claim 1 wherein the base polymer comprises recurring units having the formula (a1) or recurring units having the formula (a2):

(a1)

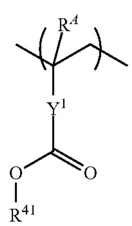

(a2)

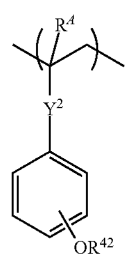

wherein $R^A$ is each independently hydrogen or methyl, $R^{41}$ and $R^{42}$ each are an acid labile group, $Y^1$ is a single bond, phenylene group, naphthylene group, or $C_1$-$C_{12}$ linking group containing at least one moiety selected from ester bond and lactone ring, and $Y^2$ is a single bond or ester bond.

4. The resist composition of claim 3 which is a chemically amplified positive resist composition.

5. The resist composition of claim 1 wherein the base polymer is free of an acid labile group.

6. The resist composition of claim 5 which is a chemically amplified negative resist composition.

7. The resist composition of claim 1 wherein the base polymer comprises recurring units of at least one type selected from recurring units having the formulae (f1) to (f3):

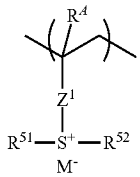
(f1)

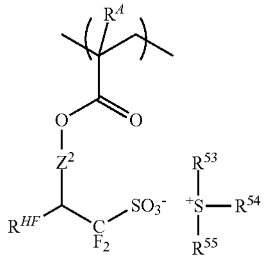
(f2)

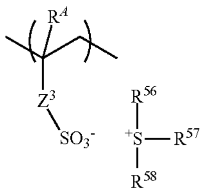
(f3)

wherein $R^A$ is each independently hydrogen or methyl, $Z^1$ is a single bond, phenylene group, —O—$Z^{11}$—, —C(═O)—O—$Z^{11}$— or —C(—O)—NH—$Z^{11}$—, $Z^{11}$ is a $C_1$-$C_6$ aliphatic hydrocarbylene group or phenylene group, which may contain a carbonyl, ester bond, ether bond or hydroxyl moiety, $Z^2$ is a single bond, —$Z^{21}$—C(═O)—O—, —$Z^{21}$—O— or —$Z^{21}$—O—C(═O)—, $Z^{21}$ is a $C_1$-$C_{12}$ saturated hydrocarbylene group which may contain a carbonyl moiety, ester bond or ether bond, $Z^3$ is a single bond, methylene, ethylene, phenylene, fluorinated phenylene, —O—$Z^{31}$, —C(═O)—O—$Z^{31}$—, or —C(—O)—NH—$Z^{31}$—, $Z^{31}$ is a $C_1$-$C_6$ aliphatic hydrocarbylene group, phenylene group, fluorinated phenylene group, or trifluoromethyl-substituted phenylene group, which may contain a carbonyl moiety, ester bond, ether bond or hydroxyl moiety, $R^{51}$ to $R^{58}$ are each independently a $C_1$-$C_{20}$ hydrocarbyl group which may contain a heteroatom, any two of $R^{53}$, $R^{54}$ and $R^{55}$ or any two of $R^{56}$, $R^{57}$ and $R^{58}$ may bond together to form a ring with the sulfur atom to which they are attached, $R^{HF}$ is hydrogen or trifluoromethyl, and M is a non-nucleophilic counter ion.

8. The resist composition of claim 1, further comprising an organic solvent.

9. The resist composition of claim 1, further comprising a surfactant.

10. A process for forming a pattern comprising the steps of applying the resist composition of claim 1 to form a resist film on a substrate, exposing the resist film to high-energy radiation, and developing the exposed resist film in a developer.

11. The process of claim 10 wherein the high-energy radiation is ArF excimer laser radiation of wavelength 193 nm or KrF excimer laser radiation of wavelength 248 nm.

12. The process of claim 10 wherein the high-energy radiation is EB or EUV of wavelength 3 to 15 nm.

13. The resist composition of claim 1 wherein $A^+$ is a cation having the formula (A)-1 or (A)-2.

* * * * *